US011635685B2

(12) United States Patent
Hatakeyama et al.

(10) Patent No.: US 11,635,685 B2
(45) Date of Patent: Apr. 25, 2023

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Takayuki Fujiwara, Joetsu (JP); Tomomi Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 224 days.

(21) Appl. No.: 17/081,106

(22) Filed: Oct. 27, 2020

(65) Prior Publication Data

US 2021/0149300 A1 May 20, 2021

(30) Foreign Application Priority Data

Nov. 20, 2019 (JP) ............................ JP2019-209458

(51) Int. Cl.

*G03F 7/004* (2006.01)
*G03F 7/038* (2006.01)
*G03F 7/20* (2006.01)
*G03F 7/039* (2006.01)
*C08L 33/14* (2006.01)
*C08L 25/18* (2006.01)
*G03F 7/029* (2006.01)

(52) U.S. Cl.

CPC ............ *G03F 7/0045* (2013.01); *C08L 25/18* (2013.01); *C08L 33/14* (2013.01); *G03F 7/0048* (2013.01); *G03F 7/029* (2013.01); *G03F 7/0382* (2013.01); *G03F 7/0392* (2013.01); *G03F 7/2004* (2013.01); *G03F 7/2053* (2013.01)

(58) Field of Classification Search

None

See application file for complete search history.

(56) References Cited

U.S. PATENT DOCUMENTS

| | | | | |
|---|---|---|---|---|
| 6,551,758 | B2 | 4/2003 | Ohsawa et al. | |
| 6,692,893 | B2 | 2/2004 | Ohsawa et al. | |
| 6,749,988 | B2 | 6/2004 | Hatakeyama et al. | |
| 6,916,593 | B2 | 7/2005 | Hatakeyama et al. | |
| 8,026,390 | B2 | 9/2011 | Oh et al. | |
| 8,148,044 | B2 | 4/2012 | Yamaguchi et al. | |
| 9,250,518 | B2 | 2/2016 | Hatakeyama et al. | |
| 10,101,653 | B2 | 10/2018 | Hatakeyama et al. | |
| 10,323,113 | B2 | 6/2019 | Hatakeyama et al. | |
| 10,871,711 | B2 * | 12/2020 | Hatakeyama | C09D 133/10 |
| 2009/0274978 | A1 | 11/2009 | Ohashi et al. | |
| 2010/0248149 | A1 * | 9/2010 | Tsuchimura | G03F 7/2037 430/296 |
| 2012/0076996 | A1 * | 3/2012 | Yamamoto | G03F 7/0395 430/311 |
| 2014/0342288 | A1 * | 11/2014 | Tomioka | G03F 7/11 560/150 |
| 2015/0212417 | A1 | 7/2015 | Hatakeyama et al. | |
| 2017/0115566 | A1 * | 4/2017 | Hatakeyama | G03F 7/2059 |
| 2017/0369616 | A1 * | 12/2017 | Hatakeyama | G03F 7/0045 |
| 2018/0039173 | A1 * | 2/2018 | Hatakeyama | C07C 309/17 |
| 2018/0267402 | A1 * | 9/2018 | Hatakeyama | C08F 228/02 |
| 2018/0275512 | A1 * | 9/2018 | Hatakeyama | C08F 220/283 |
| 2019/0094690 | A1 | 3/2019 | Hatakeyama et al. | |
| 2019/0155152 | A1 * | 5/2019 | Aqad | G03F 7/16 |

FOREIGN PATENT DOCUMENTS

| | | | | |
|---|---|---|---|---|
| CN | 102289149 | A | 12/2011 | |
| JP | 5-204157 | A | 8/1993 | |
| JP | 2001-194776 | A | 7/2001 | |
| JP | 2002-226470 | A | 8/2002 | |
| JP | 2002-363148 | A | 12/2002 | |
| JP | 2011-252147 | A | 12/2011 | |
| JP | 2015-25789 | A | 2/2015 | |
| JP | 2015-90382 | A | 5/2015 | |
| JP | 2015-161823 | A | 9/2015 | |
| JP | 2018-5224 | A | 1/2018 | |
| JP | 2018-25789 | A | 2/2018 | |
| JP | 2019-94323 | A | 6/2019 | |
| TW | 201009493 | A | 3/2010 | |
| TW | 201533528 | A | 9/2015 | |
| TW | 201921109 | A | 6/2019 | |
| WO | 2013/024777 | A1 | 2/2013 | |
| WO | WO-2014034190 | A1 * | 3/2014 | C07C 309/08 |

OTHER PUBLICATIONS

Office Action dated May 31, 2021, issued in counterpart TW Application No. 109140235. (8 pages).

Yamamoto et al., "Polymer-Structure Dependence of Acid Gerneration in Chemically Amplified Extreme Ultraviolet Resists", Japanese Journal of Applied Physics, (2007), vol. 46, No. 7, pp. L142-L144.(6 pages).

Wang et al., "Photobase generator and photo decomposable quencher for high-resolution photoresist applications," SPIE vol. 7639, 2010, p. 76390W1-15.

Lio, "EUV Resists: What's Next?," SPIE vol. 9776, 2016, p. 97760V-1-14.

Office Action dated Feb. 26, 2018, issued in Taiwanese Application No. 106121402. (12 pages).

Non-Final Office Action dated Jun. 27, 2019, issued in U.S. Appl. No. 15/920,641 (10 pages).

Non-Final Office Action dated Aug. 9, 2018, issued in U.S. Appl. No. 15/623,561 (8 pages).

Non-Final Office Action dated May 7, 2020, issued in U.S. Appl. No. 16/130,271 (15 pages).

* cited by examiner

*Primary Examiner* — Martin J Angebranndt
(74) *Attorney, Agent, or Firm* — WHDA, LLP

(57) ABSTRACT

A resist composition comprising a base polymer and an acid generator containing a sulfonium or iodonium salt of iodized benzamide group-containing fluorinated sulfonic acid offers a high sensitivity, minimal LWR and improved CDU independent of whether it is of positive or negative tone.

16 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2019-209458 filed in Japan on Nov. 20, 2019, the entire contents of which are hereby incorporated by reference.

TECHNICAL FIELD

This invention relates to a resist composition and a pattern framing process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

The EUV resist material must meet high sensitivity, high resolution and low edge roughness (LWR) at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation between sensitivity and LWR.

The wavelength (13.5 nm) of EUV is shorter than the wavelength (193 nm) of ArF excimer laser by at least one order, and the energy density of EUV is greater than that of ArF by one order. It is believed that since the number of photons available in a photoresist layer upon EUV exposure is as small as 1/14 of that of ArF exposure, a variation of size (LWR or CDU) is largely affected by a variation of photon number. There arises the phenomenon that a hole pattern is not opened at a one-in-several millions probability because of a variation of photon number. It is pointed out that the light absorption of a photoresist material must be increased in order to minimize the variation of photon number.

Patent Documents 1 to 3 disclose acid generators capable of generating acids having a iodine-substituted benzene ring. Since fully EUV absorptive iodine atoms are introduced on the anion side, the decomposition of the acid generator upon EUV exposure is promoted, leading to an improvement in sensitivity. Further improvements in sensitivity and LWR or CDU are demanded.

CITATION LIST

Patent Document 1: JP-A 2018-005224 (U.S. Pat. No. 10,323,113)

Patent Document 2: JP-A 2018-025789 (U.S. Pat. No. 10,101,653)

Patent Document 3: JP-A 2019-094323 (US 20190155152)

SUMMARY OF INVENTION

For the chemically amplified resist composition using an acid catalyst, it is desired to develop an acid generator capable of achieving a high sensitivity and reducing the LWR of line patterns or improving the CDU of hole patterns.

An object of the invention is to provide a resist composition which achieves a high sensitivity, minimal LWR and improved CDU independent of whether it is of positive or negative tone, and a pattern forming process using the resist composition.

The inventors have found that a resist composition having a high sensitivity, minimal LWR, improved CDU, high contrast, high resolution and wide process margin is obtained using a sulfonium or iodonium salt of a specific iodized benzamide group-containing fluorinated sulfonic acid as an acid generator.

In one aspect, the invention provides a resist composition comprising a base polymer and an acid generator containing a sulfonium salt having the formula (A-1) or iodonium salt having the formula (A-2).

(A-1)

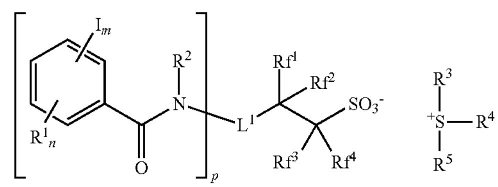

(A-2)

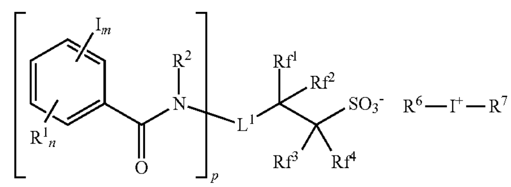

Herein in is an integer of 1 to 5, n is an integer of 0 to 3, m+n is 1 to 5, p is an integer of 1 to 3. $L^1$ is a single bond or $C_1$-$C_{20}$ divalent linking group when p=1, or a $C_1$-$C_{20}$ tri- or tetravalent linking group when p=2 or 3, the linking group optionally containing oxygen, sulfur or nitrogen. $Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$, taken together, may form a carbonyl group. $R^1$ is hydroxyl, carboxyl, nitro, cyano, fluorine, chlorine, bromine, amino, or a $C_1$-$C_{20}$ saturated hydrocarbyl, $C_1$-$C_{20}$ saturated hydrocarbyloxy, $C_2$-$C_{20}$ saturated hydrocarbyloxycarbonyl. $C_1$-$C_{20}$ saturated hydrocarbylcarbonyloxy or $C_1$-$C_4$ saturated hydrocarbylsulfonyloxy group, which may contain fluorine, chlorine, bromine, hydroxyl, amino or ether bond, or —$NR^{1A}$—C(═O)—$R^{1B}$ or —$NR^{1A}$—C(═O)—O—$R^{1B}$, $R^{1A}$ is hydrogen or a $C_1$-$C_6$ saturated hydrocarbyl group which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety, $R^{1B}$ is a $C_1$-$C_{16}$ aliphatic hydrocarbyl group or $C_6$-$C_{12}$ aryl group, which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^2$ is hydrogen or $C_1$-$C_4$ alkyl, $R^2$ and $L^1$ may bond together to form a ring with the nitrogen atom to which they are attached. $R^3$, $R^4$, $R^1$, $R^6$, and $R^7$ are each independently a $C_1$-$C_{20}$ hydrocarbyl group which may contain a heteroatom, $R^3$ and $R^4$ may bond together to form a ring with the sulfur atom to which they are attached.

The resist composition may further comprise an organic solvent.

In a preferred embodiment, the base polymer comprises recurring units having the formula (a1) or recurring units having the formula (a2).

(a1)

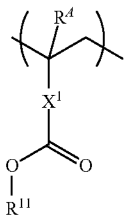

(a2)

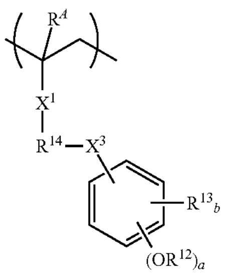

Herein $R^A$ is each independently hydrogen or methyl. $X^1$ is a single bond, phenylene group, naphthylene group, or $C_1$-$C_{12}$ linking group containing an ester bond, ether bond or lactone ring. $X^2$ is a single bond or ester bond. $X^3$ is a single bond, ether bond or ester bond. $R^{11}$ and $R^{12}$ each are an acid labile group. $R^{13}$ is fluorine, trifluoromethyl, cyano, $C_1$-$C_6$ saturated hydrocarbyl, $C_1$-$C_4$ saturated hydrocarbyloxy. $C_2$-$C_7$ saturated hydrocarbylcarbonyl. $C_2$-$C_7$ saturated hydrocarbylcarbonyloxy, or $C_2$-$C_7$ saturated hydrocarbyloxycarbonyl group. $R^{14}$ is a single bond or a $C_1$-$C_6$ alkanediyl group in which some carbon may be replaced by an ether bond or ester bond, a is 1 or 2, and b is an integer of 0 to 4.

The resist composition may further comprise a dissolution inhibitor.

In one preferred embodiment, the resist composition is a chemically amplified positive resist composition.

In another preferred embodiment, the base polymer is free of an acid labile group. The resist composition may further comprise a crosslinker. The resist composition is typically a chemically amplified negative resist composition.

The resist composition may further comprise a surfactant.

In a further preferred embodiment, the base polymer further comprises recurring units of at least one type selected from the formulae (f1) to (f3).

(f1)

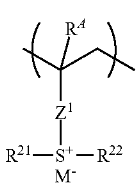

-continued (f2)

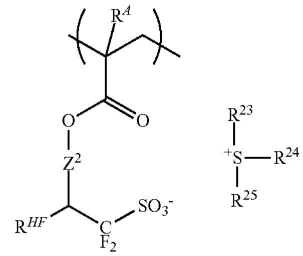

(f3)

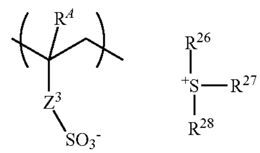

Herein $R^A$ is each independently hydrogen or methyl. $Z^1$ is a single bond, phenylene group, —O—$Z^{11}$—, —C(═O)—C)—$Z^{11}$— or —C(═O)—NH—$Z^{11}$—, wherein $Z^{11}$ is a $C_1$-$C_6$ aliphatic hydrocarbylene group, phenylene group, naphthylene group, or $C_7$-$C_{18}$ combination thereof, which may contain carbonyl, ester bond, ether bond or hydroxyl. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ saturated hydrocarbylene group which may contain carbonyl, ester bond or ether bond. $Z^3$ is a single bond, methylene, ethylene, phenylene, fluorinated phenylene, —O—$Z^{31}$—, —C(═O)—O—$Z^{31}$— or —C(═O)—NH—$Z^{31}$—, wherein $Z^{31}$ is a $C_1$-$C_6$ aliphatic hydrocarbylene group, phenylene group, fluorinated phenylene group, or trifluoromethyl-substituted phenylene group, which may contain carbonyl, ester bond, ether bond or hydroxyl. $R^{21}$ to $R^{28}$ are each independently a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached. R® is hydrogen or trifluoromethyl. $M^-$ is a non-nucleophilic counter ion.

In another aspect, the invention provides a process for forming a pattern comprising the steps of applying the resist composition defined above onto a substrate to form a resist film thereon, exposing the resist film to high-energy radiation, and developing the exposed resist film in a developer.

In a preferred embodiment, the high-energy radiation is ArF excimer laser radiation of wavelength 193 run, KrF excimer laser radiation of wavelength 248 nm, EB, or EUV of wavelength 3 to 15 nm.

Advantageous Effects of Invention

The sulfonium or iodonium salt of an iodized benzamide-containing fluorinated sulfonic acid is characterized by minimal acid diffusion due to the large atomic weight of iodine and the acid diffusion control ability of amide group. Since iodine atoms are highly absorptive to EUV of wavelength 13.5 nm, they generate secondary electrons during exposure, contributing to a high sensitivity. Thus a resist composition having a high sensitivity, minimal LWR and unproved CDU is designed.

DESCRIPTION OF EMBODIMENTS

As used herein, the singular forms “a,” “an” and “the” include plural referents unless the context clearly dictates otherwise. The notation ($C_n$-$C_m$) means a group containing from n to m carbon atoms per group. As used herein, the term "iodized" or "fluorinated" indicates that a compound contains iodine or fluorine; and the terms "group" and "moiety" are interchangeable. In chemical formulae, the broken line designates a valence bond.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generates
LWR: line width roughness
CDU: critical dimension uniformity Resist Composition One embodiment of the invention is a resist composition comprising a base polymer and an acid generator, the acid generator containing a sulfonium or iodonium salt of an iodized benzamide-containing fluorinated sulfonic acid. The sulfonium or iodonium salt is an add generator capable of generating an iodized benzamide-containing fluorinated sulfonic acid upon light exposure. In the resist composition, another add generator capable of generating a different sulfonic acid, imide acid or methide acid may be added, or a base polymer having an add generator bound hereto may be combined.

When a resist composition containing the sulfonium salt of an iodized benzamide-containing fluorinated sulfonic acid in admixture with a sulfonium salt of weaker sulfonic or carboxylic acid is exposed to radiation, the iodized benzamide-containing fluorinated sulfonic acid and the weaker sulfonic or carboxylic acid generate. Since the acid generator is not entirely decomposed, the undecomposed acid generator is present nearby. When the iodized benzamide-containing fluorinated sulfonic acid co-exists with the sulfonium salt of weaker sulfonic or carboxylic acid, an ion exchange takes place between the iodized benzamide-containing fluorinated sulfonic acid and the sulfonium salt of weaker sulfonic or carboxylic acid, whereby a sulfonium salt of the iodized benzamide-containing fluorinated sulfonic acid is created and the weaker sulfonic or carboxylic acid is released. This is because the salt of iodized benzamide-containing fluorinated sulfonic acid having a higher acid strength is more stable. In contrast, when a sulfonium salt of an iodized benzamide-containing fluorinated sulfonic acid co-exists with weaker sulfonic or carboxylic acid, no ion exchange takes place. The ion exchange conforming to the order of acid strength takes place not only with sulfonium salts, but also similarly with iodonium salts. When combined with an acid generator of fluorosulfonic acid, a sulfonium or iodonium salt of weak acid functions as a quencher. Since iodine is highly absorptive to EUV of wavelength 13.5 nm, it generates secondary electrons during exposure. The energy of secondary electrons is transferred to the acid generator, which promotes the decomposition of the generator, contributing to a higher sensitivity. The effect is outstanding particularly when the substitution number of iodine is 2 or more.

For the LWR improving purpose, it is effective to prevent a polymer and/or acid generator from agglomeration. Effective means for preventing agglomeration of a polymer is by reducing the difference between hydrophobic and hydrophilic properties, by lowering the glass transition temperature (Tg), or by reducing the molecular weight of the polymer. Specifically, it is effective to reduce the polarity difference between a hydrophobic acid labile group and a hydrophilic adhesive group or to lower the Tg by using a compact adhesive group like monocyclic lactone. One effective means for preventing agglomeration of an acid generator is by introducing a substituent into the triphenylsulfonium cation. In particular, with respect to a methacrylate polymer containing an alicyclic protective group and a lactone adhesive group for ArF lithography, a triphenylsulfonium composed solely of aromatic groups has a heterogeneous structure and low compatibility. As the substituent to be introduced into triphenylsulfonium, an alicyclic group or lactone similar to those used in the base polymer is regarded adequate. When lactone is introduced in a sulfonium salt which is hydrophilic, the resulting sulfonium salt becomes too hydrophilic and thus less compatible with a polymer, with a likelihood that the sulfonium salt will agglomerate. When a hydrophobic alkyl group is introduced, the sulfonium salt may be uniformly dispersed within the resist film. WO 2011/048919 discloses the technique for improving LWR by introducing an alkyl group into a sulfonium salt capable of generating an α-fluorinated sulfone imide acid.

The sulfonium or iodonium salt of an iodized benzamide-containing fluorinated sulfonic acid is reduced in acid diffusion because an iodine atom with a large atomic weight and an amide group capable of controlling acid diffusion are introduced in the anion. The salt is highly compatible with and thus well dispersible in a polymer. There are achieved improvements in LWR and CDU. The amide group is hydrophilic enough to offset a lowering of solubility in alkaline developer by iodine.

The sulfonium or iodonium salt of an iodized benzamide-containing fluorinated sulfonic acid exerts a LWR or CDU improving effect, which may stand good either in positive and negative tone pattern formation by aqueous alkaline development or in negative tone pattern formation by organic solvent development Sulfonium or Iodonium Salt of Iodized Benzamide-Containing Fluorinated Sulfonic Acid The sulfonium salt and iodonium salt used herein have the following formulae (A-1) and (A-2), respectively.

(A-1)

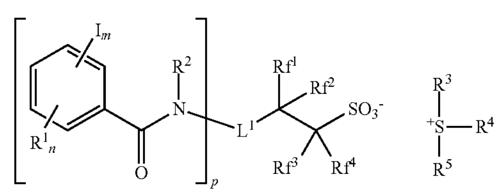

(A-2)

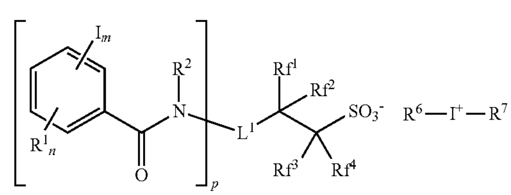

In formulae (A-1) and (A-2), m is an integer of 1 to 5, n is an integer of 0 to 3, m+n is 1 to 5, and p is an integer of 1 to 3.

$L^1$ is a single bond or $C_1$-$C_{20}$ divalent linking group when p=1, or a $C_1$-$C_{20}$ tri- or tetravalent linking group which may contain oxygen, sulfur or nitrogen, when p=2 or 3.

$Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$, taken together, may form a carbonyl group.

$R^1$ is hydroxyl, carboxyl, nitro, cyano, fluorine, chlorine, bromine, amino, or a $C_1$-$C_{20}$ saturated hydrocarbyl, $C_1$-$C_{20}$ saturated hydrocarbyloxy, $C_2$-$C_{20}$ saturated hydrocarbyloxycarbonyl, $C_2$-$C_{20}$ saturated hydrocarbylcarbonyloxy or $C_1$-$C_4$ saturated hydrocarbylsulfonyloxy group, which may contain fluorine, chlorine, bromine, hydroxyl, amino or ether bond, or —$NR^{1A}$—C(═O)—$R^{1B}$ or —$NR^{1A}$—C(═O)—O—$R^{1B}$. $R^{1A}$ is hydrogen or a $C_1$-$C_6$ saturated hydrocarbyl group which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{1B}$ is a $C_1$-$C_{16}$ aliphatic hydrocarbyl group or $C_6$-$C_{12}$ aryl group, which may contain halogen, hydroxyl, $C_1$-$C_{16}$ saturated hydrocarbyloxy, $C_2$-$C_6$ saturated hydrocarbylcarbonyl or $C_2$-$C_6$ saturated hydrocarbylcarbonyloxy moiety.

The $C_1$-$C_{20}$ saturated hydrocarbyl group represented by $R^1$ may be straight, branched or cyclic. Examples include alkyl groups such as methyl, ethyl, n-propyl, isopropyl, n-butyl, isobutyl, sec-butyl, tert-butyl, n-pentyl, neopentyl, n-hexyl, n-heptyl, n-octyl, 2-ethylhexyl, n-nonyl, n-decyl, n-undecyl, n-dodecyl, n-tridecyl, n-pentadecyl, and n-hexadecyl; and cyclic saturated hydrocarbyl groups such as cyclopentyl and cyclohexyl. Examples of the $C_1$-$C_6$ saturated hydrocarbyl group represented by $R^{1A}$ include those exemplified above, but of 1 to 6 carbon atoms. Examples of the saturated hydrocarbyl moiety in the hydrocarbyloxy, saturated hydrocarbyloxycarbonyl, saturated hydrocarbylcarbonyloxy or saturated hydrocarbylsulfonyloxy group include those exemplified above for the saturated hydrocarbyl group, but of corresponding carbon count.

The $C_1$-$C_{16}$ aliphatic hydrocarbyl group represented by $R^{1B}$ may be saturated or unsaturated, and straight, branched or cyclic. Examples thereof include alkyl groups such as methyl, ethyl, n-propyl, isopropyl, n-butyl, isobutyl, sec-butyl, tert-butyl, n-pentyl, neopentyl, n-hexyl, n-heptyl, n-octyl, 2-ethylhexyl, n-nonyl, n-decyl, n-undecyl, n-dodecyl, n-tridecyl, n-pentadecyl, and n-hexadecyl; cyclic saturated hydrocarbyl groups such as cyclopentyl and cyclohexyl; alkenyl groups such as vinyl, 1-propenyl, 2-propenyl, butenyl and hexenyl; and cyclic unsaturated hydrocarbyl groups such as cyclohexenyl. Examples of the $C_6$-$C_{12}$ aryl group $R^{1B}$ include phenyl, tolyl, xylyl, 1-naphthyl and 2-naphthyl.

In formulae (A-1) and (A-2), $R^2$ is hydrogen or $C_1$-$C_4$ alkyl $R^2$ and $L^1$ may bond together to form a ring with the nitrogen atom to which they are attached. Examples of the $C_1$-$C_4$ alkyl group $R^2$ include methyl, ethyl, n-propyl, isopropyl, n-butyl, isobutyl, sec-butyl, and tert-butyl.

In formulae (A-1) and (A-2), $R^3$, $R^4$, $R^5$, $R^6$, and $R^7$ are each independently a $C_1$-$C_{20}$ hydrocarbyl group which may contain a heteroatom. The hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl n-pentyl n-hexyl, n-octyl n-nonyl, n-decyl, undecyl, dodecyl tridecyl tetradecyl, pentadecyl heptadecyl octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, uorbornyl and adamantyl; $C_2$-$C_{10}$ alkenyl groups such as vinyl, propenyl, butenyl and hexenyl $C_2$-$C_{20}$ unsaturated alicyclic hydrocarbyl groups such as cyclohexenyl and norbornenyl; $C_2$-$C_{20}$ alkynyl groups such as ethynyl, propynyl and butynyl; $C_6$-$C_{20}$ aryl groins such as phenyl methylphenyl, ethylphenyl, n-propylphenyl, isopropylphenyl, n-butylphenyl, isobutylphenyl, sec-butylphenyl tert-butylphenyl, naphthyl, methylnaphthyl ethylnaphthyl, n-propylnaphthyl, isopropylnaphthyl, n-butylnaphthyl, isobutylnaphthyl, sec-butyluaphthyl, tert-butylnaphthyl; $C_7$-$C_{20}$ aralkyl groups such as benzyl and phenetyl and mixtures thereof. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety.

$R^3$ and $R^4$ may bond together to form a ring with the sulfur atom to which they are attached. Rings of the following structure are preferred.

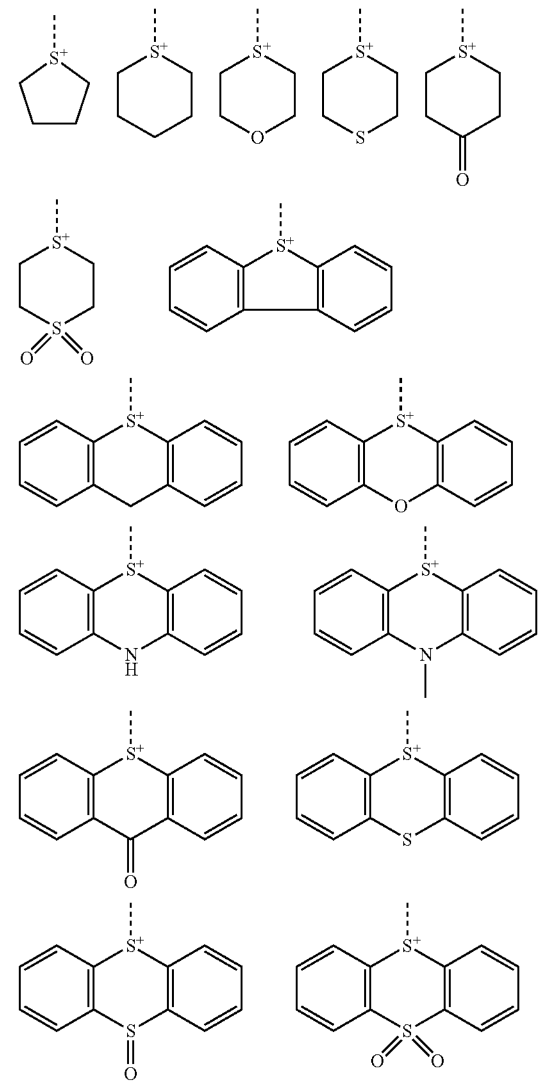

Herein the broken line designates a point of attachment to $R^5$.

Of the sulfonium and iodonium salts, those having the formulae (A-1-1) and (A-2-1) are preferred because of greater absorption of EUV, which leads to a high sensitivity, low LWR or improved CDU.

(A-1-1)

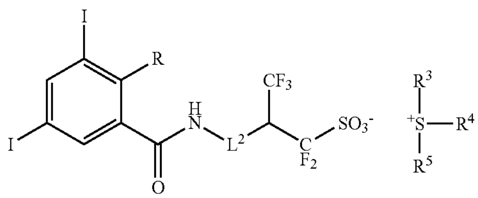

(A-2-1)

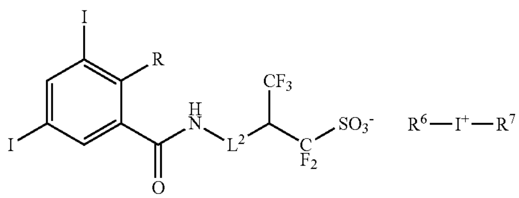

In formulae (A-1-1) and (A-2-1), $R^3$, $R^4$, $R^5$, $R^6$, and $R^7$ are as defined above. R is iodine or hydroxyl. $L^2$ is a single bond or $C_1$-$C_4$ alkanediyl group. Examples of the Q-$C_6$ alkanediyl group include methylene, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-1,4-diyl, butane-2,2-diyl, butane-2,3-diyl, pentane-1,5-diyl, and hexane-1,6-diyl.

Examples of the cation in the sulfonium salt having formula (A-1) are given below, but not limited thereto.

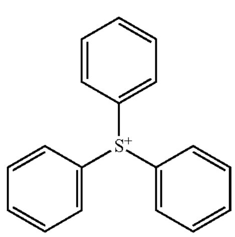

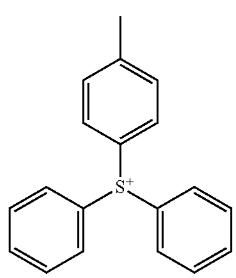

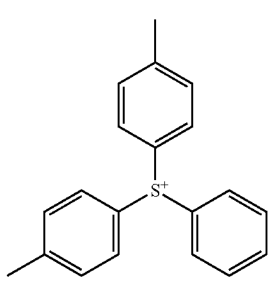

-continued

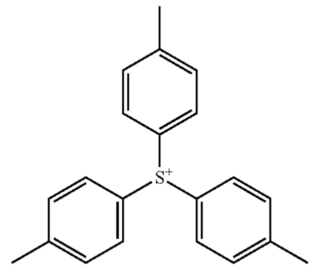

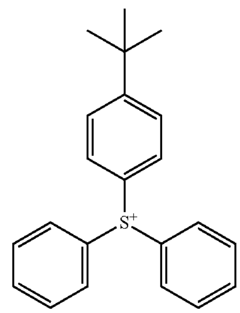

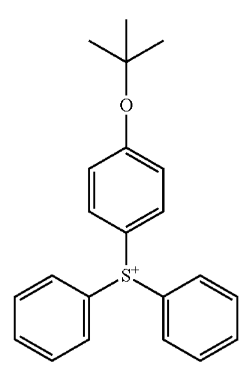

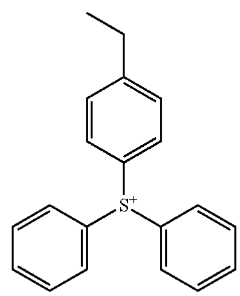

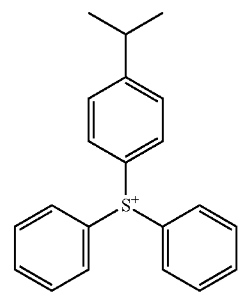

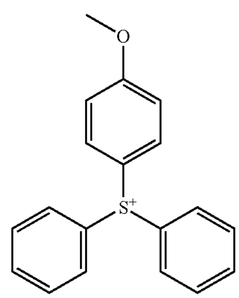

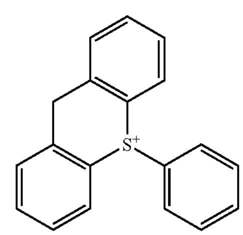

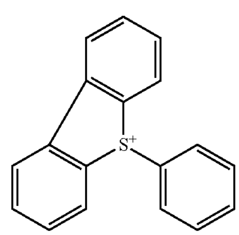

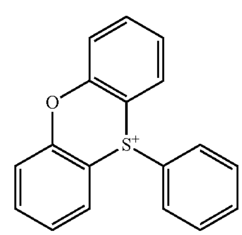

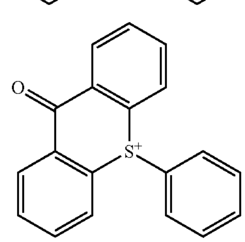

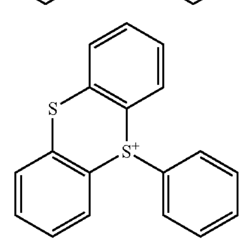

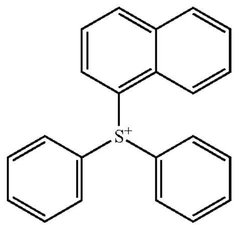
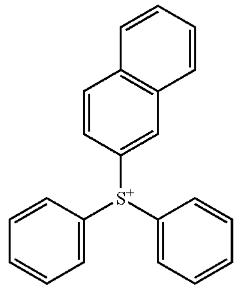
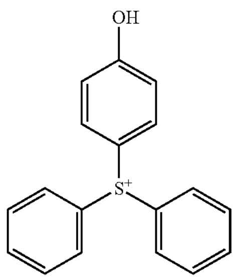
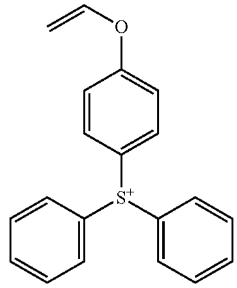
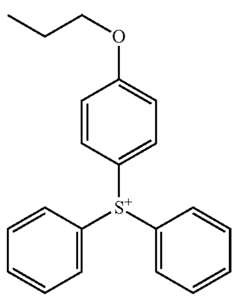
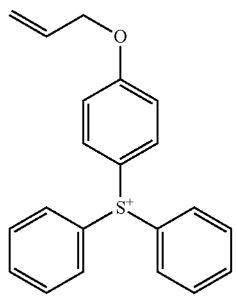
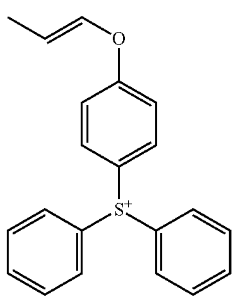
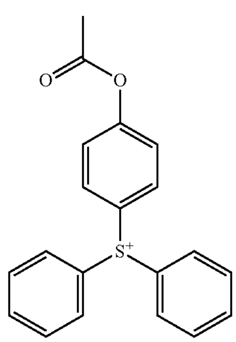
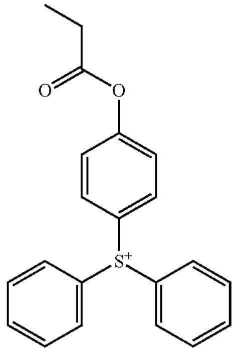
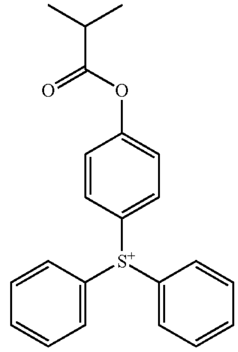
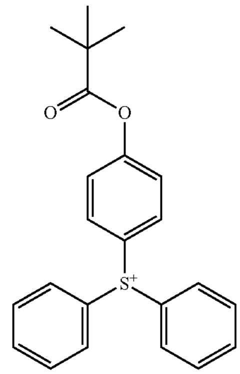
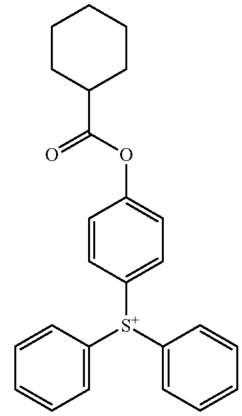
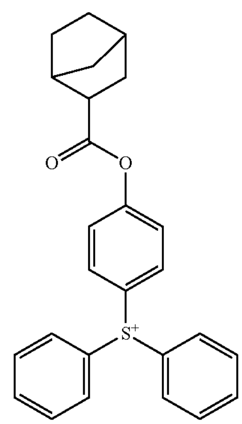
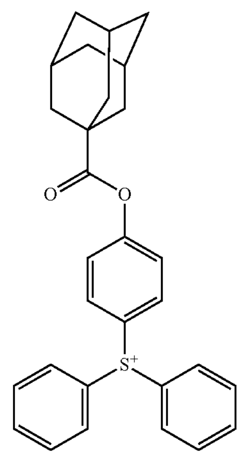
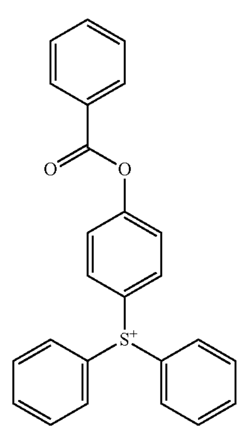
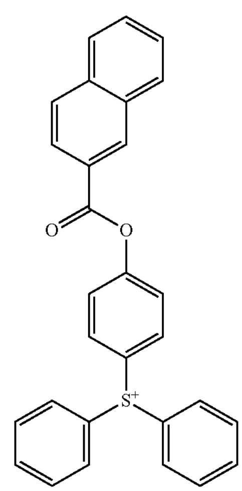

-continued
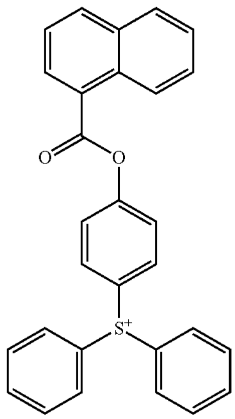
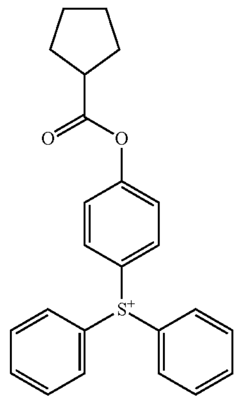
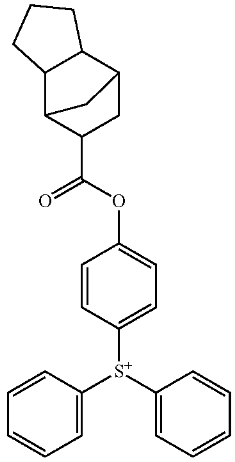
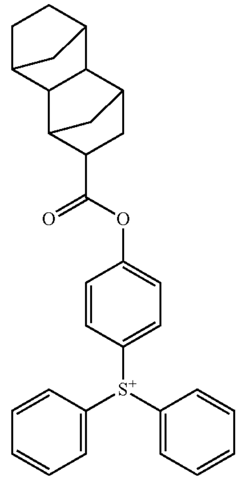
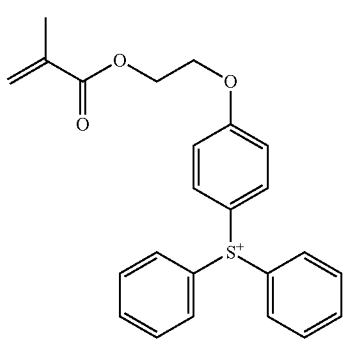
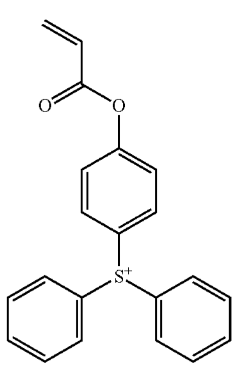
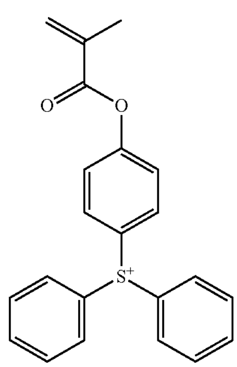
-continued
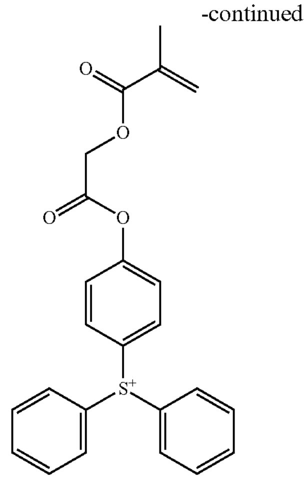
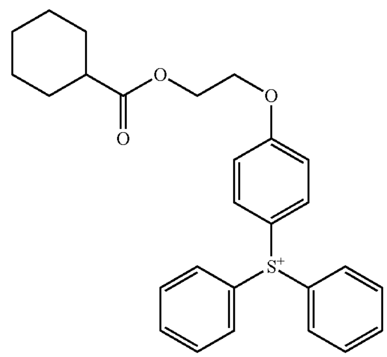
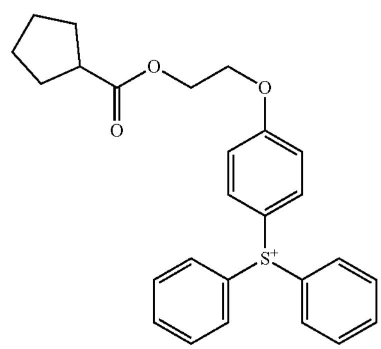
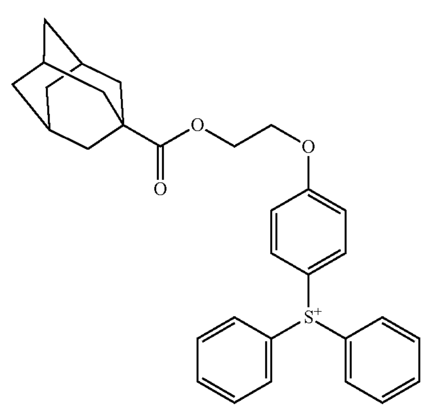

-continued
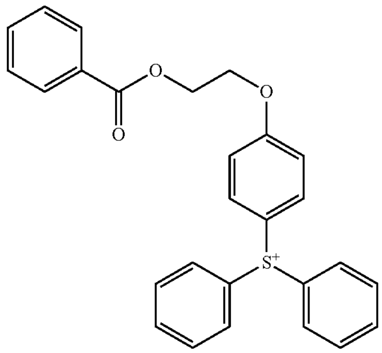
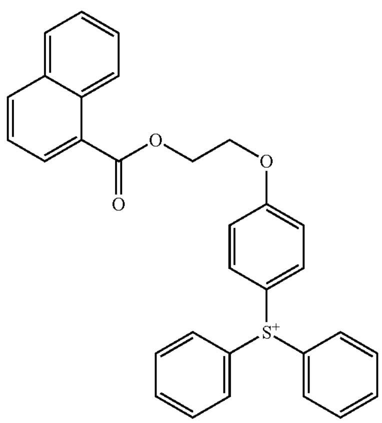
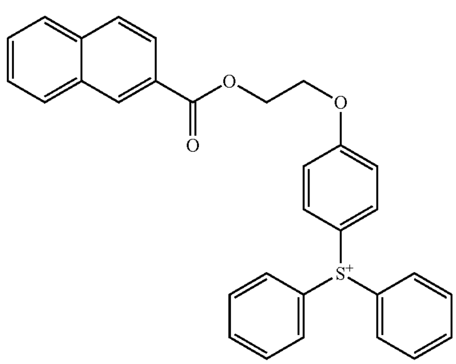
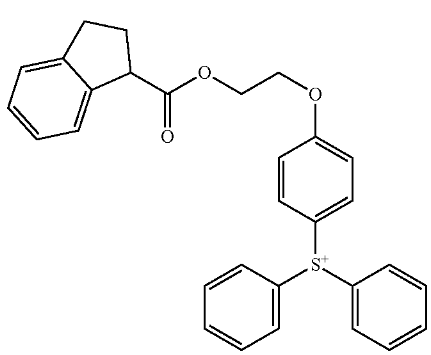
-continued
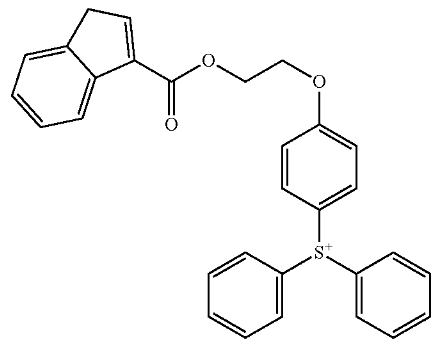
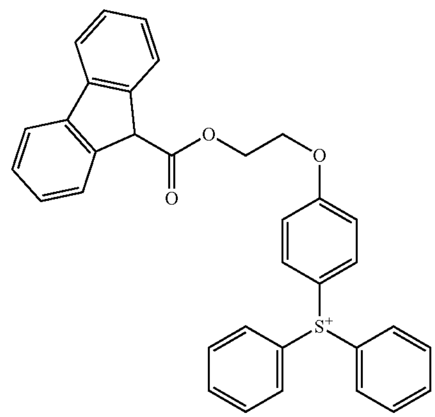
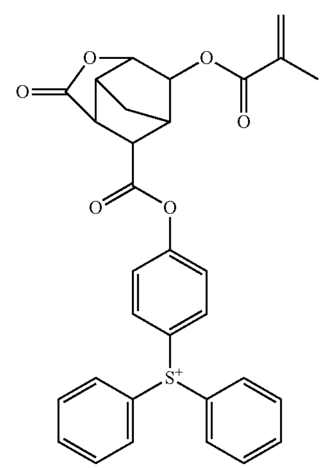
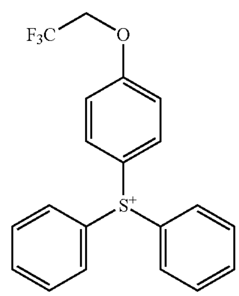
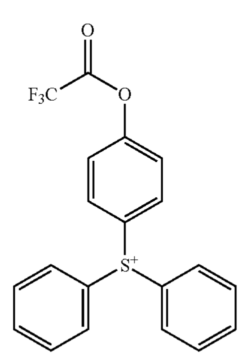

-continued
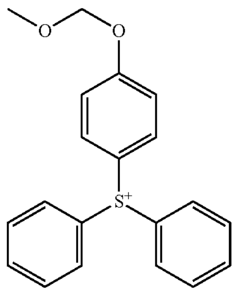
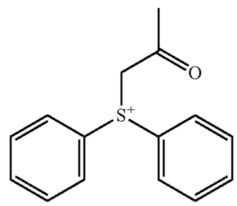
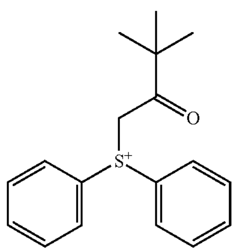
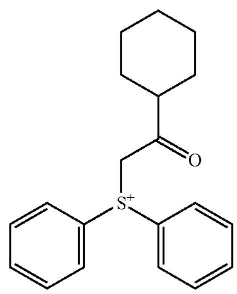
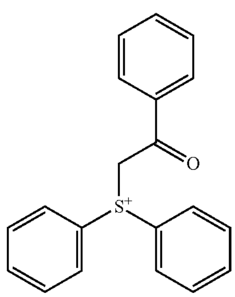
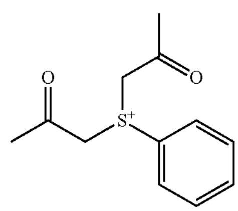
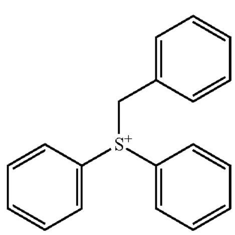
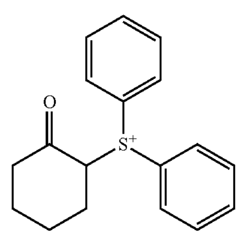
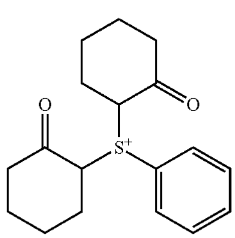
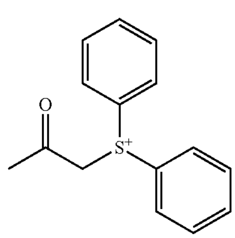
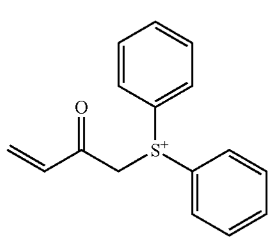
-continued
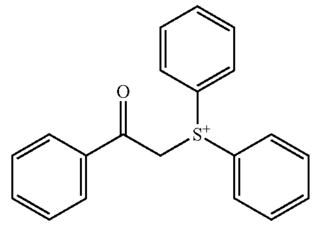
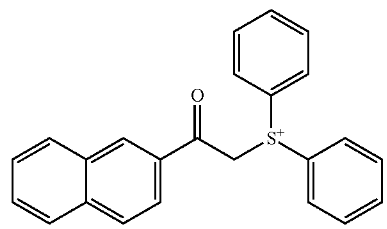
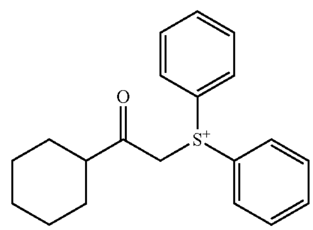
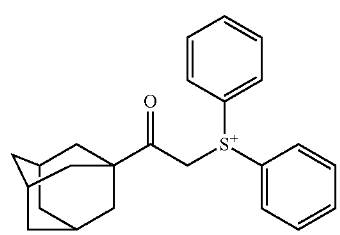
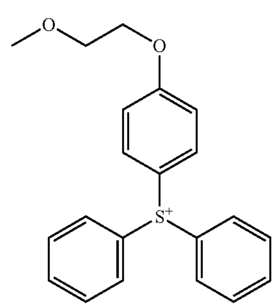
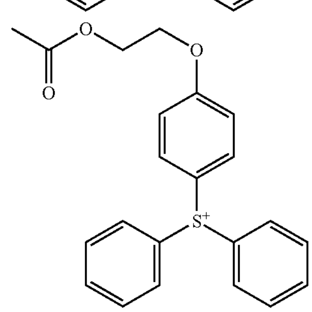

-continued
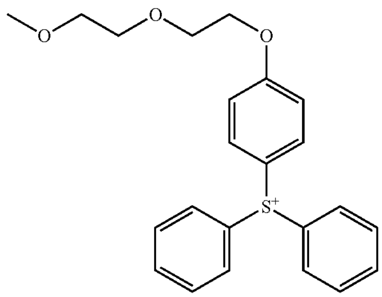
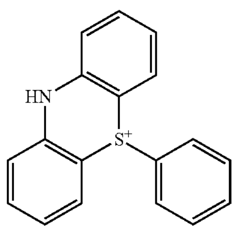
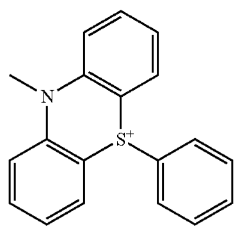
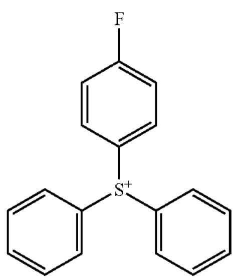
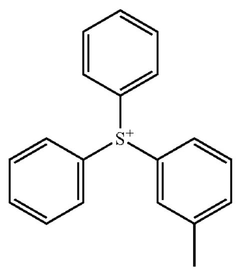
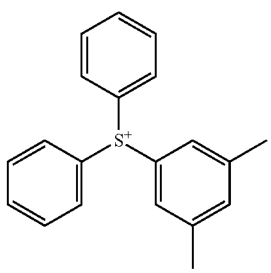
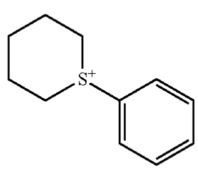
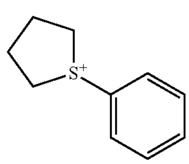
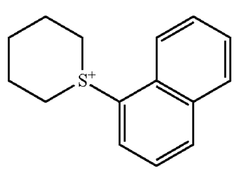
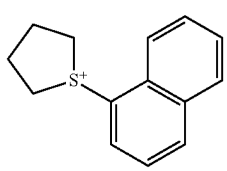
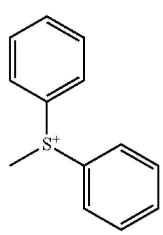
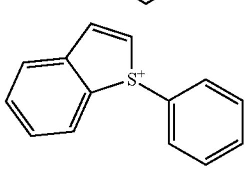
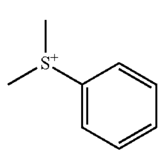
-continued
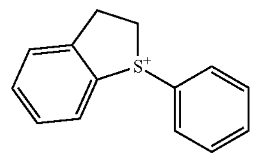
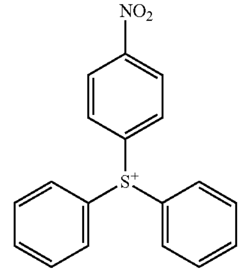
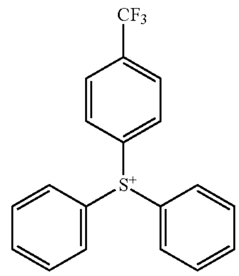
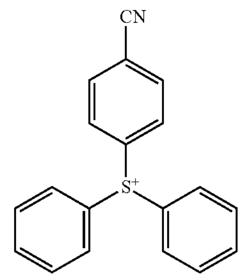
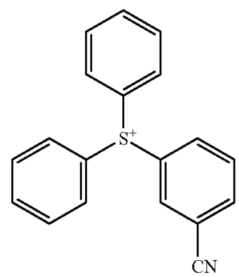
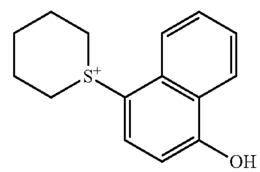
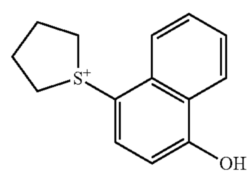
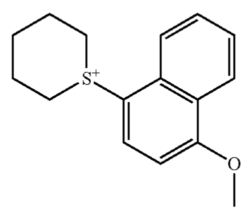
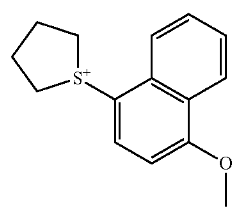
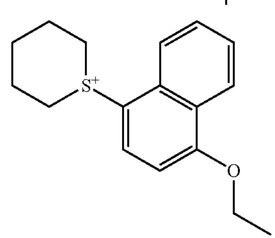
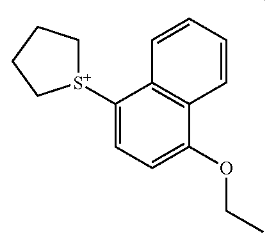

-continued
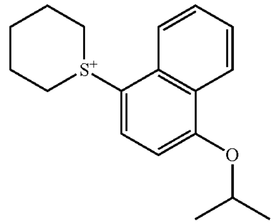
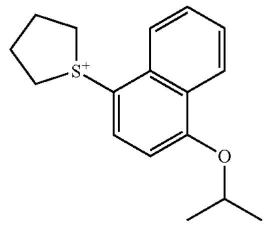
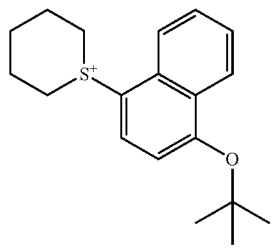
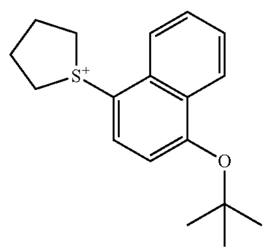
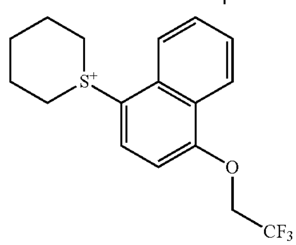
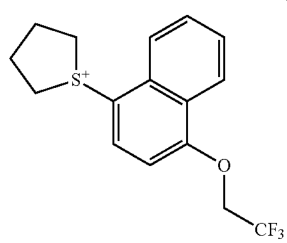
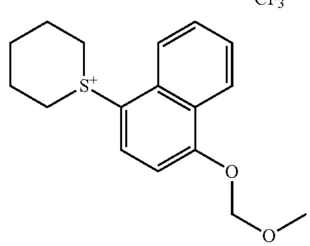
-continued
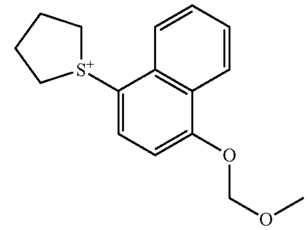
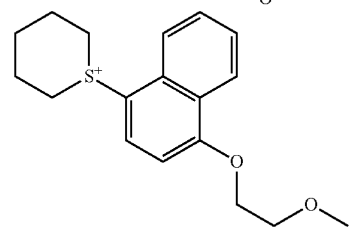
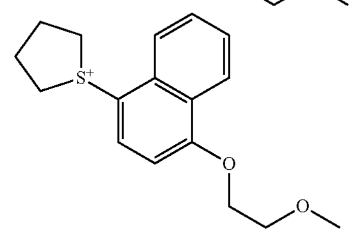
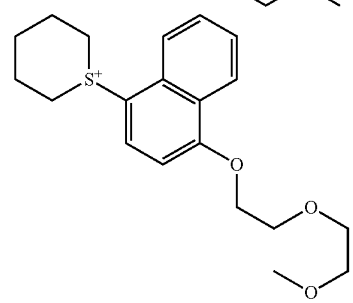
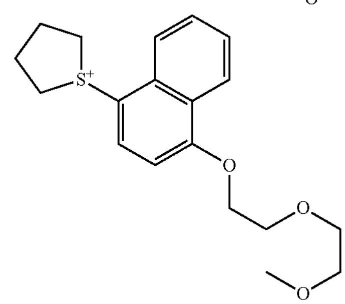
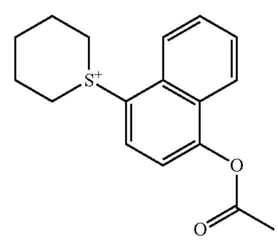
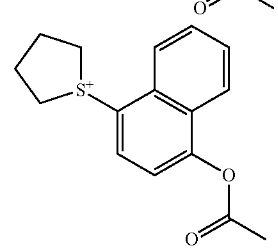

-continued
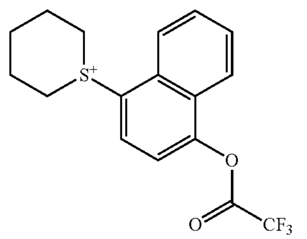
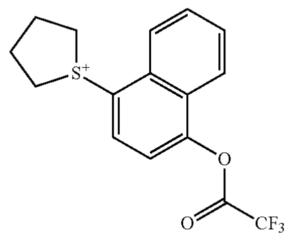
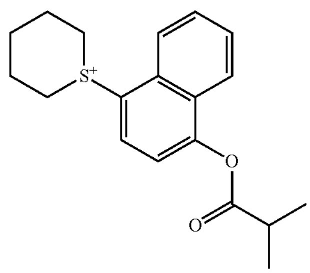
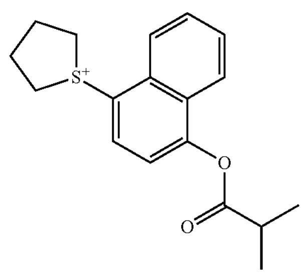
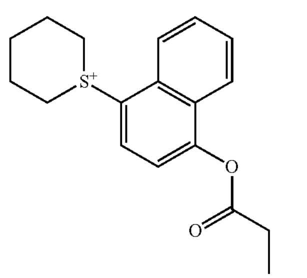
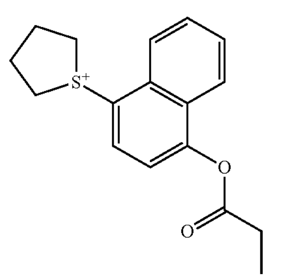
-continued
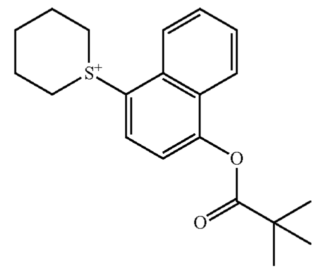
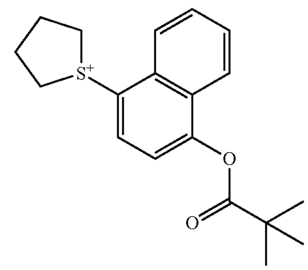
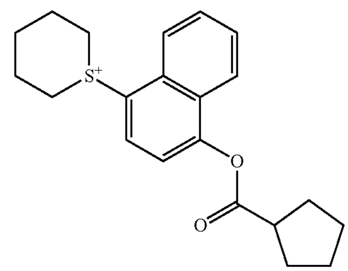
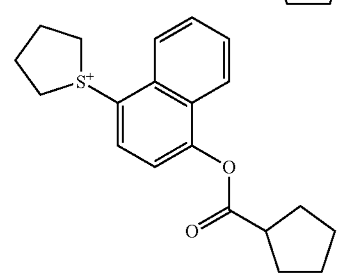
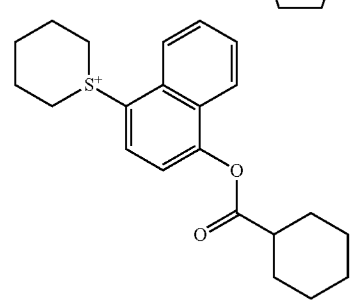
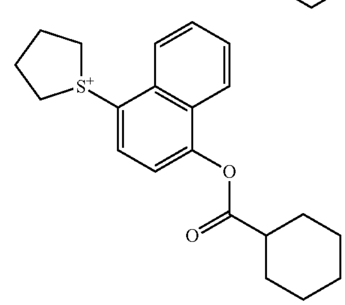

-continued
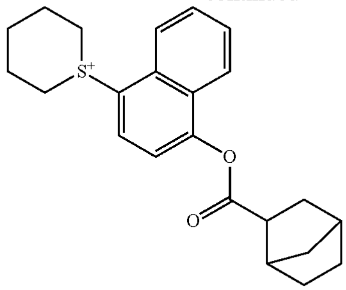
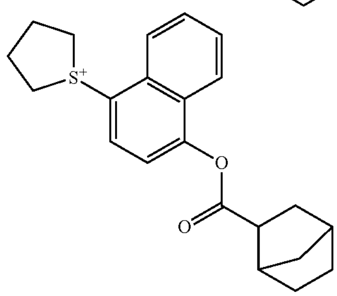
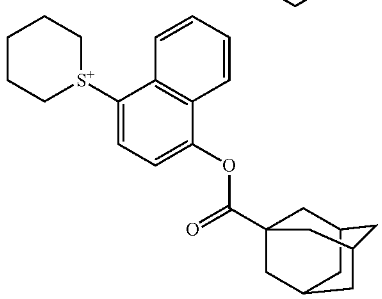
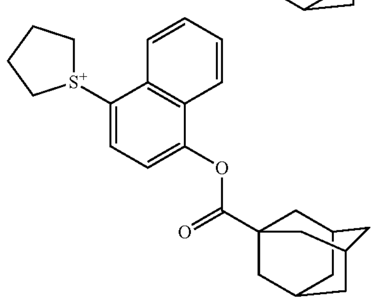
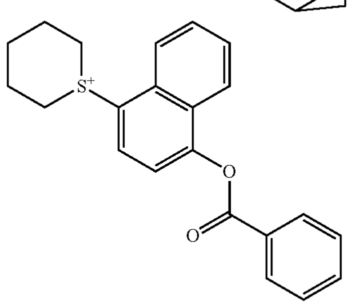
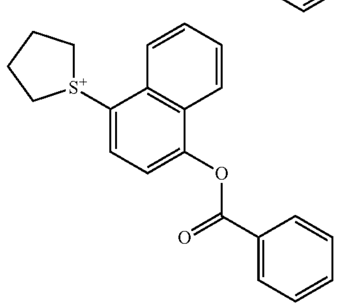
-continued
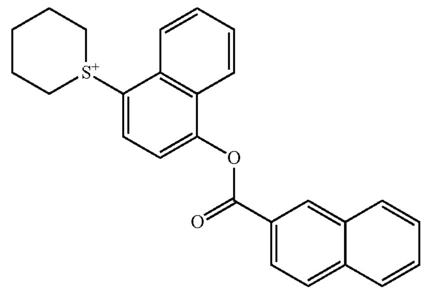
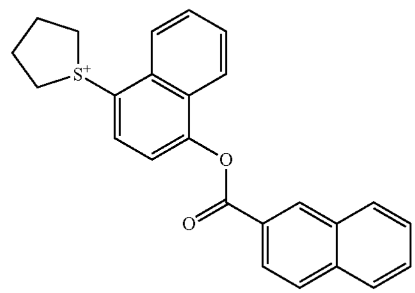
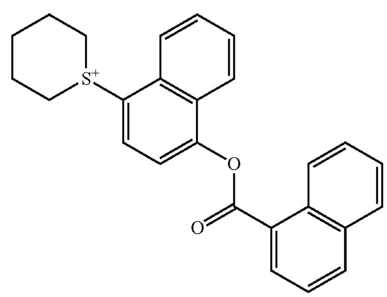
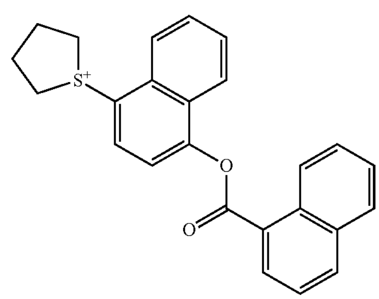
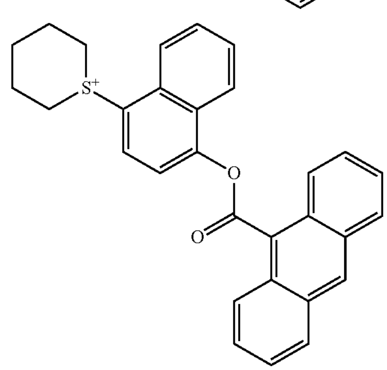

-continued
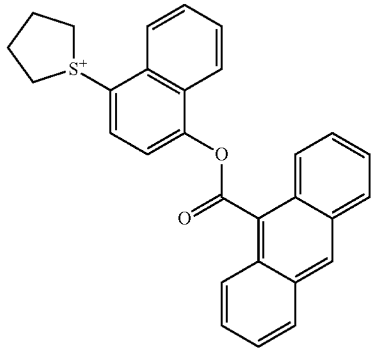
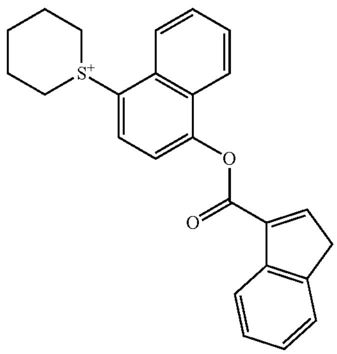
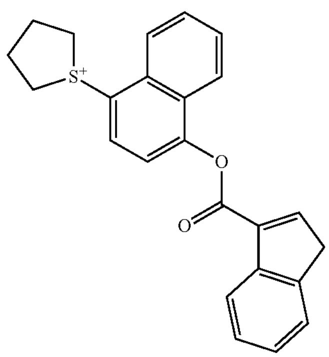
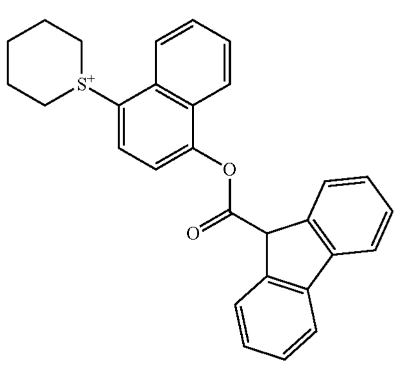
-continued
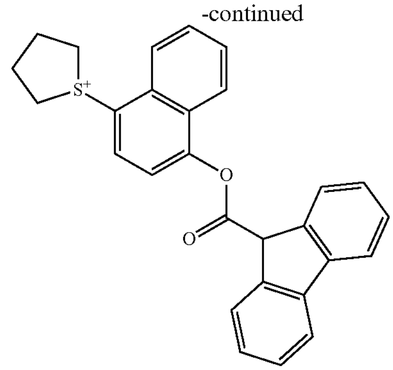
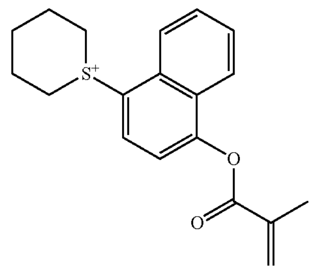
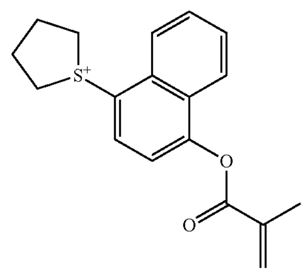
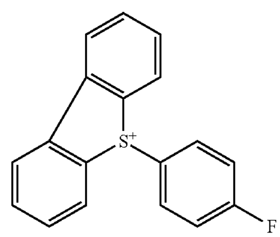
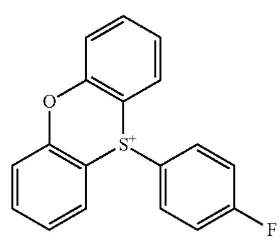
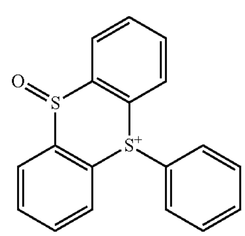

-continued
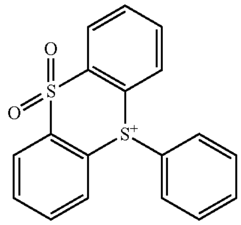
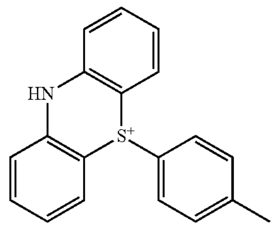
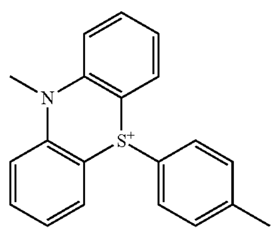
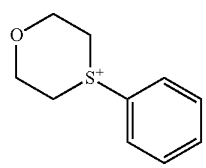
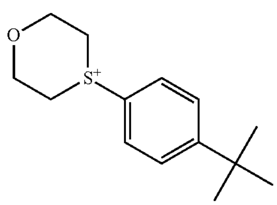
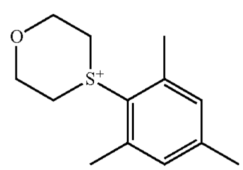
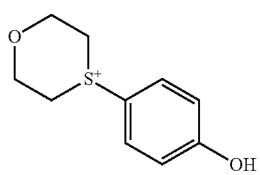
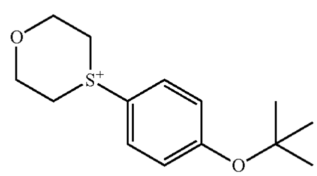
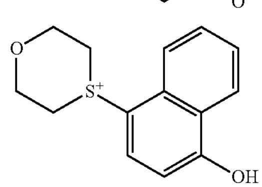
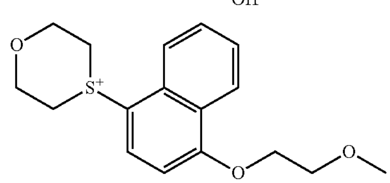
-continued
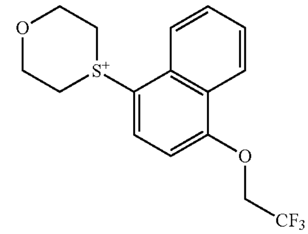
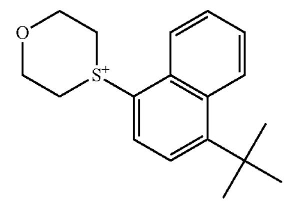
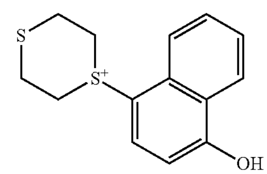
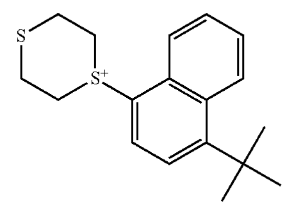
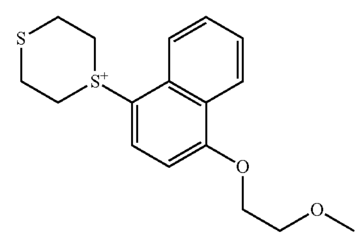
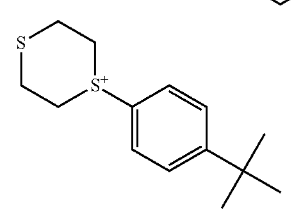
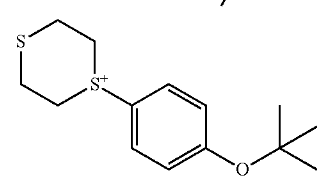
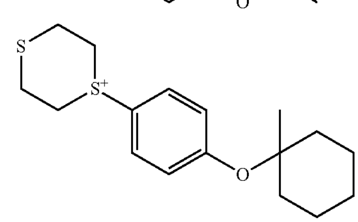

-continued
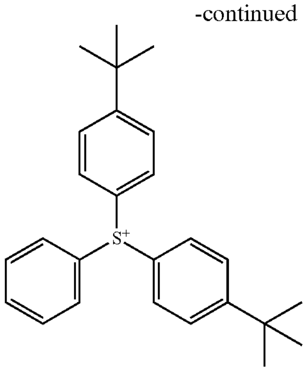
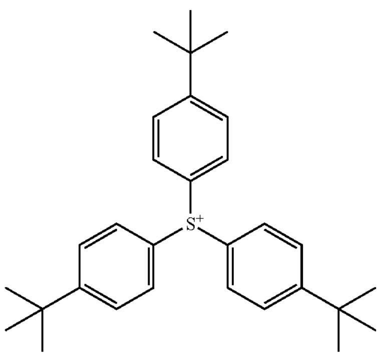
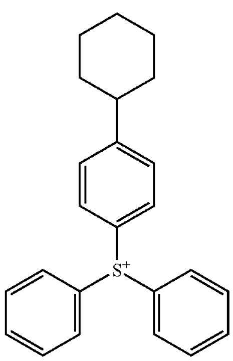
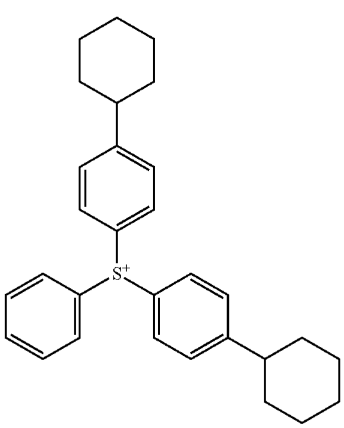
-continued
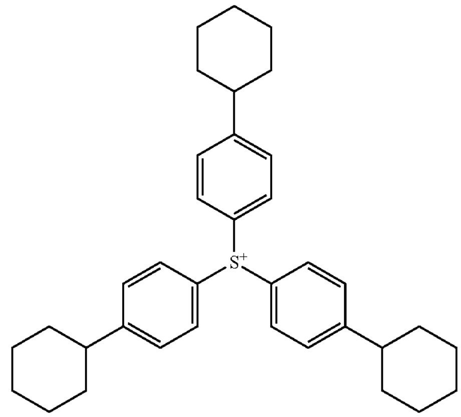
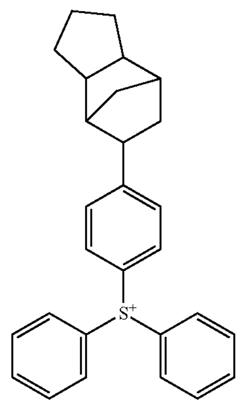
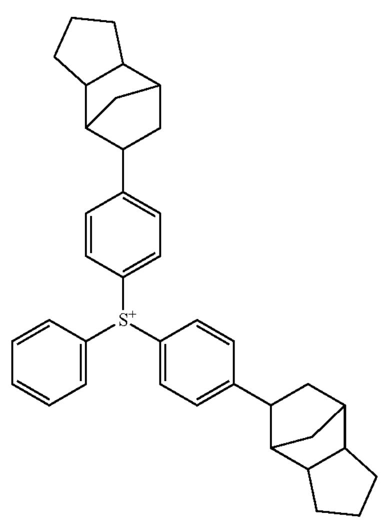

-continued
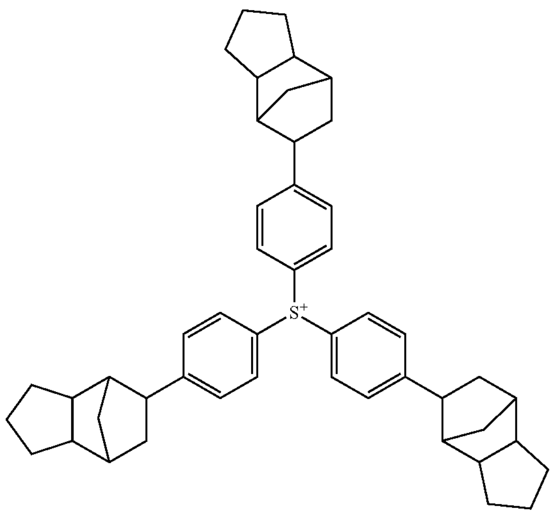
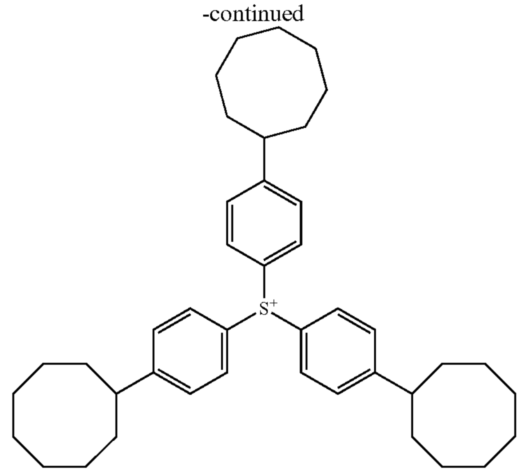
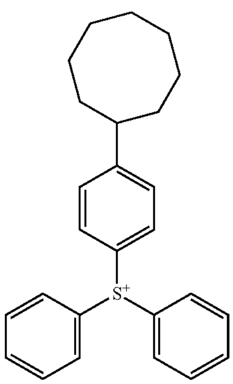
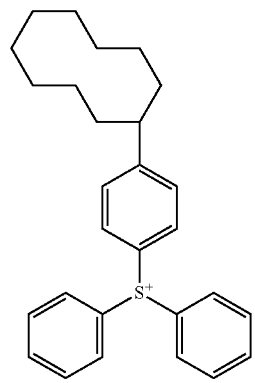
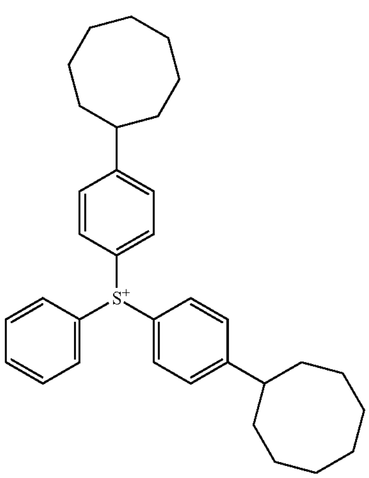
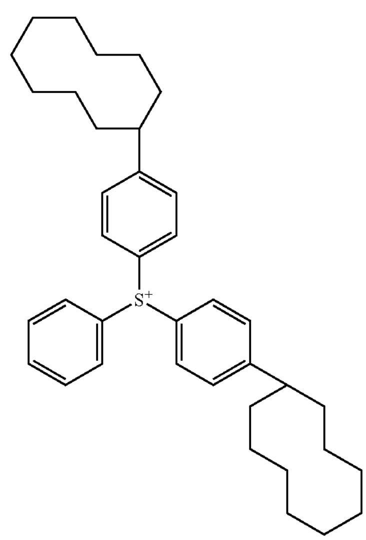

-continued
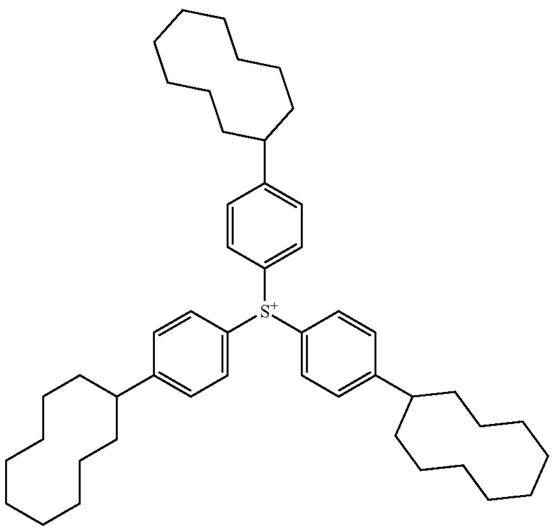
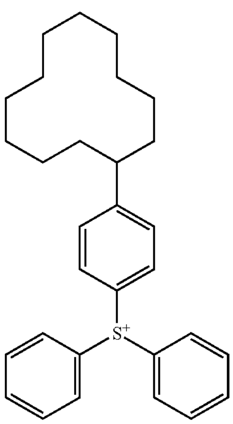
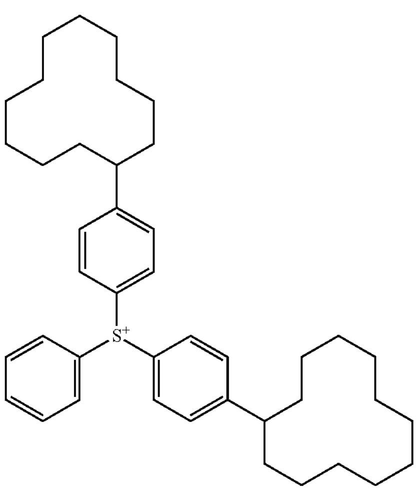
-continued
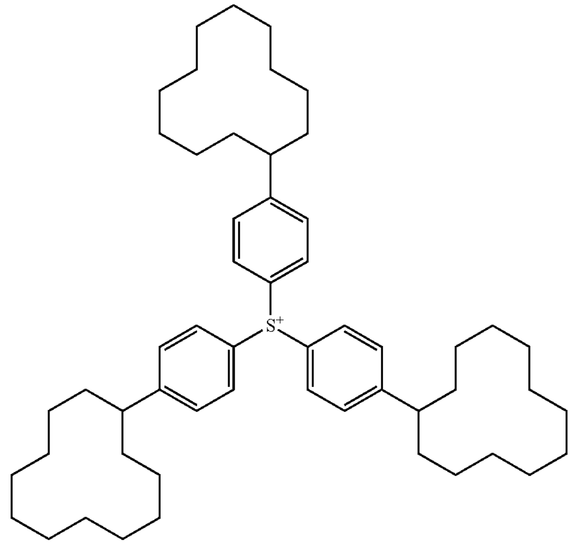
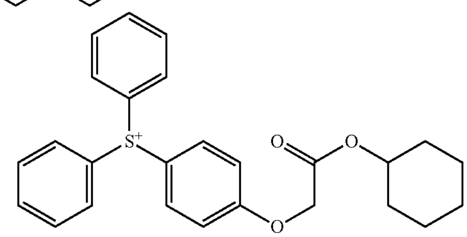
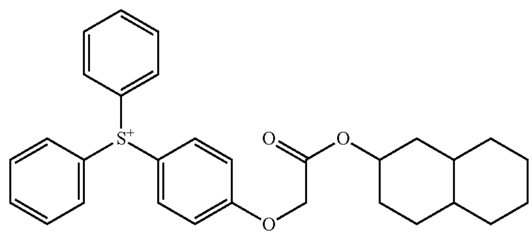
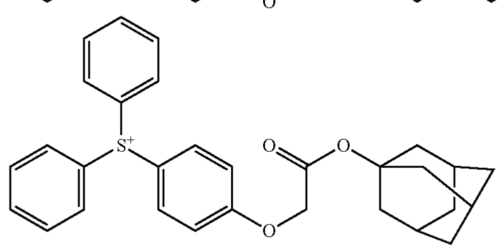
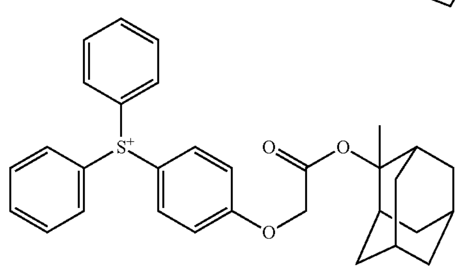
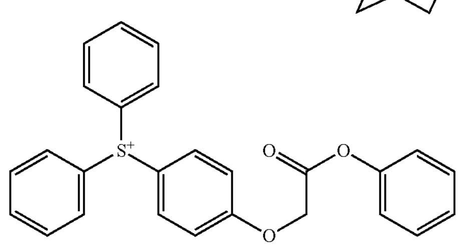

-continued
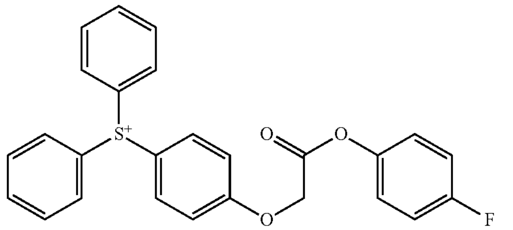
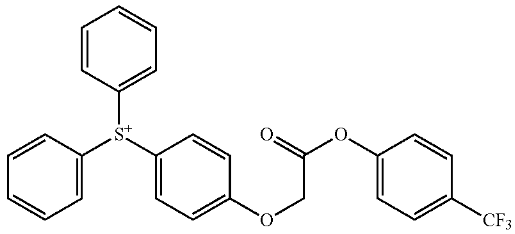
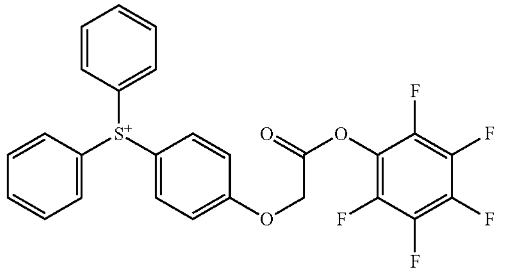
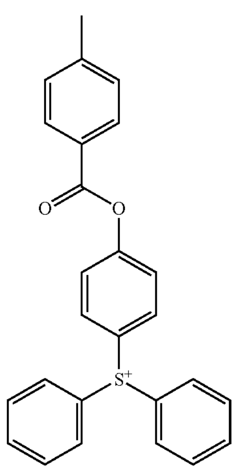
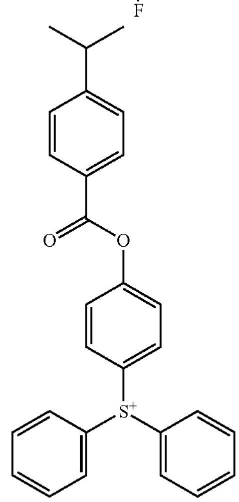
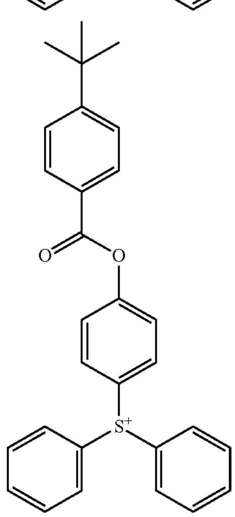
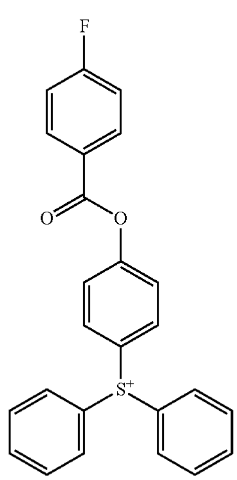
-continued
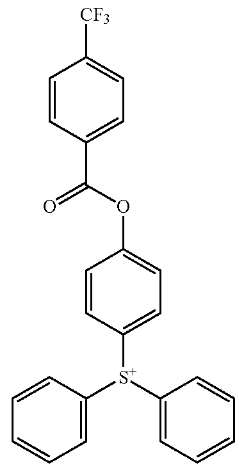
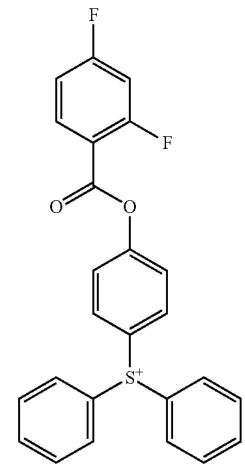
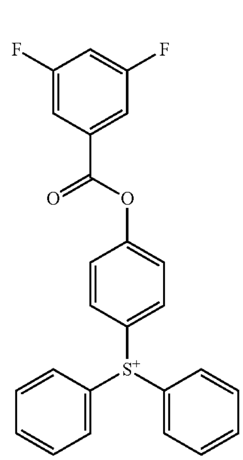
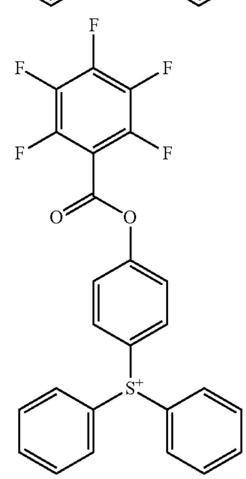
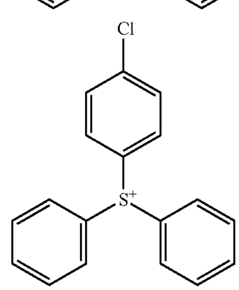
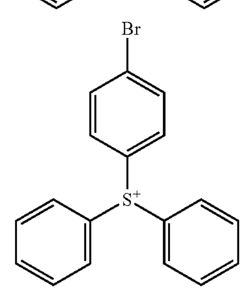
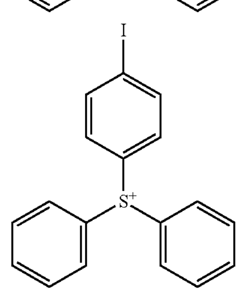
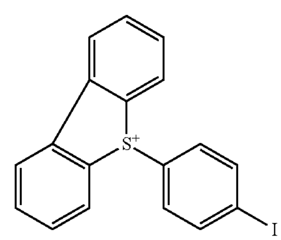
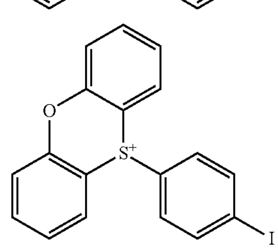

-continued
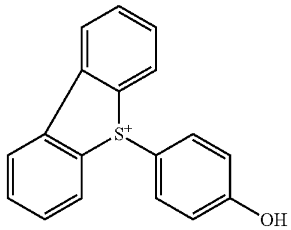 [SMILES: Oc1ccc(-[s+]2c3ccccc3c3ccccc32)cc1]
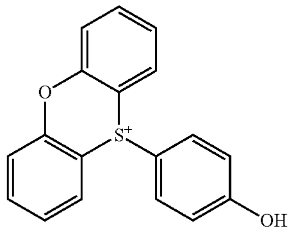
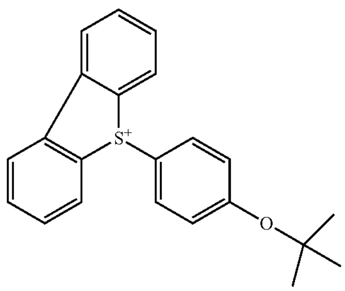
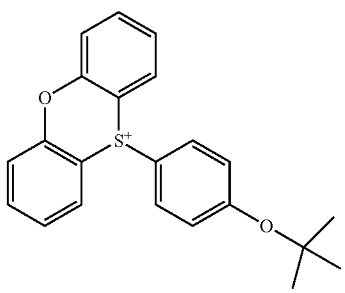
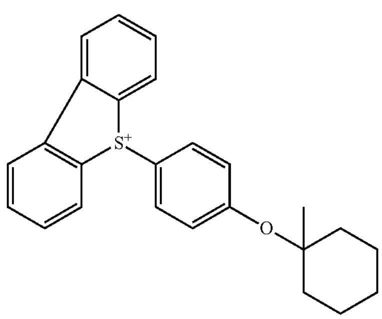
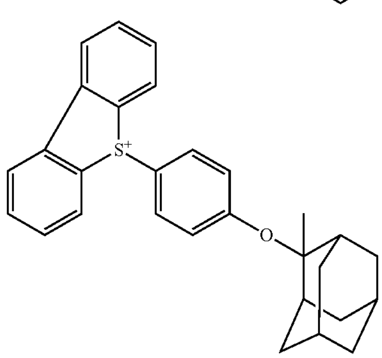
-continued
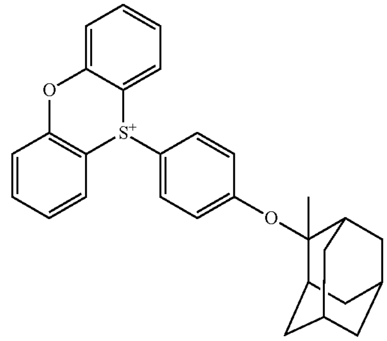
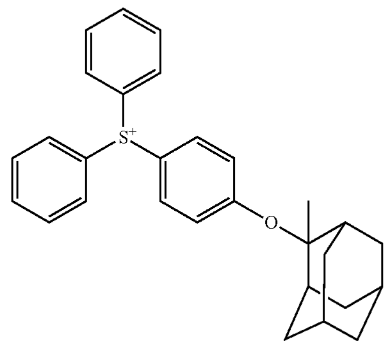
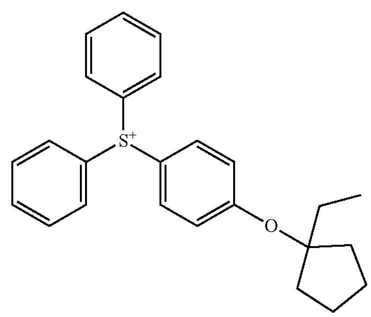
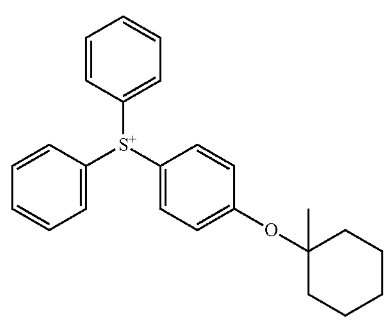
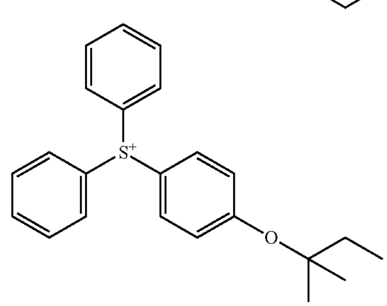

-continued
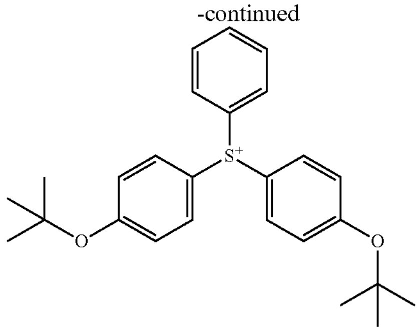
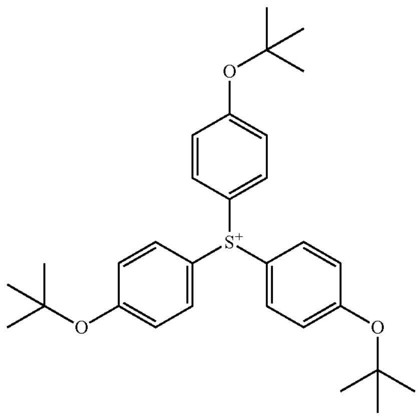
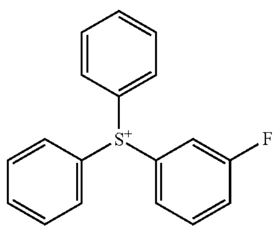
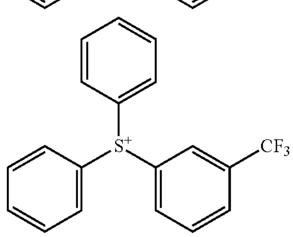
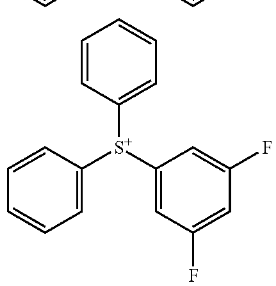
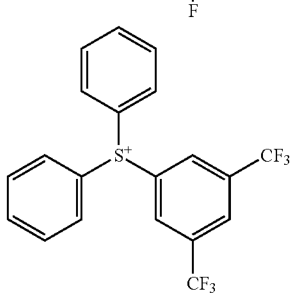
-continued
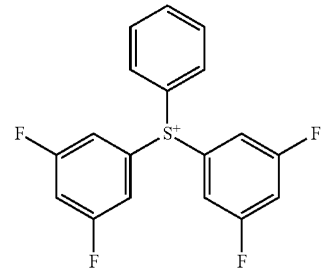
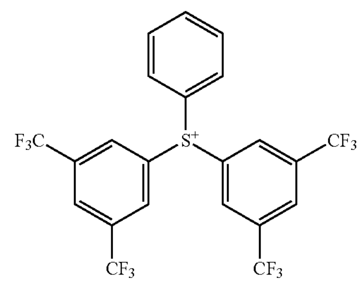
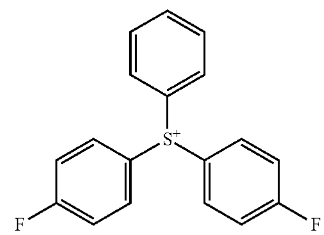
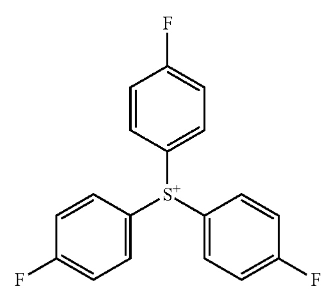
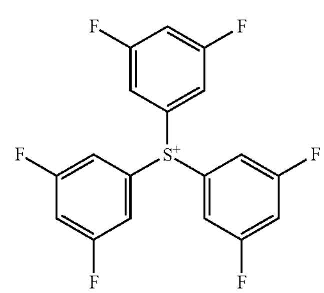
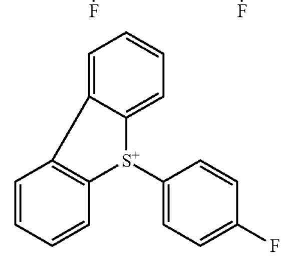

-continued
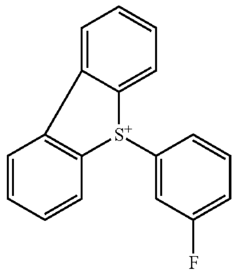
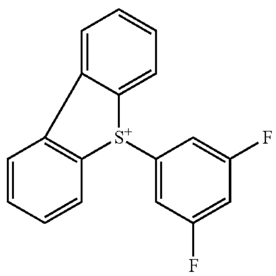 [SMILES: Fc1cc(F)cc(-[s+]2c3ccccc3c3ccccc32)c1]
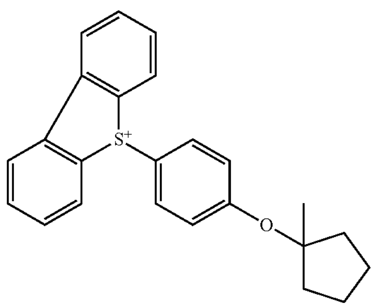
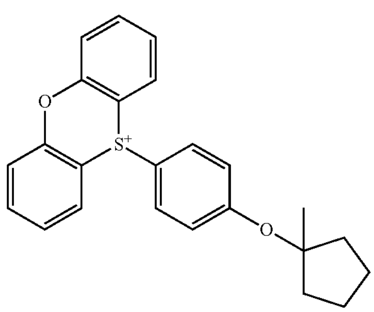
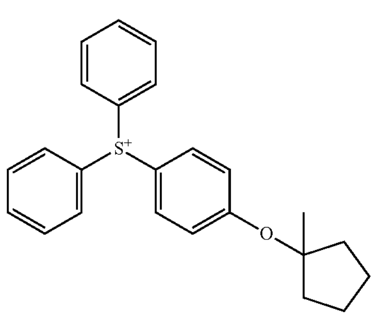
-continued
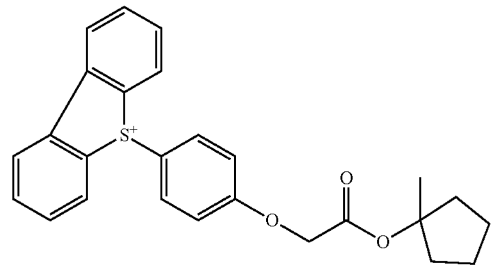
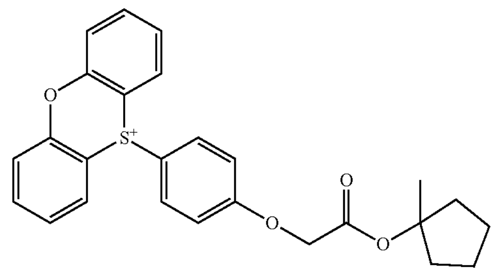
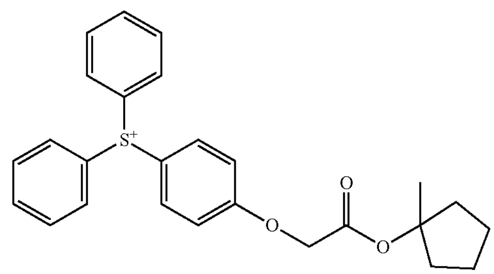
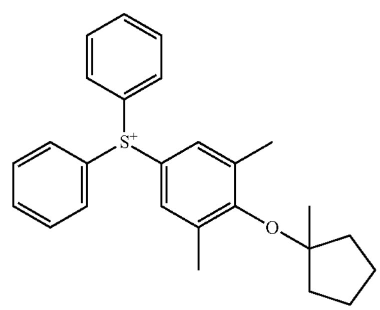
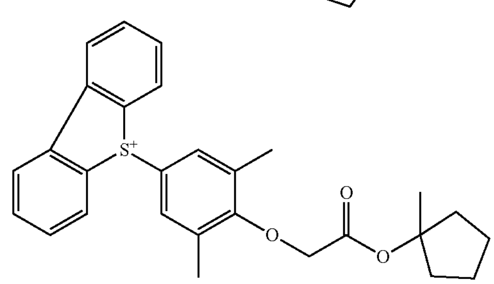
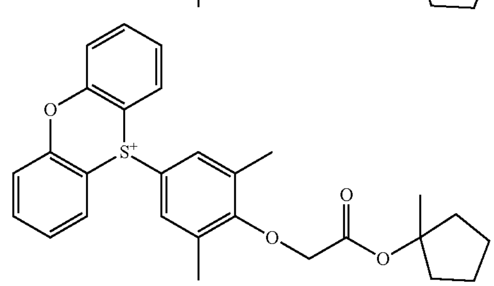

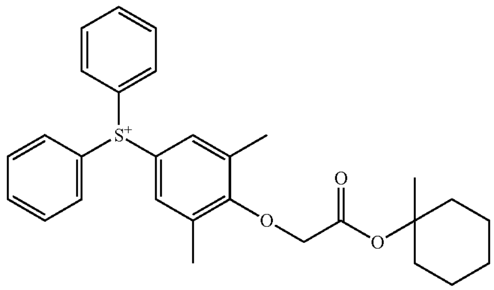
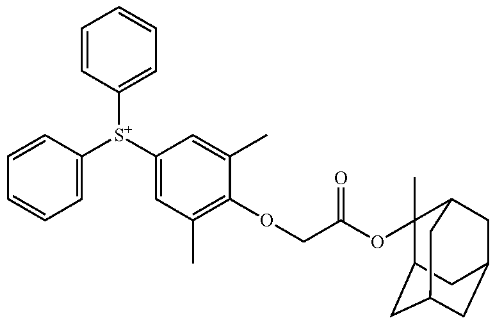
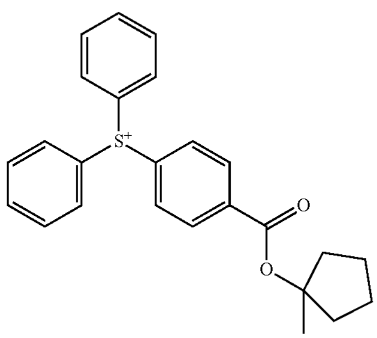
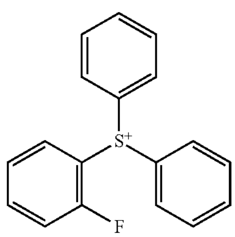
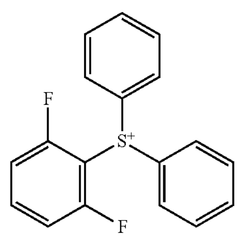
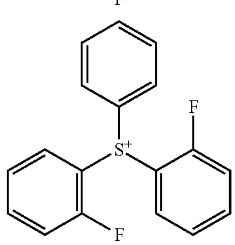
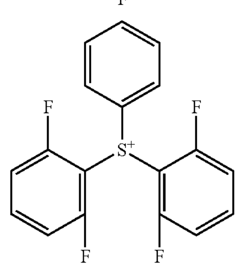
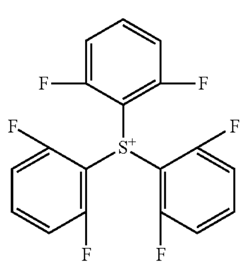
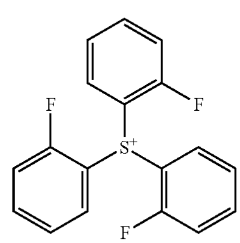
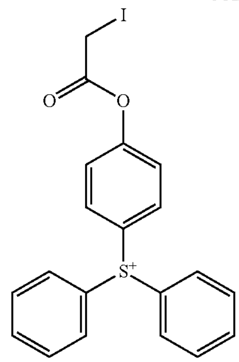
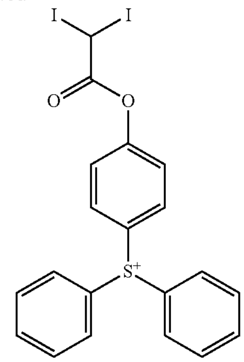
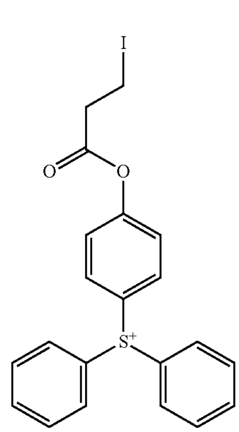
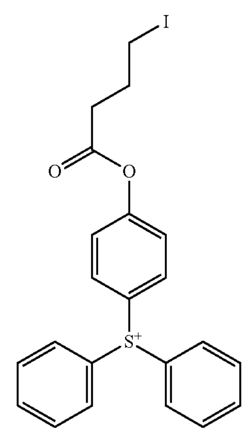
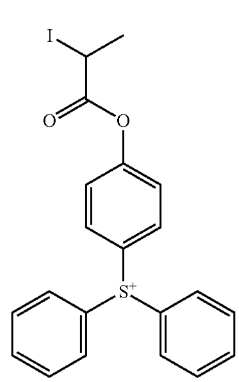
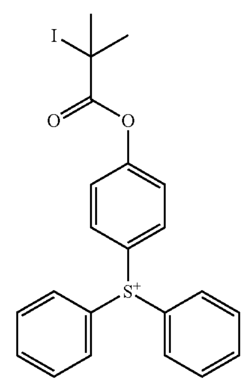
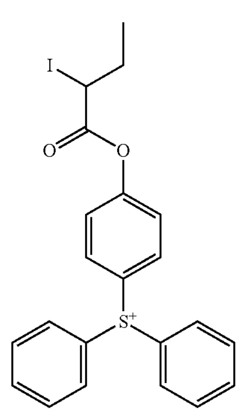
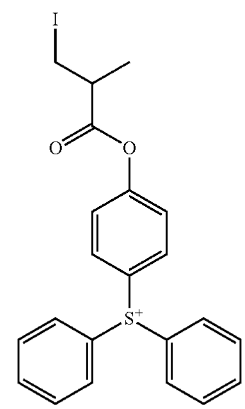

-continued
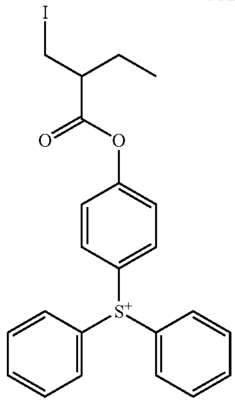
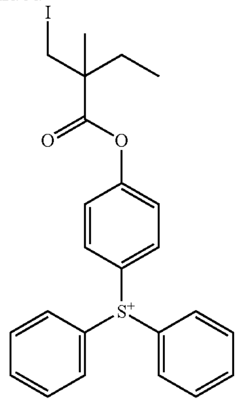
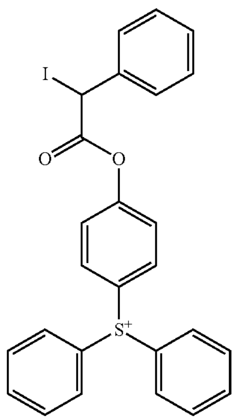
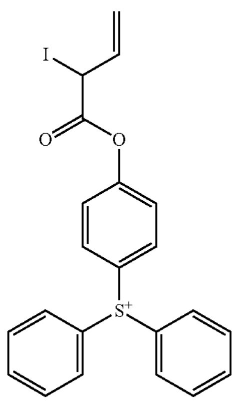
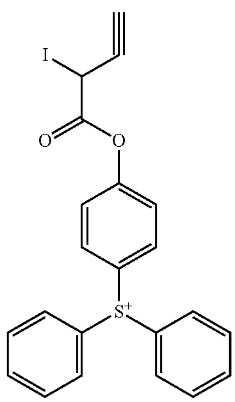
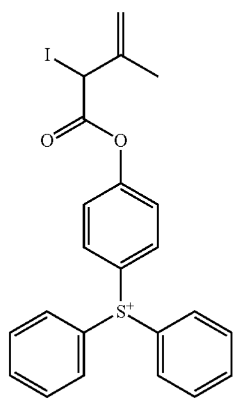
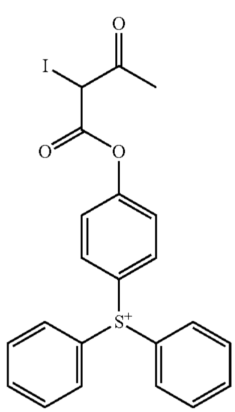
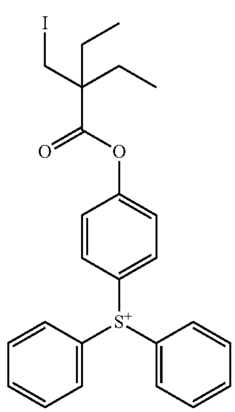
-continued
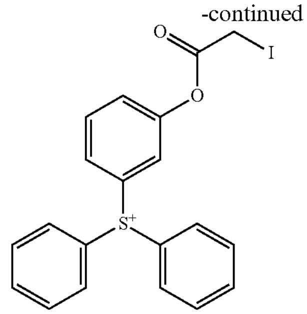
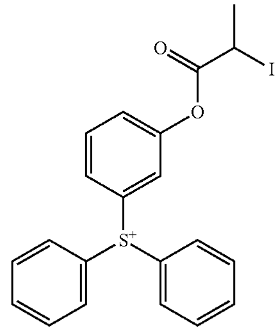
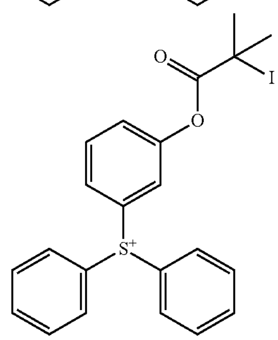
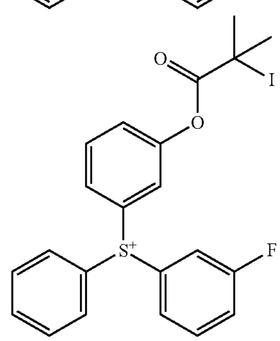
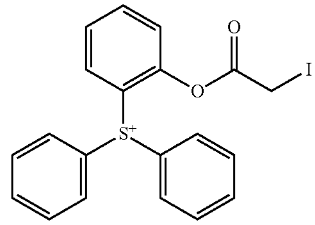
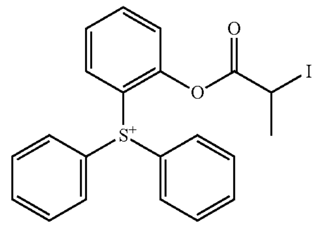

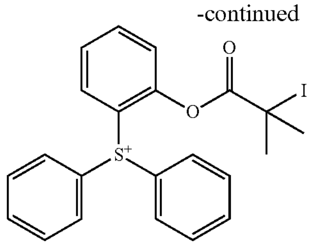
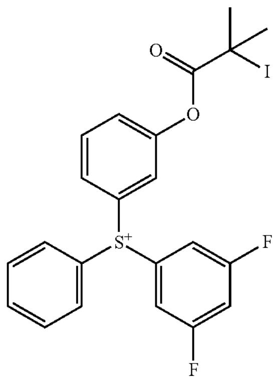
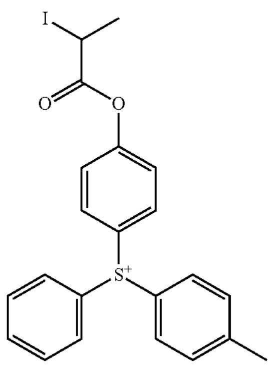
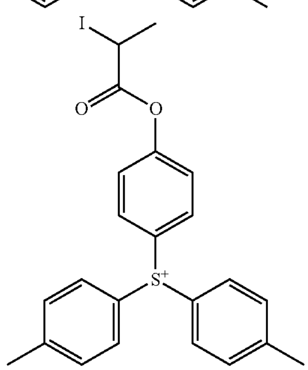
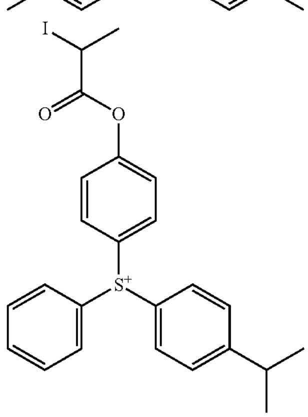
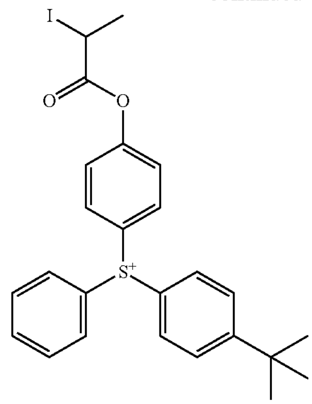
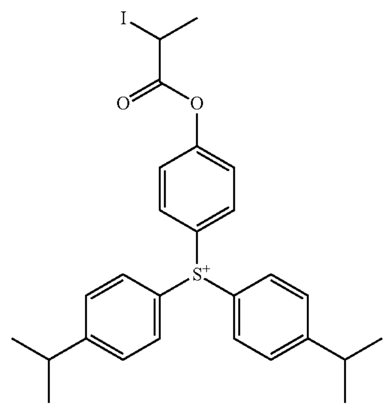
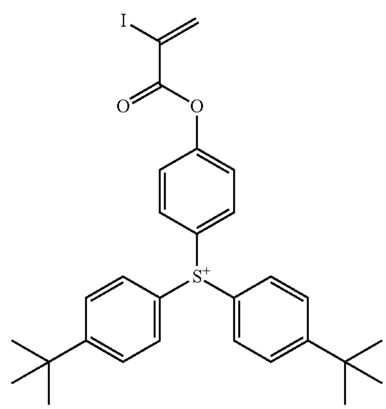
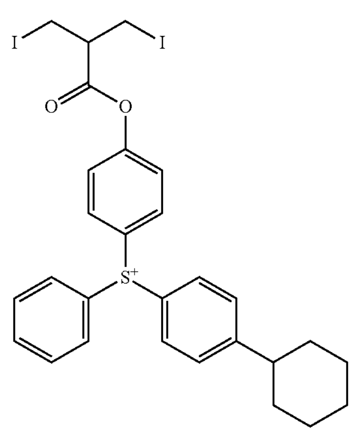

-continued
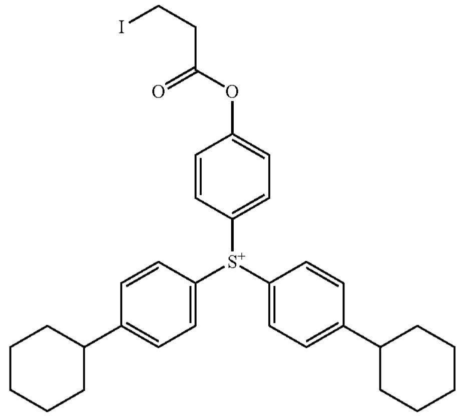
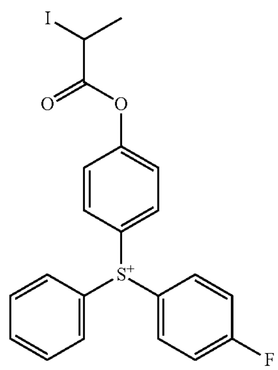
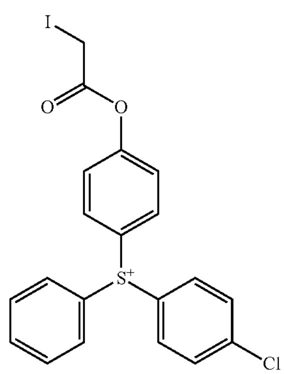
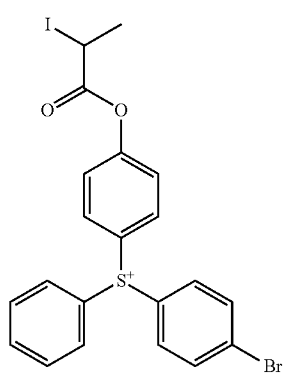
-continued
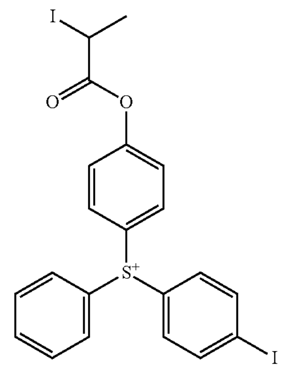
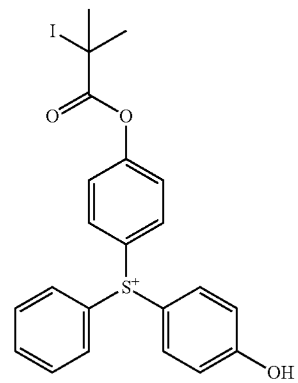
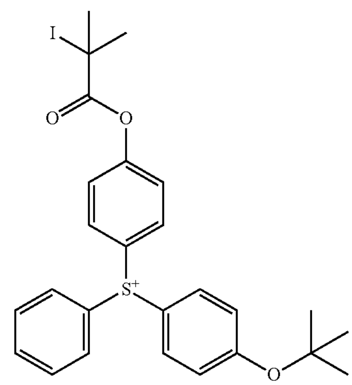
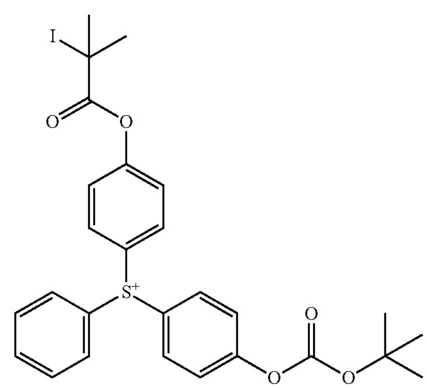

-continued
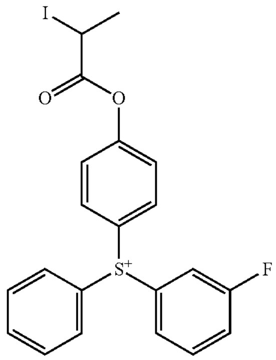
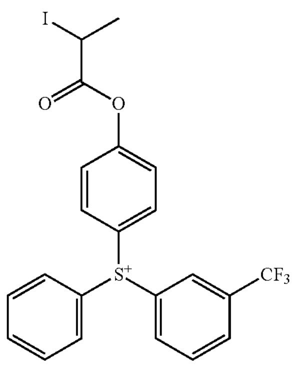
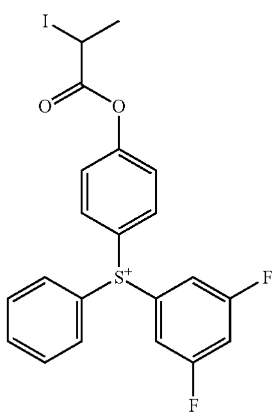
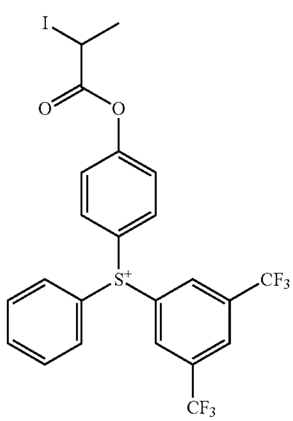
-continued
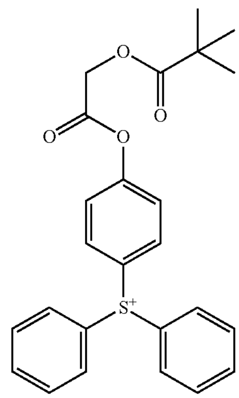
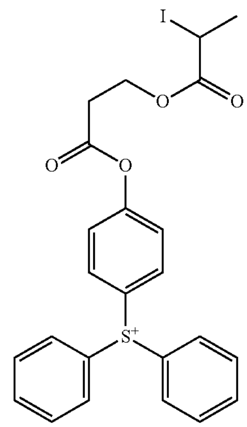
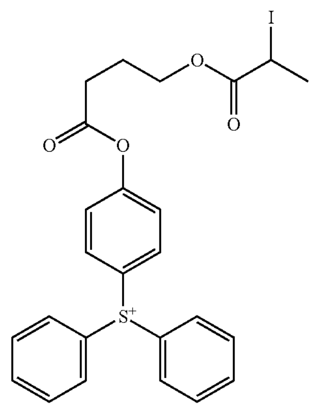
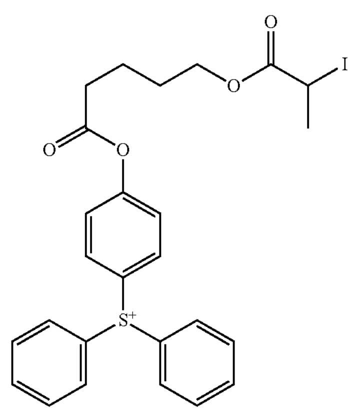
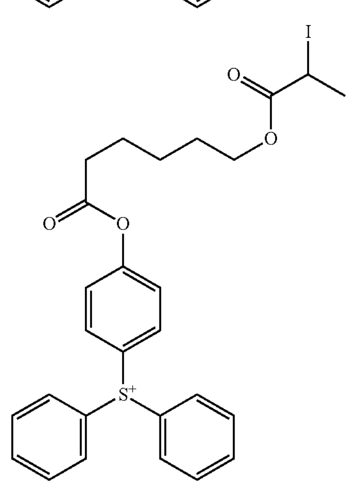

-continued
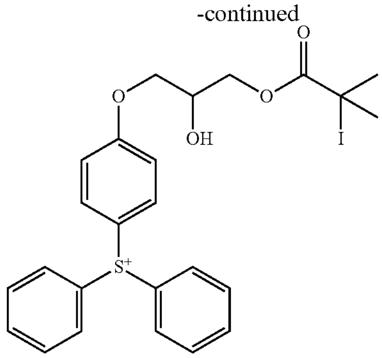
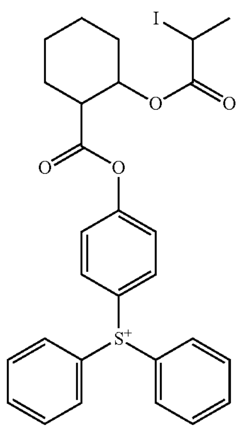
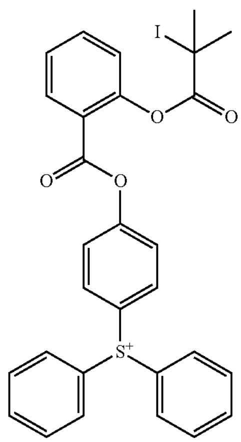
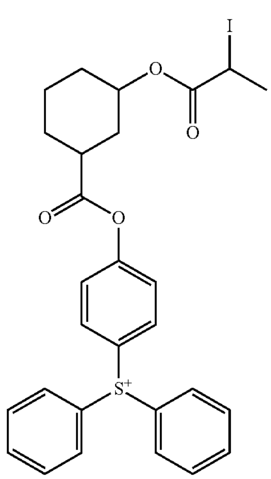
-continued
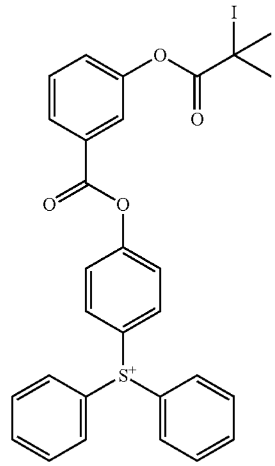
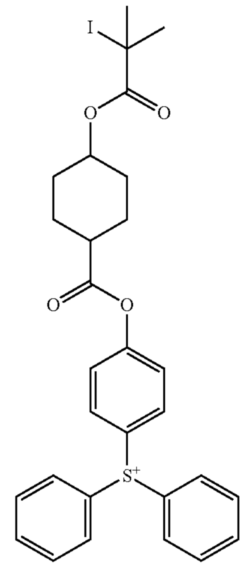
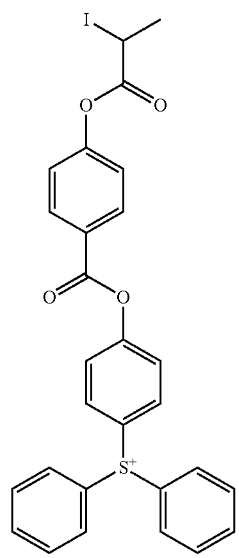
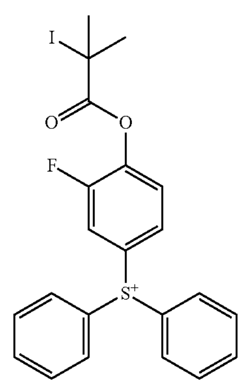
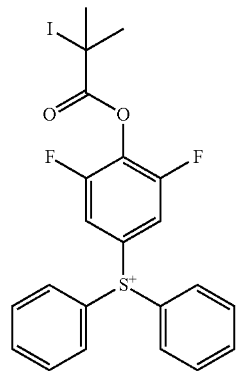
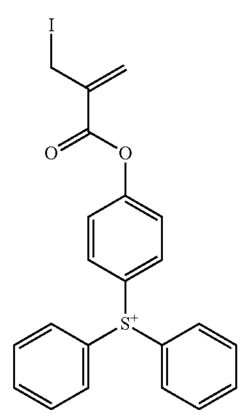

-continued
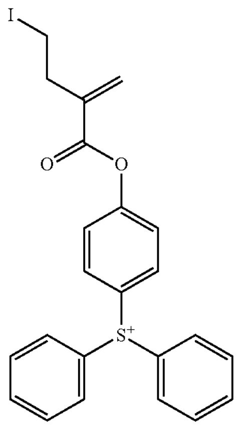
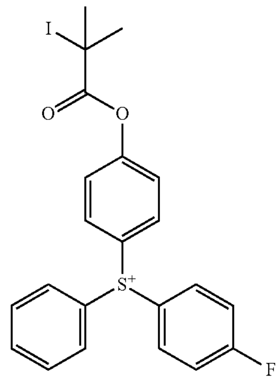
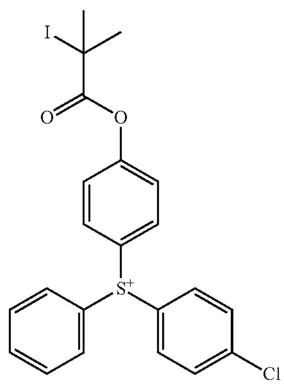
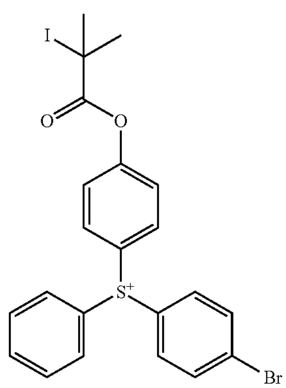
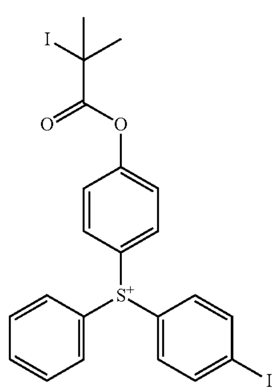
-continued
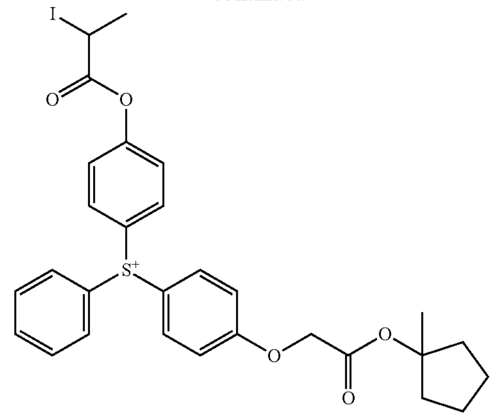
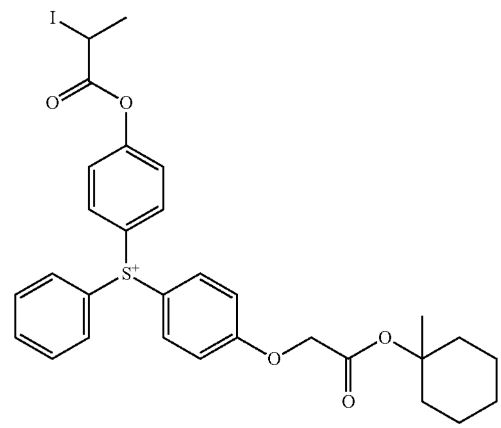
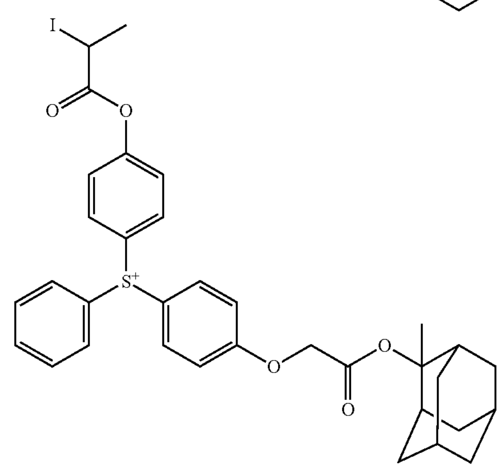
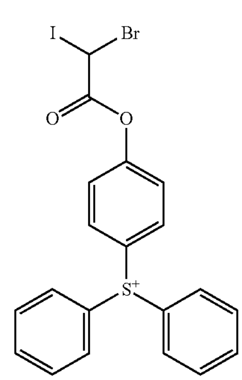
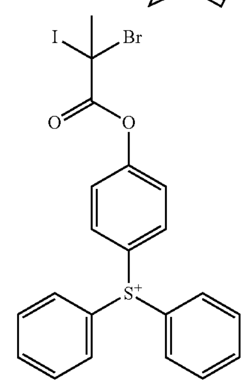

-continued
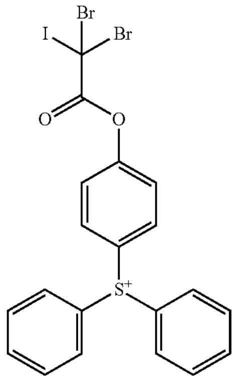
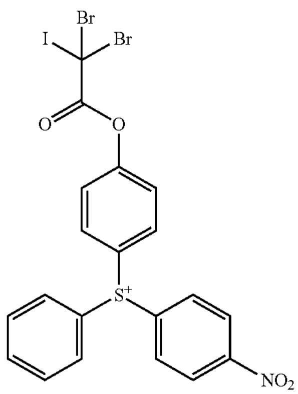
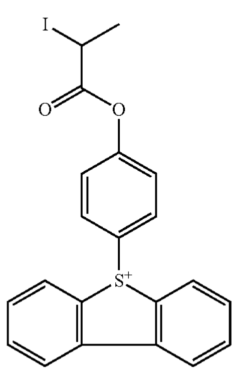
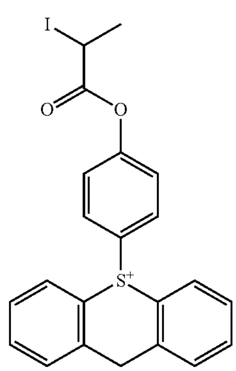
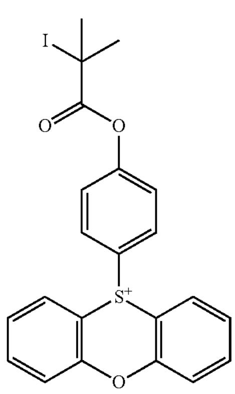
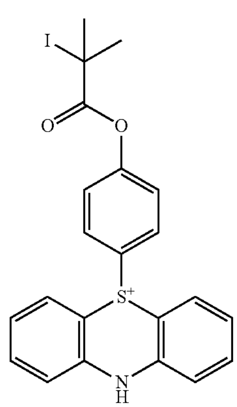
-continued
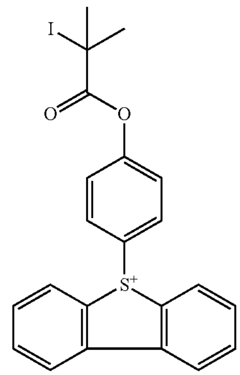
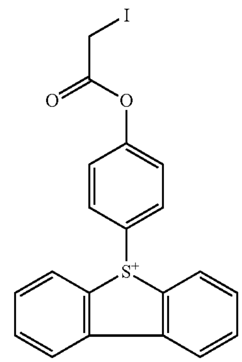
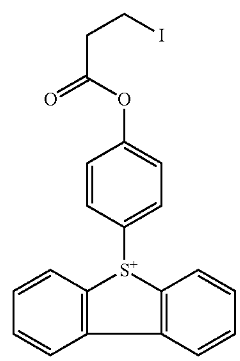
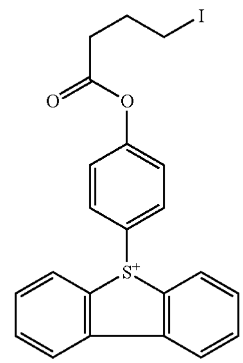
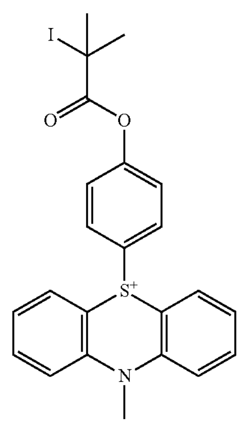
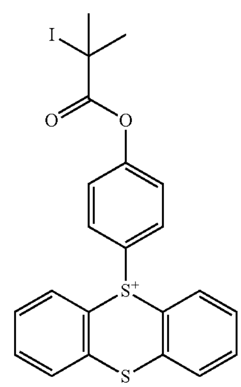
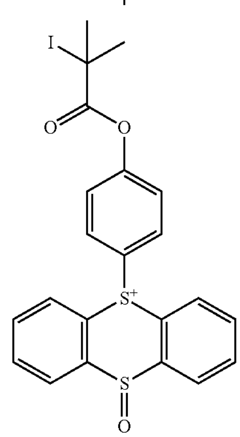
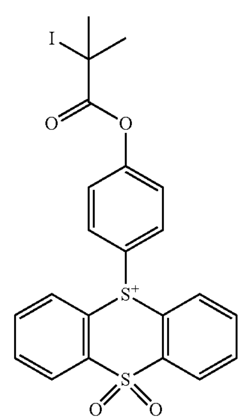

-continued
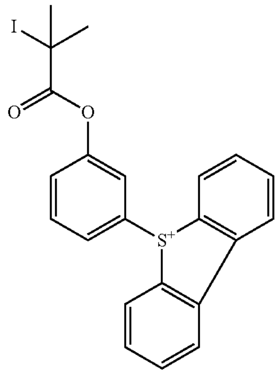
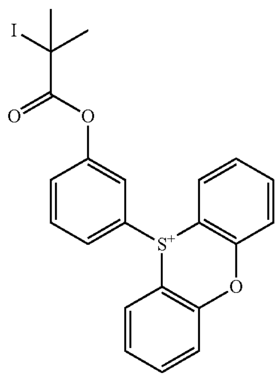
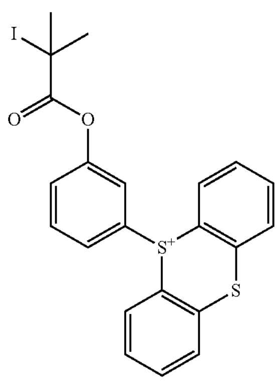
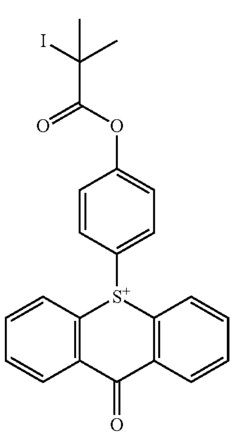
-continued
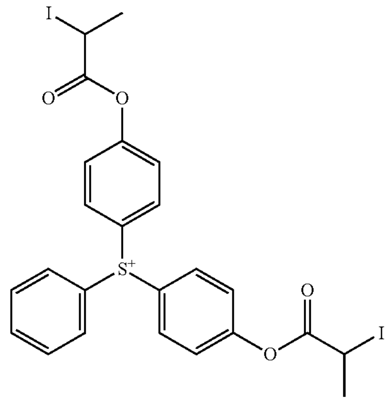
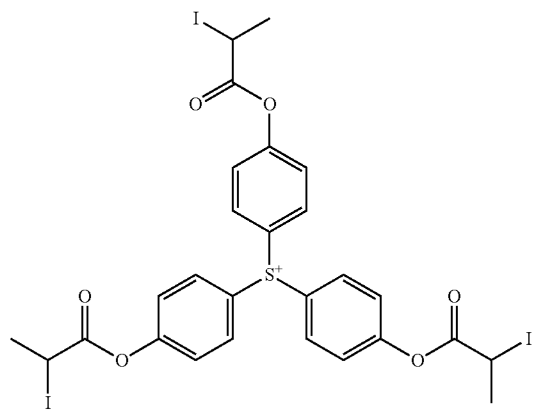
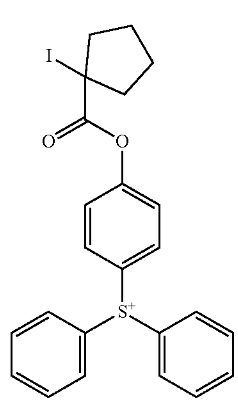
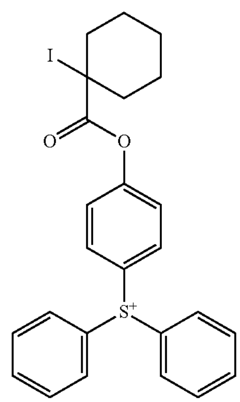
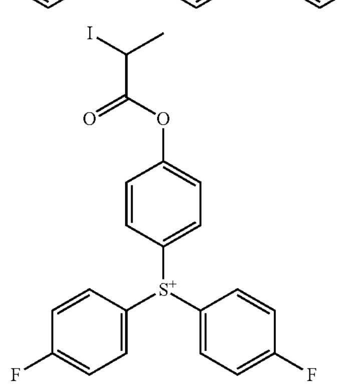

-continued
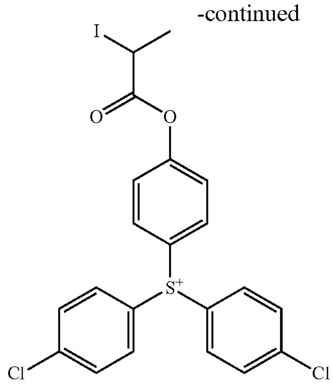
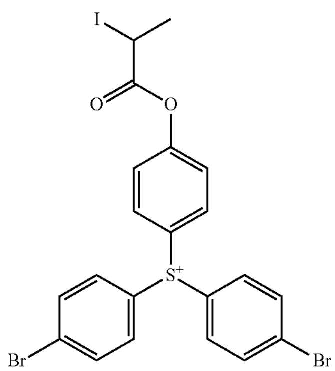
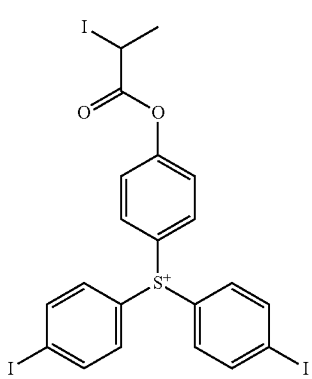
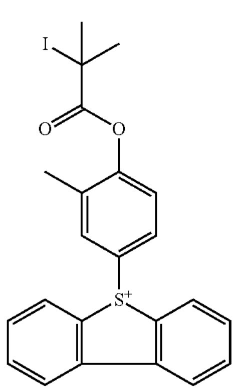
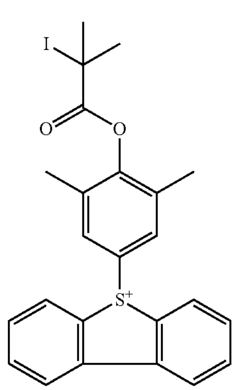
-continued
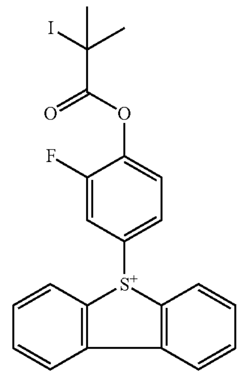
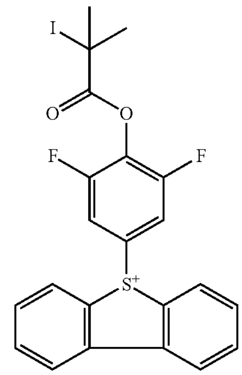
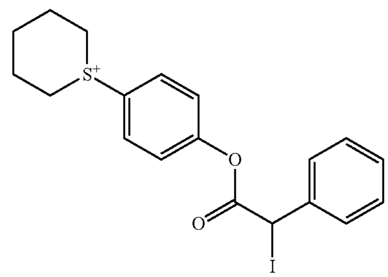
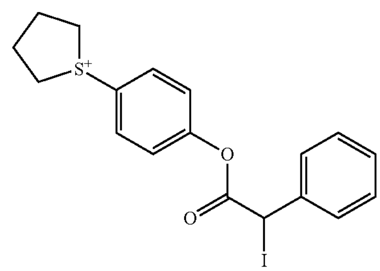
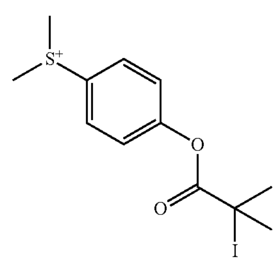
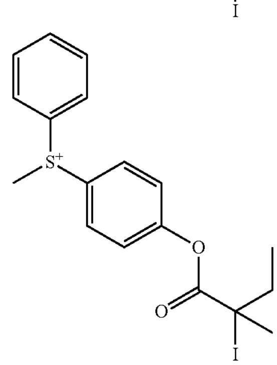

-continued
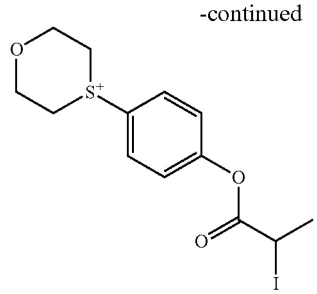
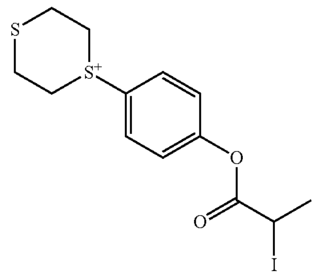
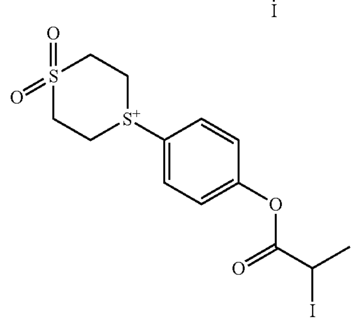
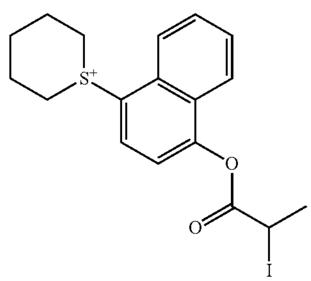
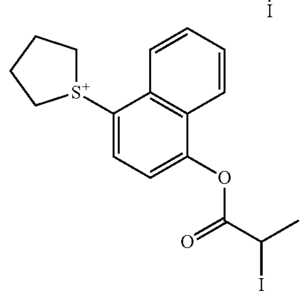
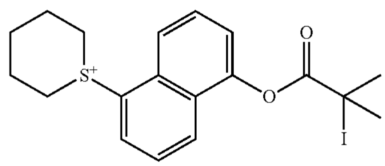
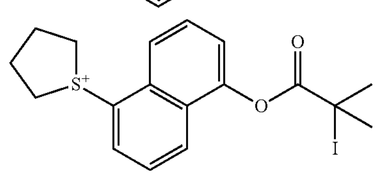
-continued
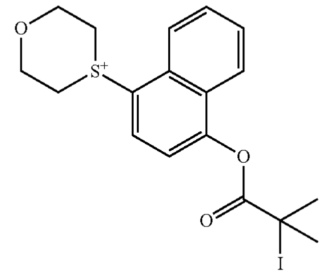
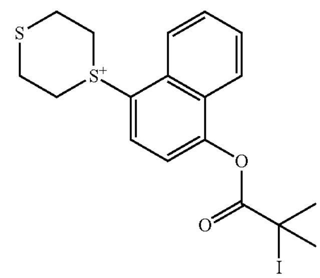
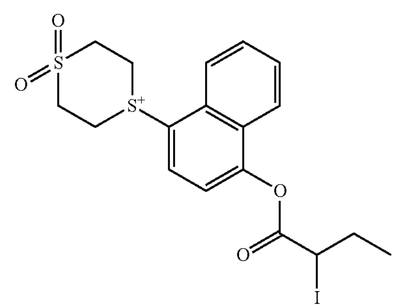
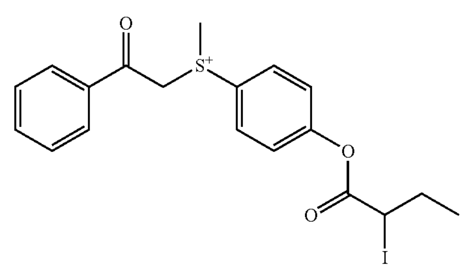
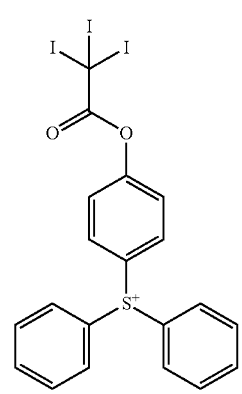

-continued
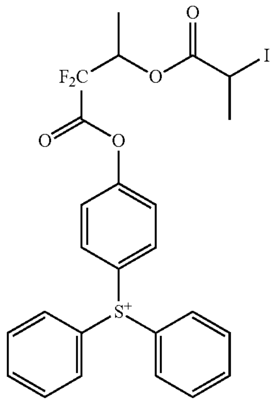
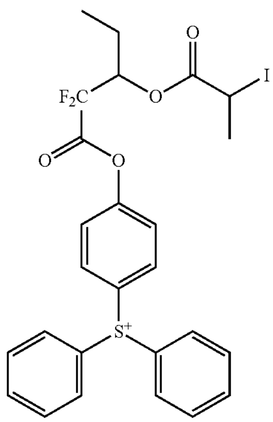
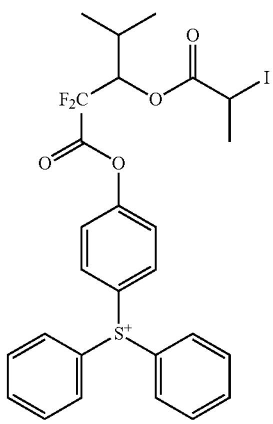
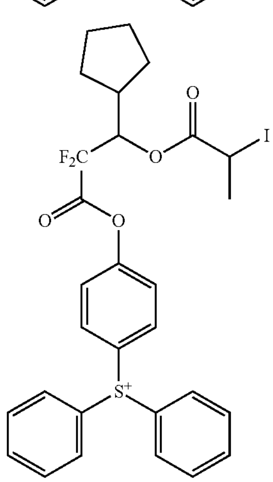
-continued
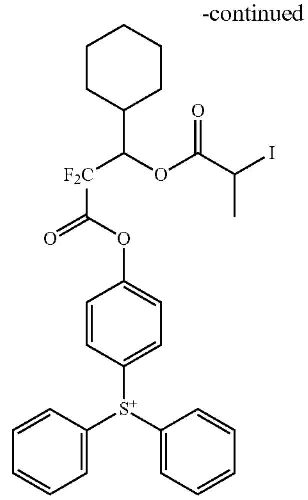
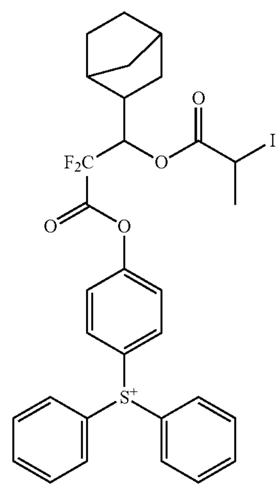
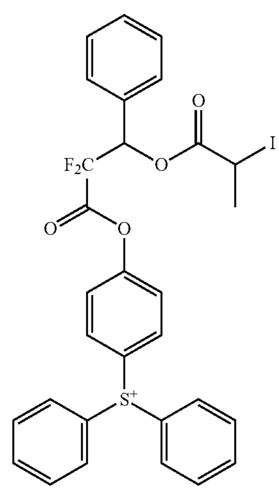

-continued
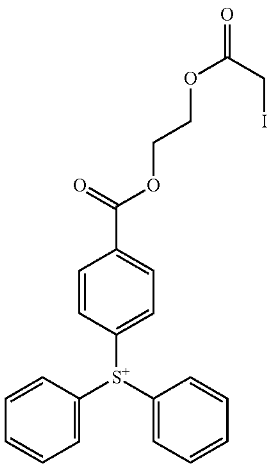
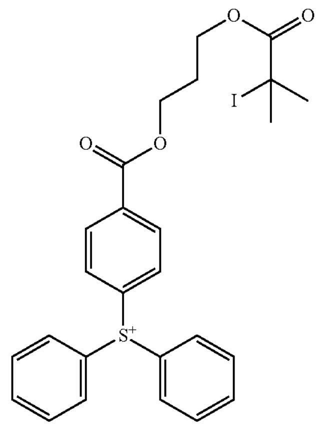
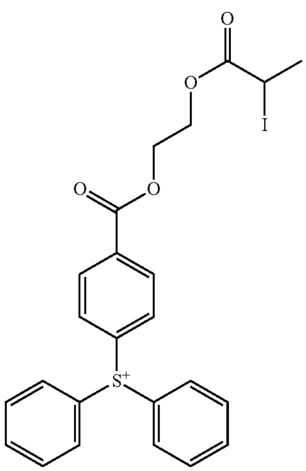
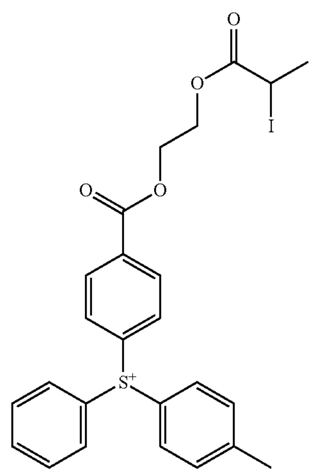
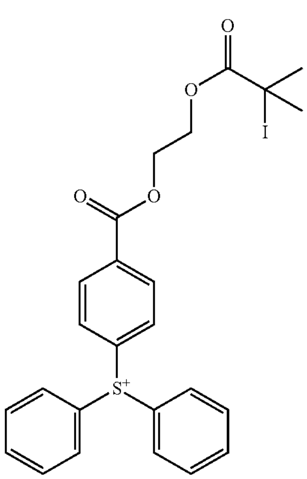
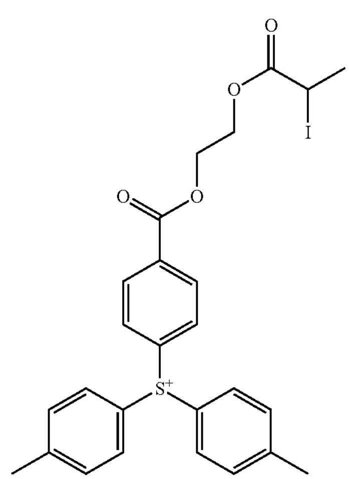

-continued
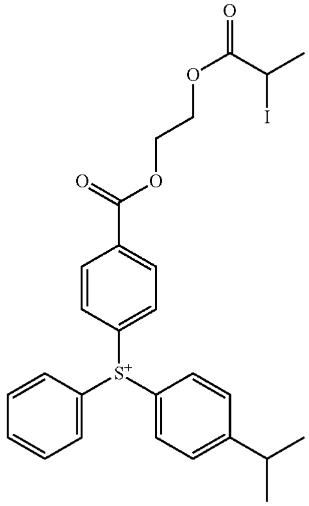
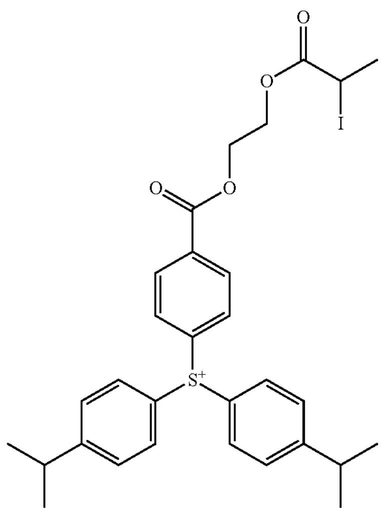
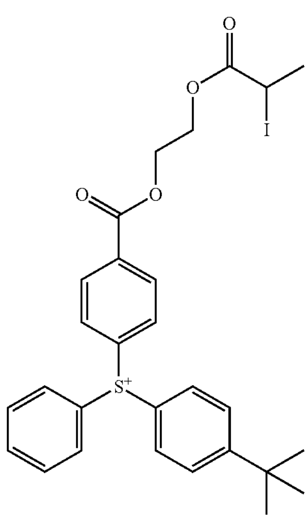
-continued
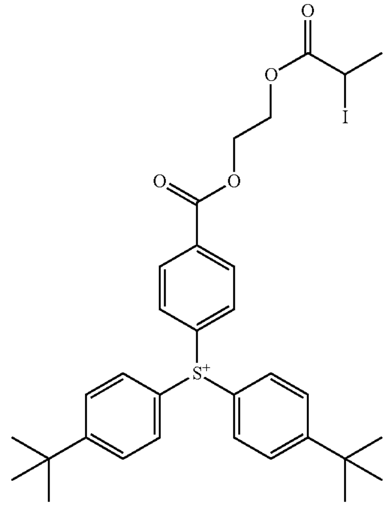
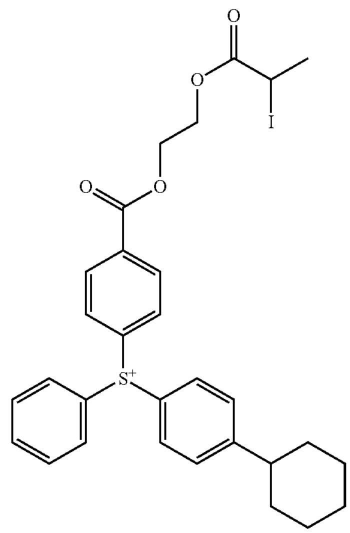
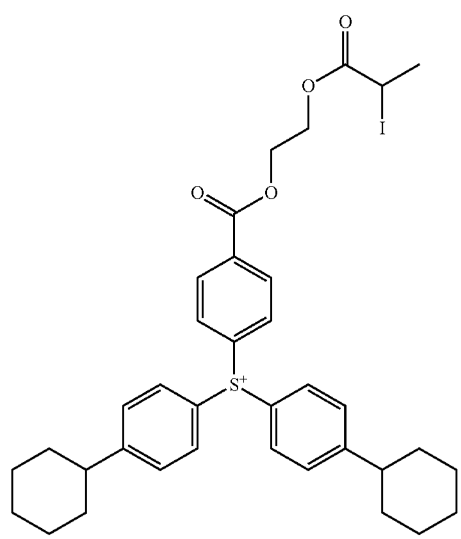

-continued
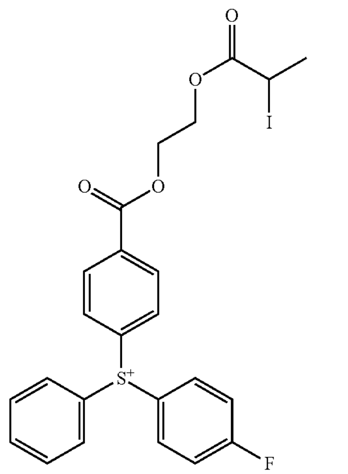
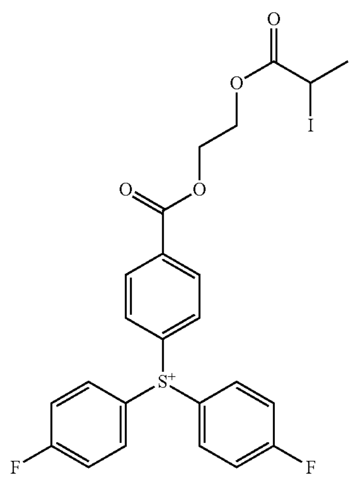
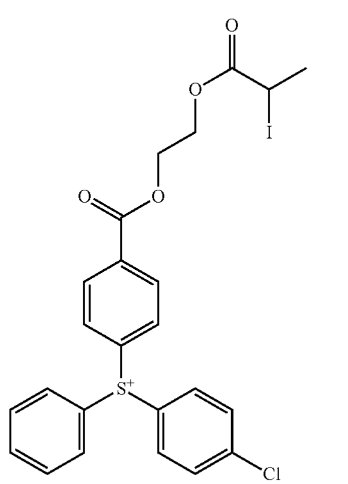
-continued
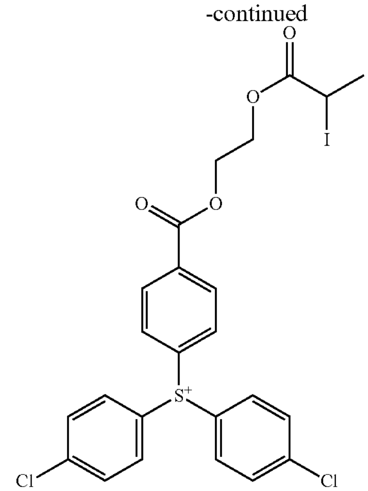
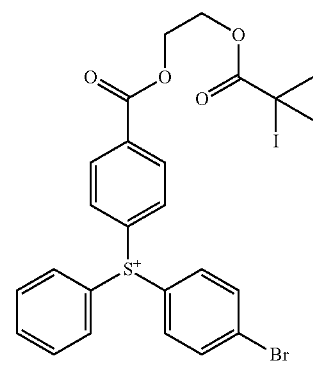
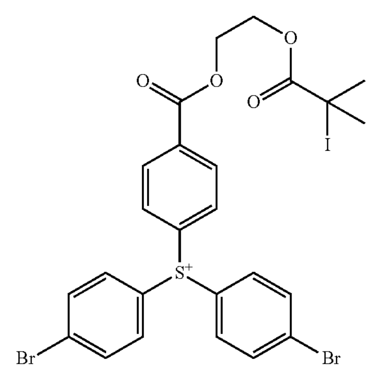
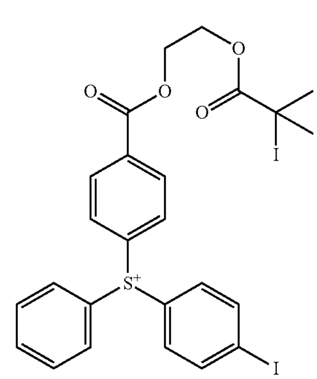

-continued
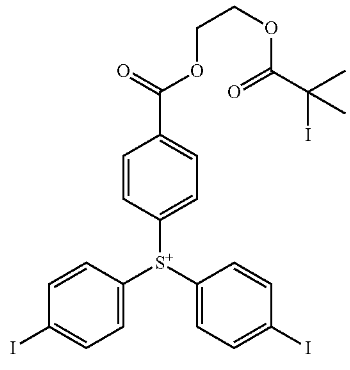
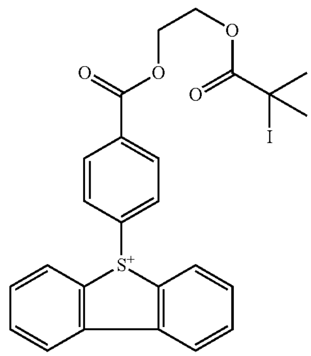
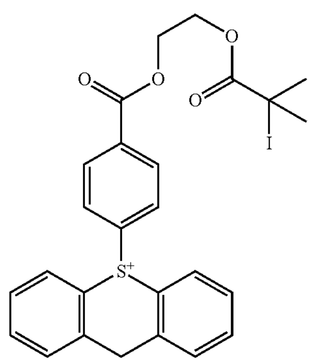
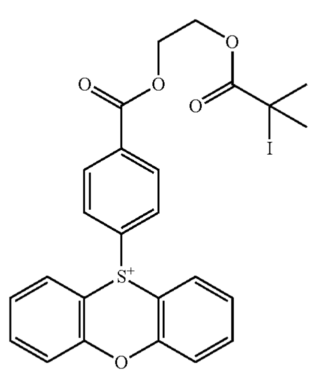
-continued
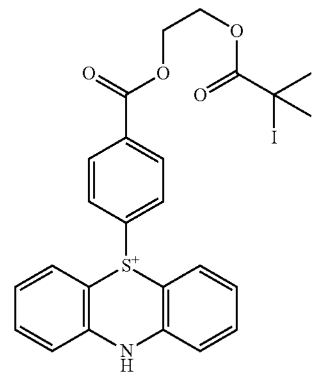
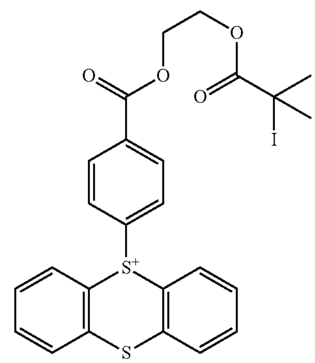
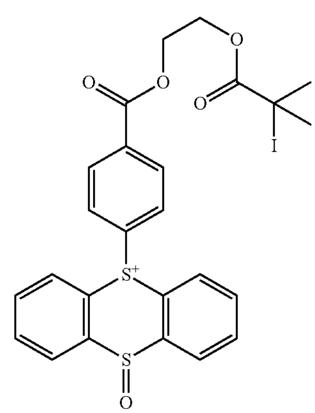
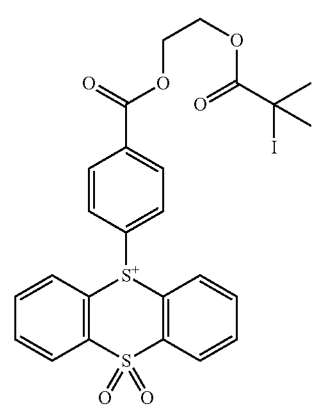

-continued
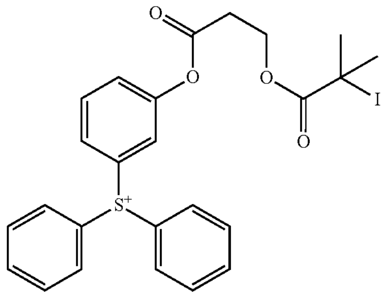
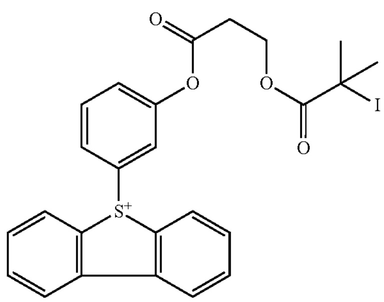
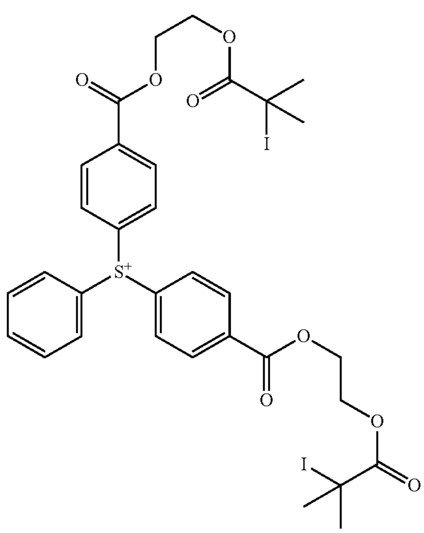
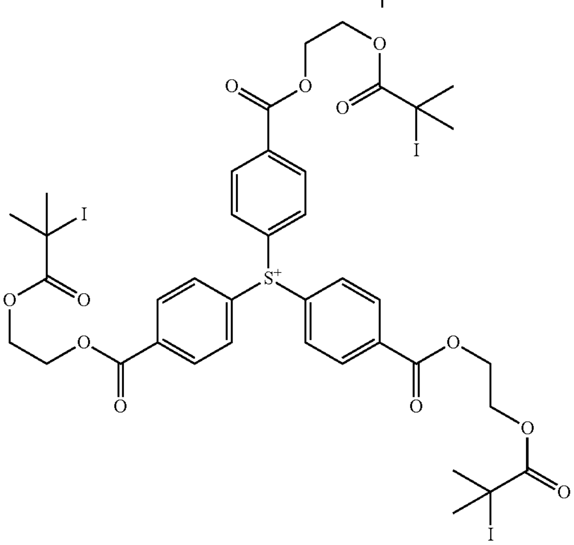
-continued
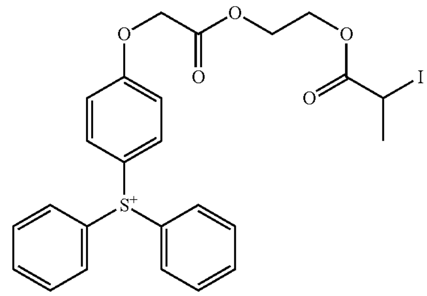
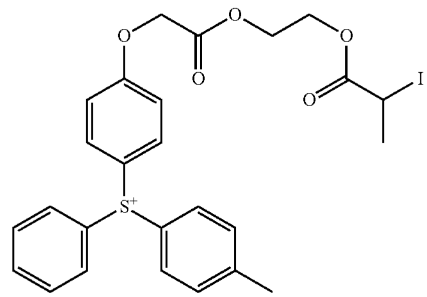
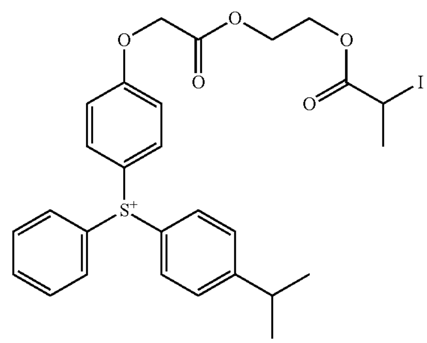
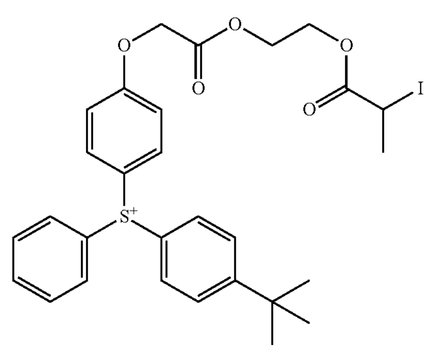
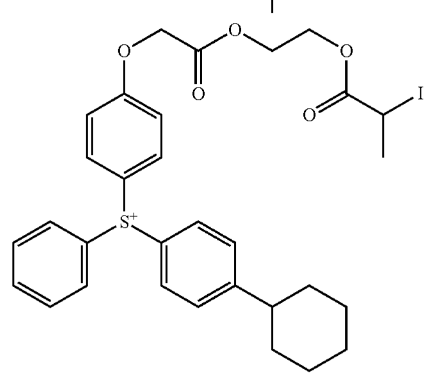

-continued
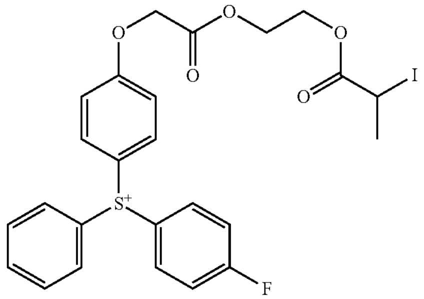
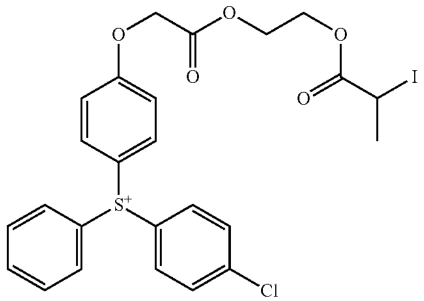
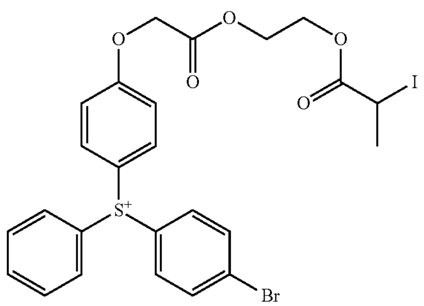
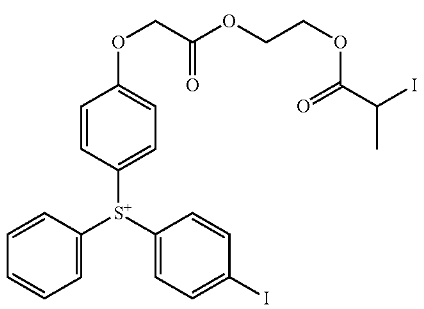
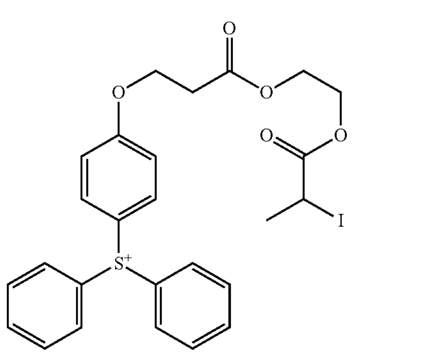
-continued
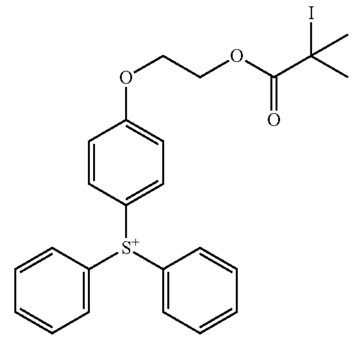
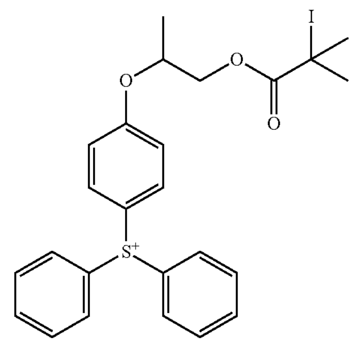
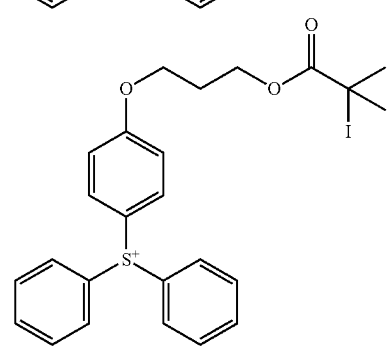
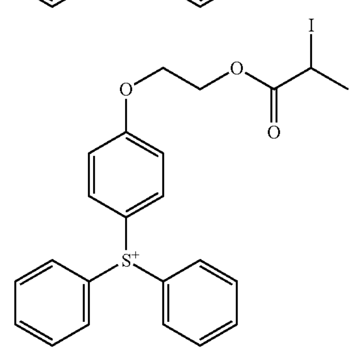
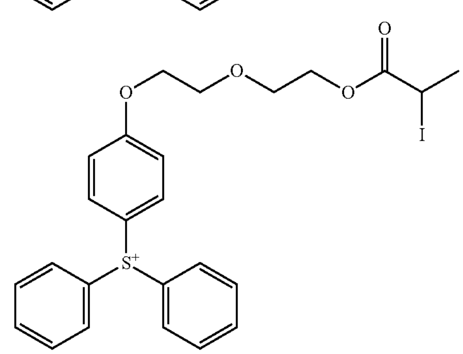

-continued
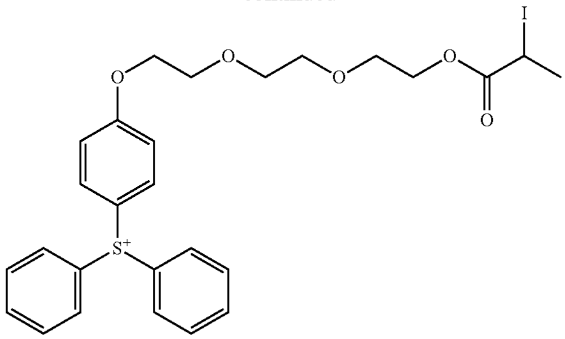
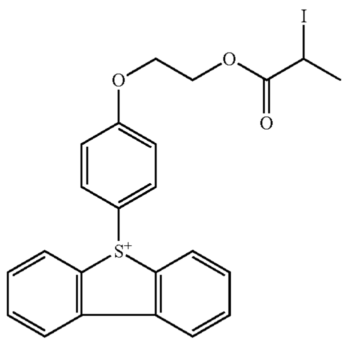
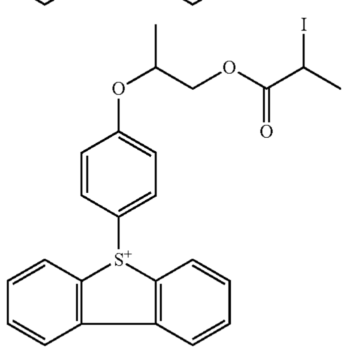
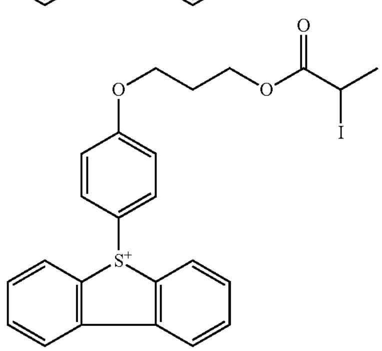
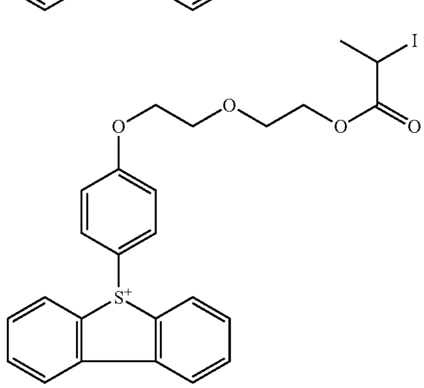
-continued
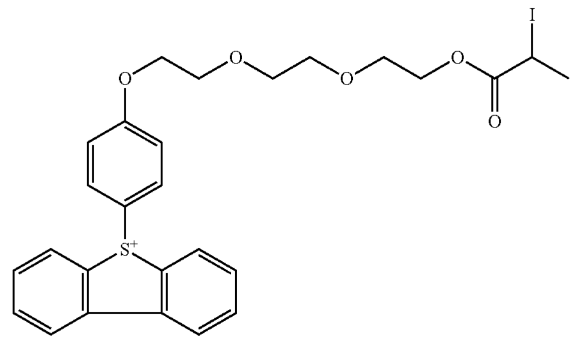
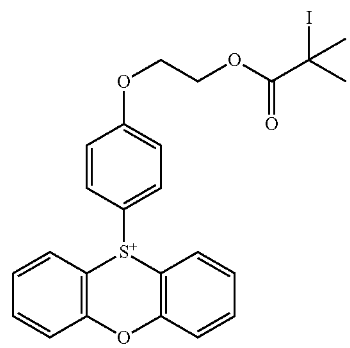
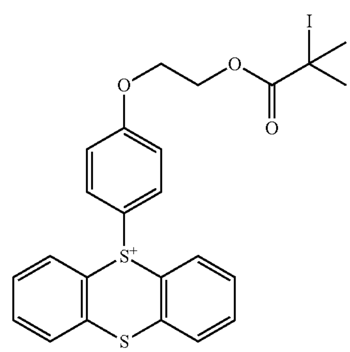
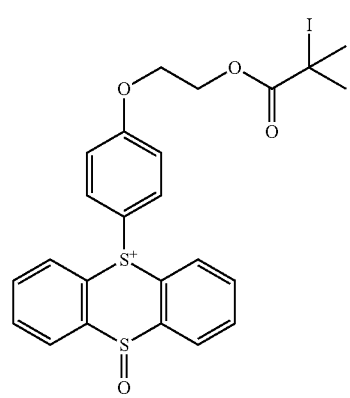

-continued
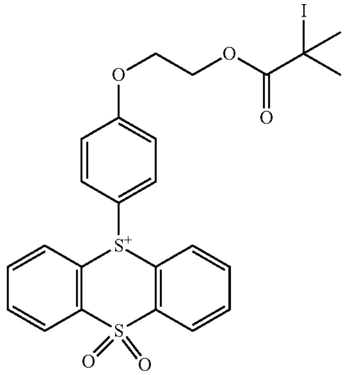
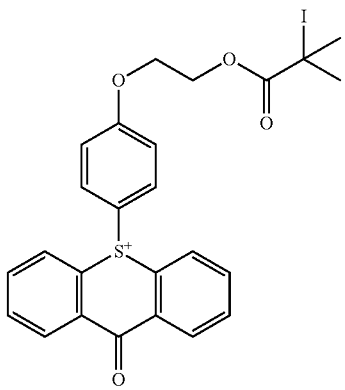
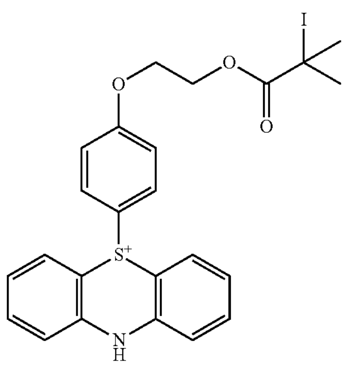
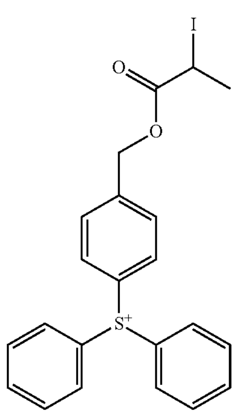
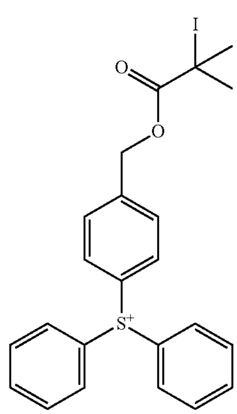
-continued
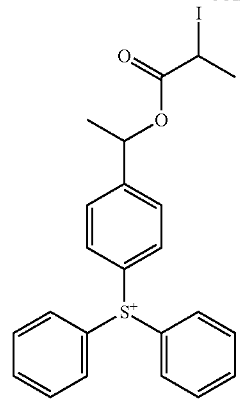
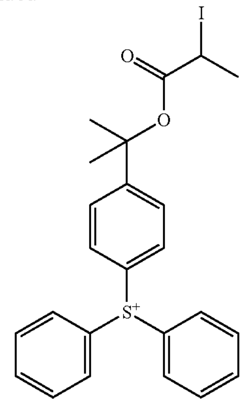
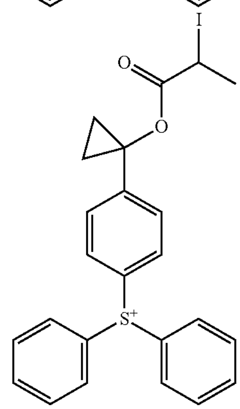
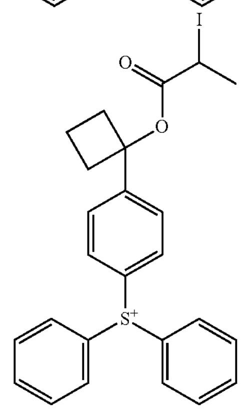
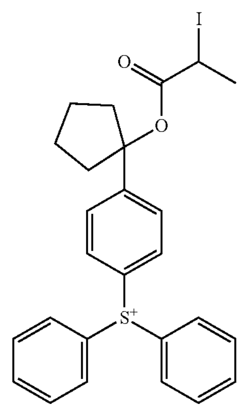
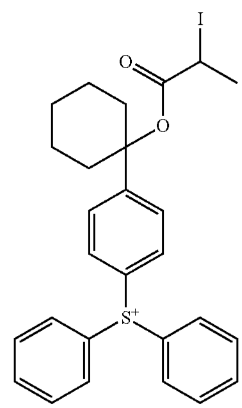
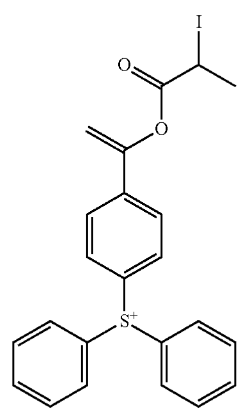
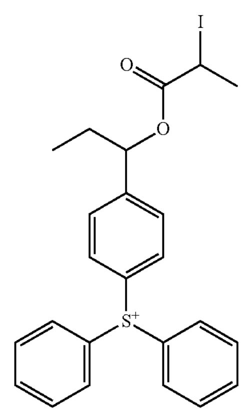

-continued
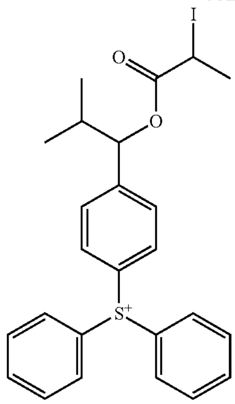
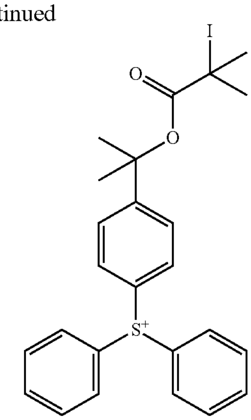
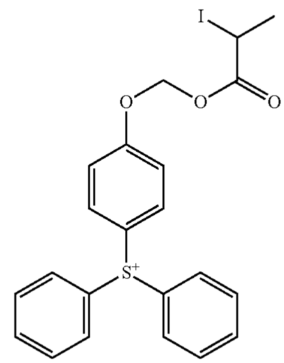
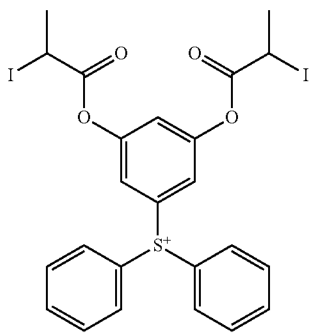
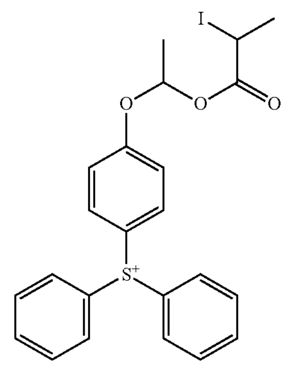
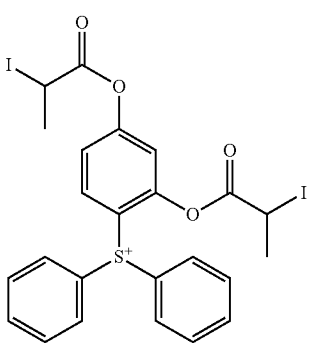
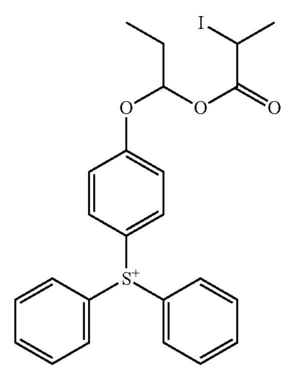
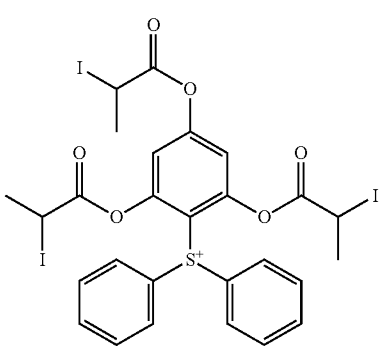
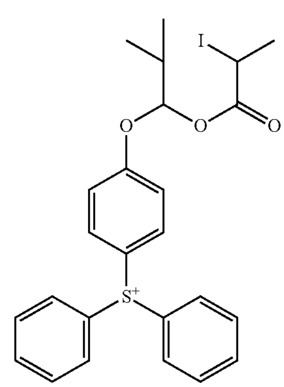

-continued
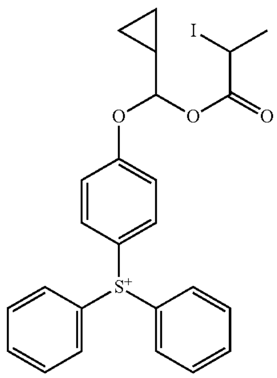
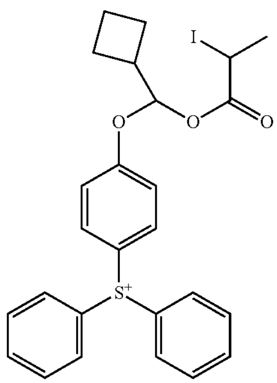
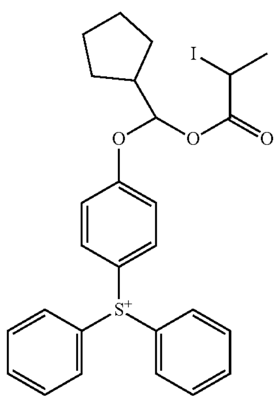
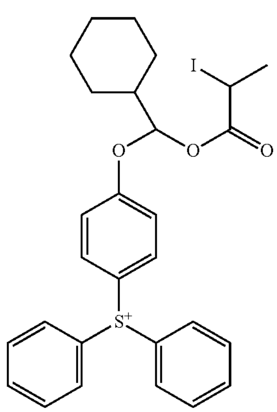
-continued
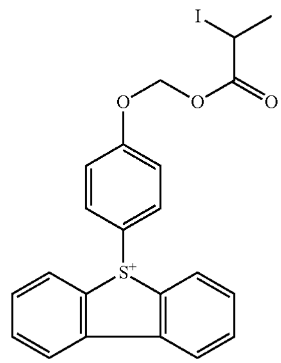
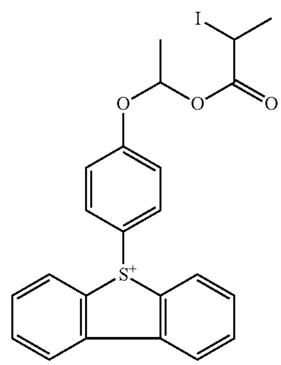
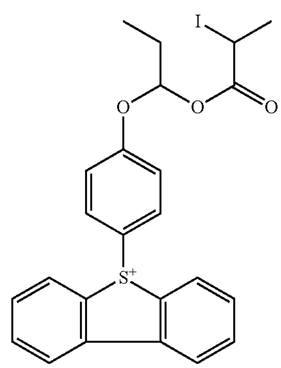
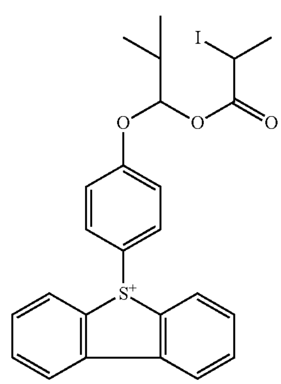

-continued
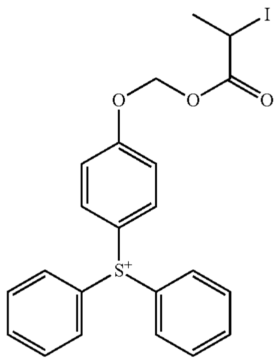
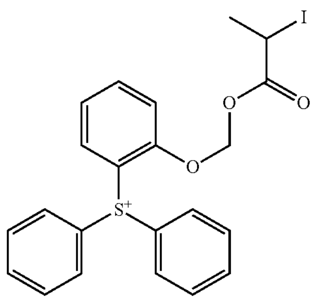
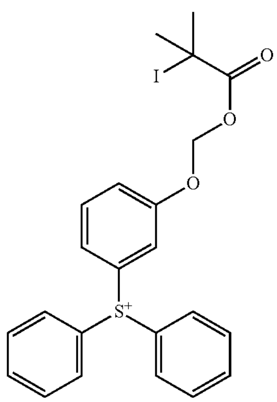
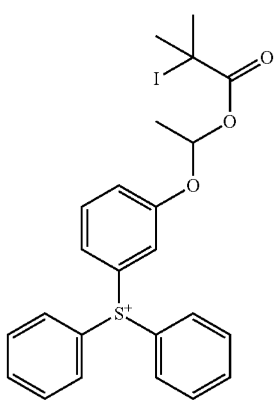
-continued
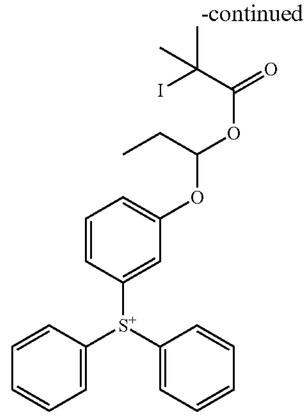
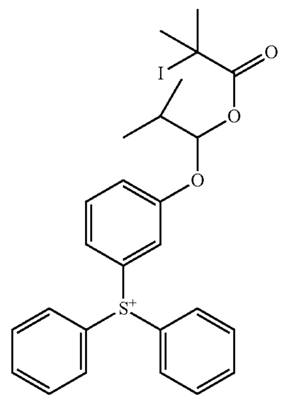
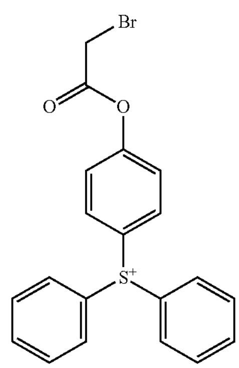
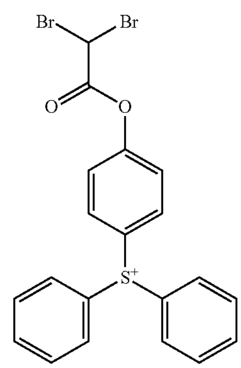
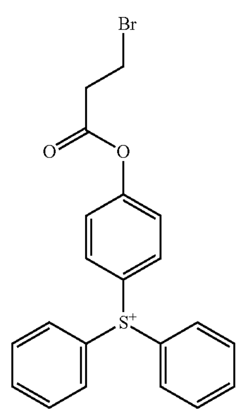
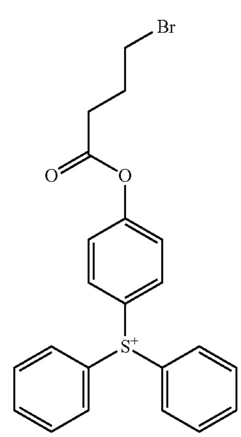

-continued
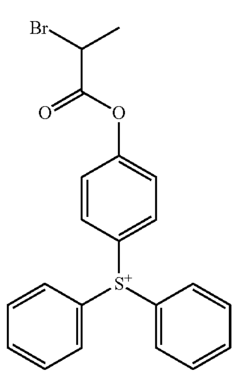
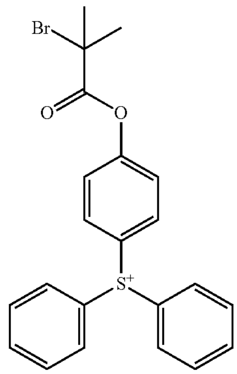
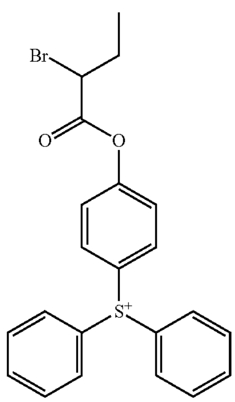
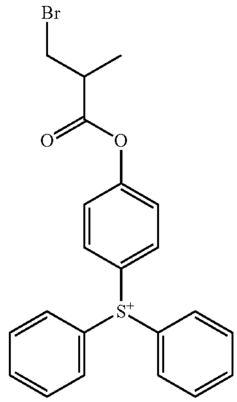
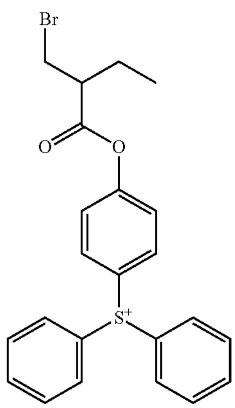
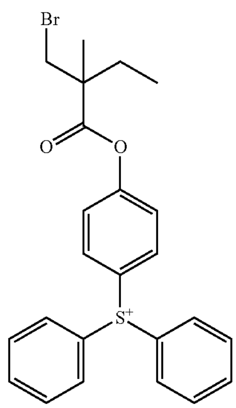
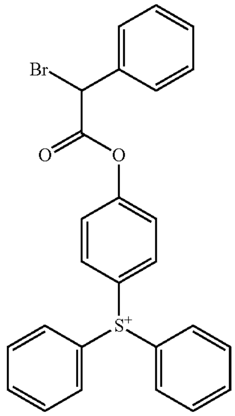
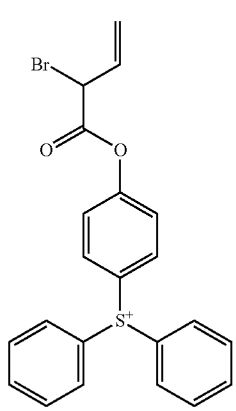
-continued
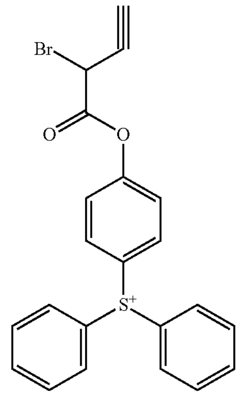
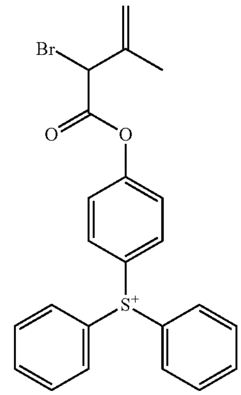
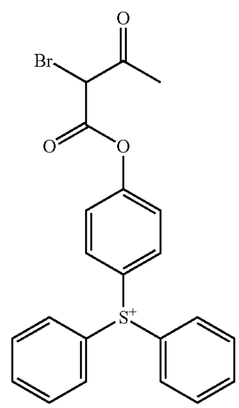
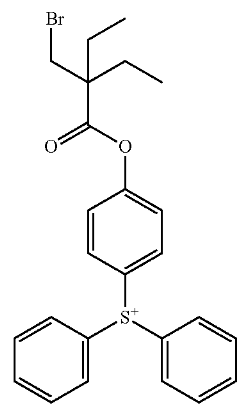
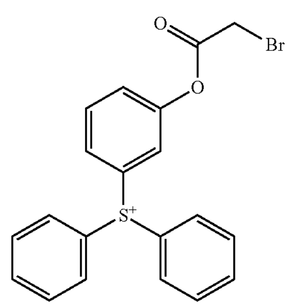
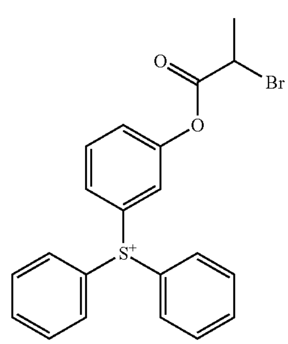

-continued
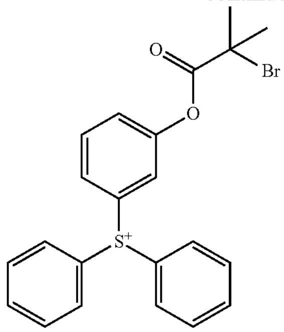
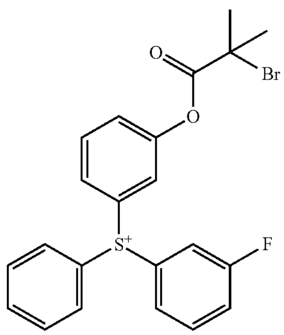
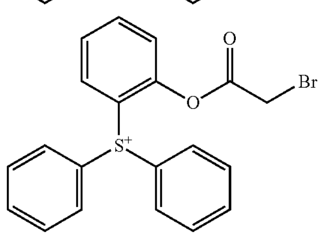
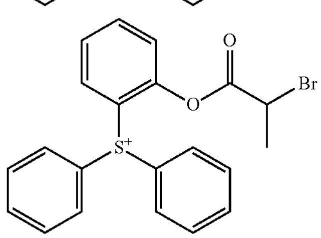
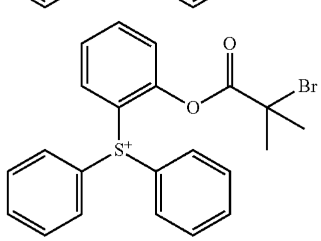
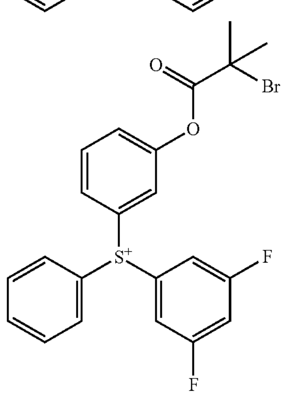
-continued
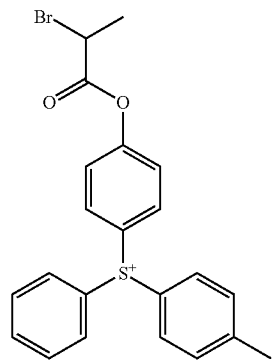
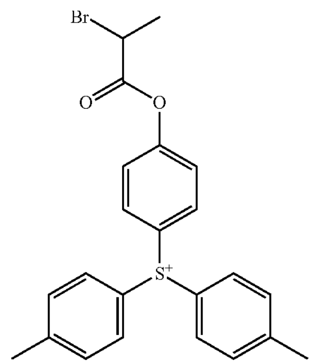
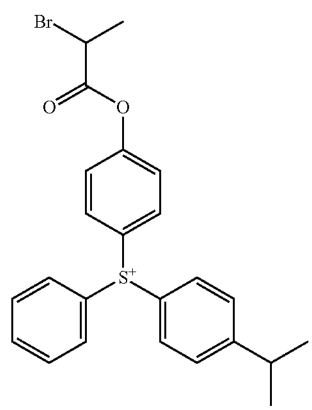
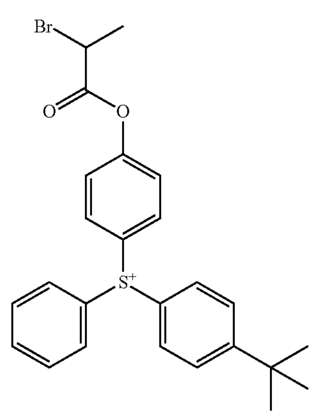

-continued
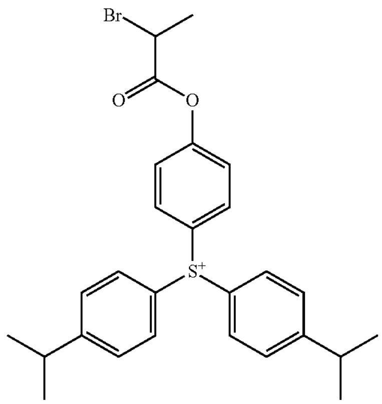
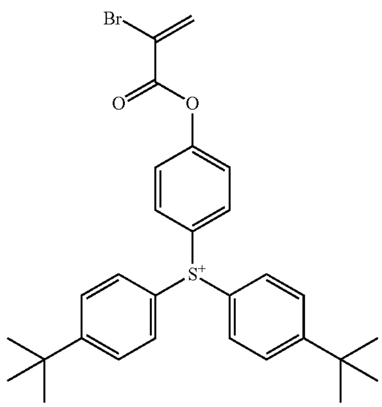
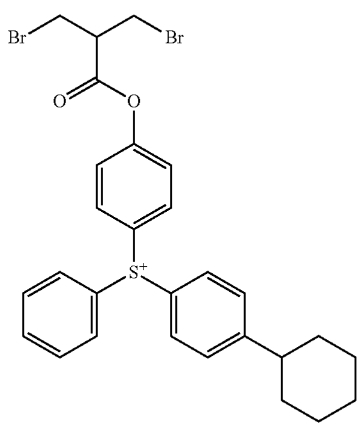
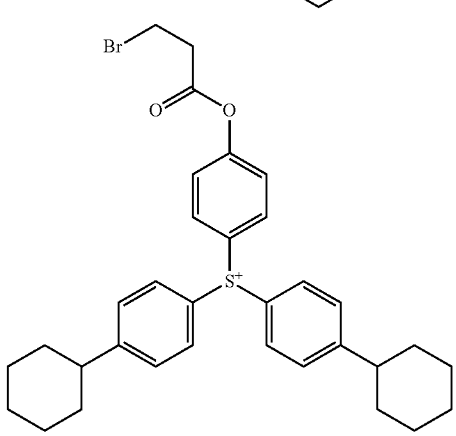
-continued
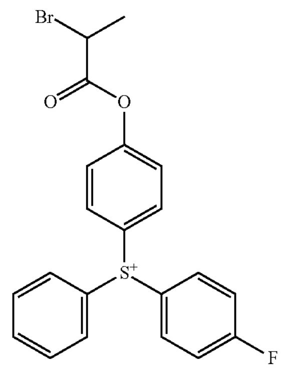
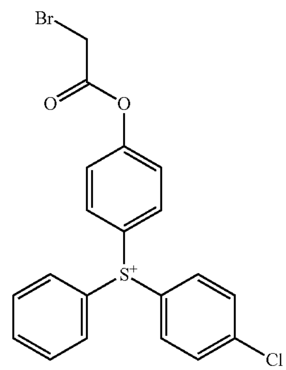
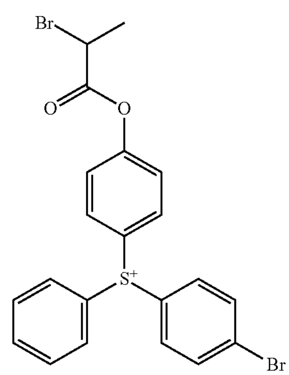
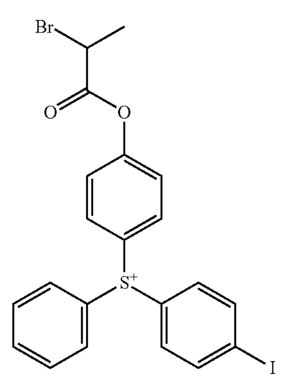

-continued
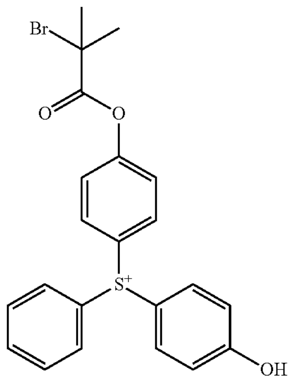
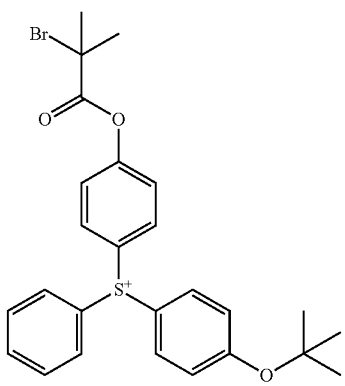
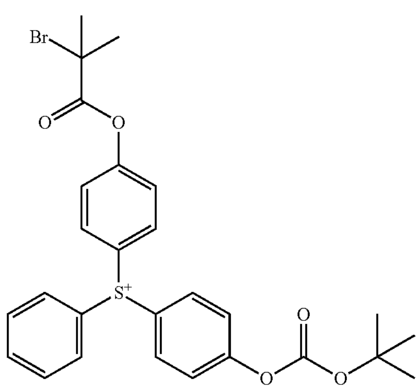
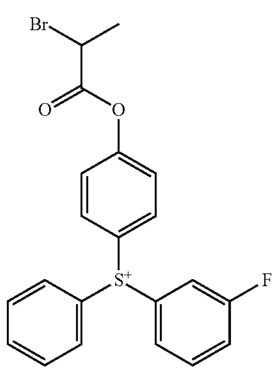
-continued
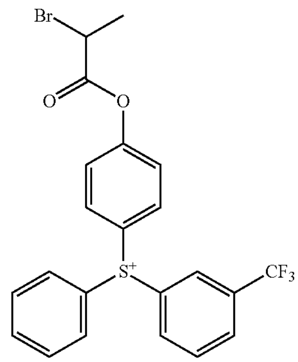
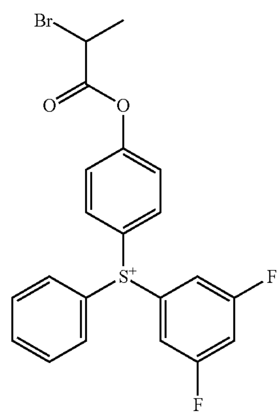
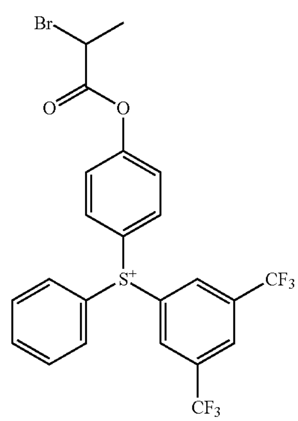
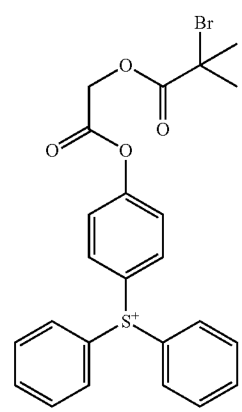
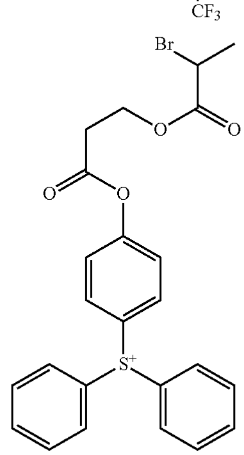

-continued
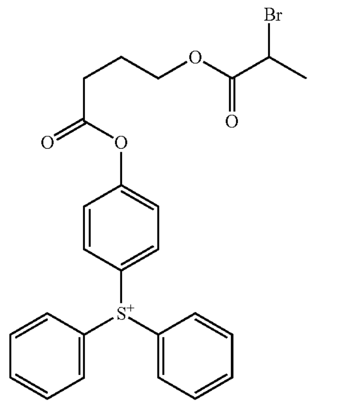
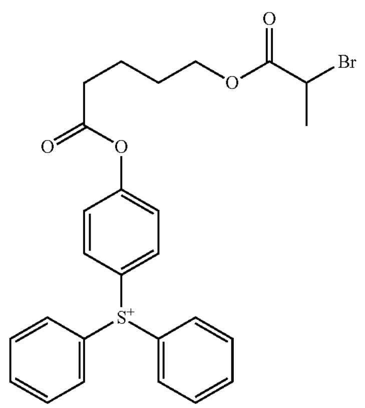
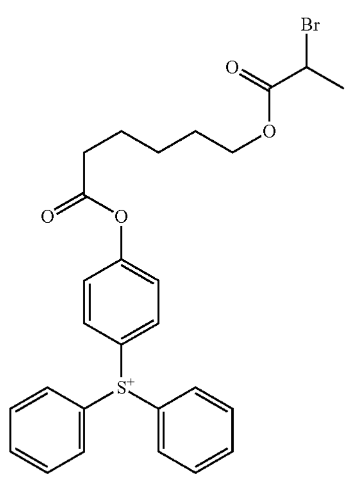
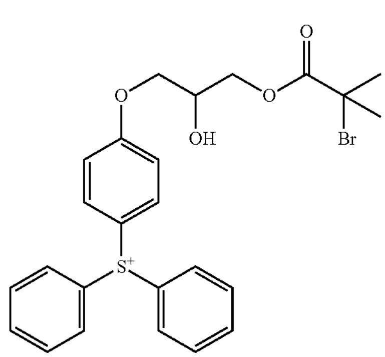
-continued
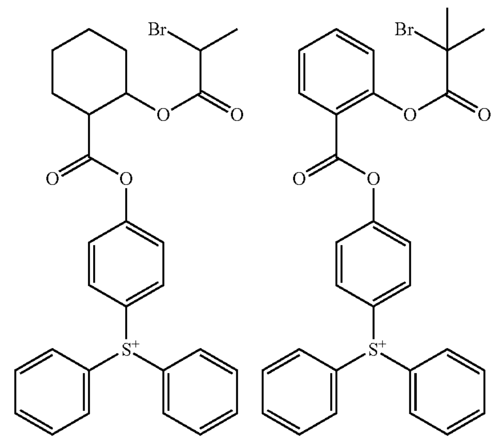
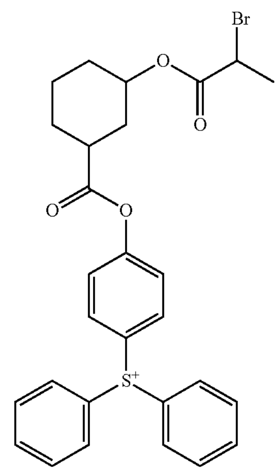
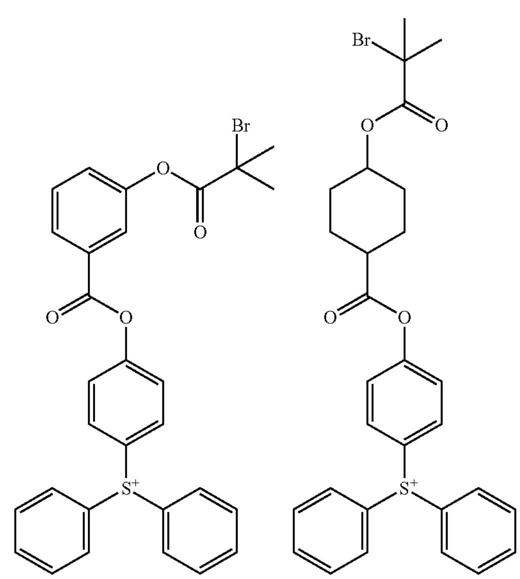

-continued
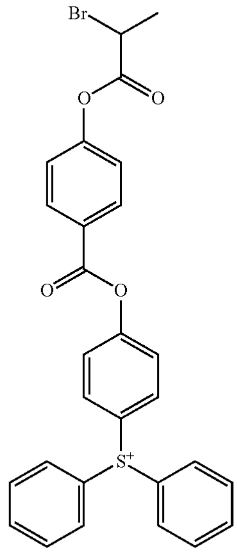
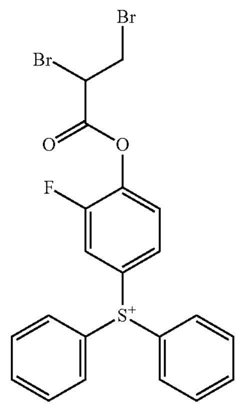
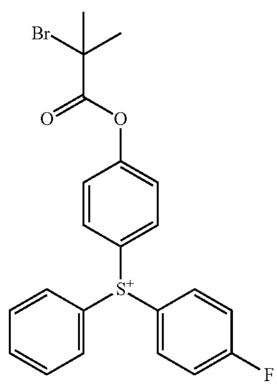
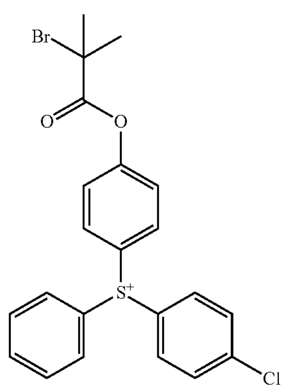
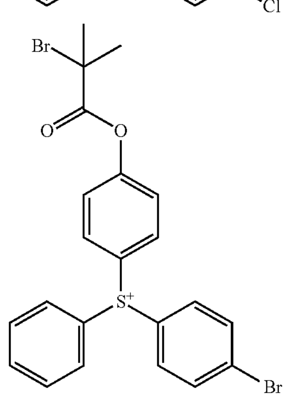
-continued
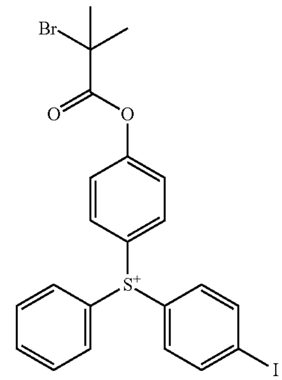
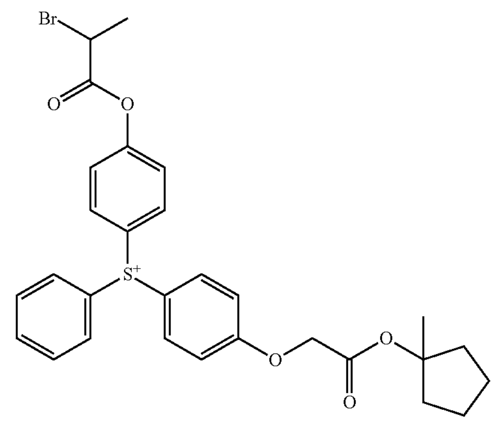
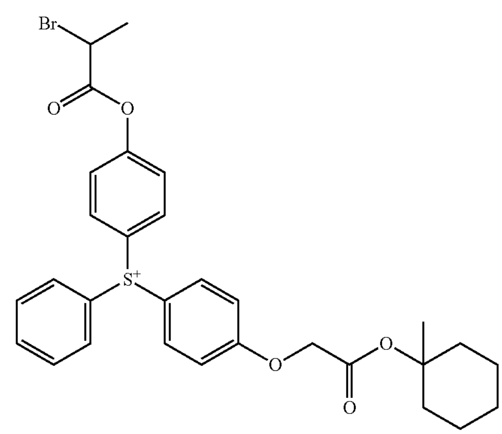
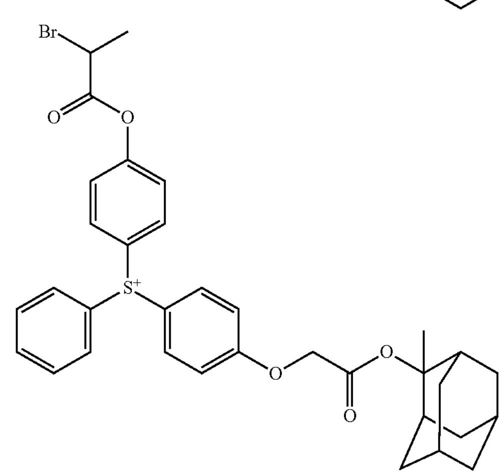

-continued
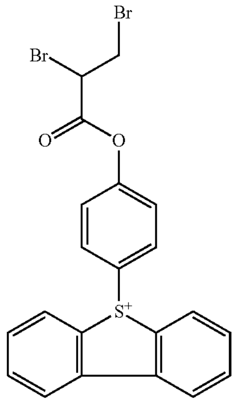
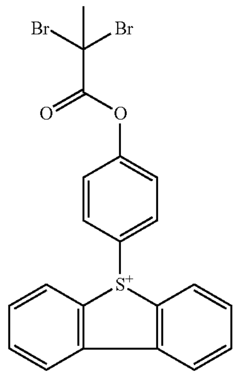
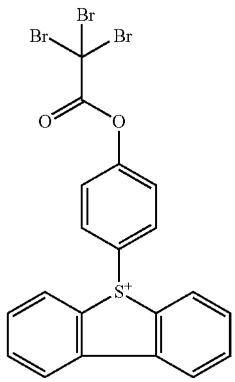
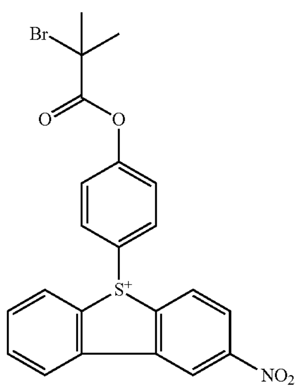
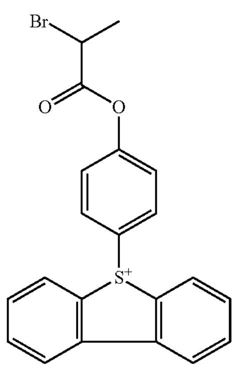
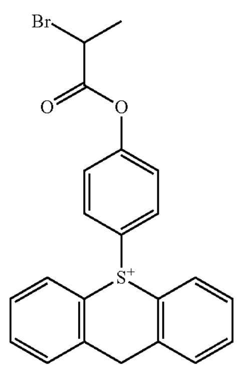
-continued
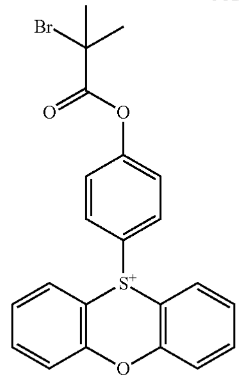
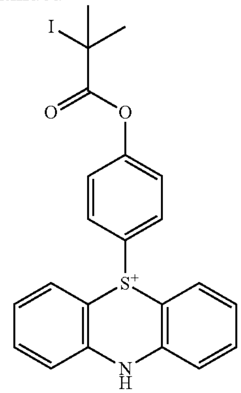
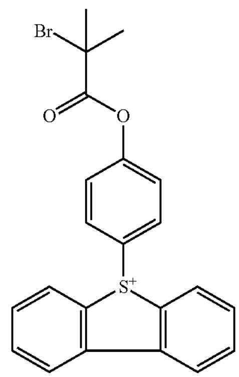
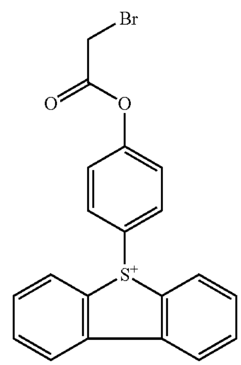
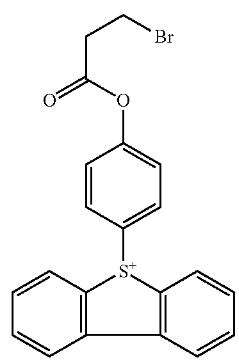
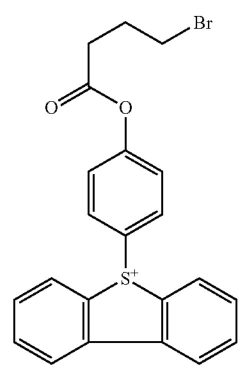
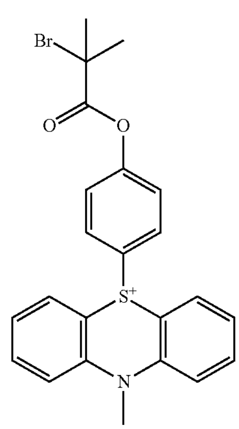
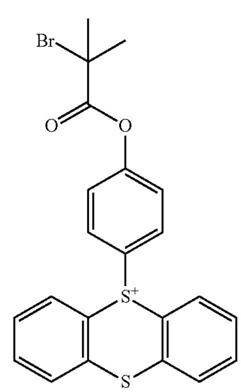

-continued
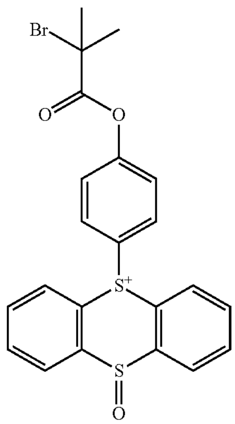
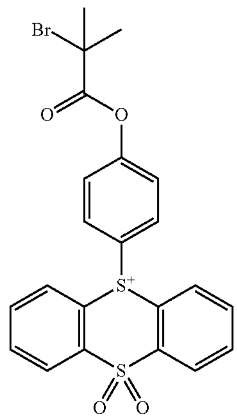
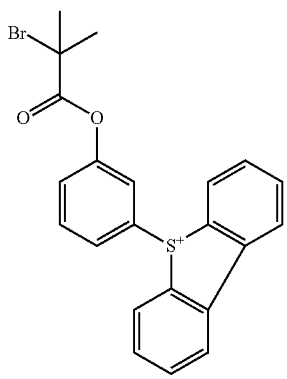
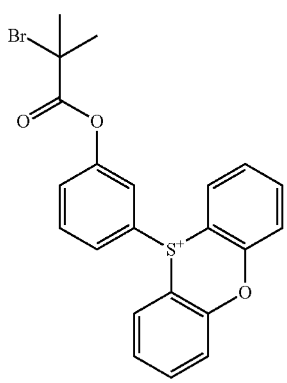
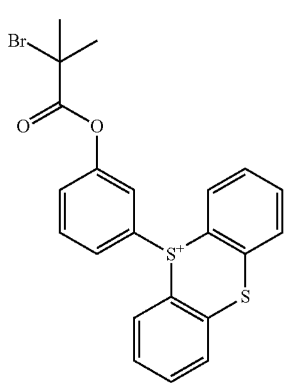
-continued
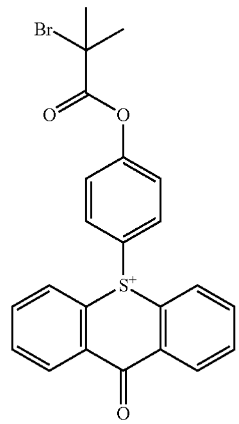
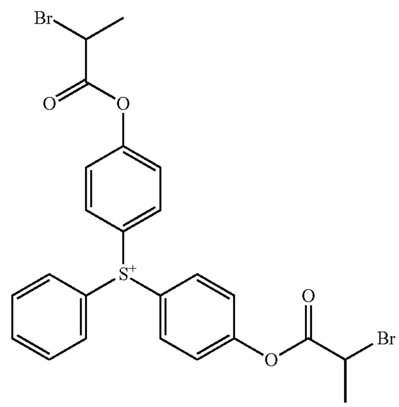
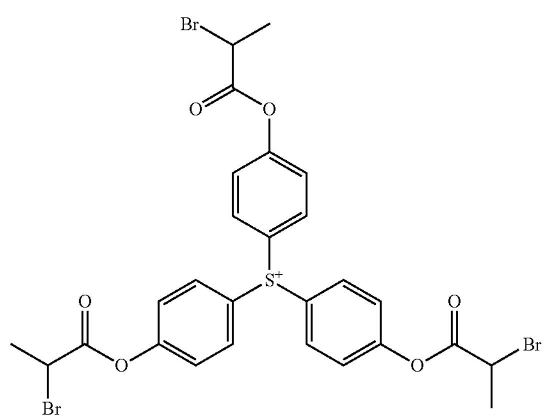
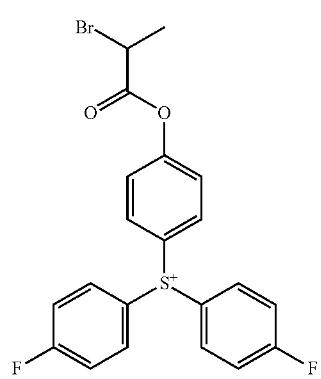

-continued
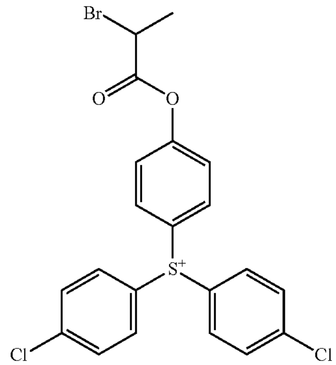
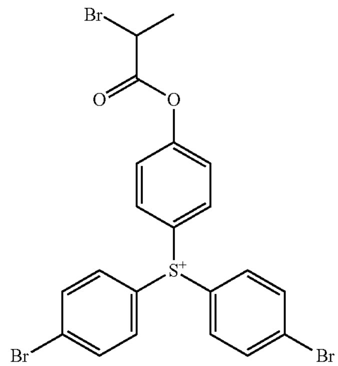
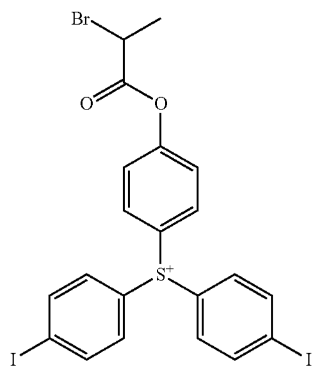
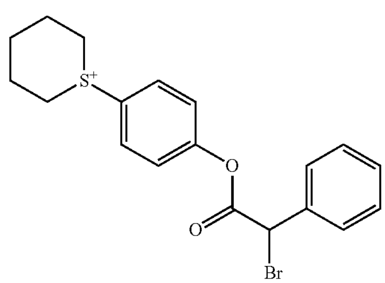
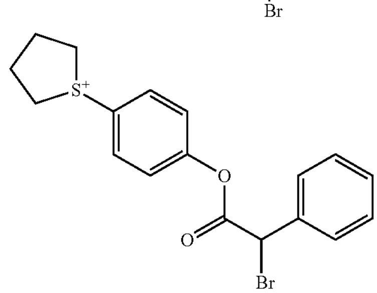
-continued
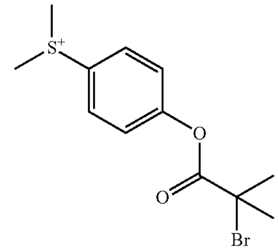
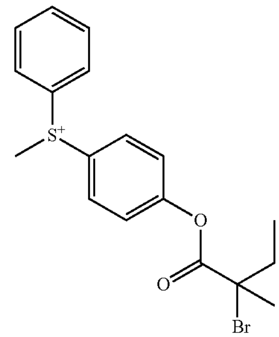
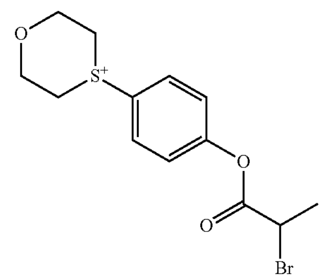
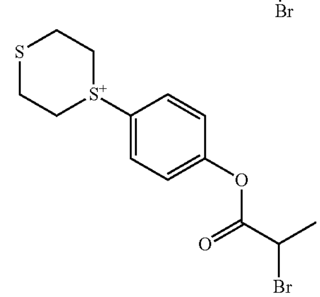
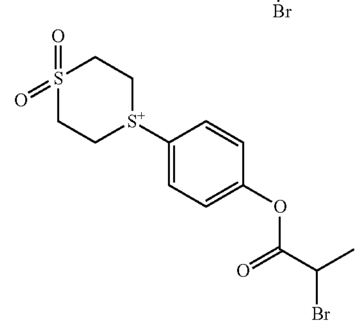
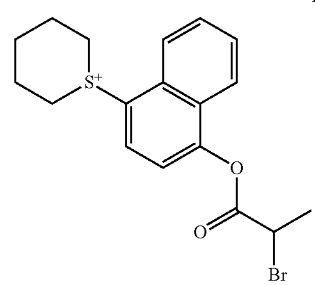

-continued
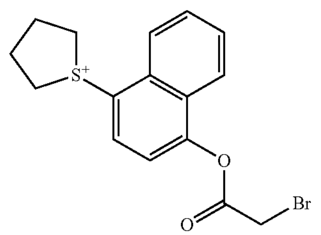
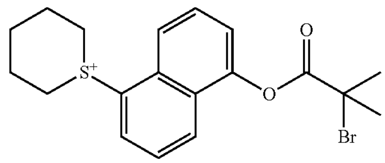
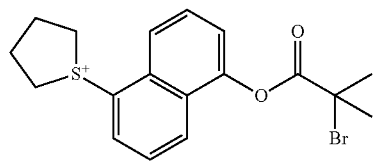
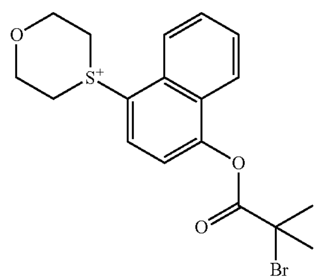
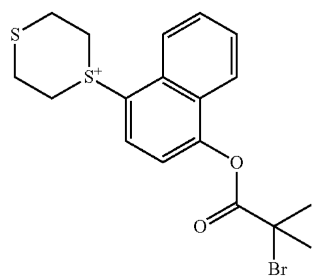
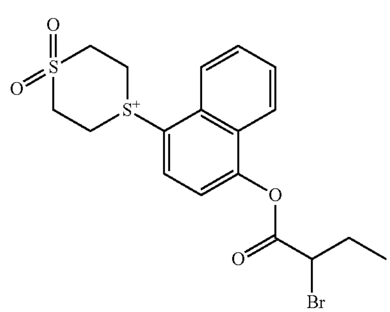
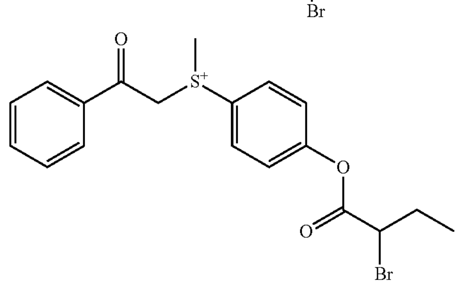
-continued
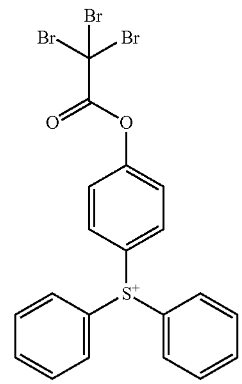
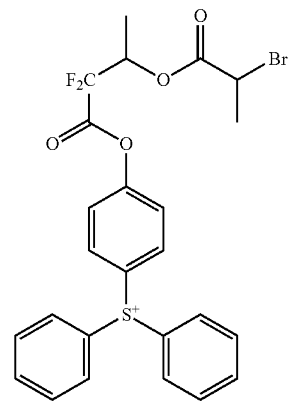
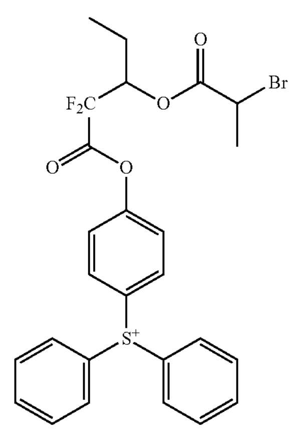
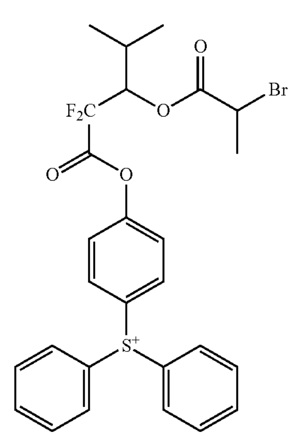

-continued
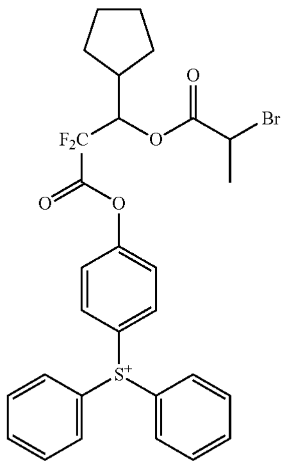
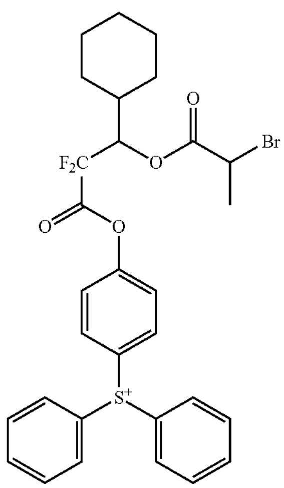
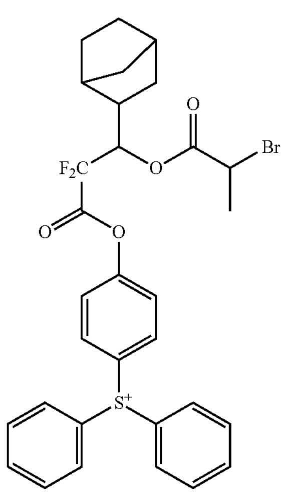
-continued
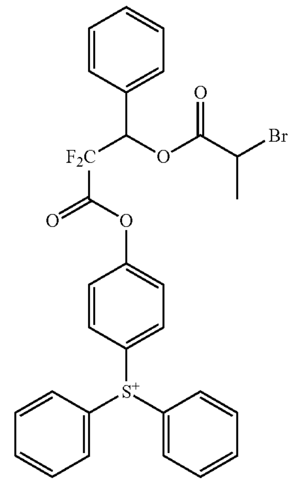
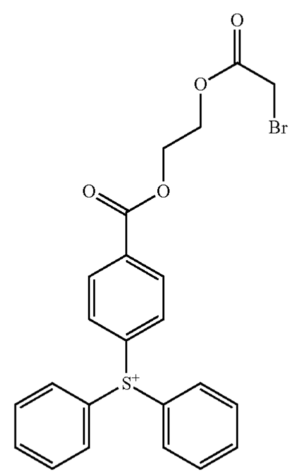
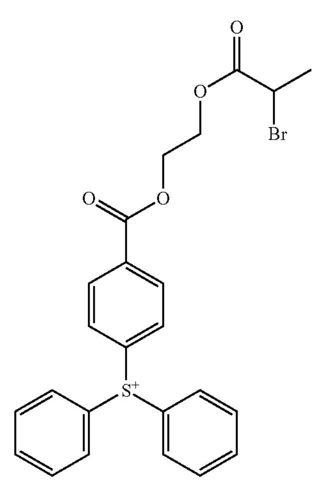

-continued
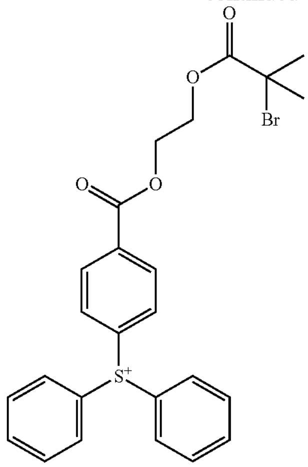
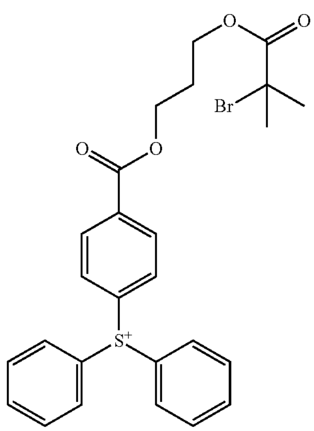
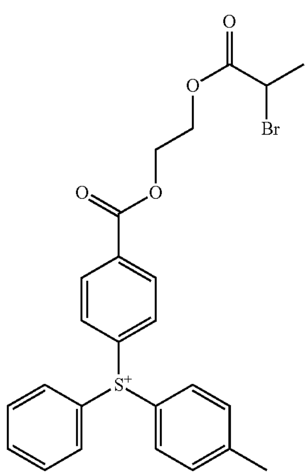
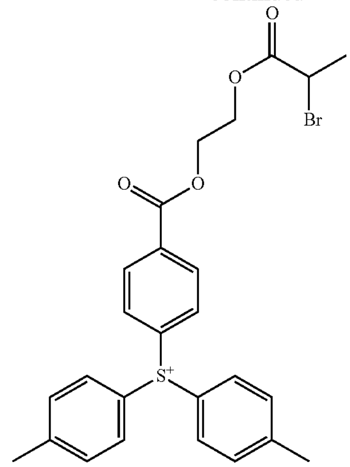
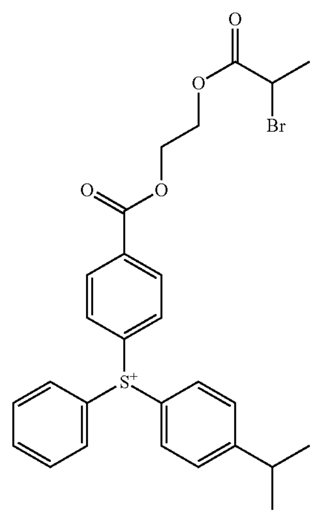
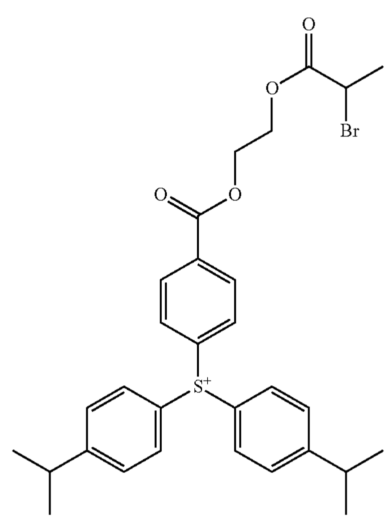

-continued
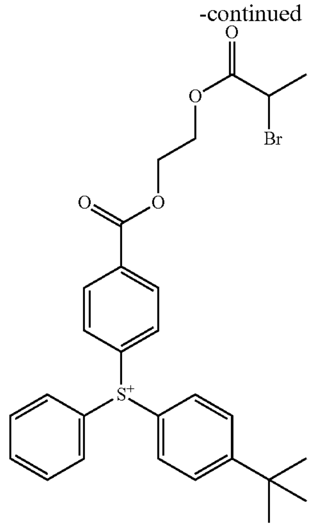
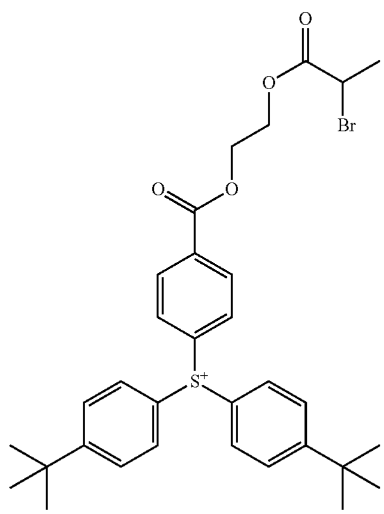
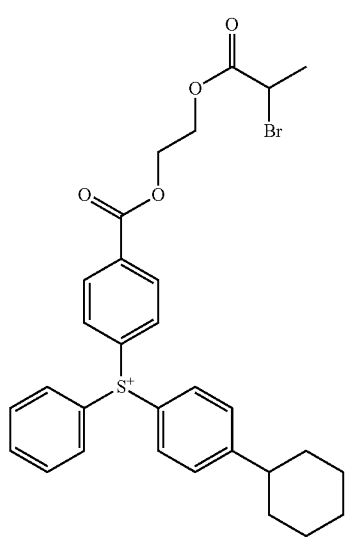
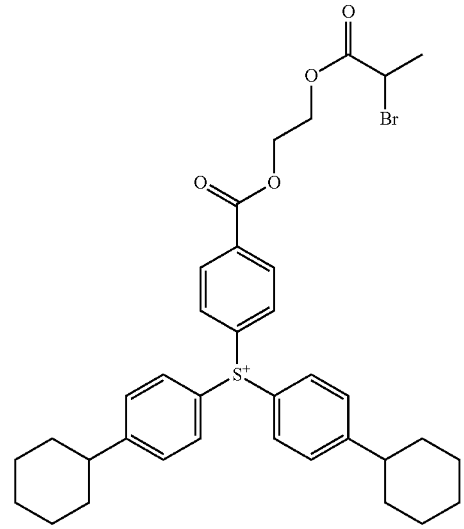
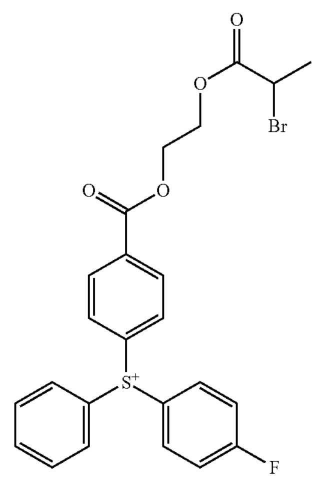
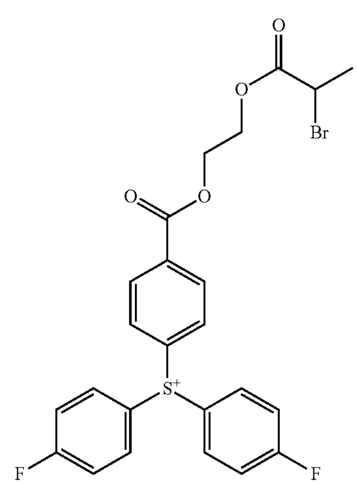

-continued
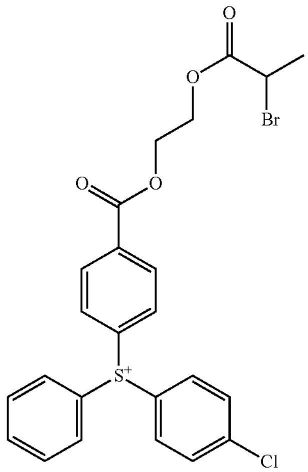
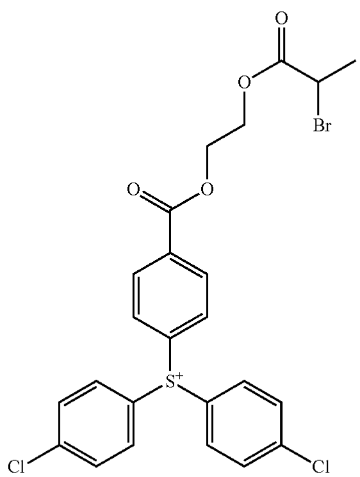
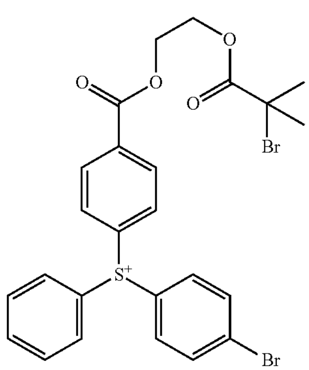
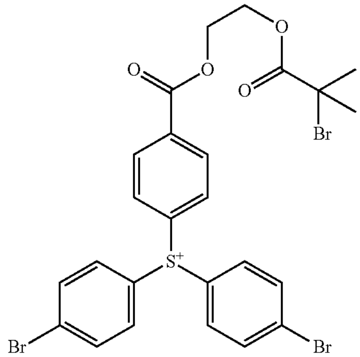
-continued
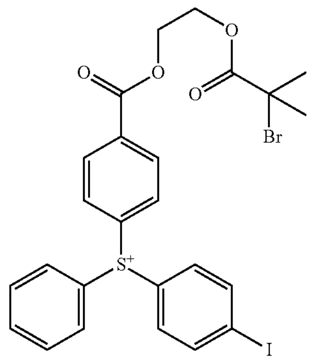
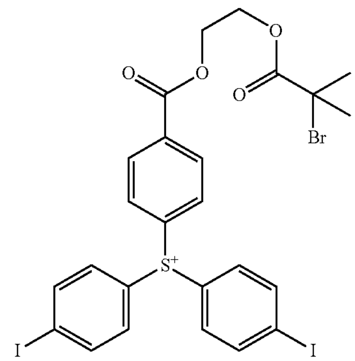
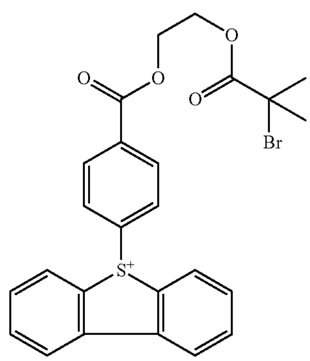
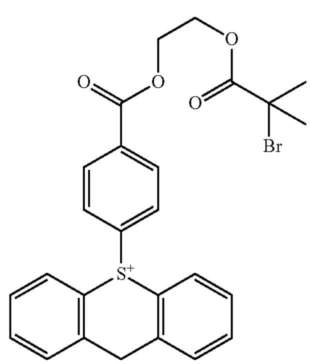

-continued
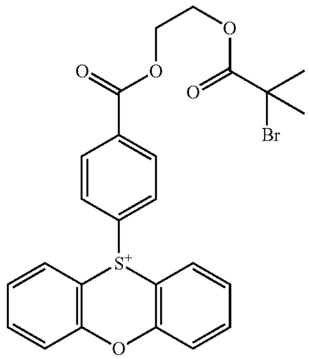
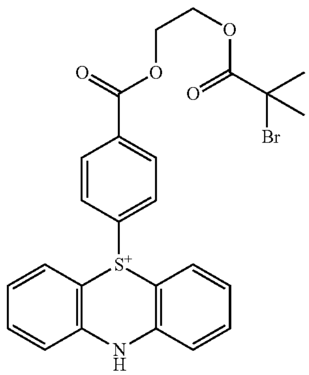
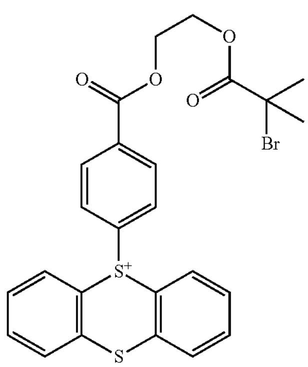
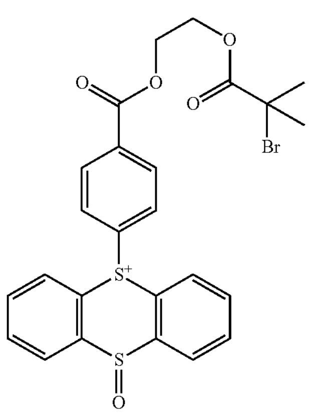
-continued
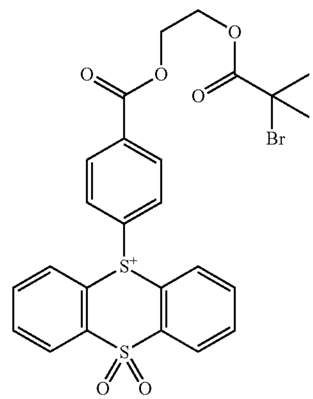
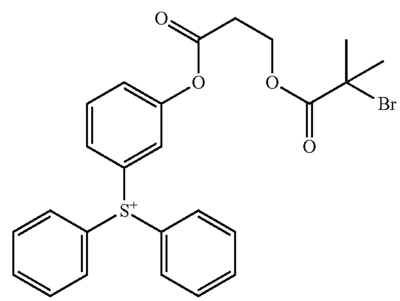
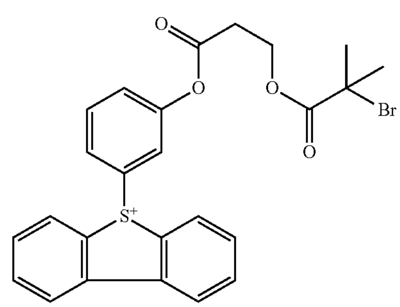
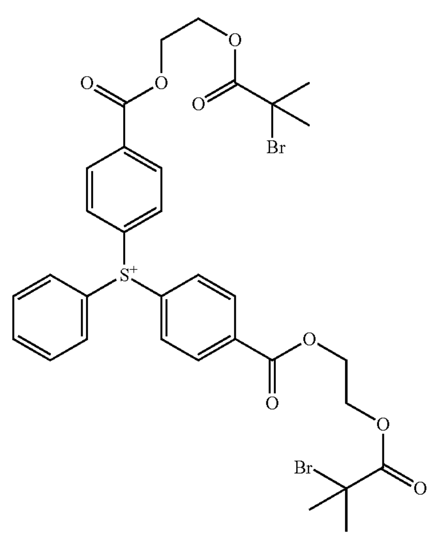

-continued
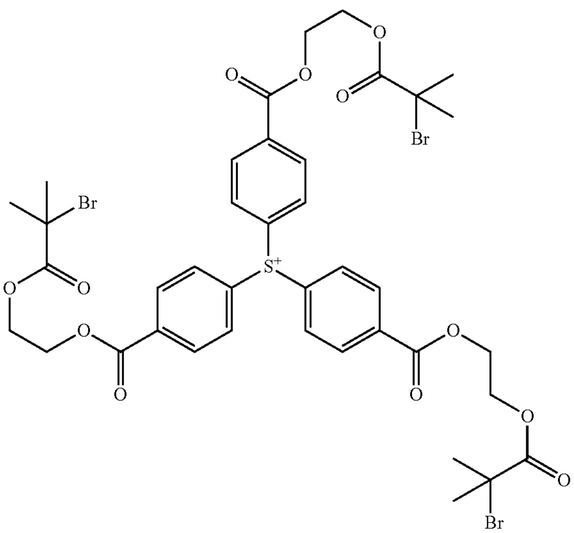
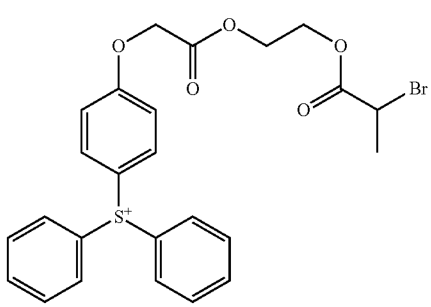
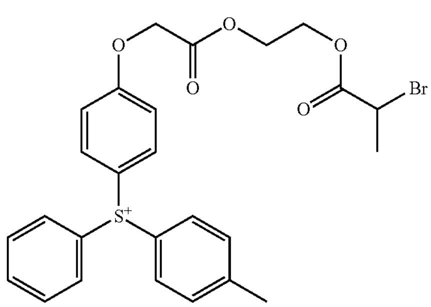
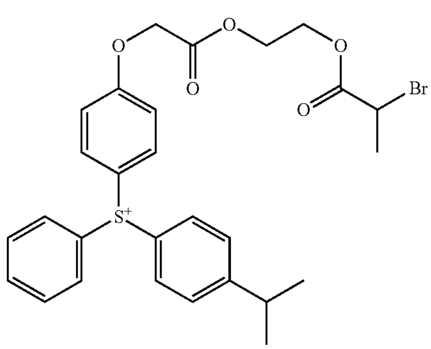
-continued
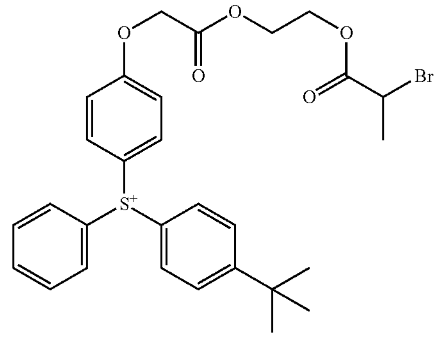
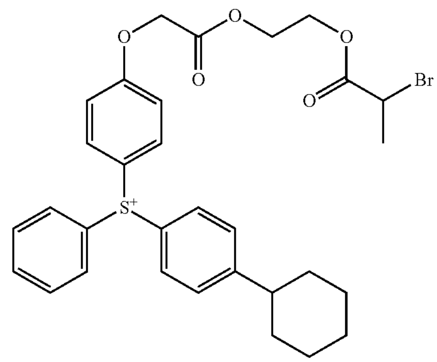
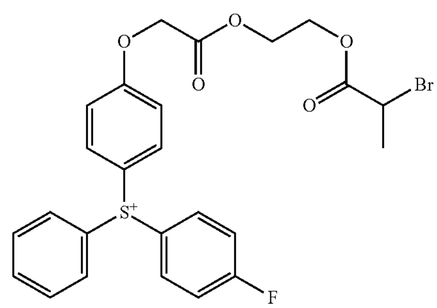
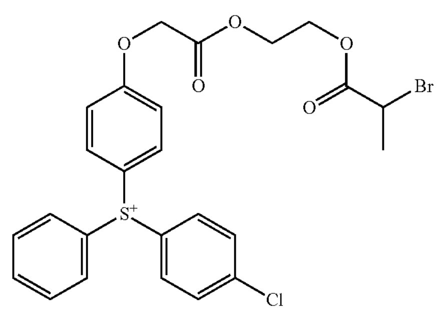
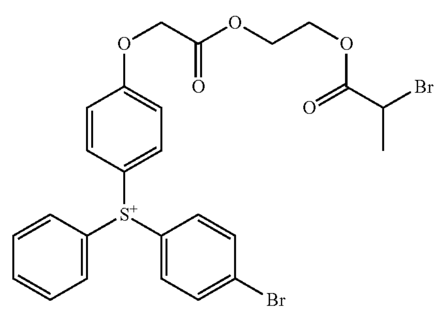

-continued
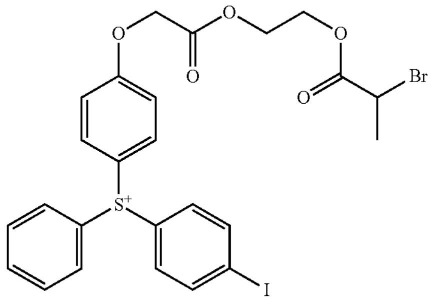
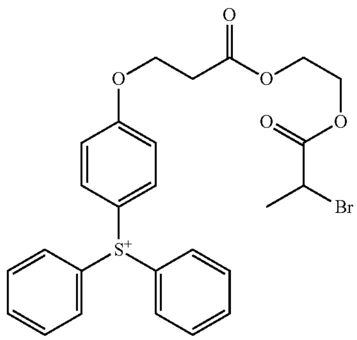
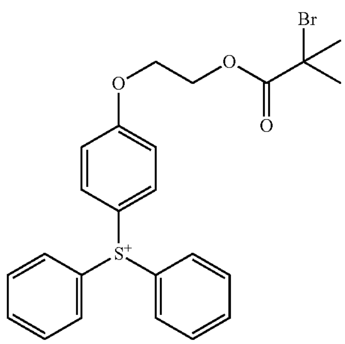
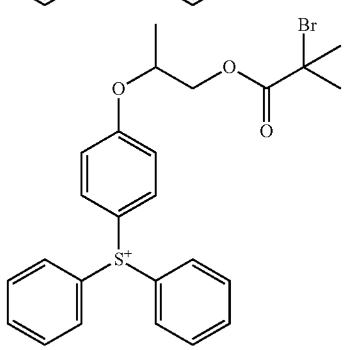
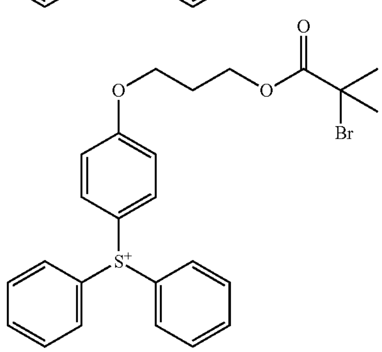
-continued
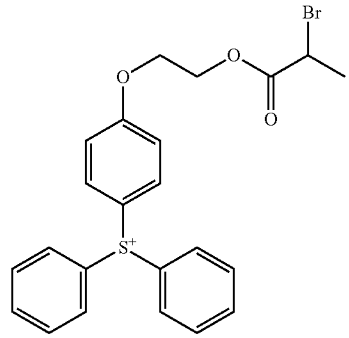
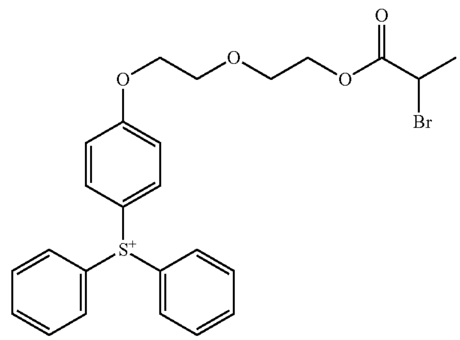
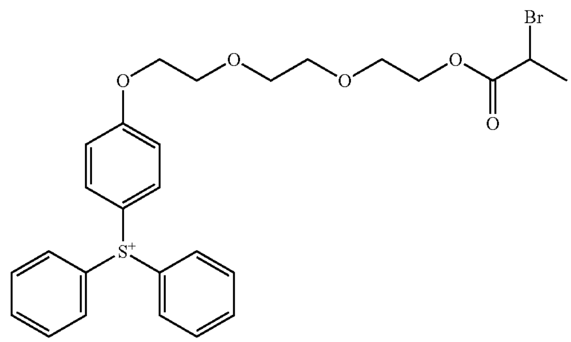
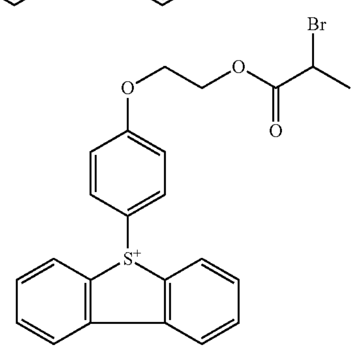
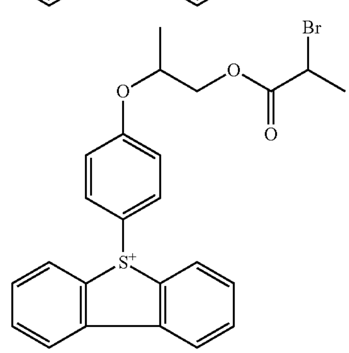

-continued
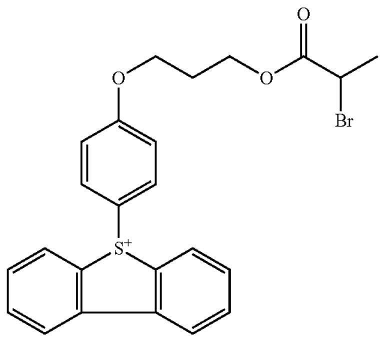
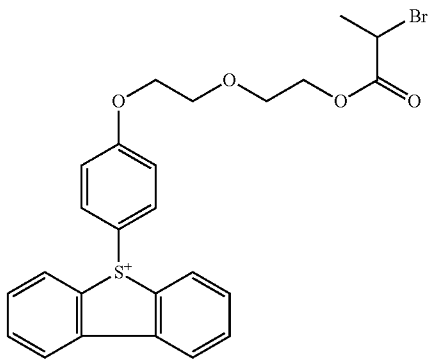
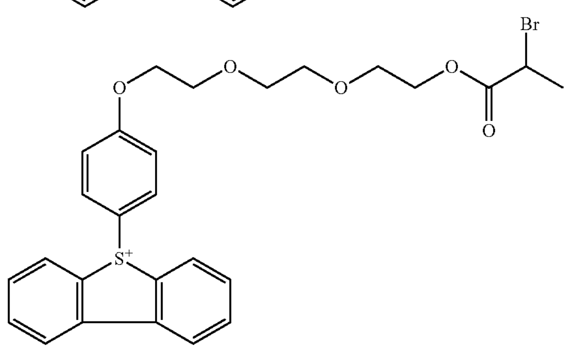
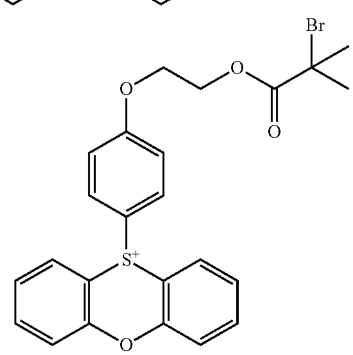
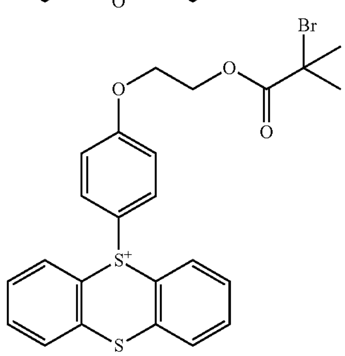
-continued
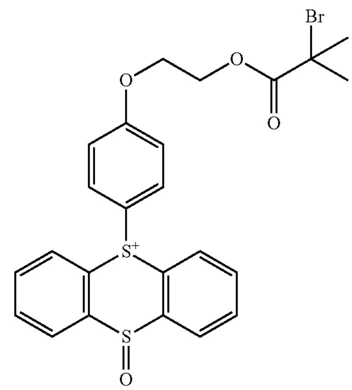
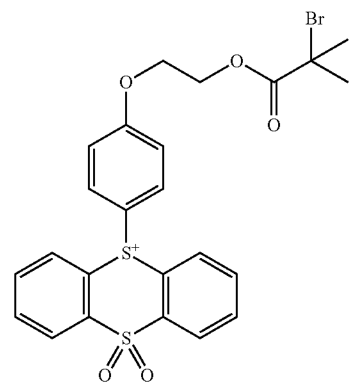
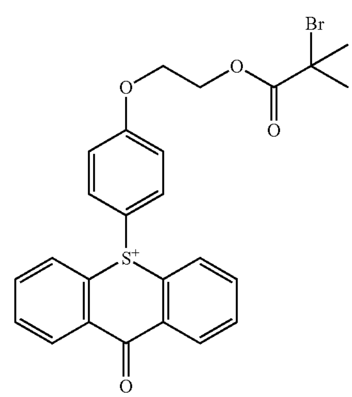
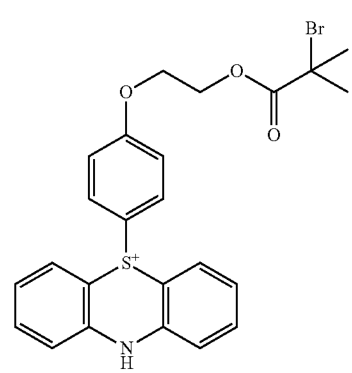

-continued
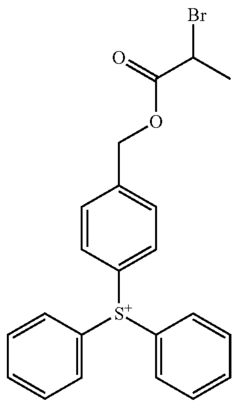
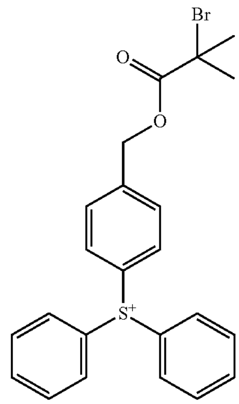
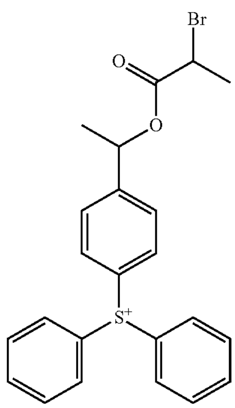
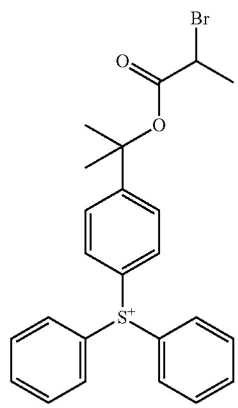
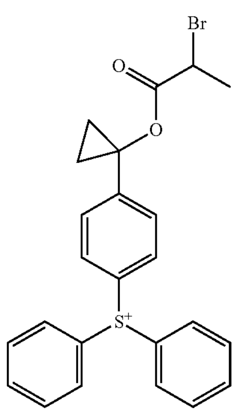
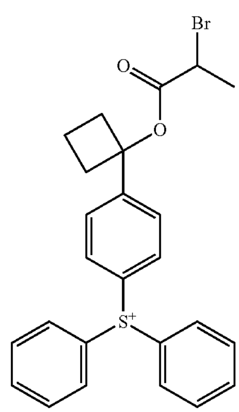
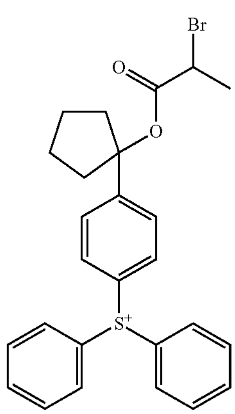
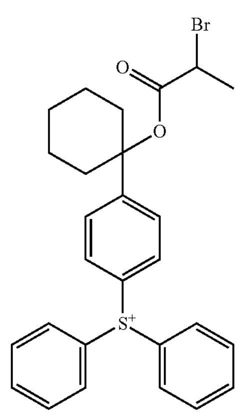
-continued
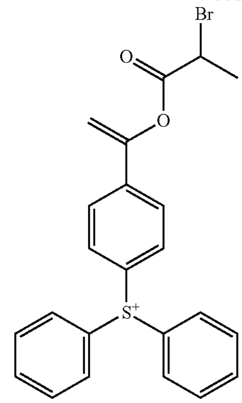
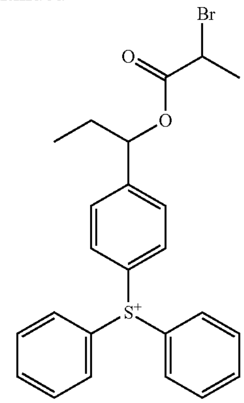
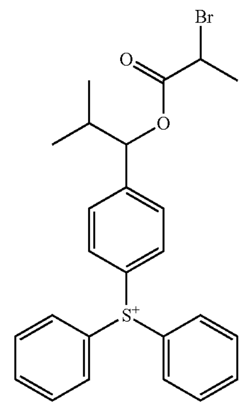
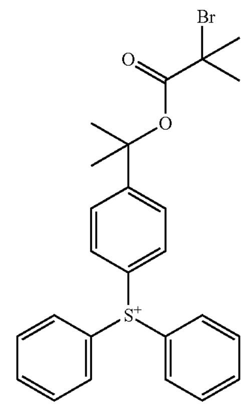
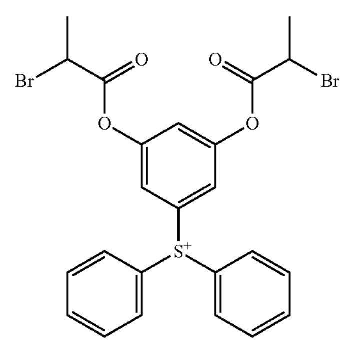
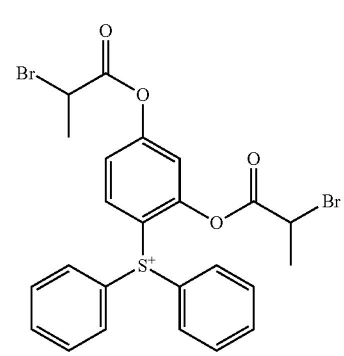

-continued
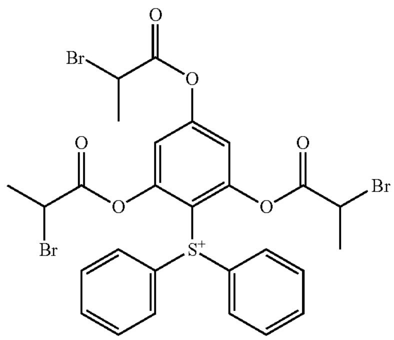
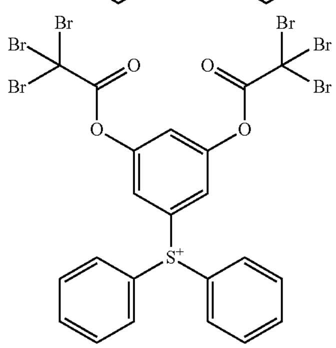
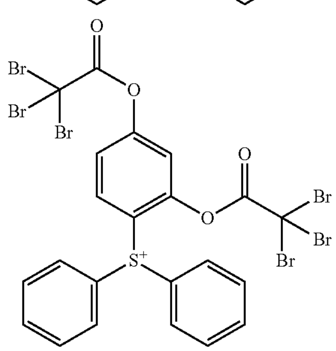
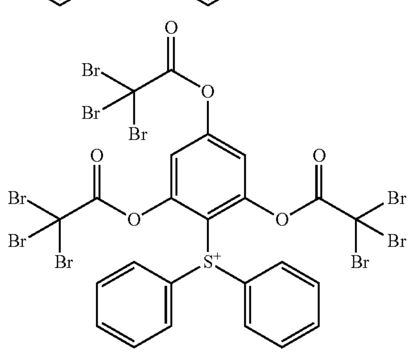
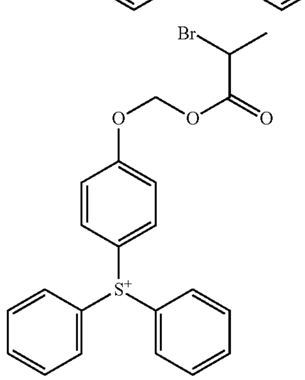
-continued
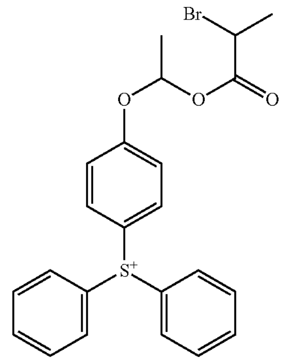
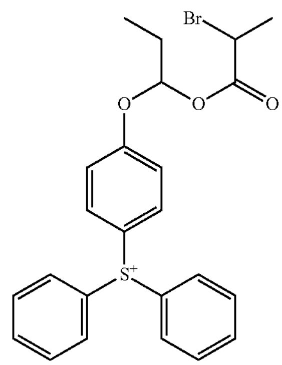
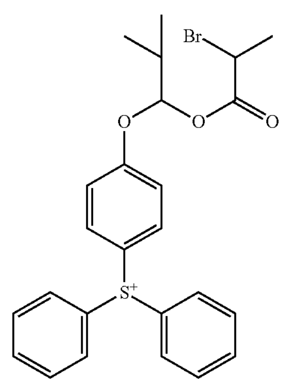
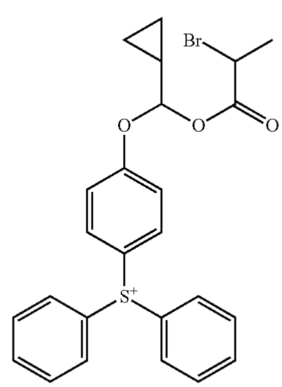

-continued
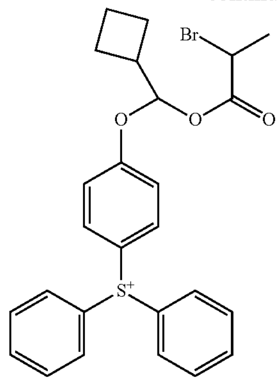
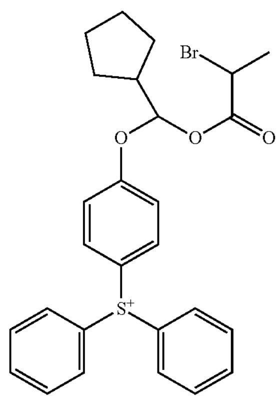
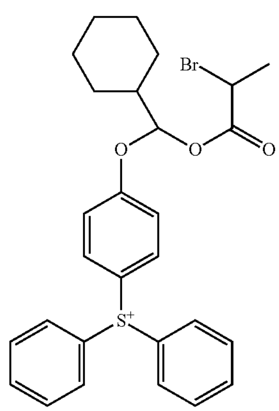
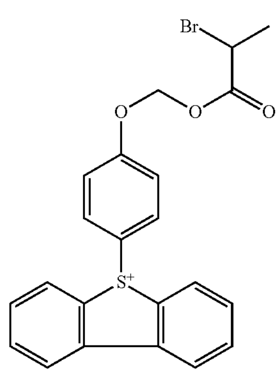
-continued
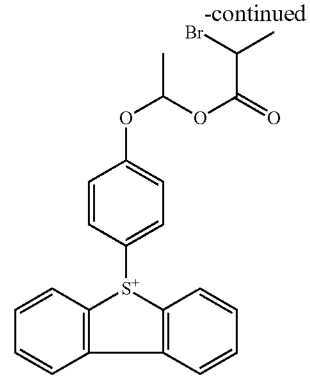
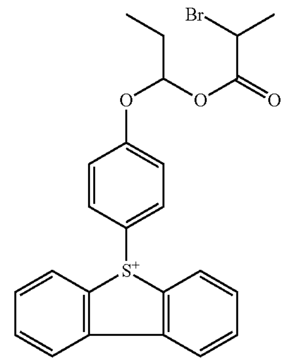
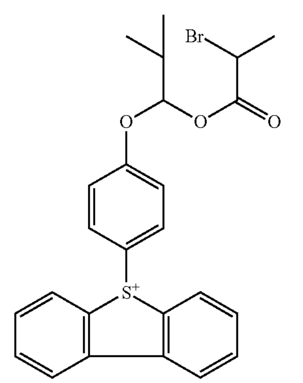
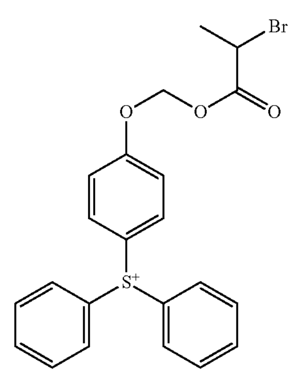

-continued
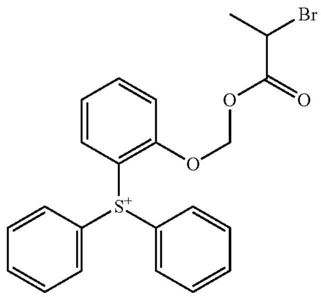
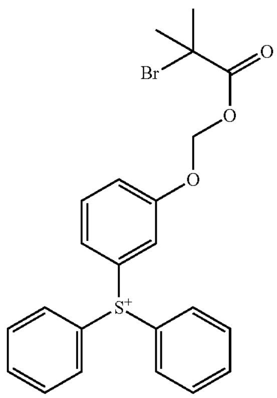
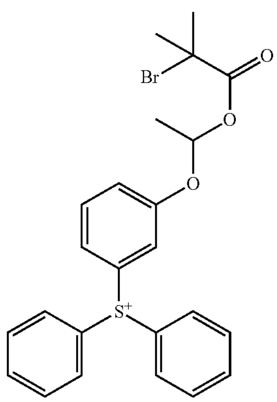
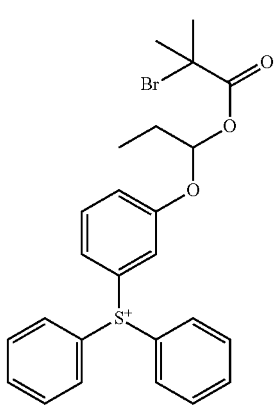
-continued
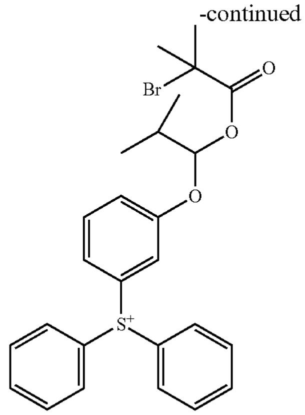
Examples of the cation in the iodonium salt having formula (A-2) are given below, but not limited thereto.
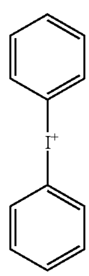
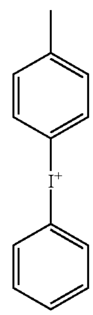
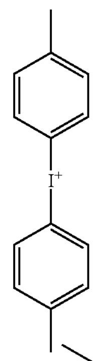
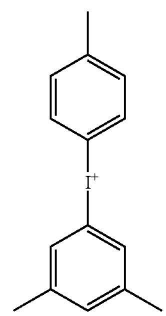
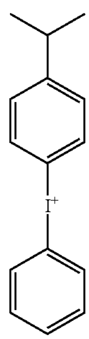
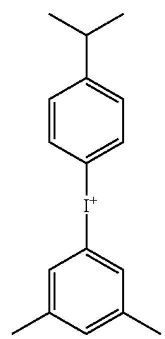
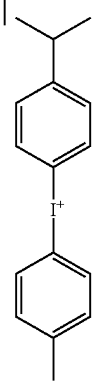
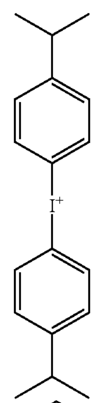
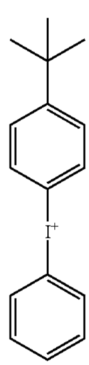
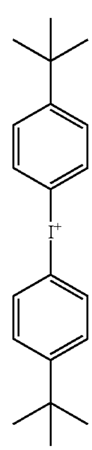
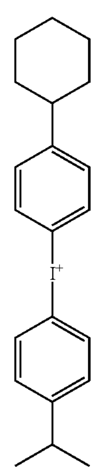
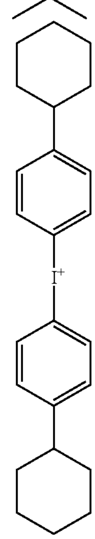

-continued
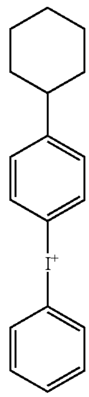
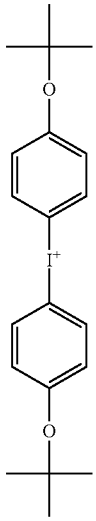
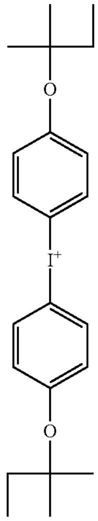
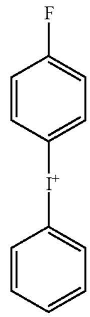
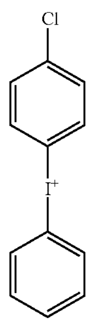
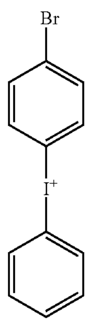
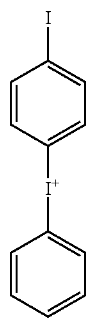
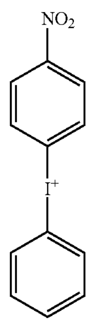
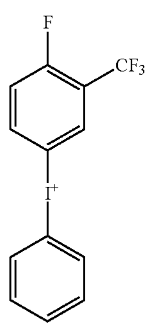
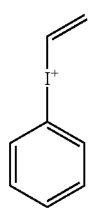
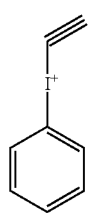
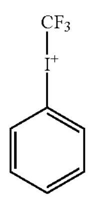
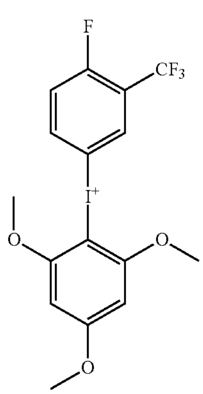
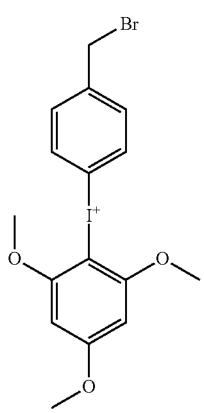
-continued
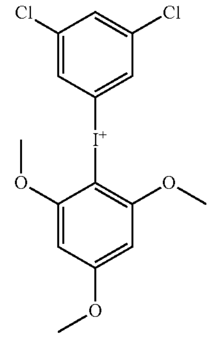
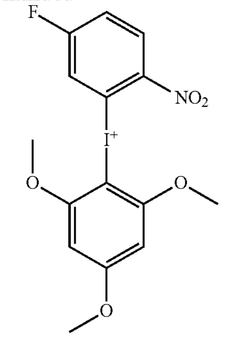
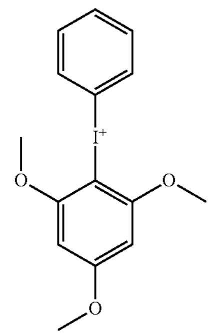
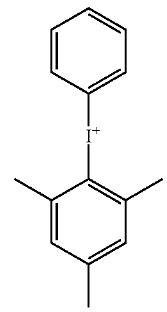
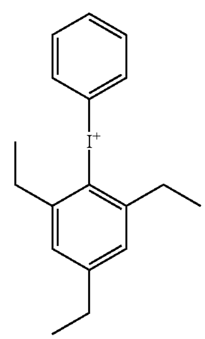
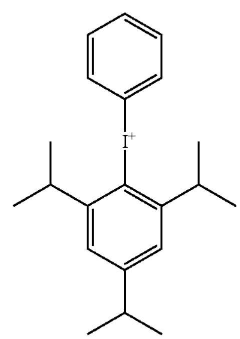
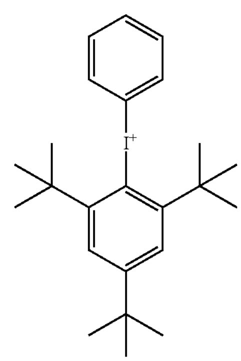
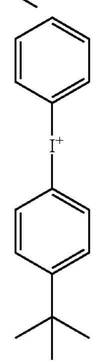
Examples of the anion in the sulfonium salt having formula (A-1) and the iodonium salt having formula (A-2) are given below, but not limited thereto.
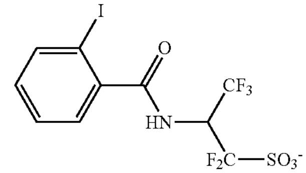

-continued
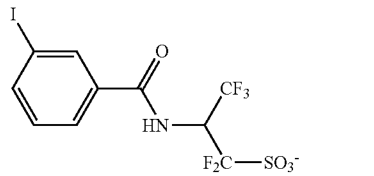
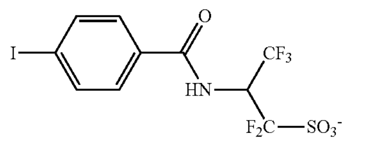
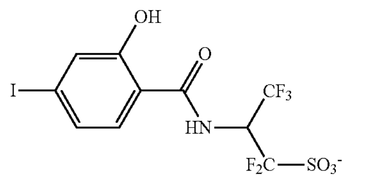
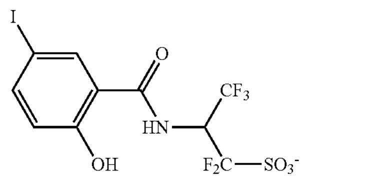
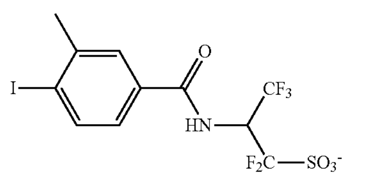
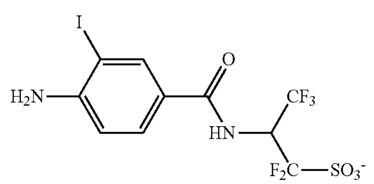
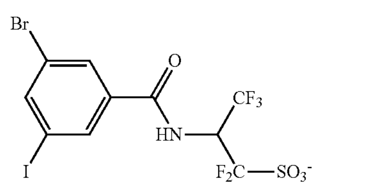
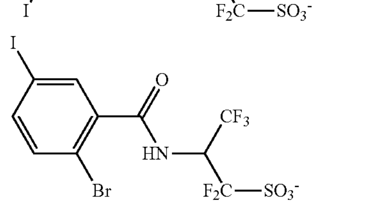
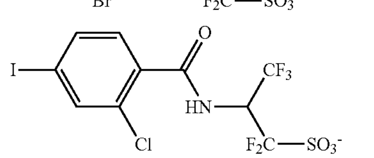
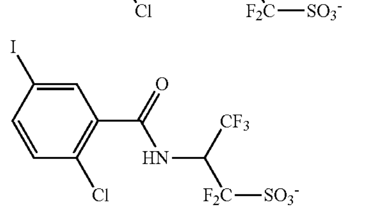
-continued
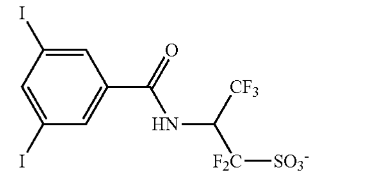
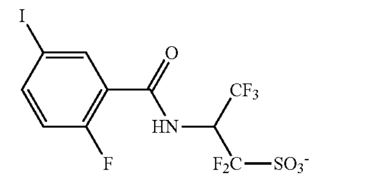
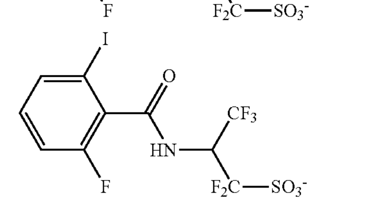
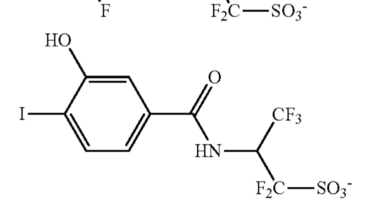
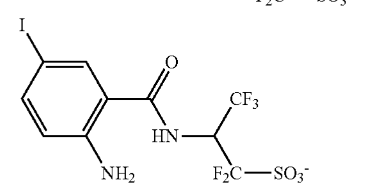
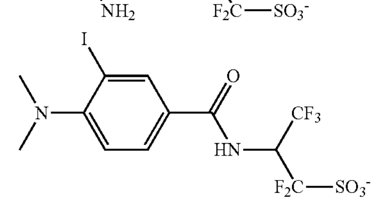
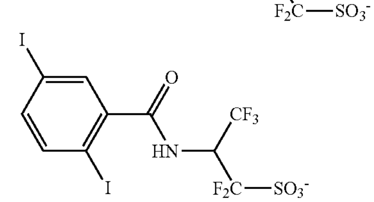
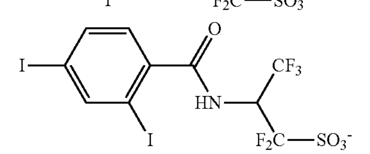
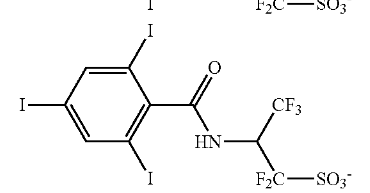
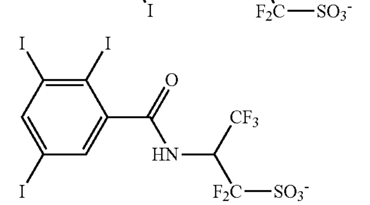

-continued
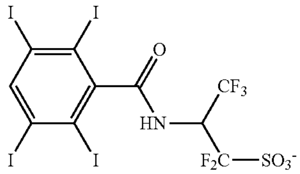
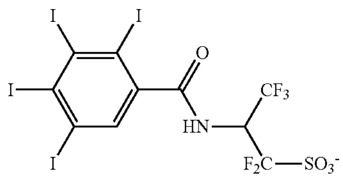
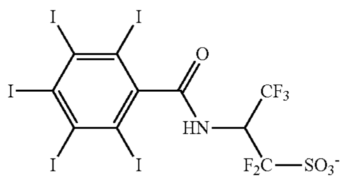
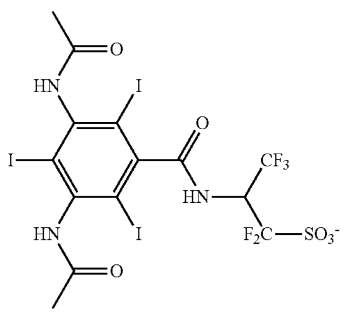
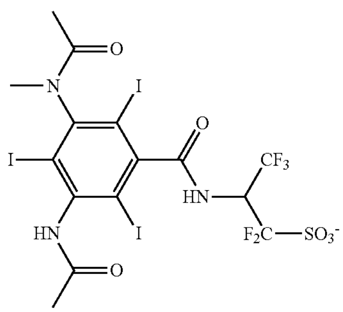
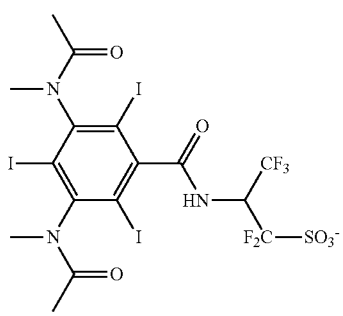
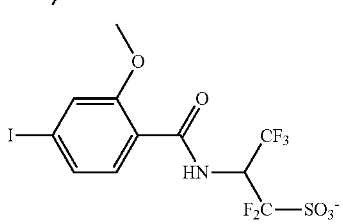
-continued
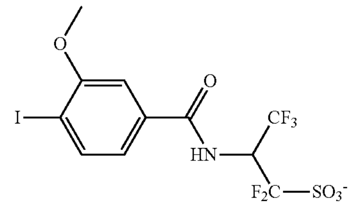
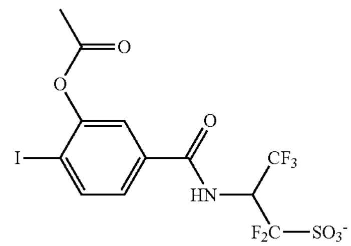
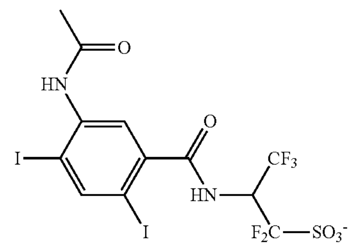
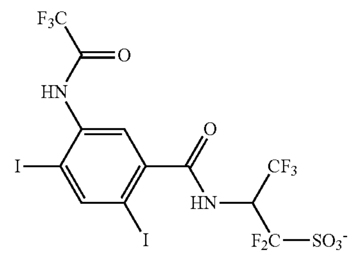
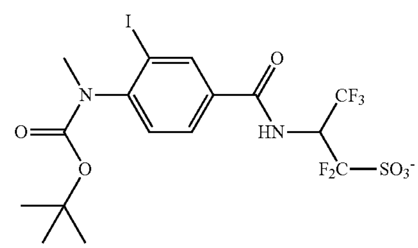
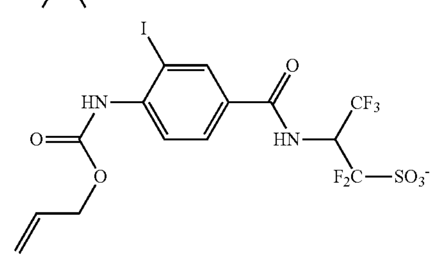
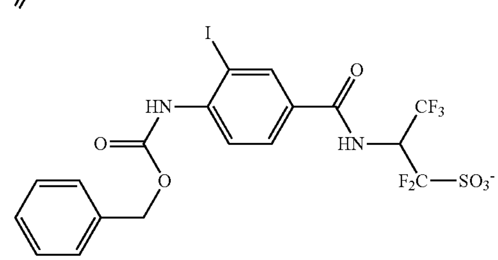

-continued
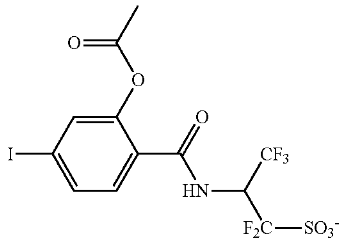
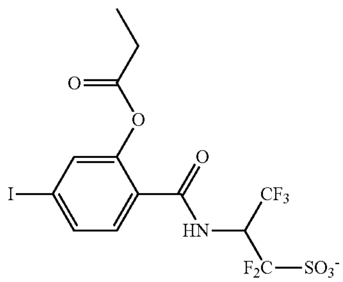
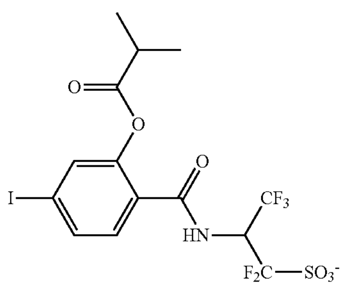
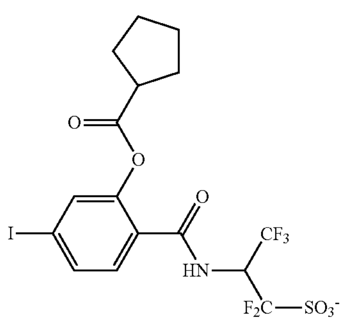
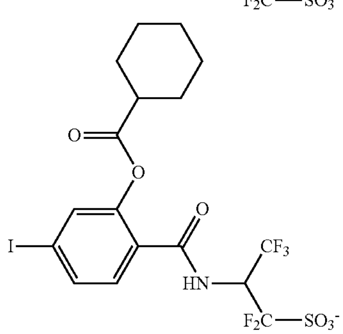
-continued
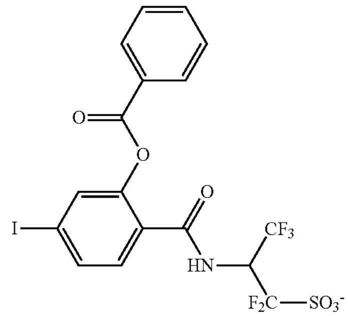
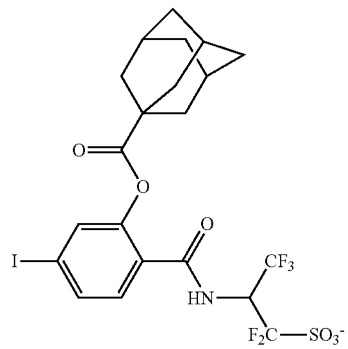
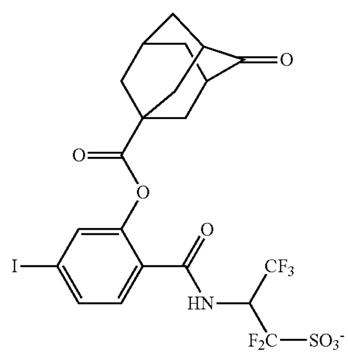
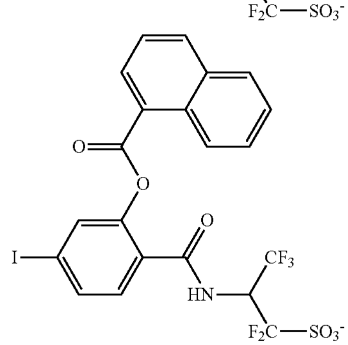
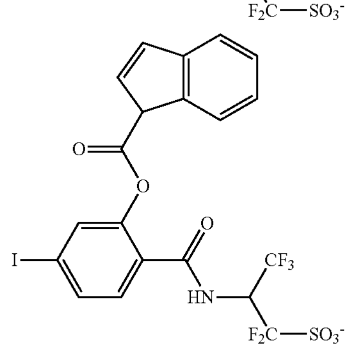

-continued
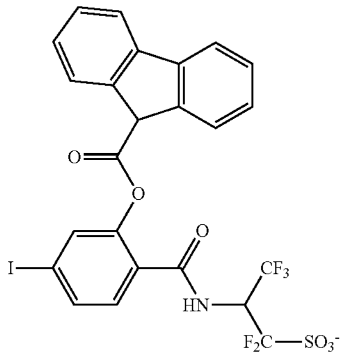
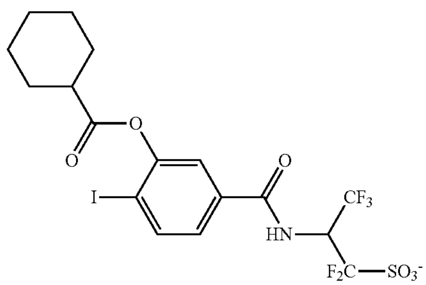
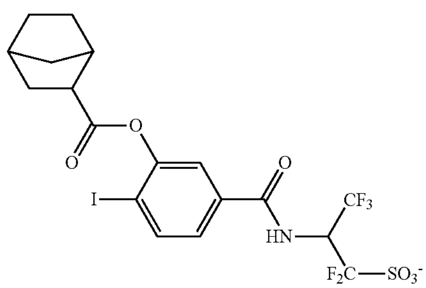
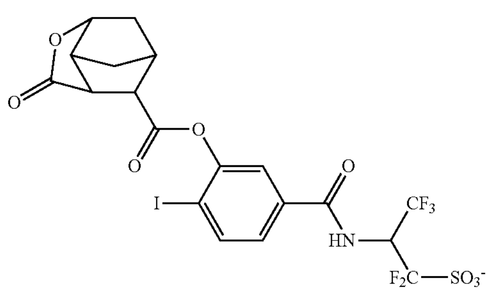
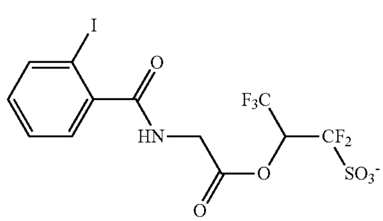
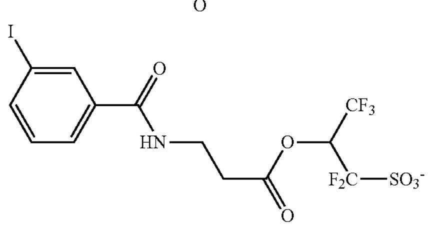
-continued
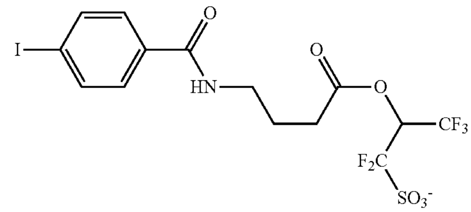
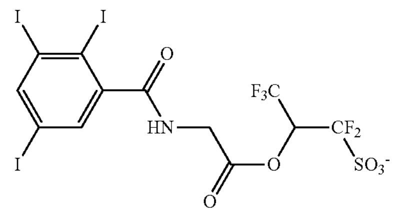
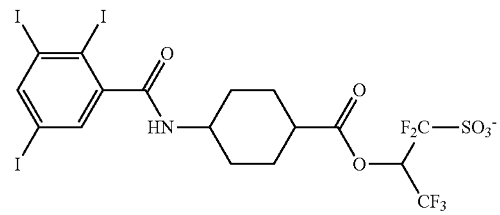
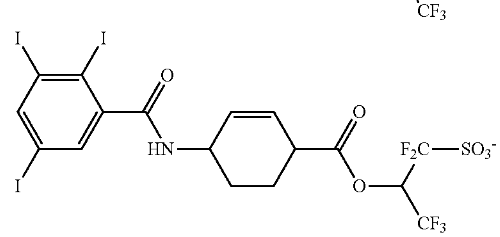
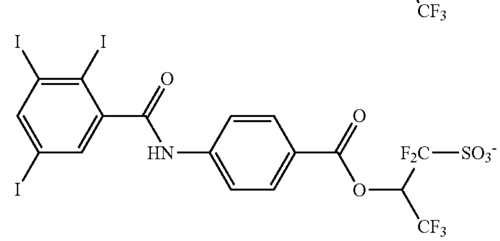
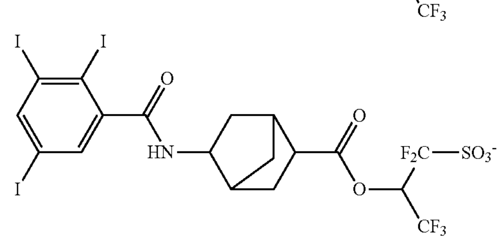
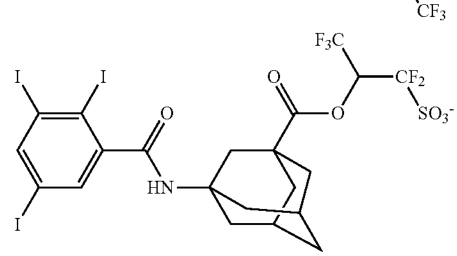
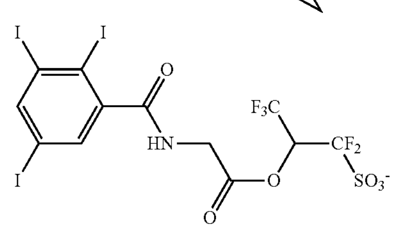

-continued
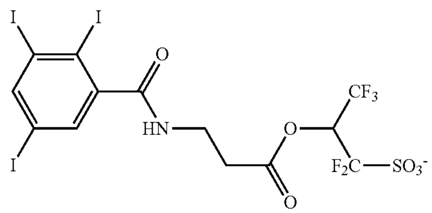
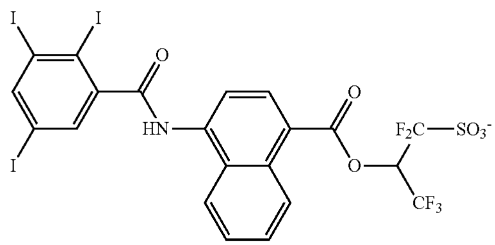
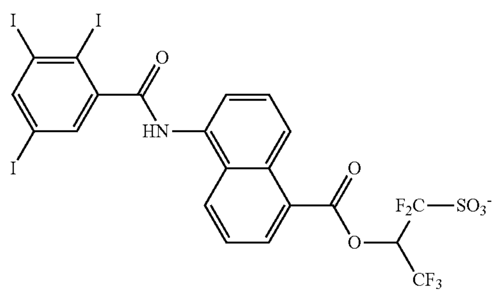
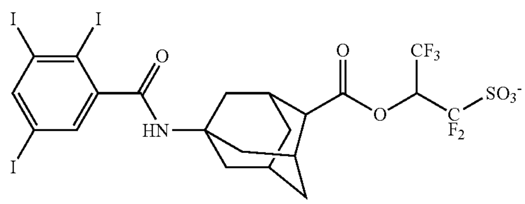
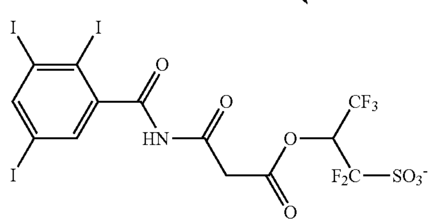
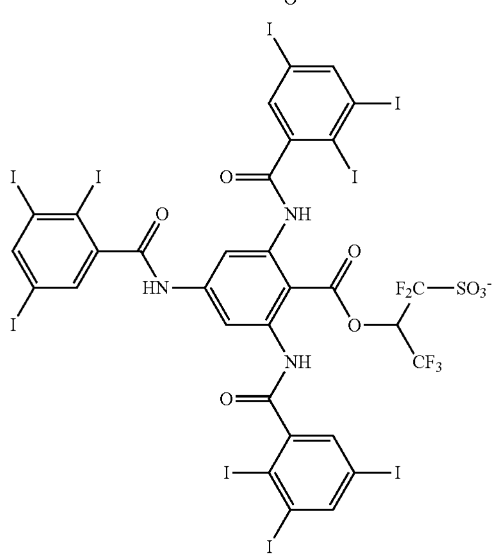
-continued
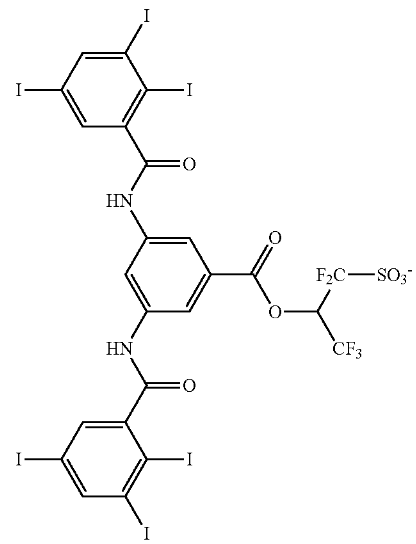
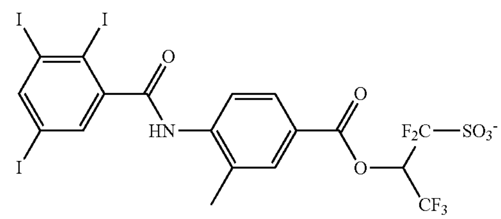
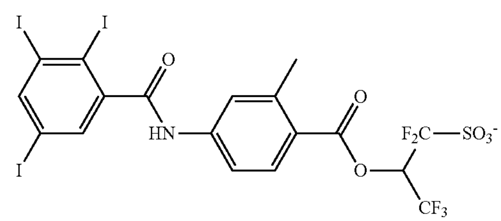
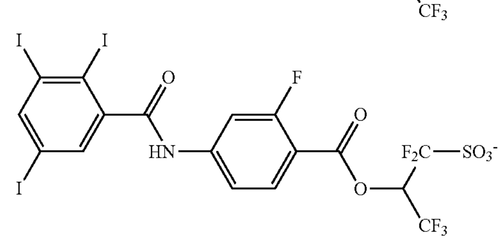
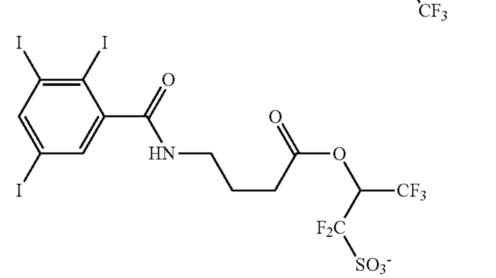
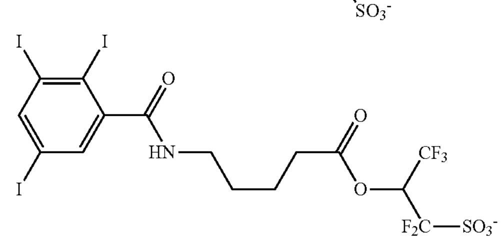

-continued
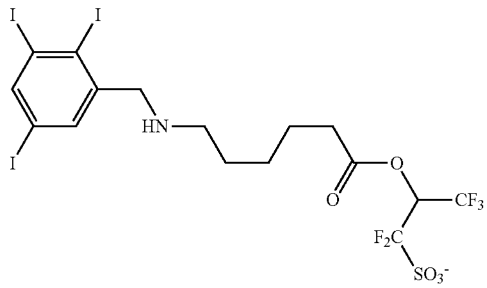
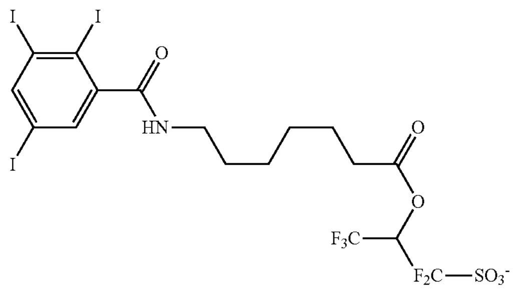
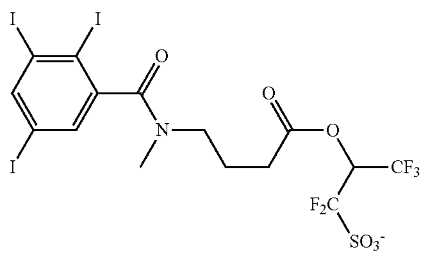
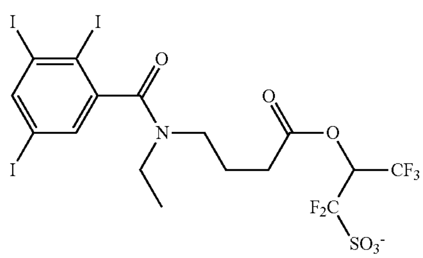
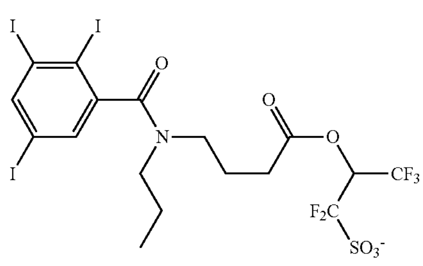
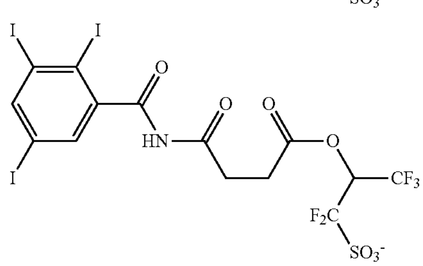
-continued
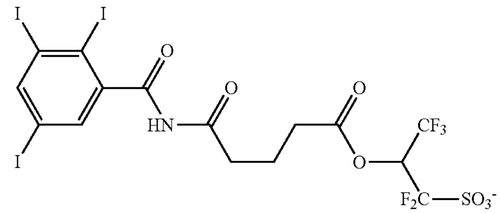
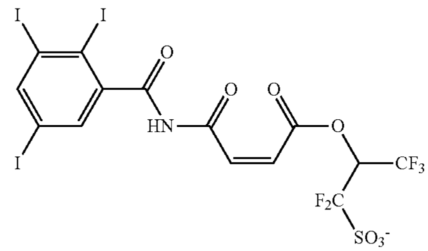
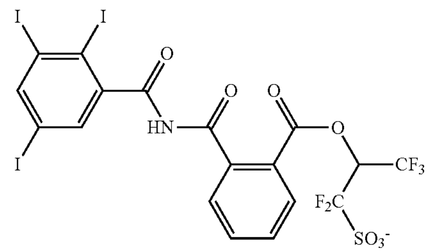
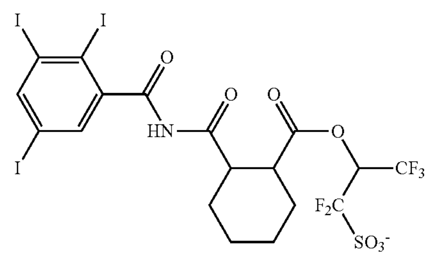
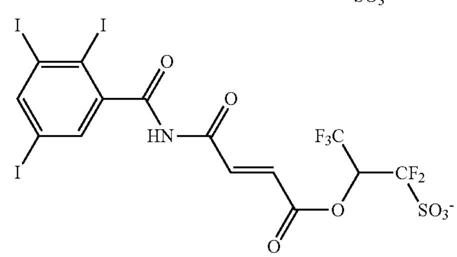
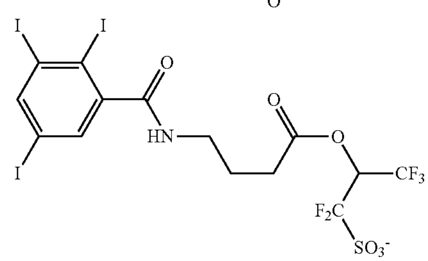
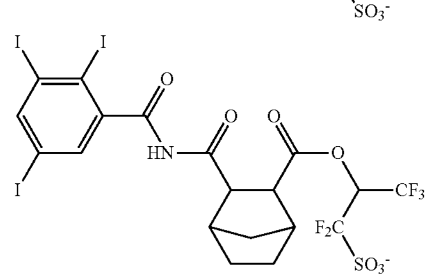

-continued
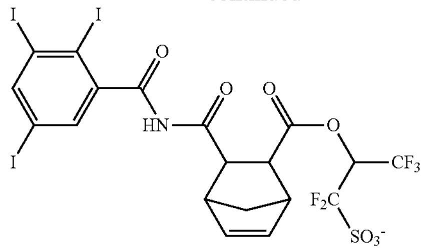
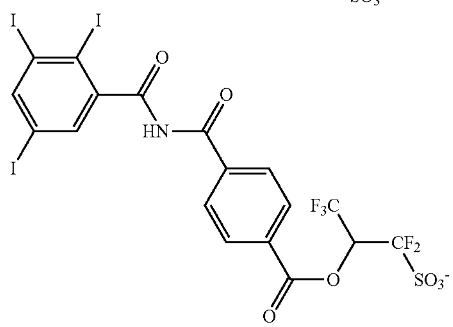
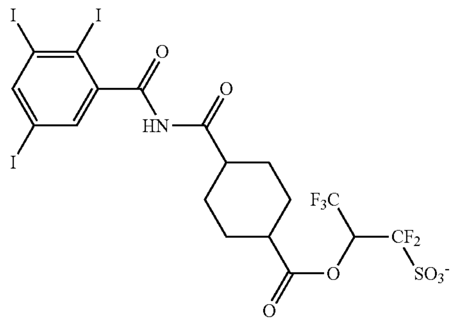
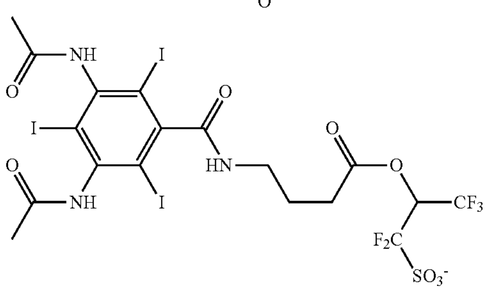
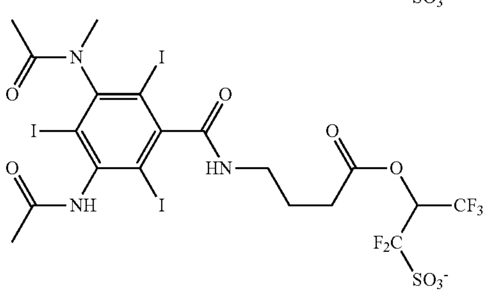
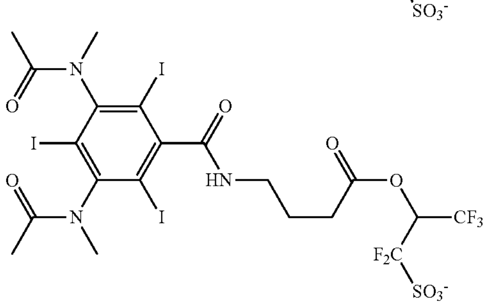
-continued
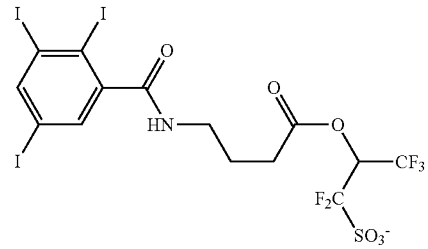
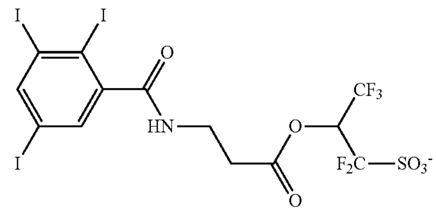
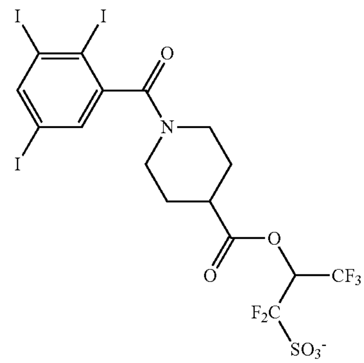
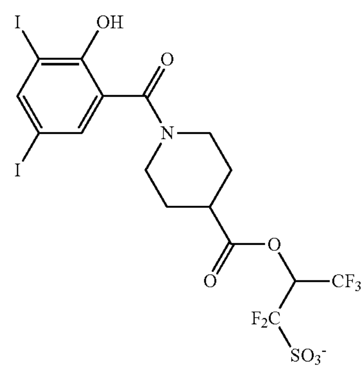
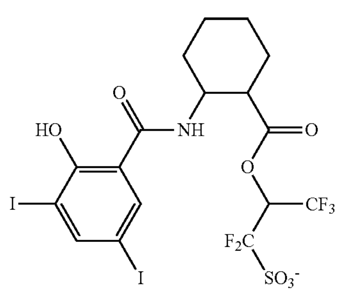

-continued
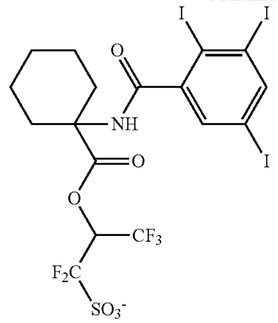
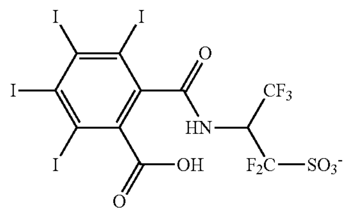
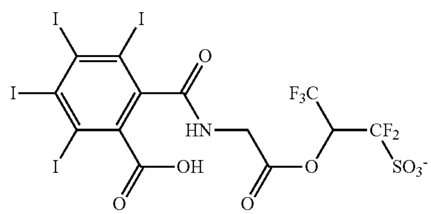
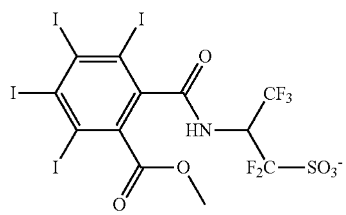
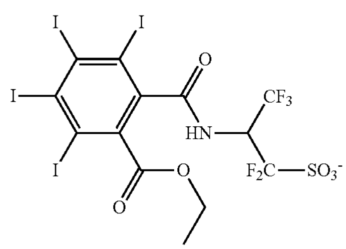
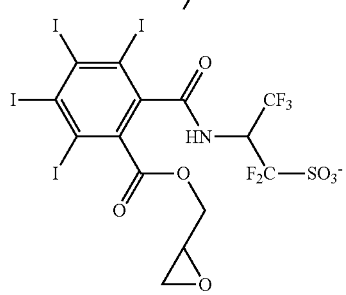
-continued
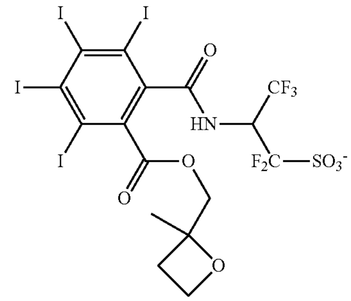
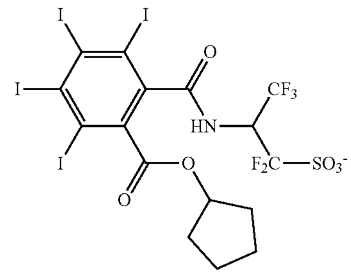
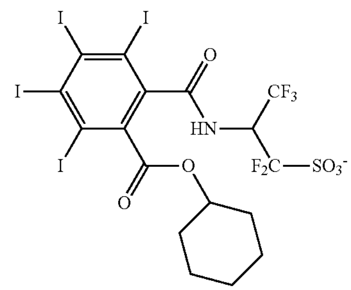
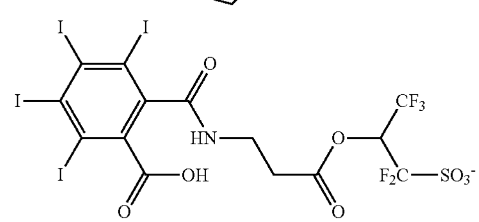
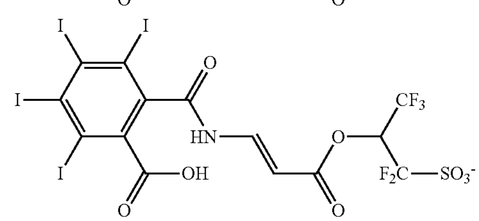
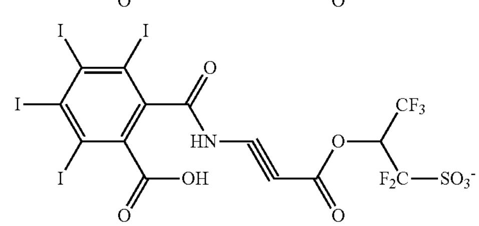
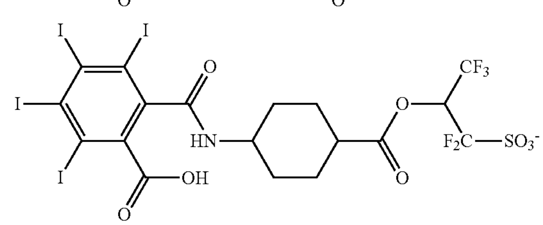

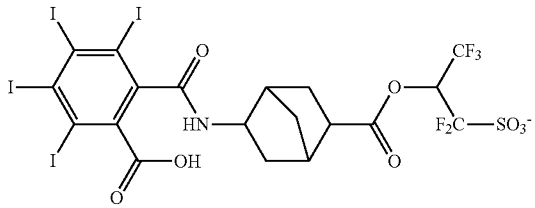
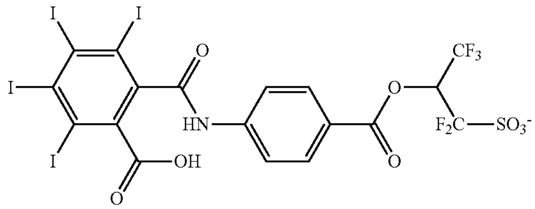
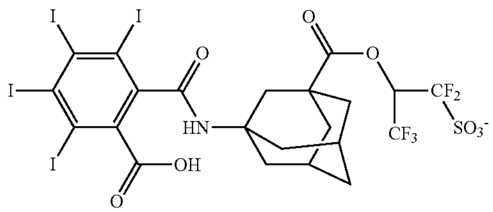
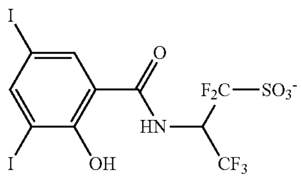
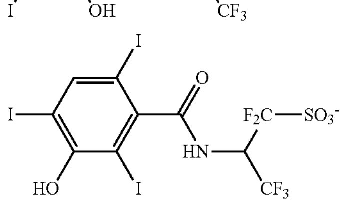
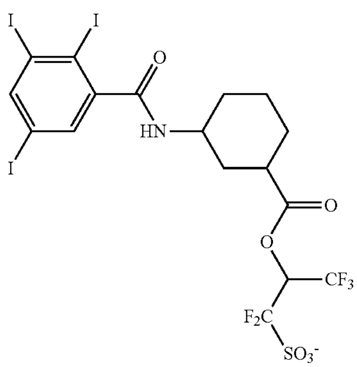
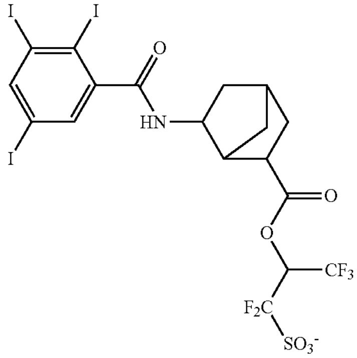
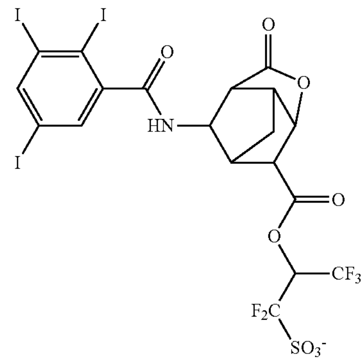
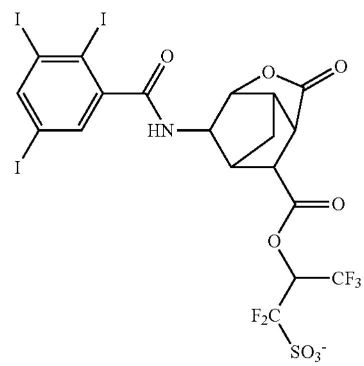
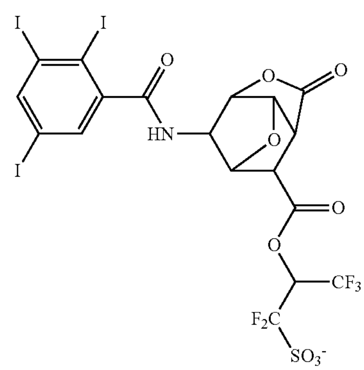
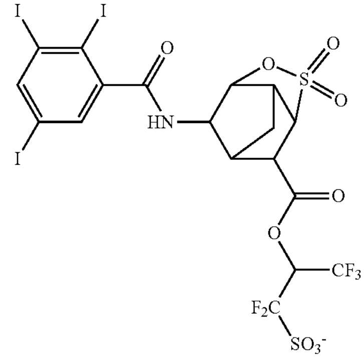

-continued
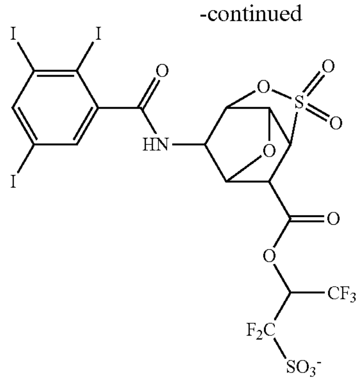
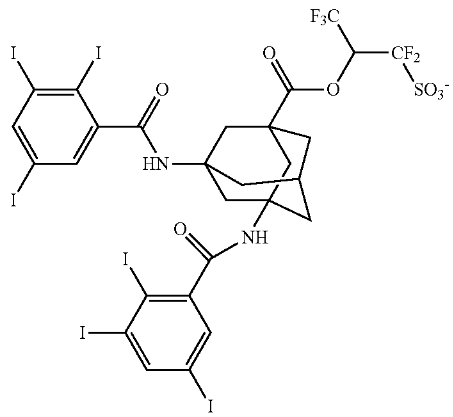
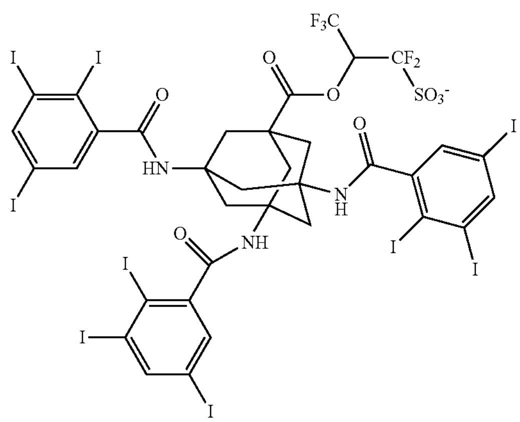
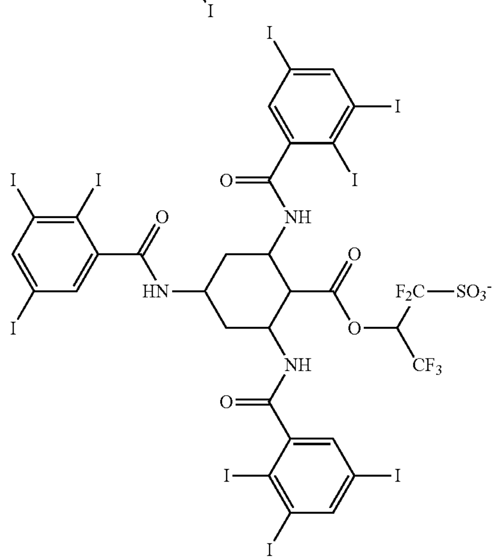
-continued
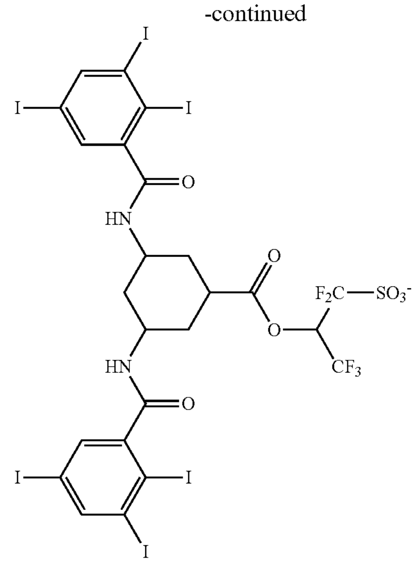
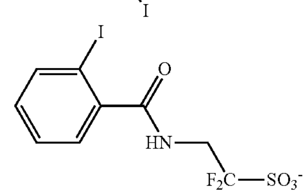
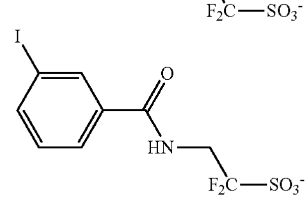
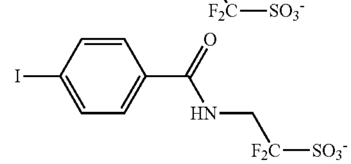
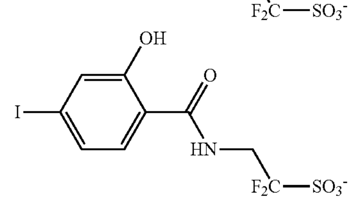
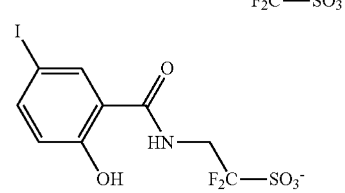
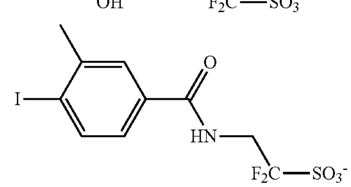
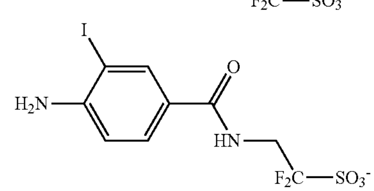

-continued
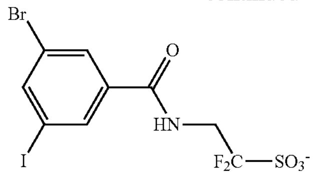
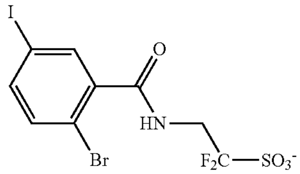
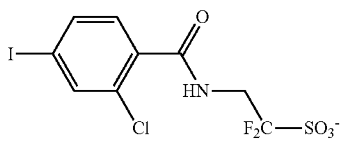
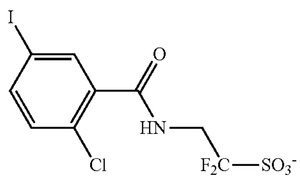
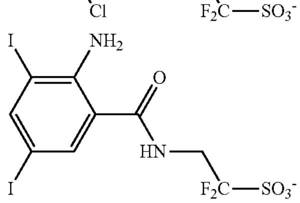
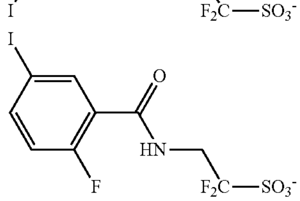
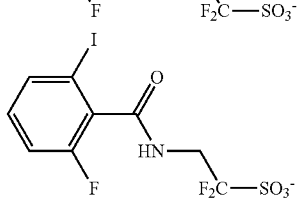
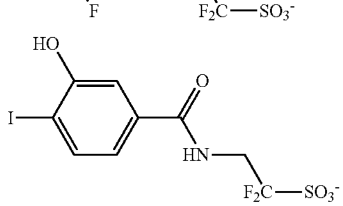
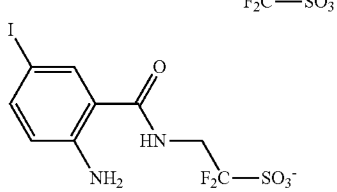
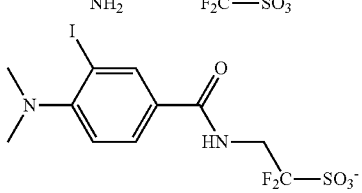
-continued
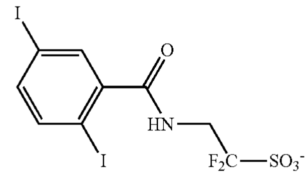
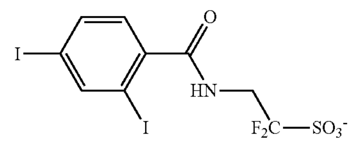
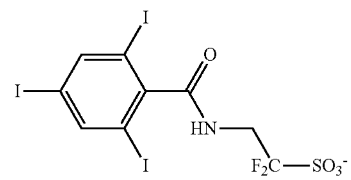
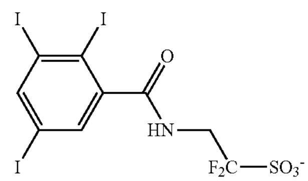
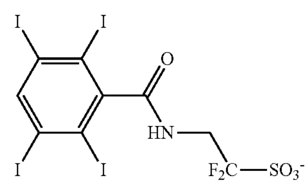
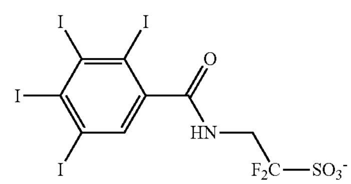
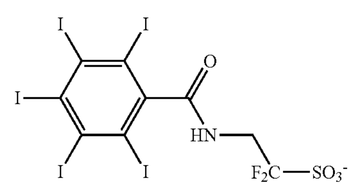
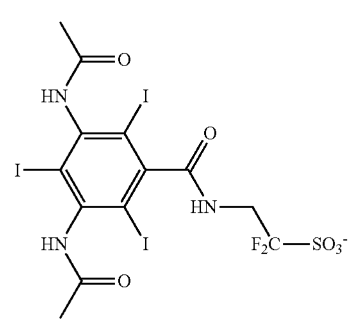

-continued
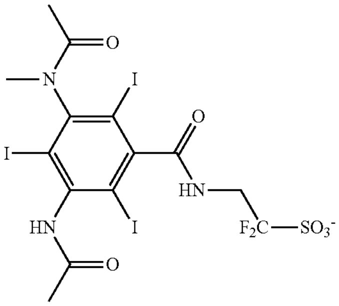
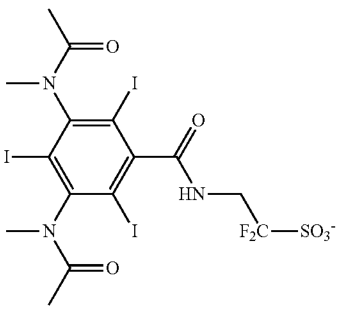
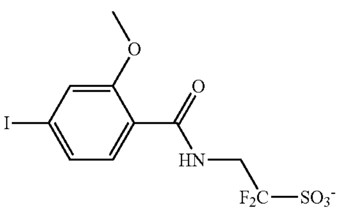
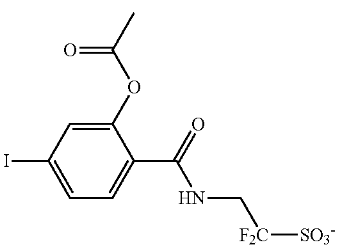
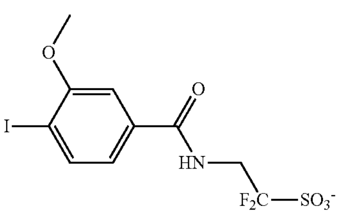
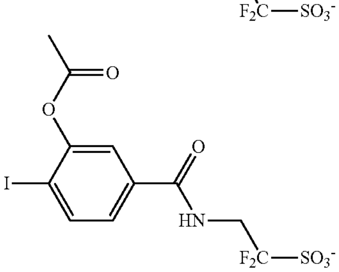
-continued
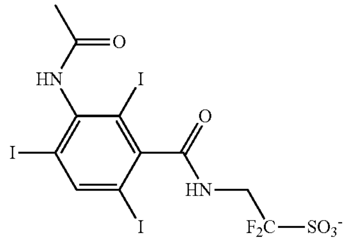
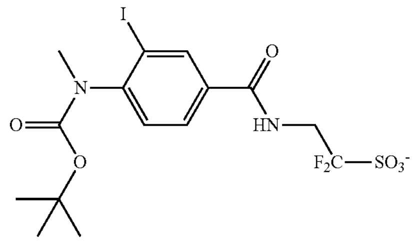
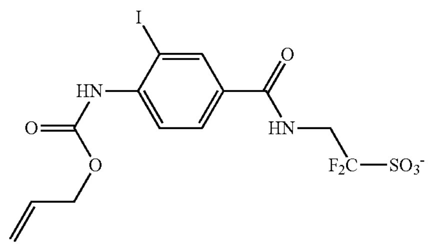
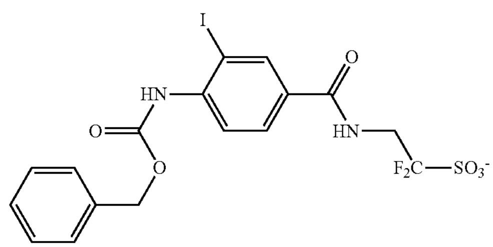
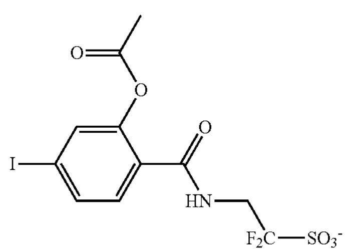
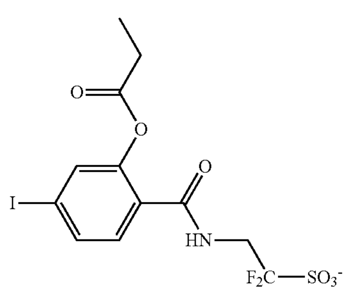

-continued
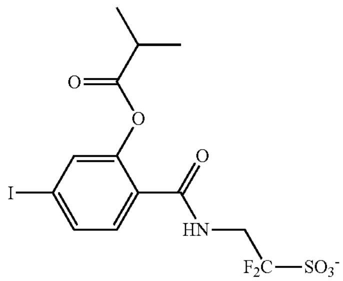
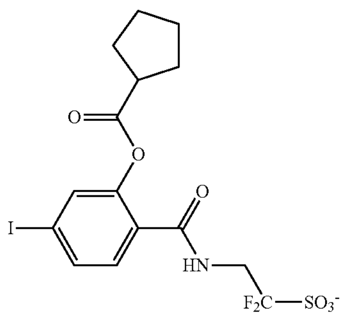
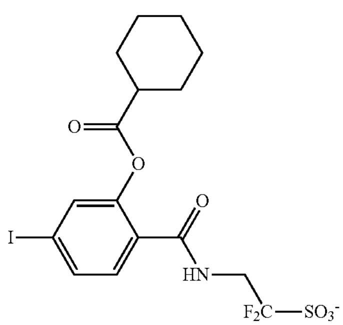
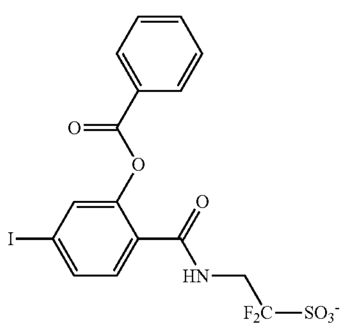
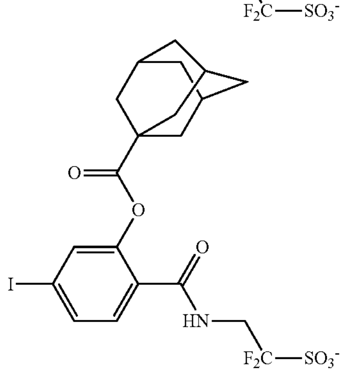
-continued
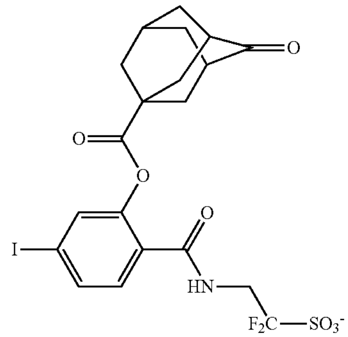
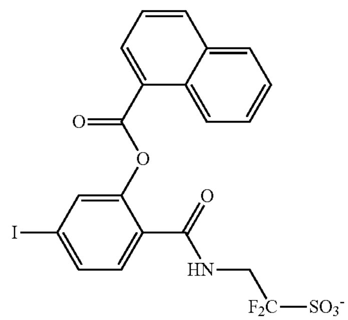
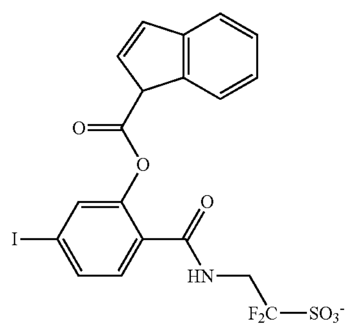
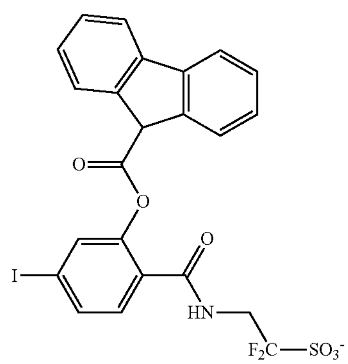
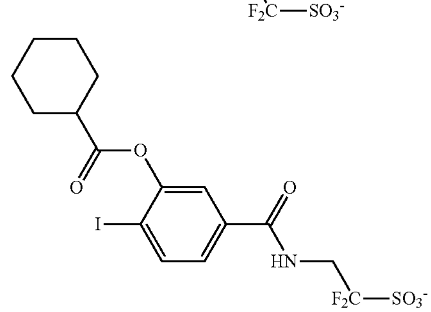

-continued
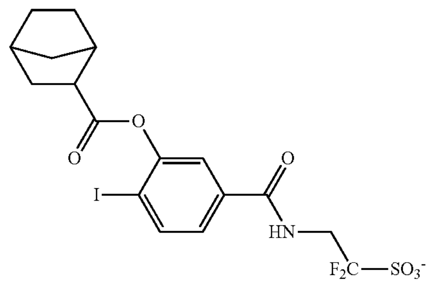
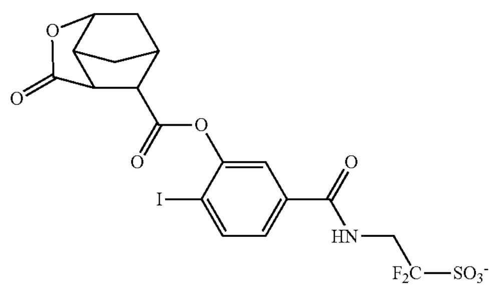
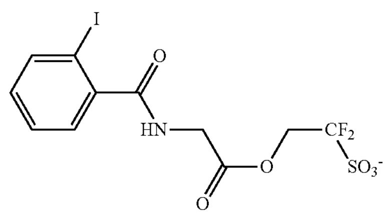
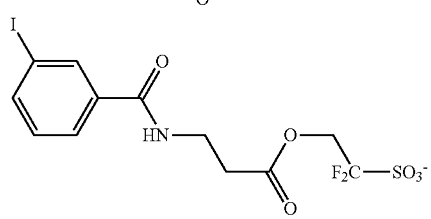
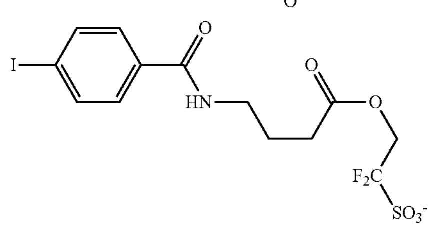
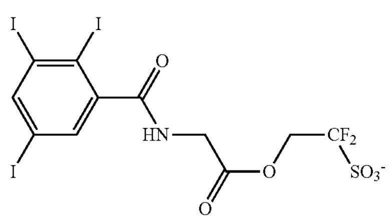
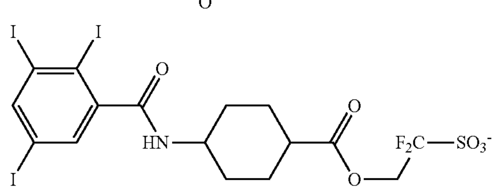
-continued
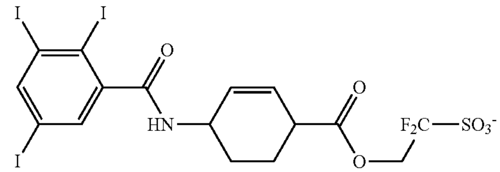
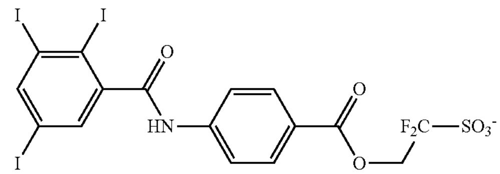
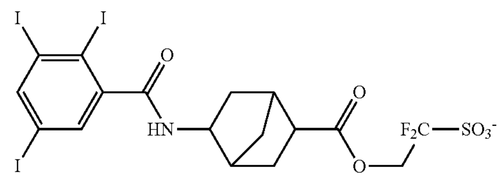
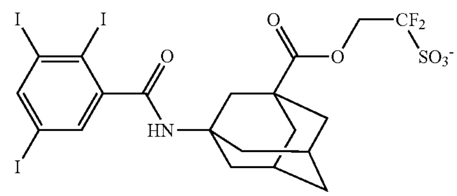
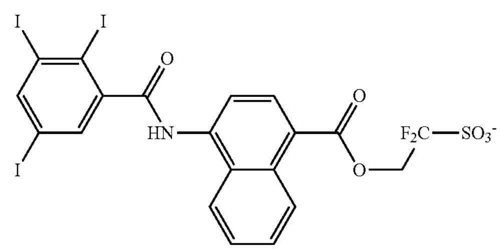
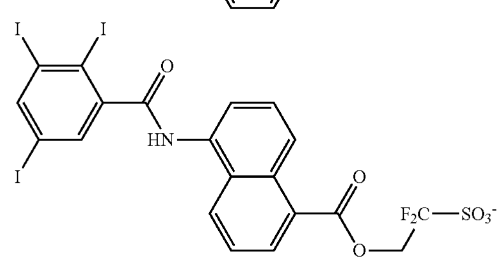
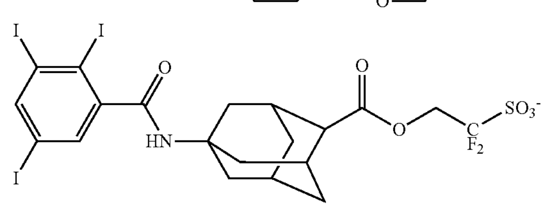

-continued
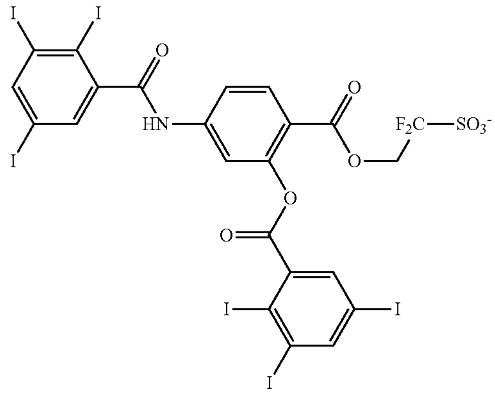
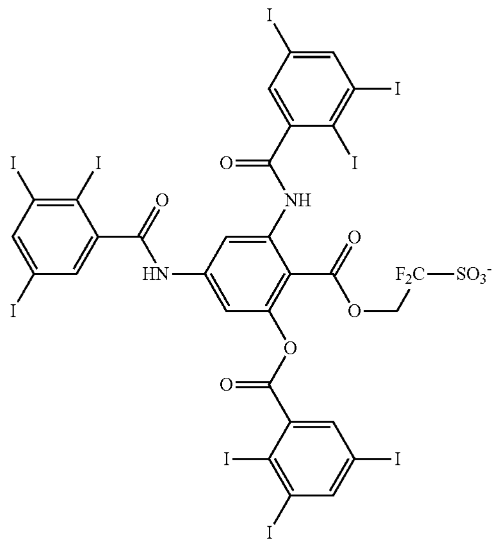
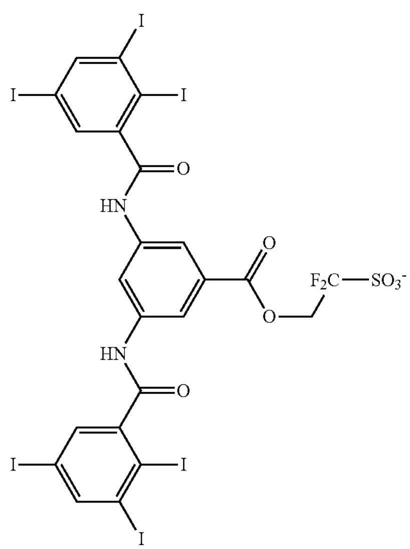
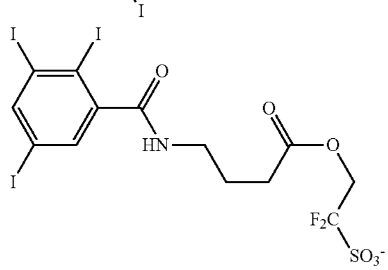
-continued
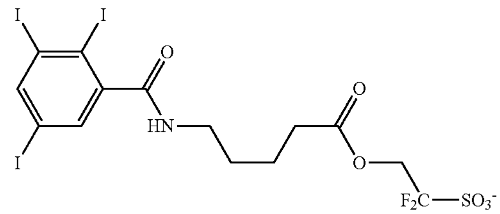
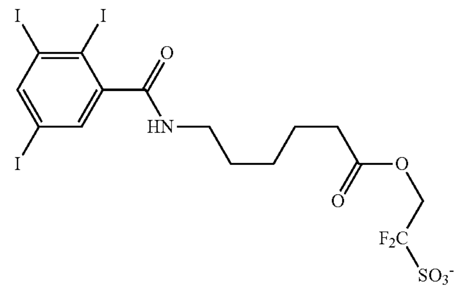
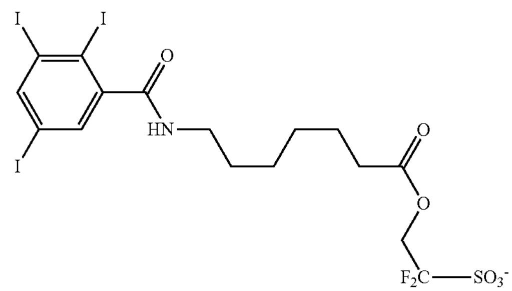
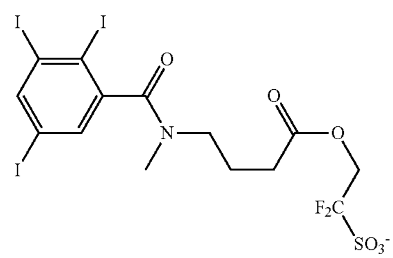
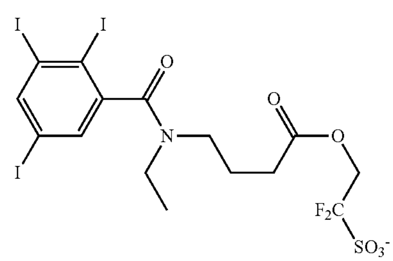
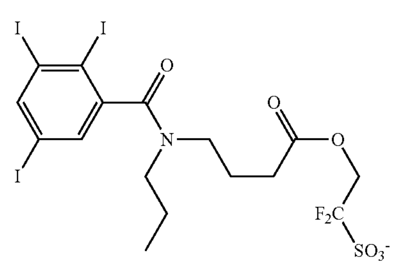

-continued
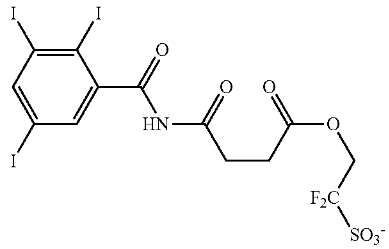
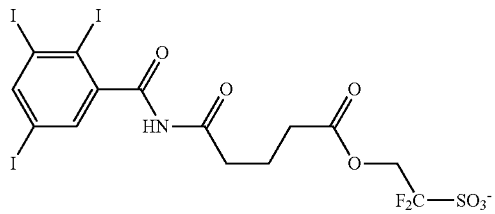
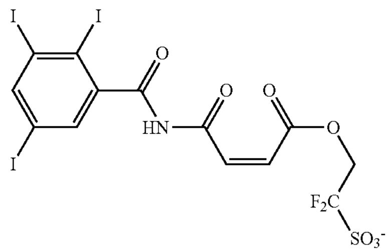
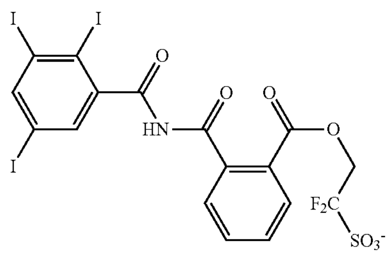
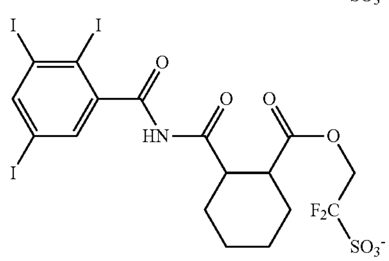
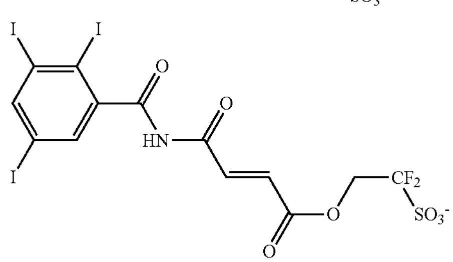
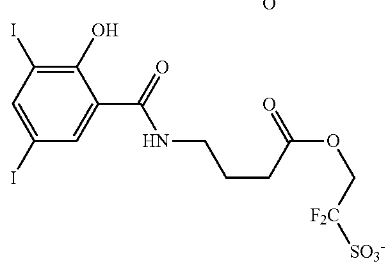
-continued
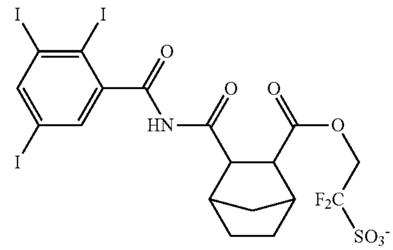
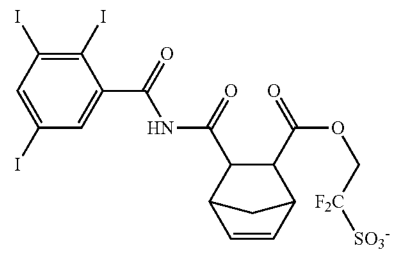
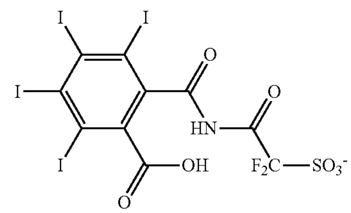
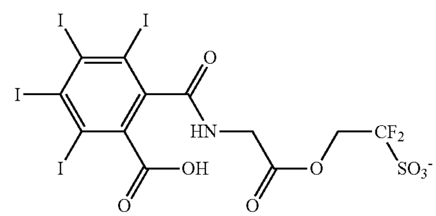
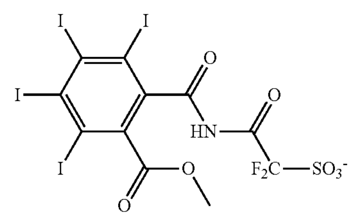
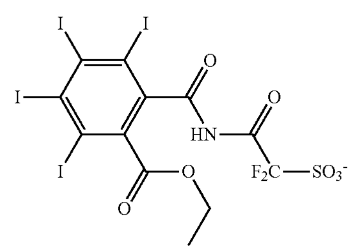
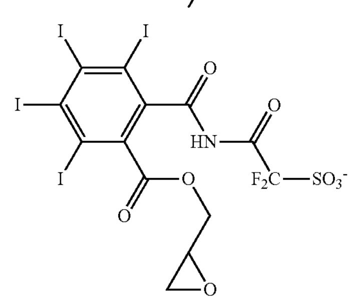

-continued
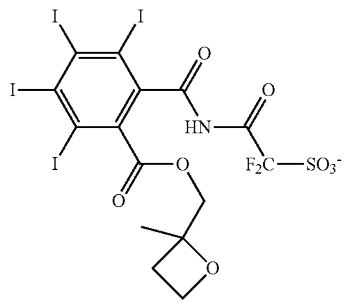
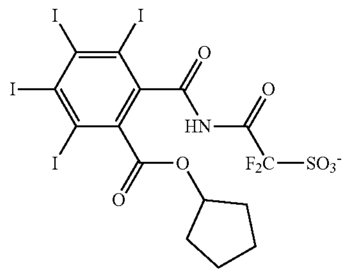
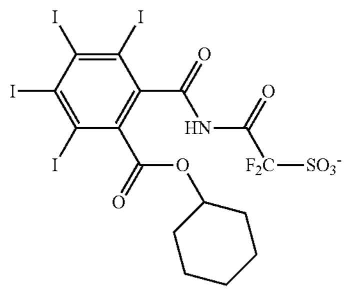
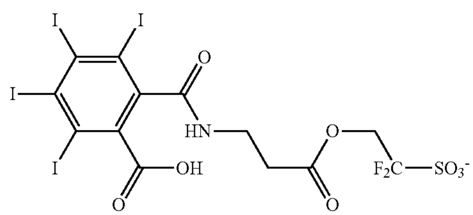
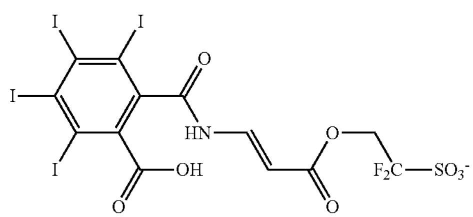
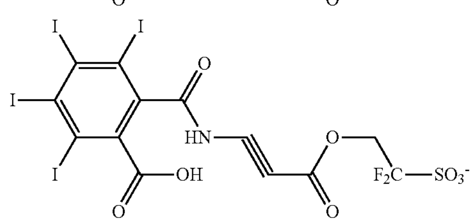
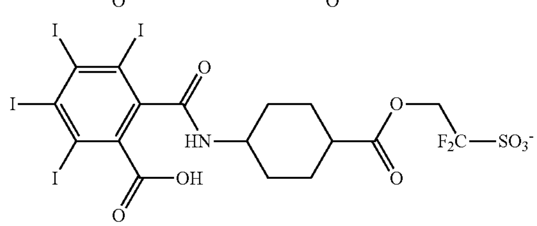
-continued
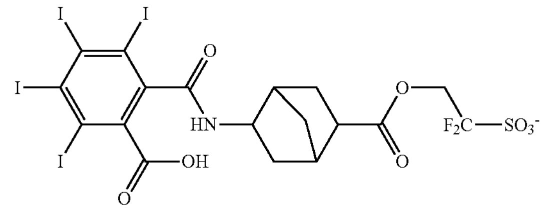
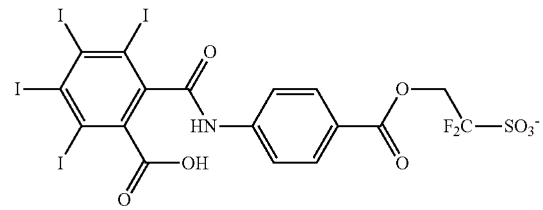
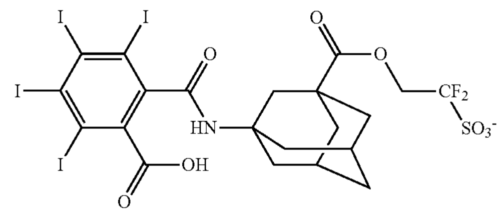
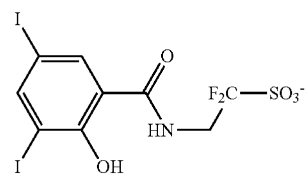
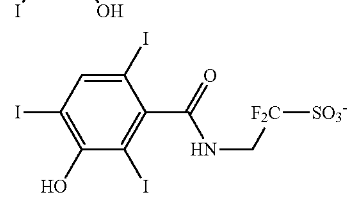
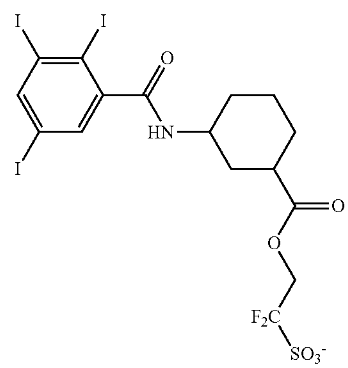
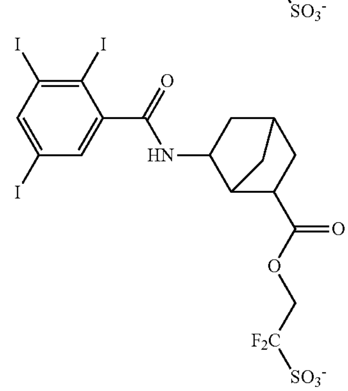

-continued
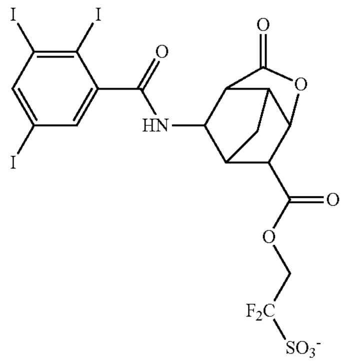
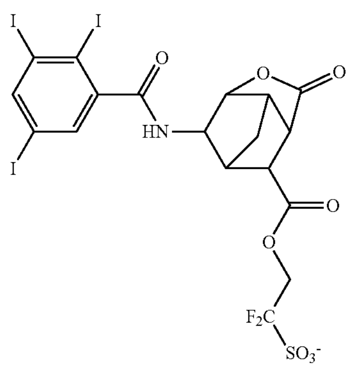
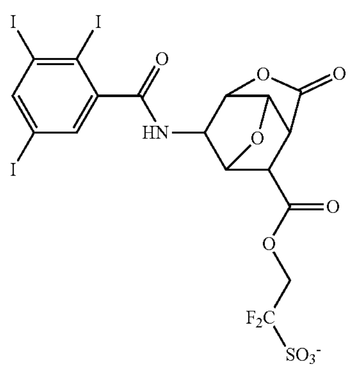
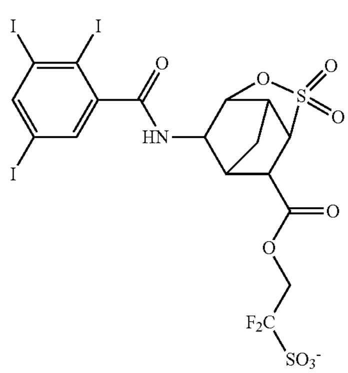
-continued
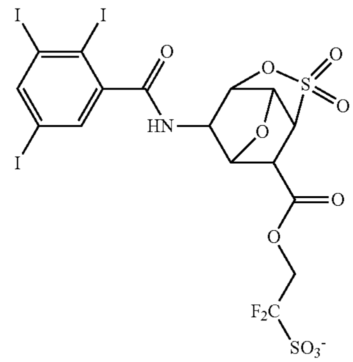
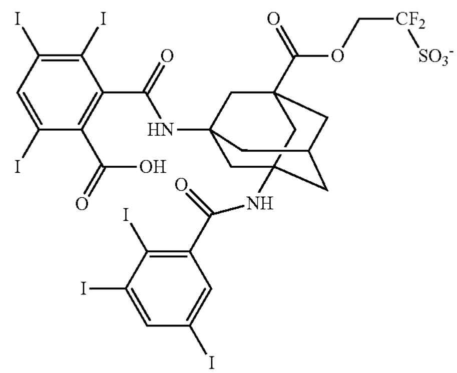
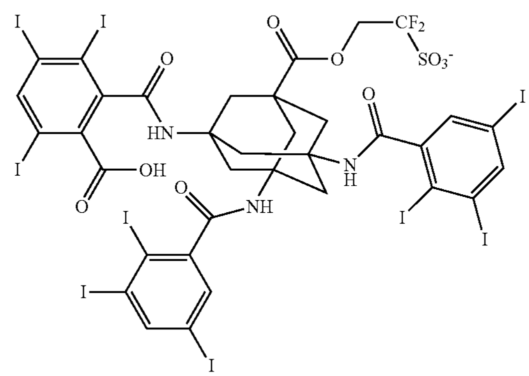
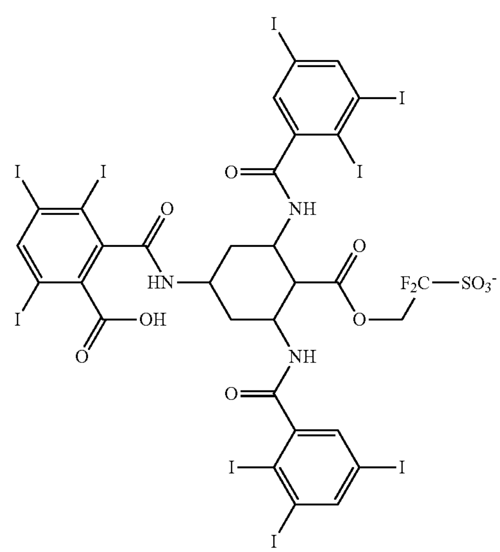

-continued
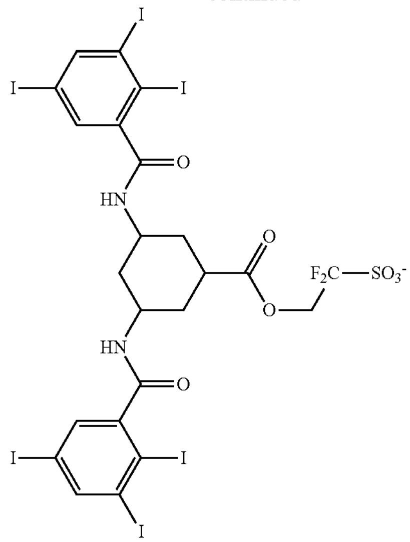
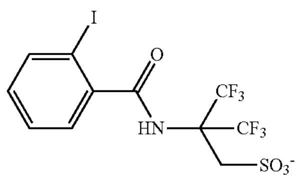
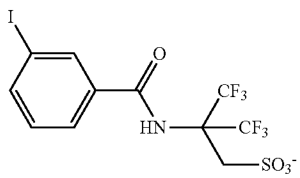
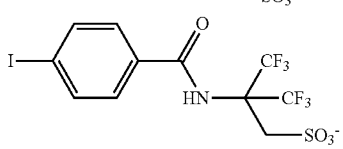
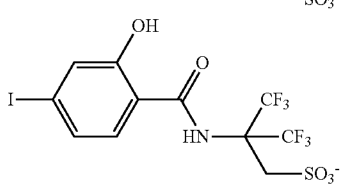
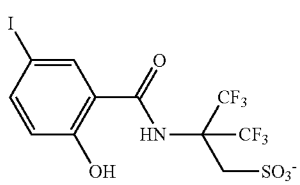
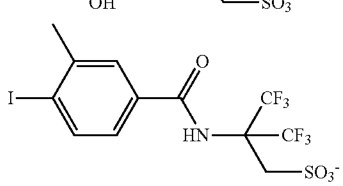
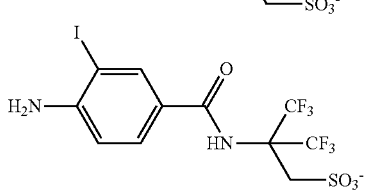
-continued
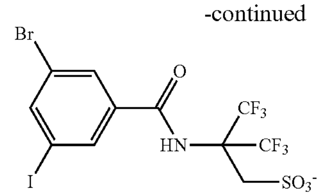
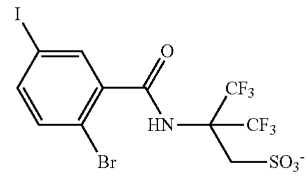
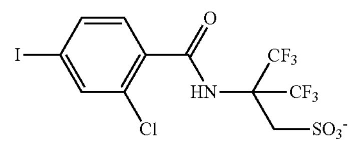
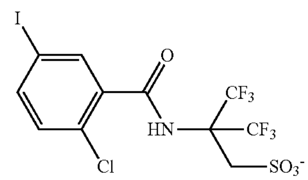
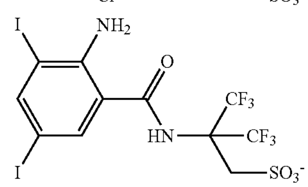
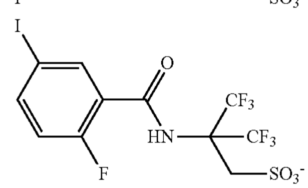
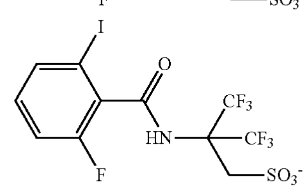
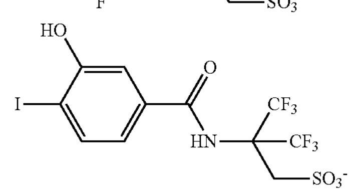
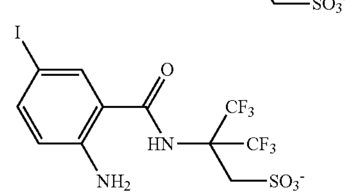
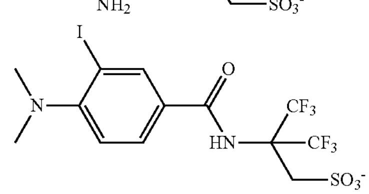

-continued
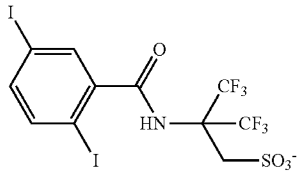
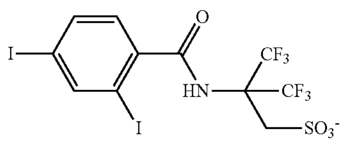
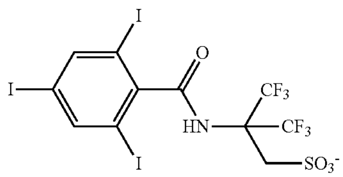
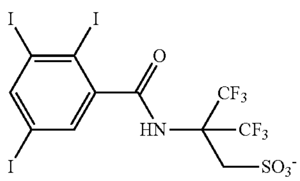
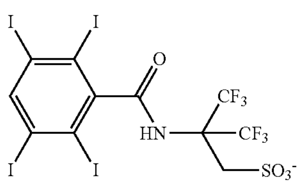
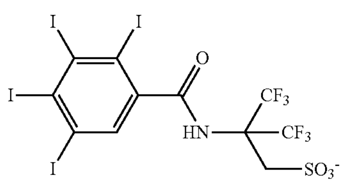
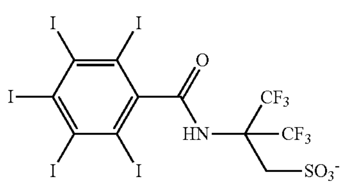
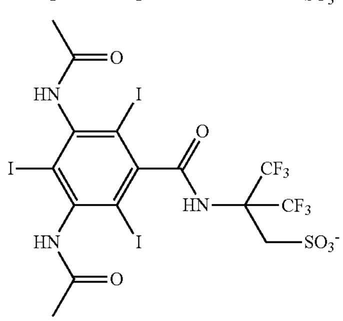
-continued
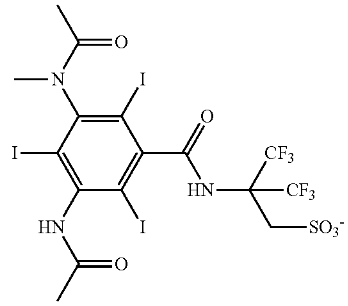
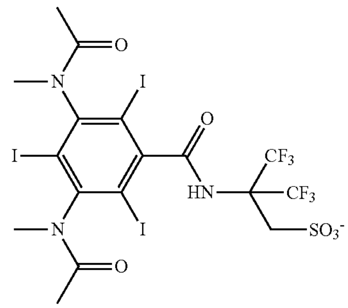
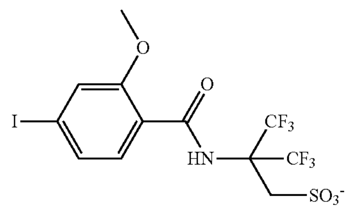
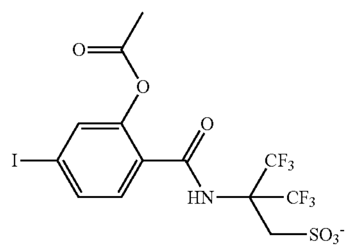
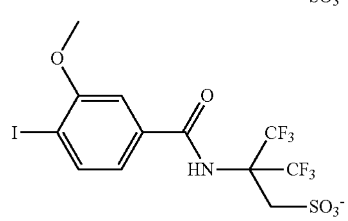
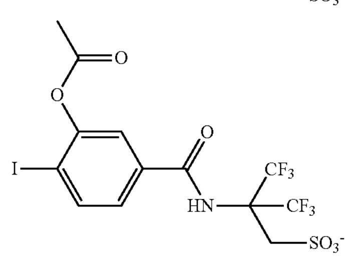

-continued
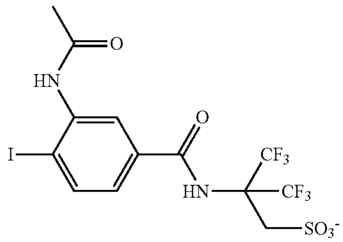
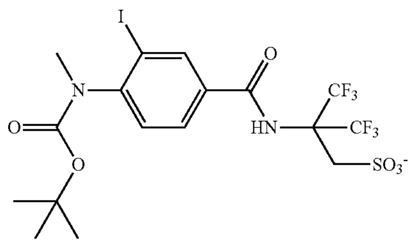
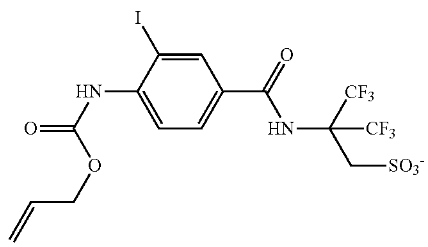
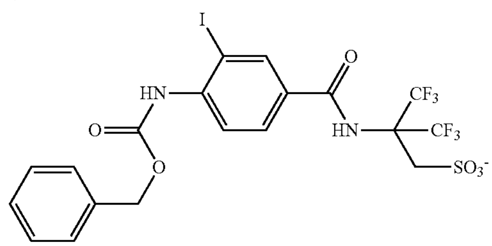
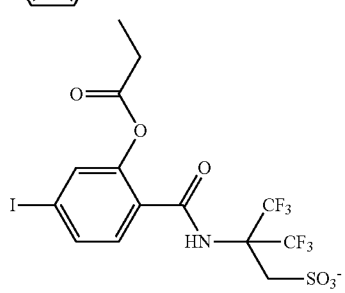
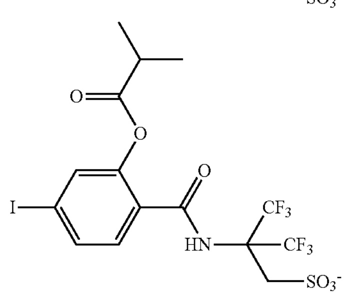
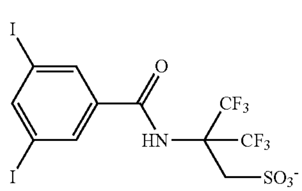
-continued
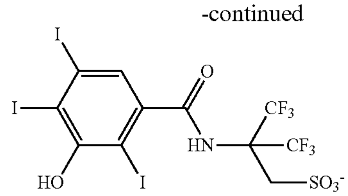
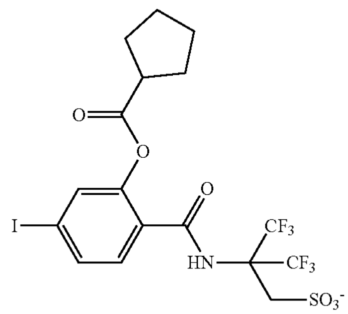
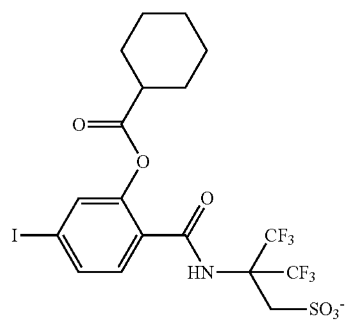
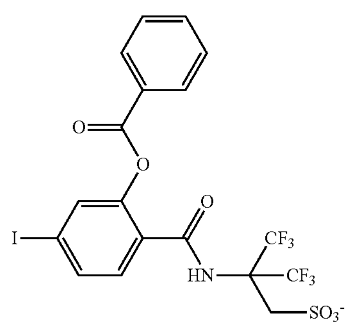
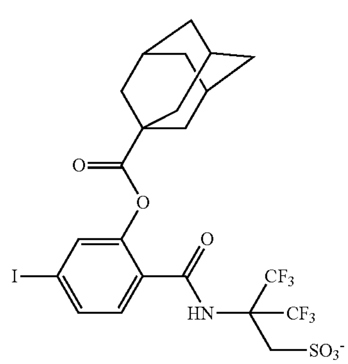

-continued
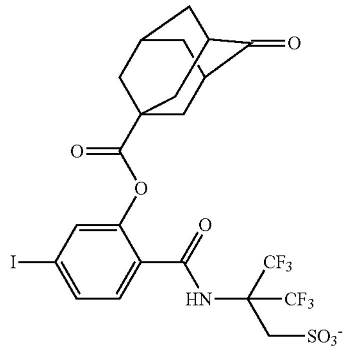
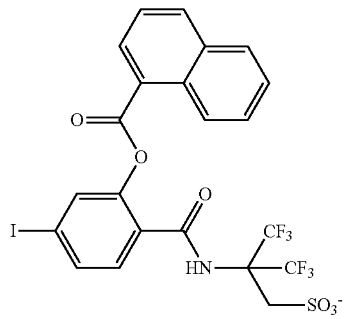
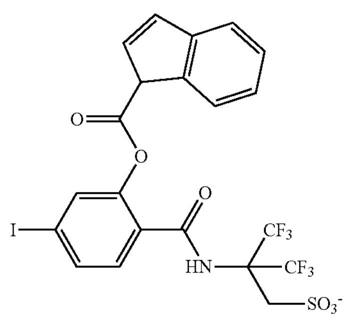
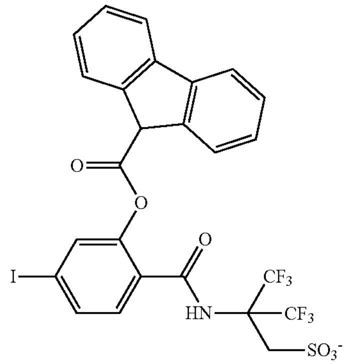
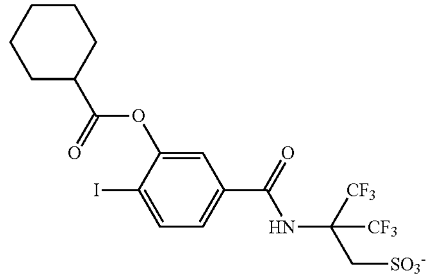
-continued
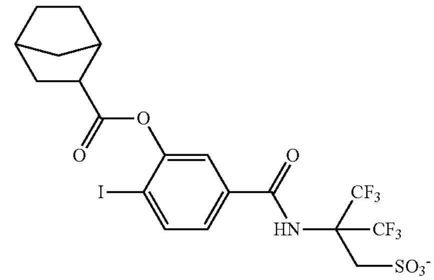
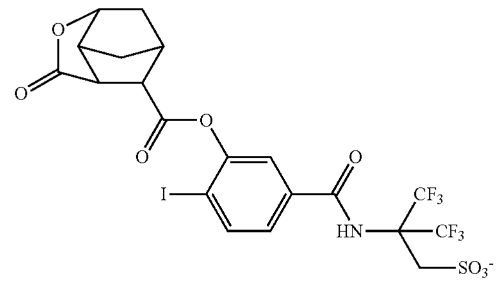
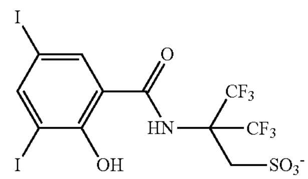
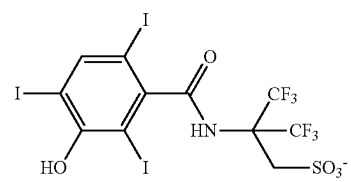
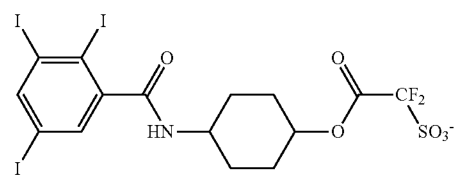
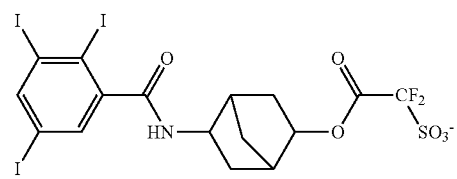
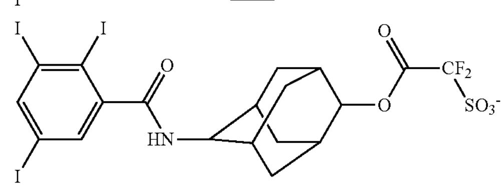
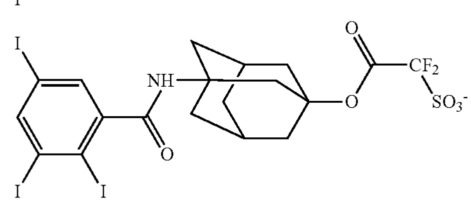

-continued
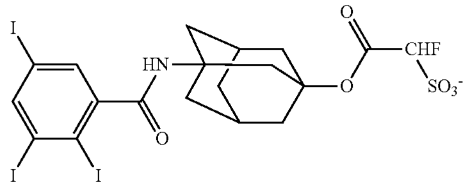
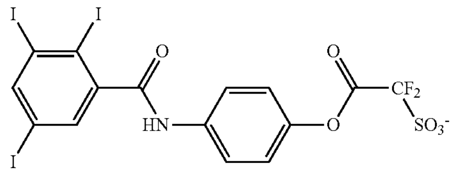
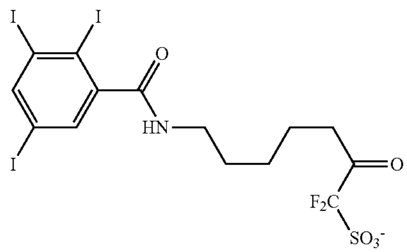
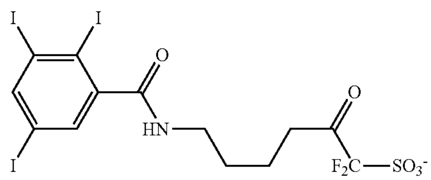
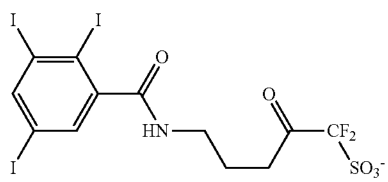
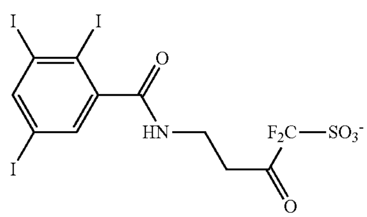
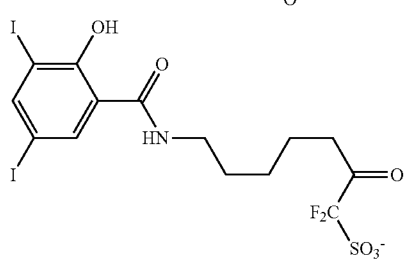
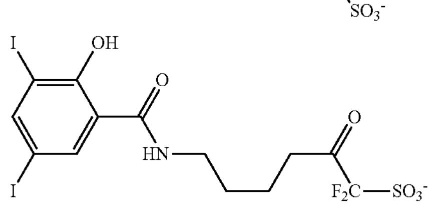
-continued
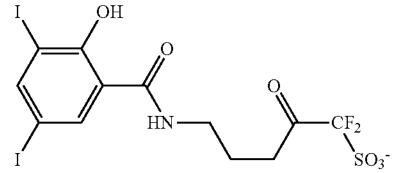
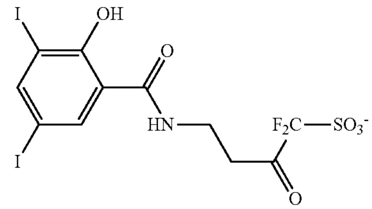
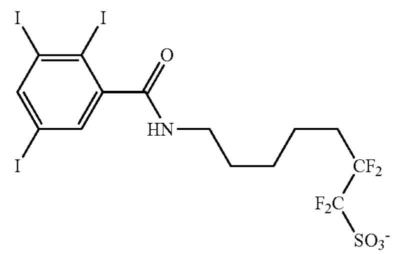
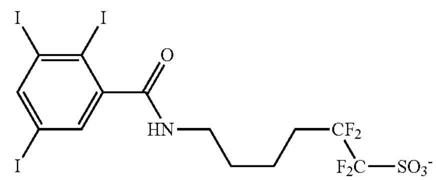
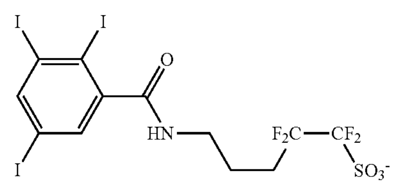
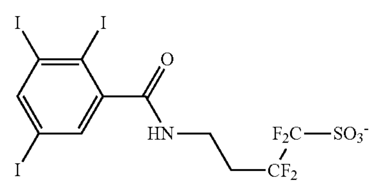
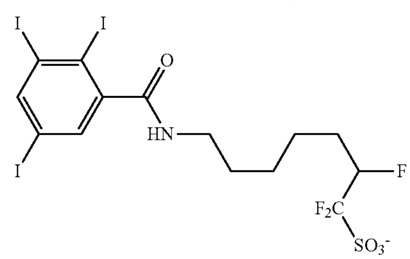
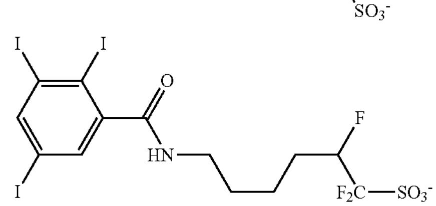

-continued

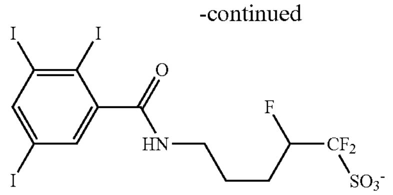

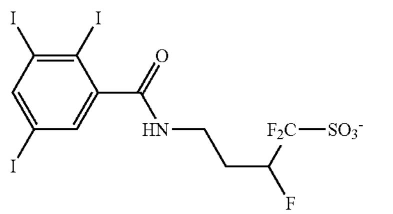

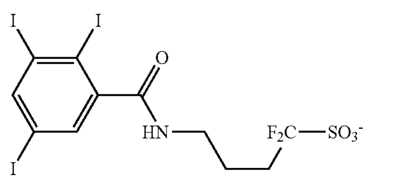

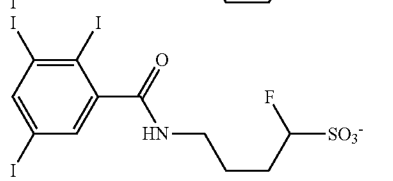

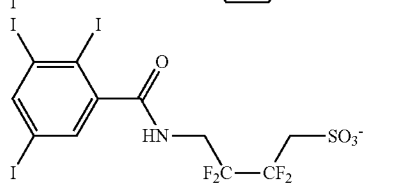

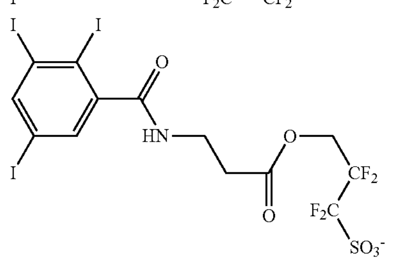

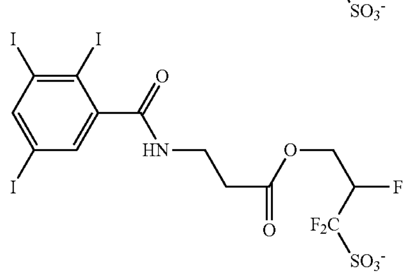

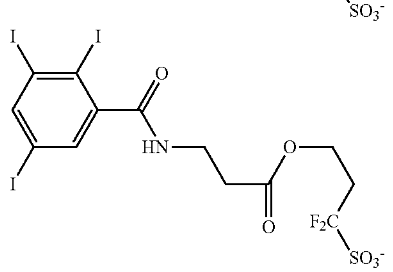

The sulfonium salt having formula (A-1) or the iodonium salt having formula (A-2) may be synthesized, for example, by ion exchange between an iodized benzamide-containing fluorinated sulfonic acid and a sulfonium or iodonium salt of a weaker acid than the sulfonic acid. Typical of the weaker acid than the sulfonic acid is carbonic acid. Alternatively, the sulfonium or iodonium salt may be synthesized by ion exchange between a sodium or ammonium salt of an iodized benzamide-containing fluorinated sulfonic acid and a sulfonium or iodonium chloride.

In the resist composition, the sulfonium or iodonium salt having formula (A-1) or (A-2) is preferably used in an amount of 0.01 to 1,000 parts by weight, more preferably 0.05 to 500 parts by weight per 100 parts by weight of the base polymer, as viewed from sensitivity and acid diffusion suppressing effect.

Base Polymer

Where the resist composition is of positive tone, the base polymer comprises recurring units containing an acid labile group, preferably recurring units having the formula (a1) or recurring units having the formula (a2). These units are simply referred to as recurring units (a1) and (a2).

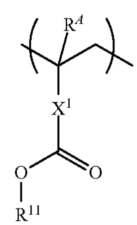

(a1)

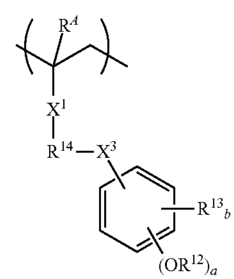

(a2)

Herein $R^A$ is each independently hydrogen or methyl. $X^1$ is a single bond, phenylene or naphthylene group, or $C_1$-$C_{12}$ linking group containing an ester bond, ether bond or lactone ring. $X^2$ is a single bond or ester bond. $X^3$ is a single bond, ether braid or ester bond $R^{11}$ and $R^{12}$ each are an acid labile group. $R^{13}$ is fluorine, trifluoromethyl, cyano, $C_1$-$C_6$ saturated hydrocarbyl, $C_1$-$C_6$ saturated hydrocarbyloxy, $C_2$-$C_7$ saturated hydrocarbylcarbonyl, $C_2$-$C_7$ saturated hydrocarbylcarbonyloxy, or $C_2$-$C_7$ saturated hydrocarbyloxycarbonyl group. $R^{14}$ is a single bond or a $C_1$-$C_6$ alkanediyl group in which some carbon may be replaced by an ether bond or ester bond. The subscript "a" is 1 or 2, and "b" is an integer of 0 to 4.

Examples of the monomer from which the recurring units (a1) are derived are shown below, but not limited thereto. $R^A$ and $R^{11}$ are as defined above.

-continued
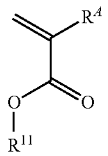
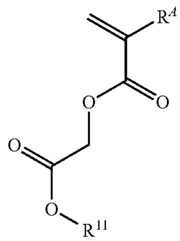
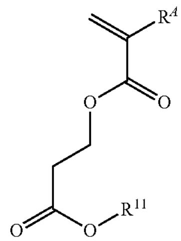
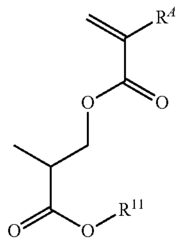
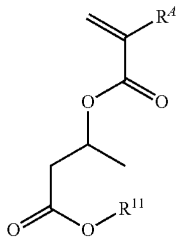
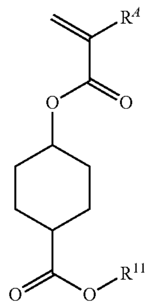
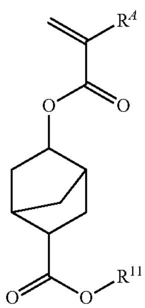
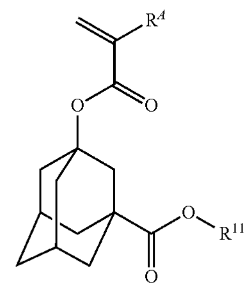
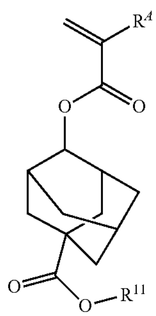
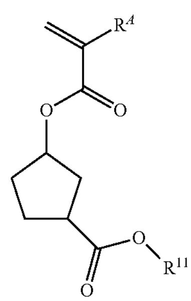
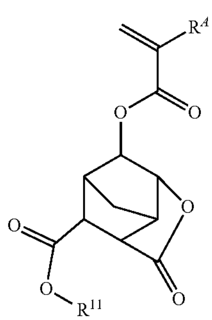
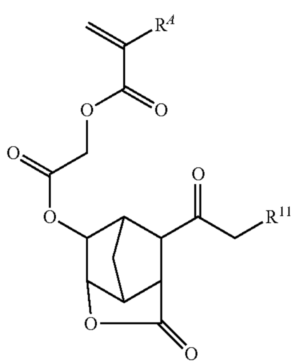
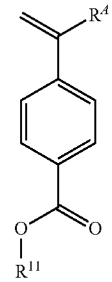
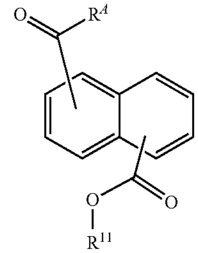
Examples of the monomer from which the recurring units (a2) are derived are shown below, but not limited thereto. $R^A$ and $R^{12}$ are as defined above.
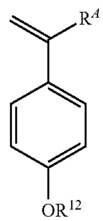
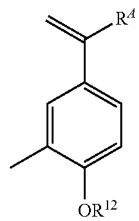
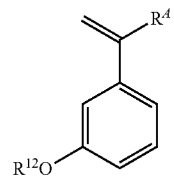
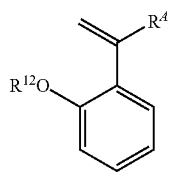
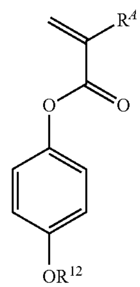
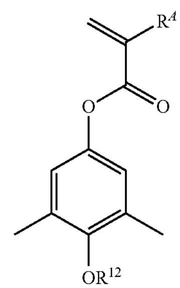
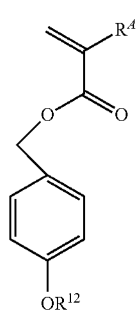
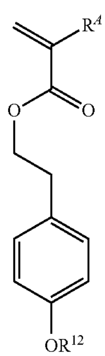
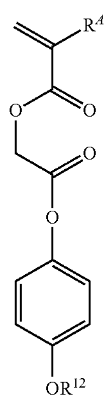

-continued

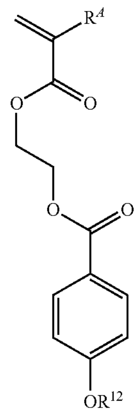

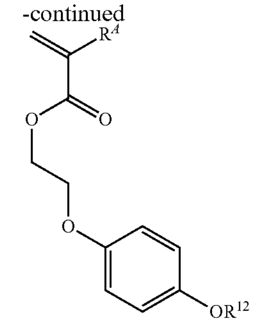

The acid labile groups represented by $R^{11}$ and $R^{12}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

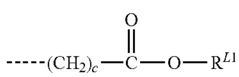

(AL-2)

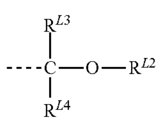

(AL-3)

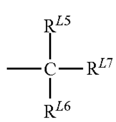

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl groups may be saturated or unsaturated and straight, branched or cyclic. Inter alia, $C_1$-$C_{40}$ saturated hydrocarbyl groups are preferred, with $C_1$-$C_{20}$ saturated hydrocarbyl being more preferred. In formula (AL-1), c is an integer of 0 to 10, preferably 1 to 5.

In formula (AL-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl groups may be saturated or unsaturated and straight, branched or cyclic. Inter alia, $C_1$-$C_{10}$ saturated hydrocarbyl groups are preferred. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl groups may be saturated or unsaturated and straight, branched or cyclic. Inter alia, $C_1$-$C_{20}$ saturated hydrocarbyl groups are preferred. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of suitable monomers from which recurring units (b) are derived are given below, but not limited thereto. Herein $R^A$ is as defined above.

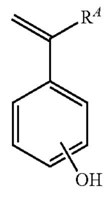

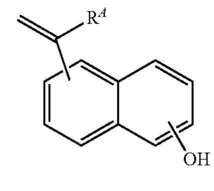

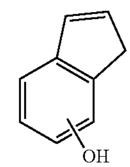

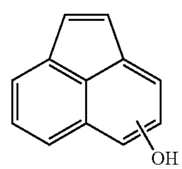

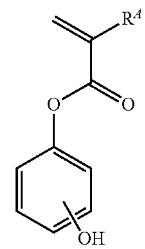

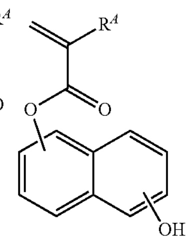

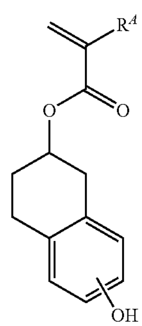

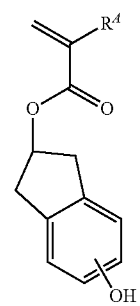

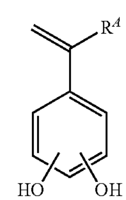

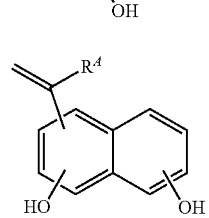

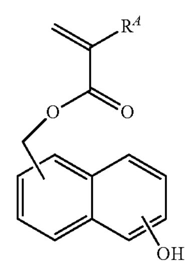

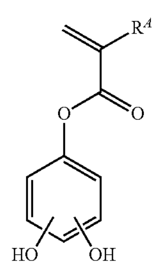

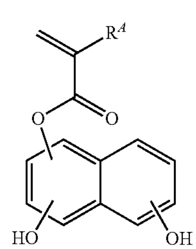

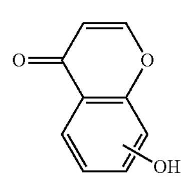

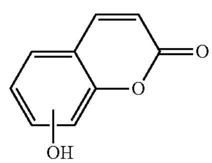
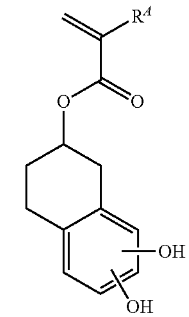
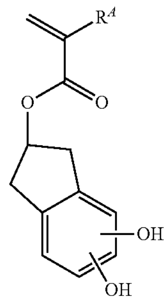

Further, recurring units (c) having another adhesive group selected from hydroxyl (other than the foregoing phenolic hydroxyl), lactone ring, ether bond, ester bond, carbonyl, and cyano groups may also be incorporated in the base polymer. Examples of suitable monomers from which recurring units (c) are derived are given below, but not limited thereto. Herein $R^A$ is as defined above.

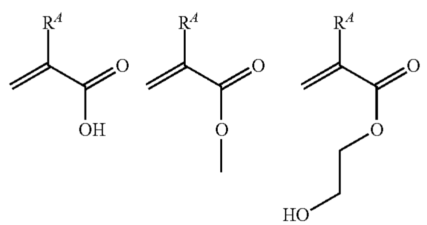
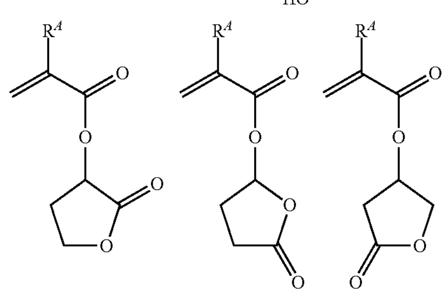
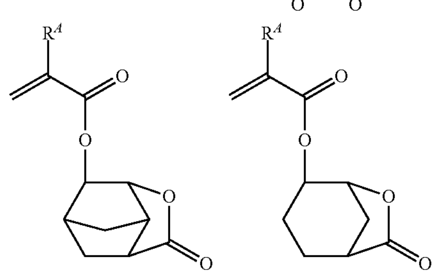

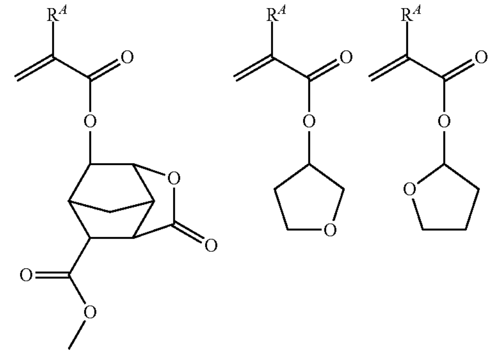
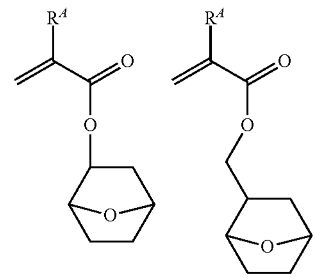
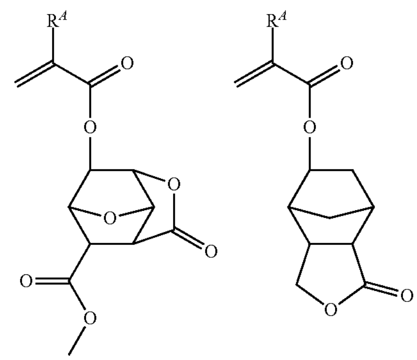
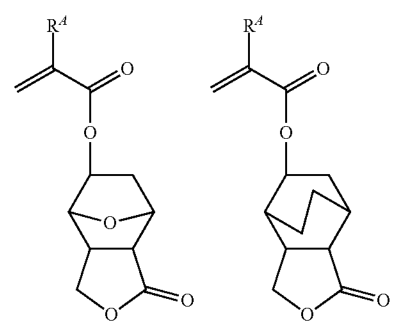
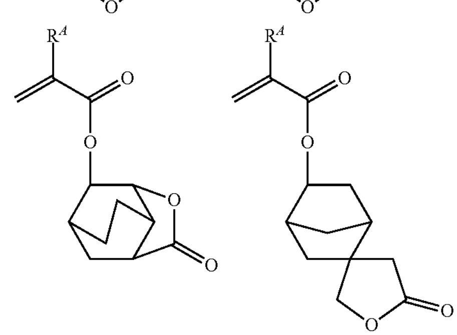

-continued
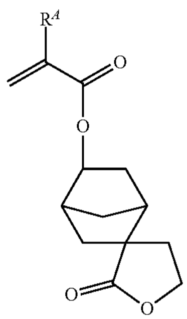
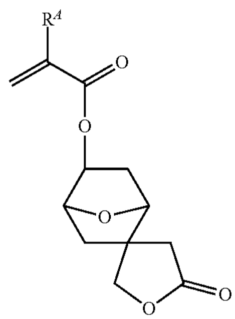
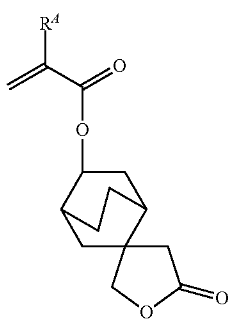
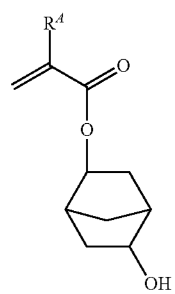
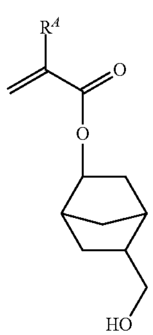
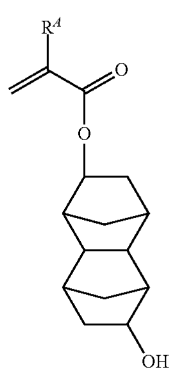
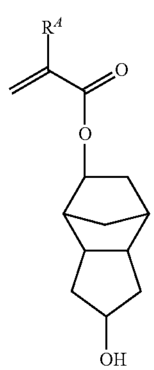
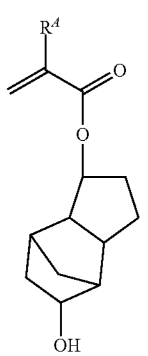
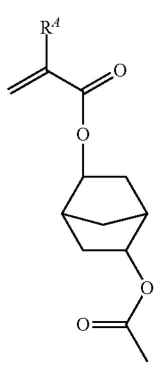
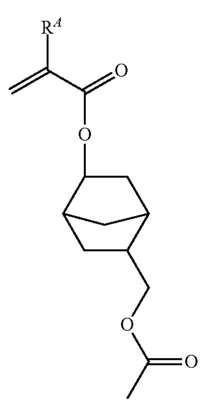
-continued
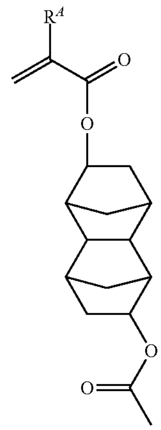
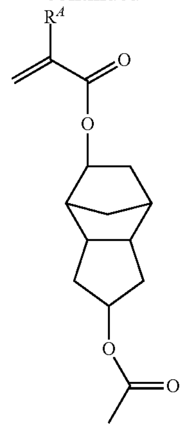
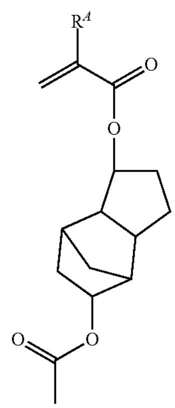
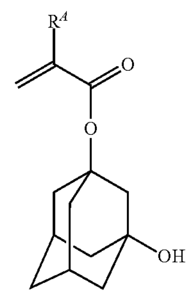
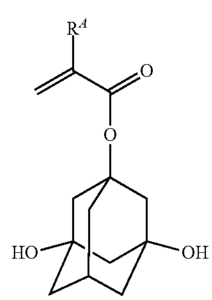
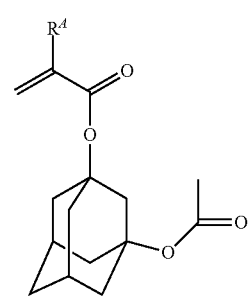
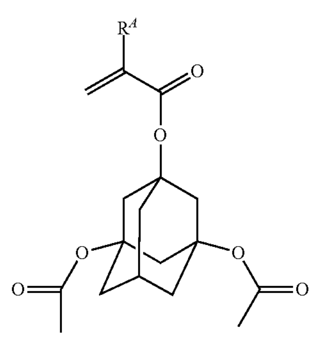

-continued
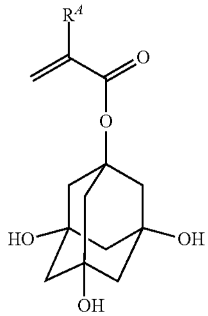
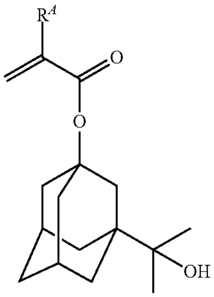
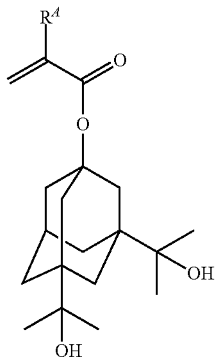
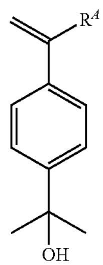
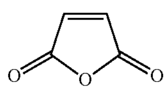
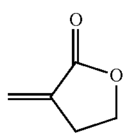
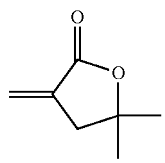
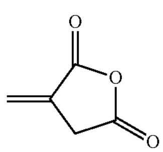
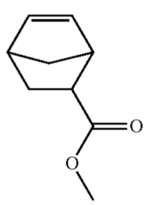
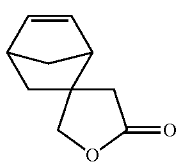
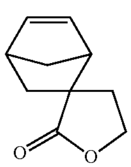
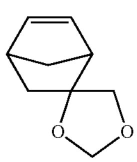
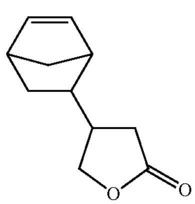
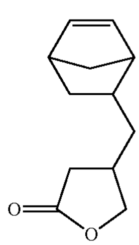
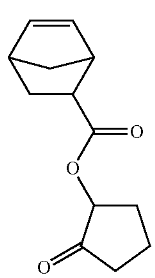
-continued
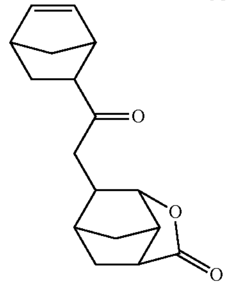
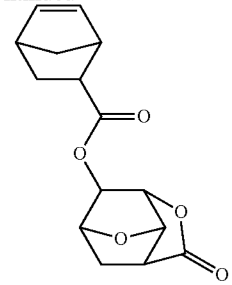
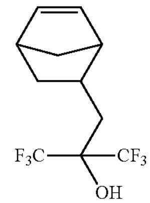
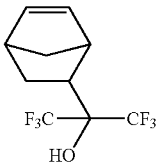
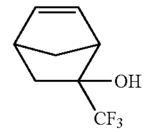
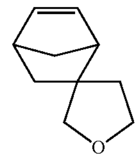
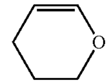
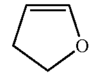
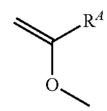
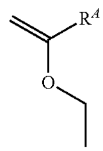
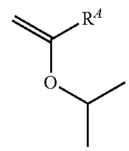
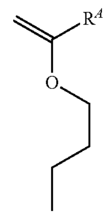
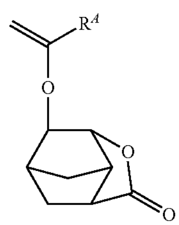
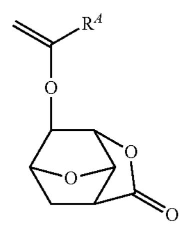
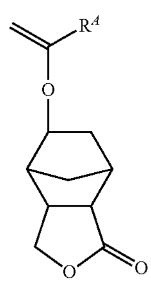
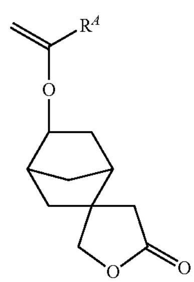
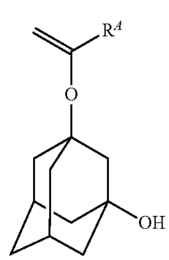
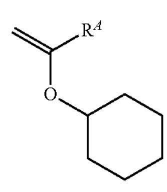
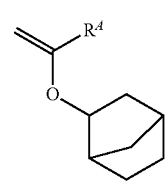

-continued
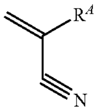
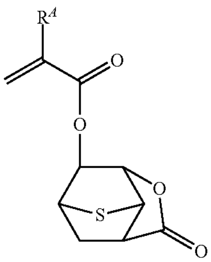
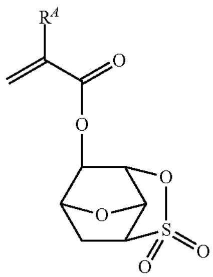
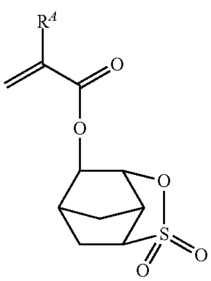
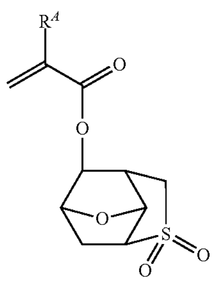
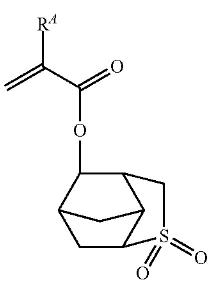
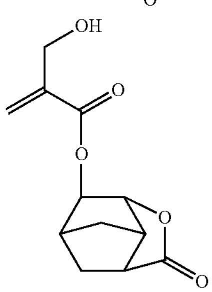
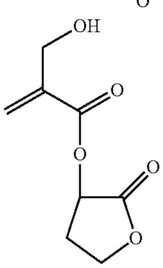
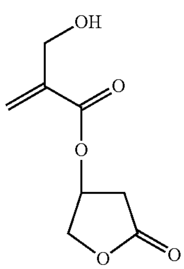
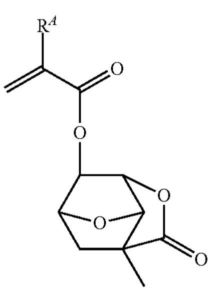
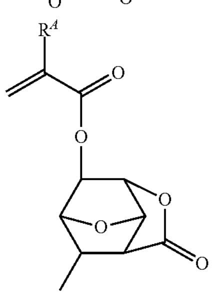
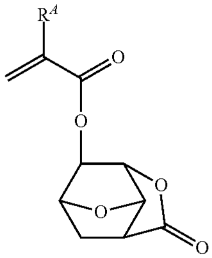
-continued
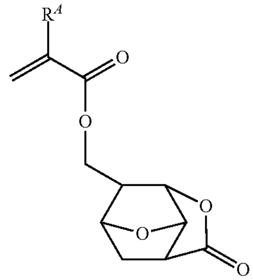
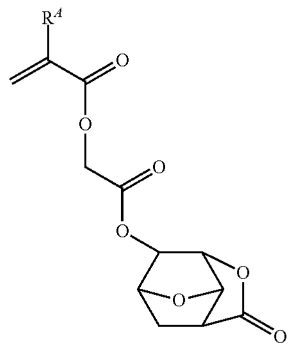
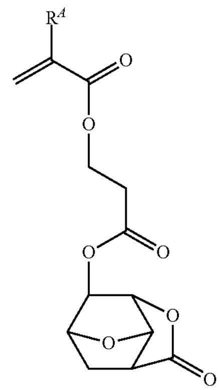
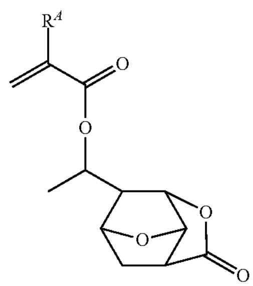
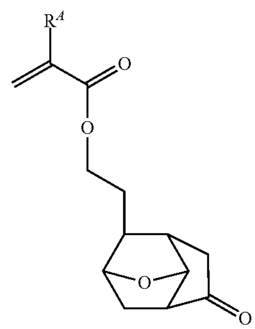
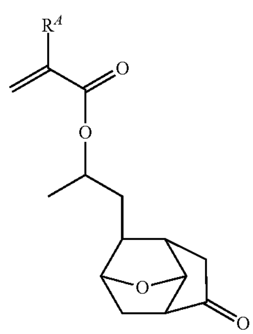
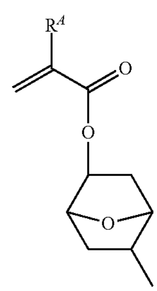
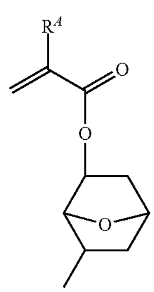
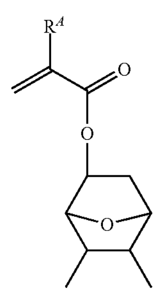

-continued
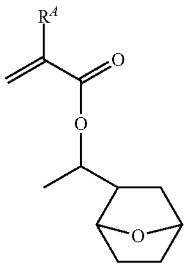
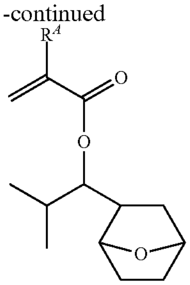
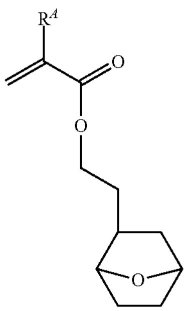
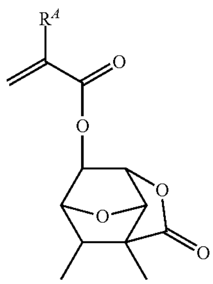
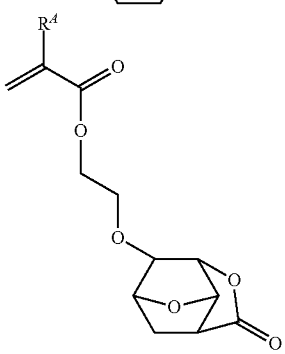
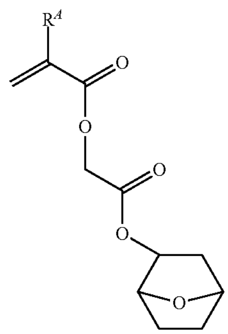
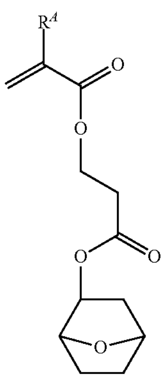
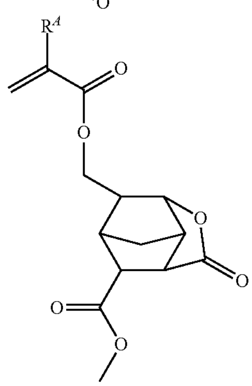
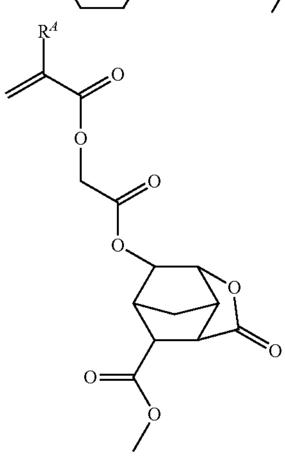
-continued
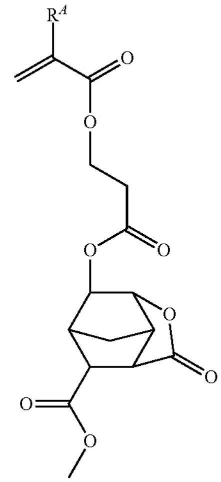
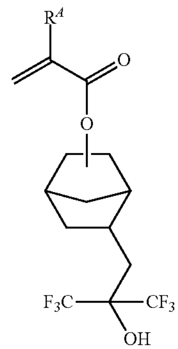
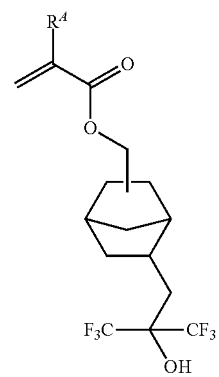
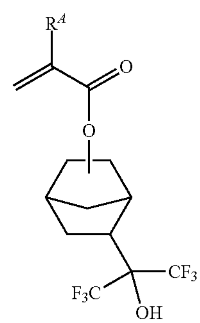
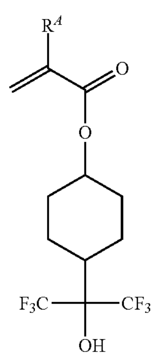
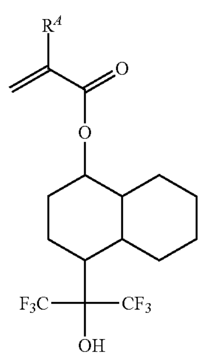
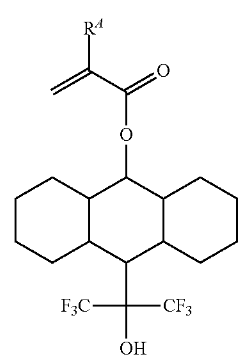
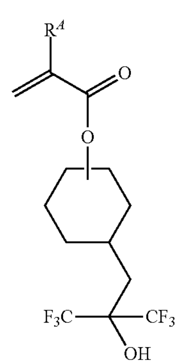

-continued
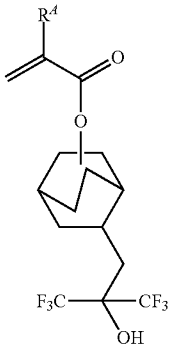
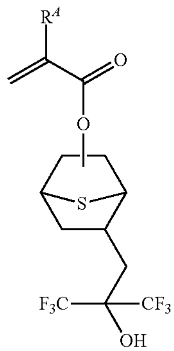
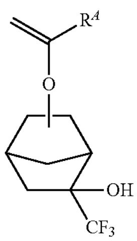
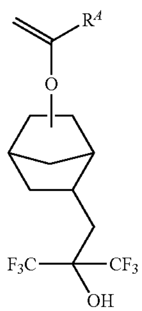
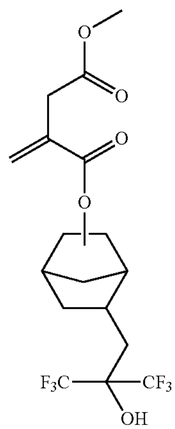
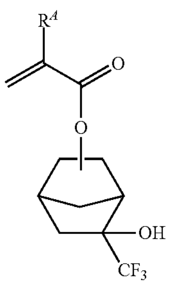
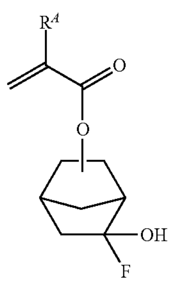
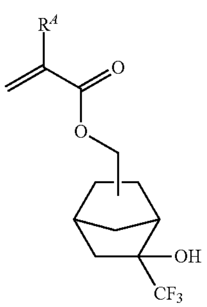
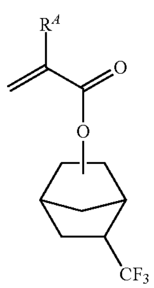
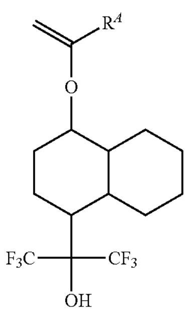
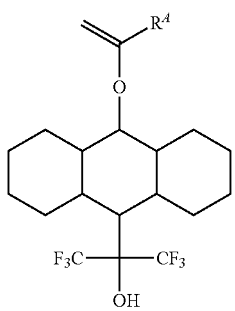
-continued
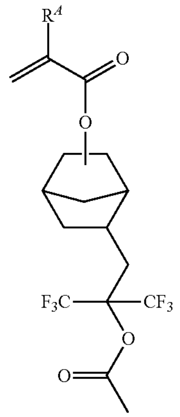
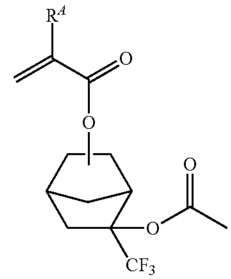
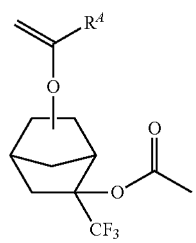
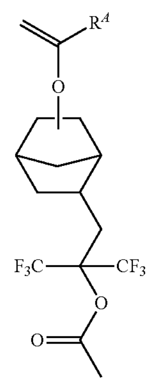
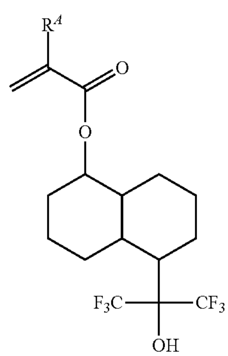
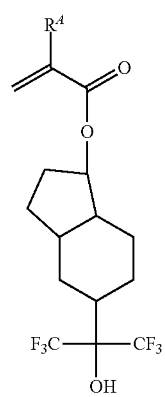
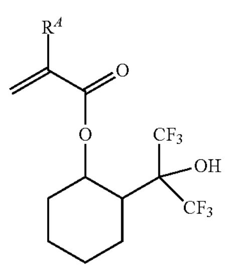

-continued
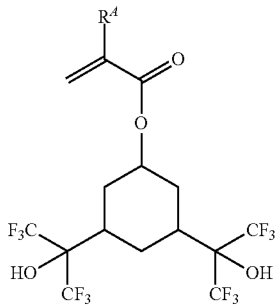
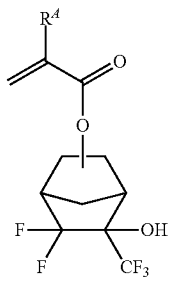
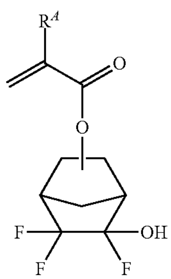
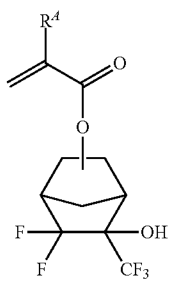
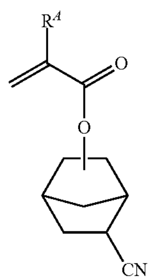
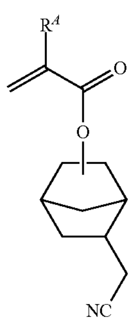
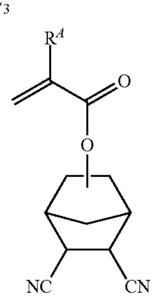
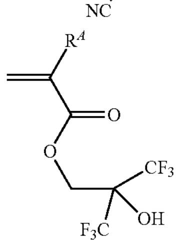
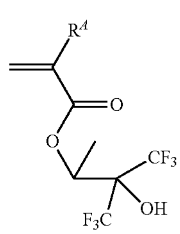
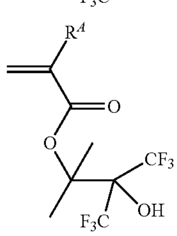
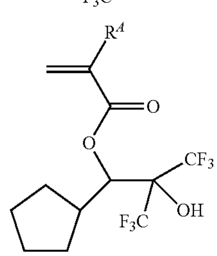
-continued
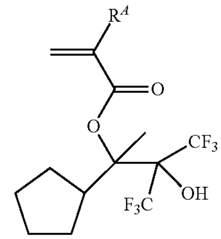
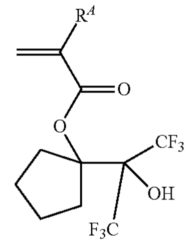
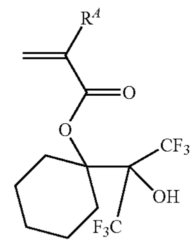
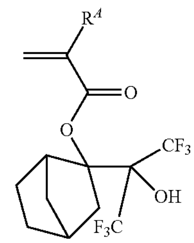
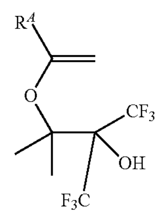
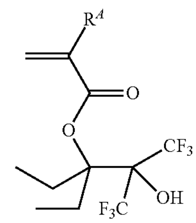
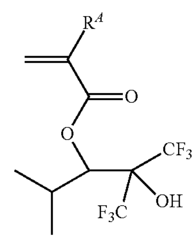
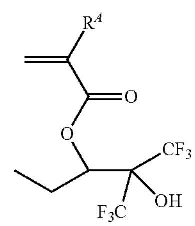
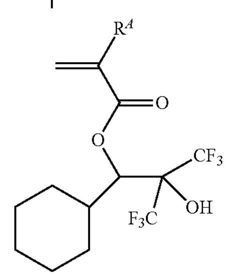
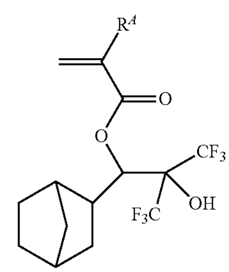
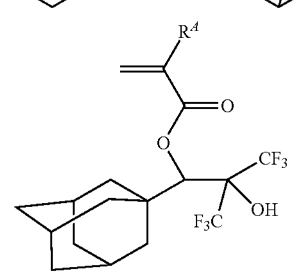
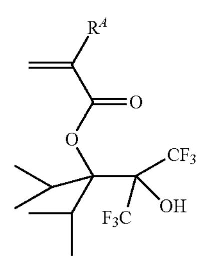
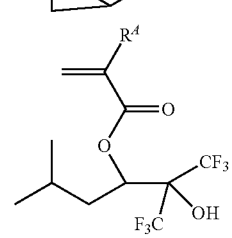
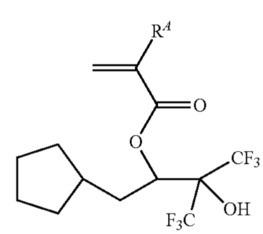

-continued
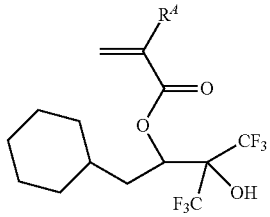
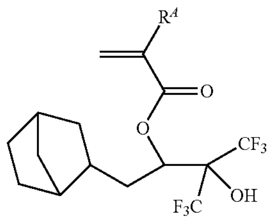
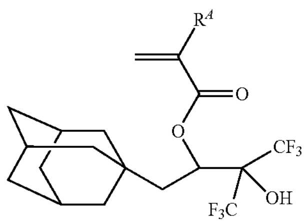
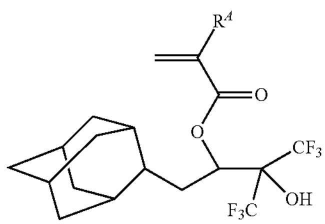
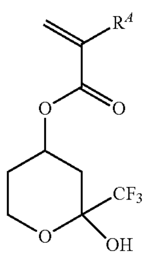
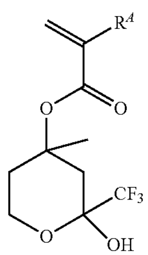
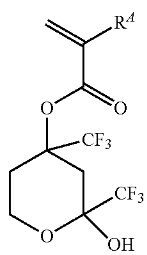
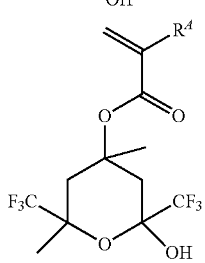
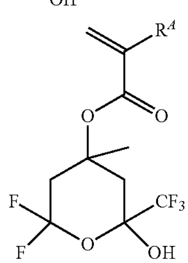
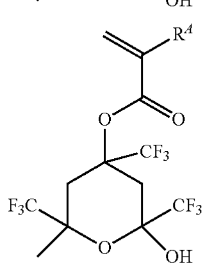
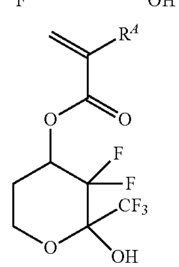
-continued
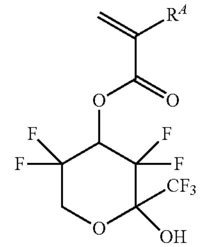
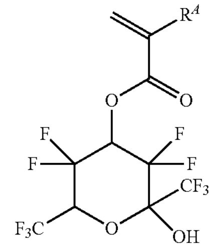
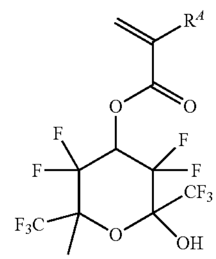
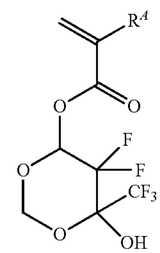
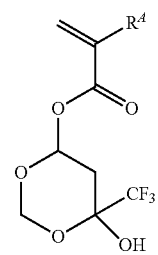
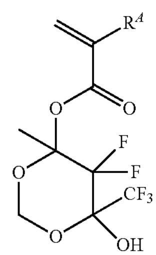
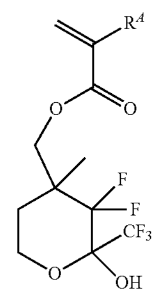
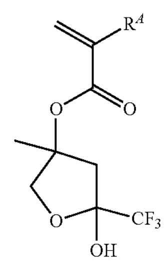
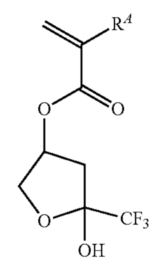
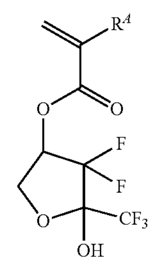
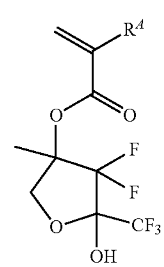
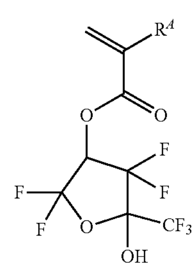
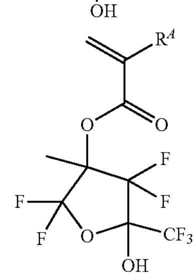
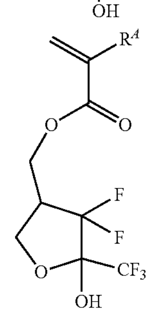

-continued
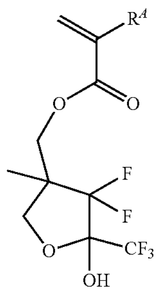
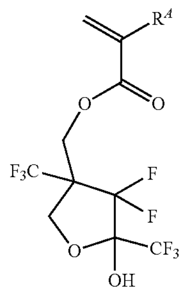
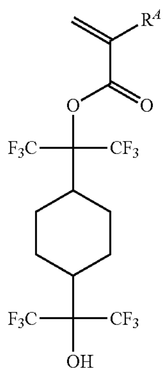
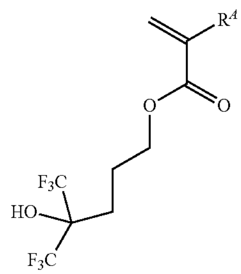
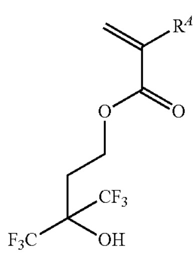
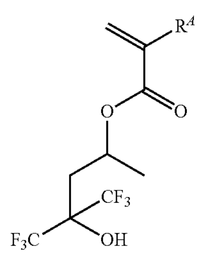
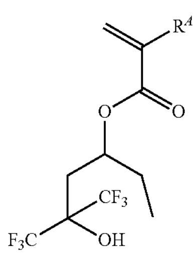
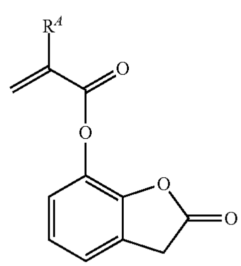
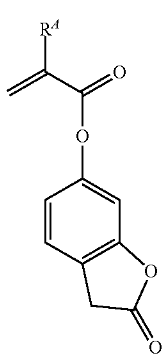
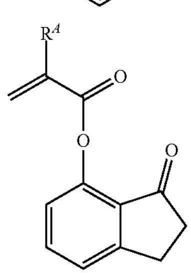
-continued
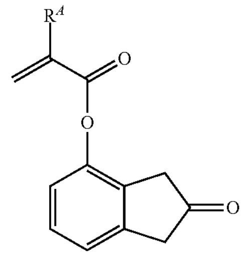
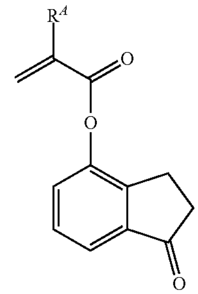
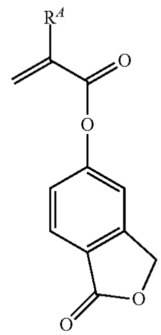
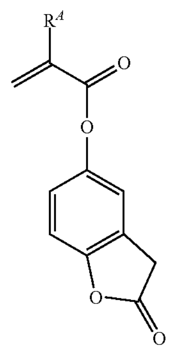
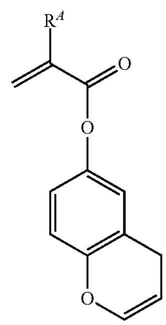
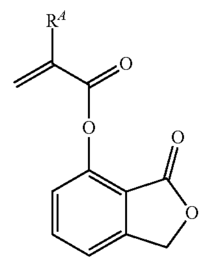
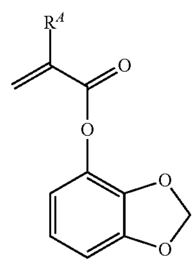
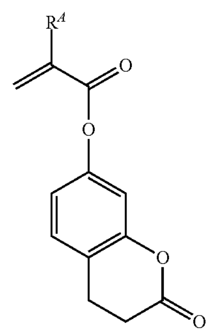
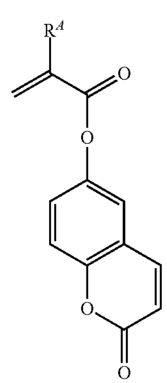
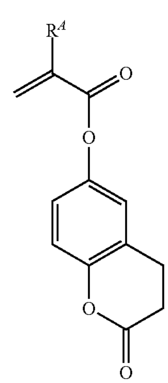
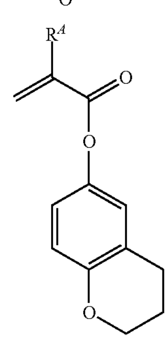

-continued
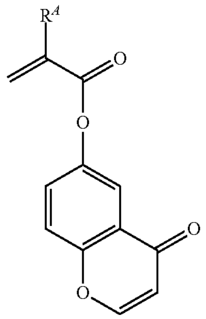
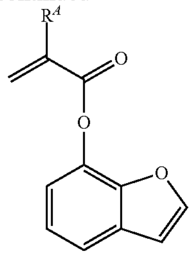
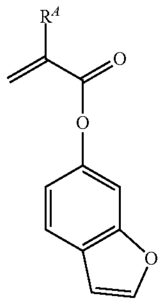
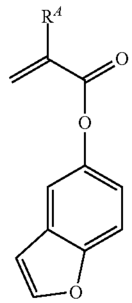
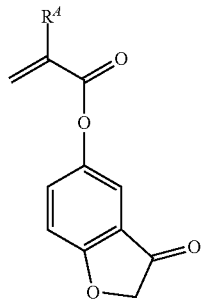
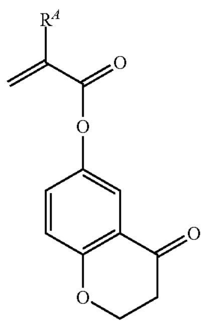
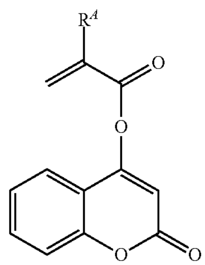
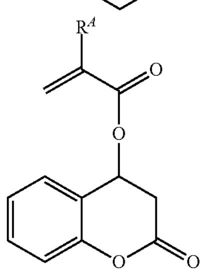
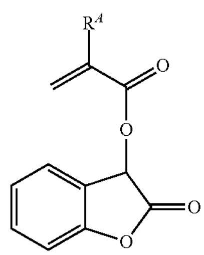
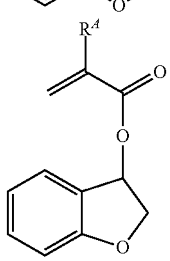
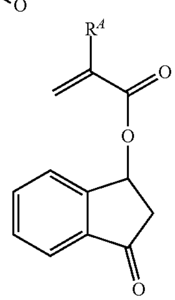
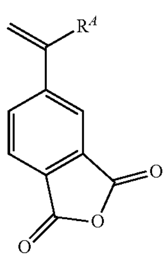
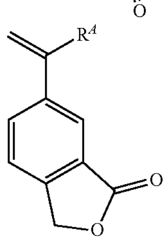
-continued
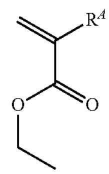
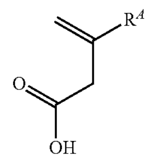
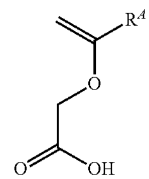
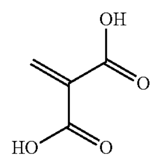
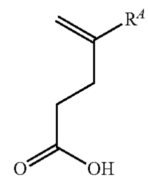
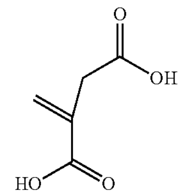
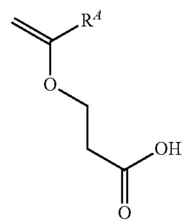
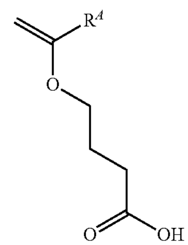
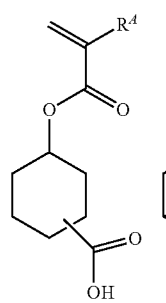
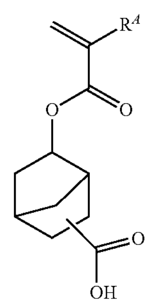
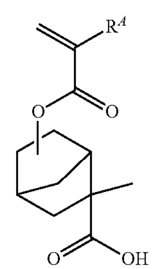
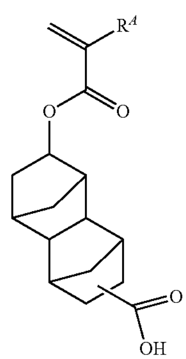
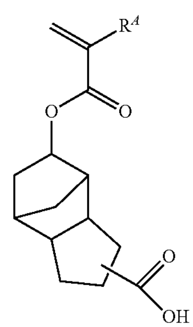
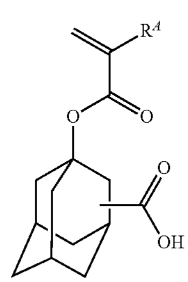
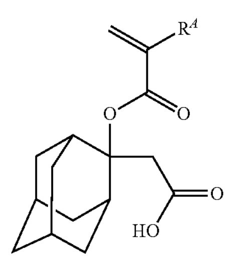

-continued

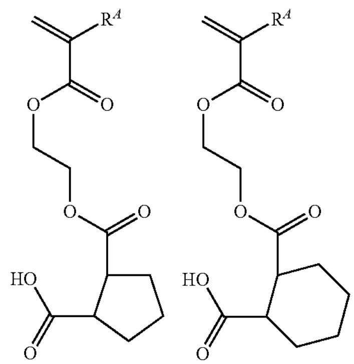

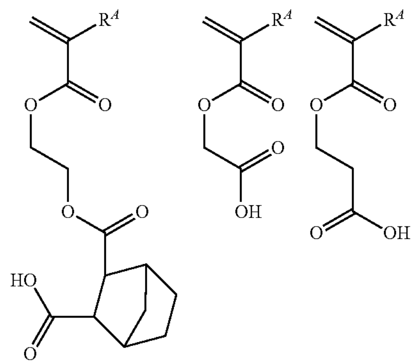

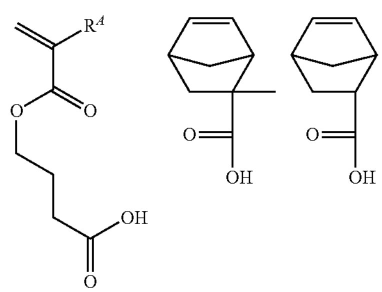

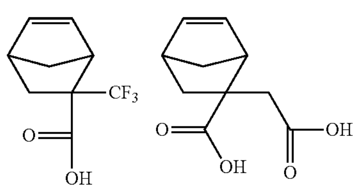

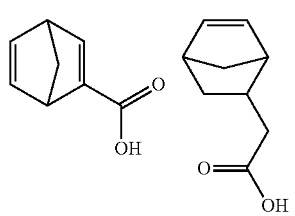

In another preferred embodiment, the base polymer may further comprise recurring units (d) which are derived from indene, benzofuran, benzothiophene, acenaphthylene, chromone, coumarin, norbornadiene, or derivatives thereof. Suitable monomers are exemplified below.

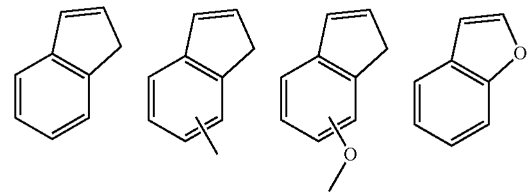

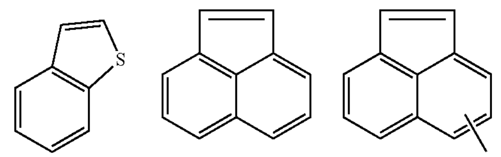

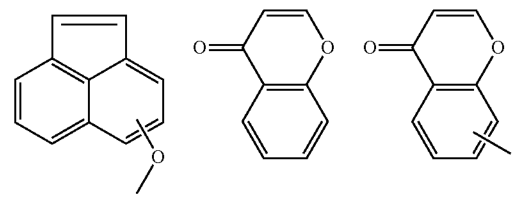

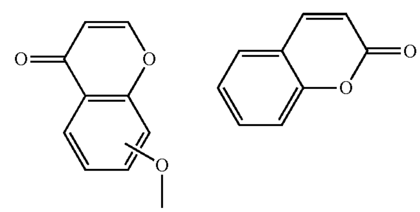

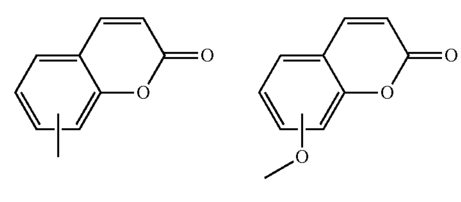

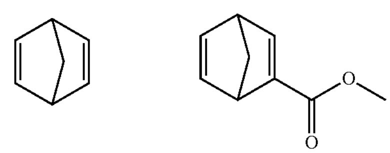

The base polymer may further comprise recurring units (e) which are derived from styrene, vinylnaphthalene, vinylanthracene, vinylpyrene, methyleneindene, vinylpyridine, vinylcarbazole, or derivatives thereof.

In a further embodiment, recurring units (f) derived from an onium salt having a polymerizable olefin may be incorporated in the base polymer. JP-A 2005-084365 discloses a sulfonium or iodonium salt containing a polymerizable olefin capable of generating a specific sulfonic acid. JP-A 2006-178317 discloses a sulfonium salt having a sulfonic acid directly attached to the backbone.

The preferred recurring units (f) are recurring units of at least one type selected from formulae (f1), (f2) and (f5). These units are simply referred to as recurring units (f1), (f2) and (f3), which may be used alone or in combination of two or more types.

(f1)

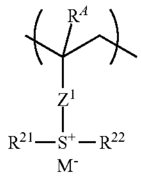

(f2)

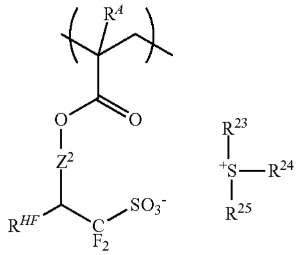

(f3)

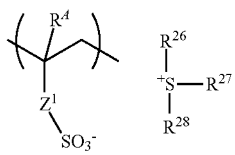

In formulae (f1) to (f3), $R^A$ is each independently hydrogen or methyl. $Z^1$ is a single bond, phenylene group, —O—$Z^{11}$—, —C(═O)—O—$Z^{11}$—, or —C(═O)—NH—$Z^{11}$—, wherein $Z^{11}$ is a $C_1$-$C_6$ aliphatic hydrocarbylene group, phenylene group, naphthylene group, or a $C_1$-$C_{18}$ combination thereof which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —O—$Z^{31}$—, —C(═O)O—$Z^{31}$—, or —C(═O)—NH—$Z^{31}$—, wherein $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond other bond or hydroxyl moiety. The aliphatic hydrocarbylene group may be saturated or unsaturated and straight, branched or cyclic. The saturated hydrocarbylene group may be straight, branched or cyclic.

In formulae (f1) to (f3), $R^{21}$ to $R^{28}$ are each independently a $C_1$-$C_{20}$ hydrocarbyl group which may contain a heteroatom. The hydrocarbyl group may be saturated or unsaturated and straight, branched or cyclic. Examples include $C_1$-$C_{20}$ alkyl groups, $C_6$-$C_{20}$ aryl groups, $C_7$-$C_{20}$ aralkyl groups, and mixtures thereof. Illustrative examples are as exemplified above for $R^3$, $R^4$, $R^5$, $R^6$ and $R^7$ in formulae (A-1) and (A-2). In these groups, some or all hydrogen atoms may be substituted by $C_1$-$C_{10}$ saturated hydrocarbyl, halogen, trifluoromethyl, cyano, nitro, hydroxyl, mercapto, $C_1$-$C_{10}$ saturated hydrocarbyloxy, $C_2$-$C_{10}$ saturated hydrocarbyloxycarbonyl, or $C_2$-$C_{10}$ saturated hydrocarbylcarbonyloxy moieties, or some carbon may be replaced by a carbonyl moiety, ether bond or ester bond. Also, a pair of $R^{23}$ and $R^{24}$ or $R^{26}$ and $R^{27}$ may bond together to form a ring with the sulfur atom to which they are attached. Examples of the ring are as exemplified above as the ring that $R^3$ and $R^4$, taken together, form with the sulfur atom in formula (A-1).

In formula (f2), $R^{HF}$ is hydrogen or trifluoromethyl.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoromethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide: methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α-position and trifluoromethyl at β-position as represented by the formula (f1-2).

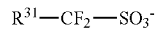

(f1-1)

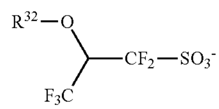

(f1-2)

In formula (f1-1), $R^{31}$ is hydrogen or a $C_1$-$C_{20}$ hydrocarbyl group which may contain an ether bond, ester bond, carbonyl moiety, lactone ring, or fluorine atom.

In formula (f1-2), $R^{32}$ is hydrogen, or a $C_1$-$C_{10}$ hydrocarbyl or $C_2$-$C_{30}$ hydrocarbylcarbonyl group which may contain an ether bond, ester bond, carbonyl moiety or lactone ring.

The hydrocarbyl group and hydrocarbyl moiety of the hydrocarbylcarbonyl group, represented by $R^{31}$ or $R^{32}$, may be saturated or on saturated and straight, branched or cyclic. Examples thereof include alkyl groups such as methyl ethyl propyl, isopropyl butyl, isobutyl sec-butyl, tert-butyl, pentyl neopentyl hexyl, heptyl, 2-ethylhexyl, nonyl, undecyl, tridecyl pentadecyl heptadecyl and icosanyl; cyclic saturated hydrocarbyl groups such as cyclopentyl cyclohexyl, 1-adamantyl, 2-adamantyl 1-adamantylmethyl, norbornyl, norbornylmethyl tricyclodecyl, tetracyclododecanyl, tetracyclododecanylmethyl and dicyclohexylmethyl; alkenyl groups such as allyl; cyclic unsaturated hydrocarbyl groups such as 3-cyclohexenyl; aryl groups such as phenyl, 1-naphthyl, and 2-naphthyl; and aralkyl groups such as benzyl and diphenylmethyl.

In the foregoing groups, some or all of the hydrogen atoms may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl moiety, cyano moiety, carbonyl moiety, ether bond, ester bond, sulfonic acid ester bond, carbonate bond, lactone ring, sultone ring, carboxylic anhydride, or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl 2-oxopropyl, 4-oxo-1-adamantyl and 3-oxocyclohexyl.

Examples of the cation in the monomer from which recurring unit (f1) is derived are shown below, bat not limited thereto. $R^A$ are as defined above.

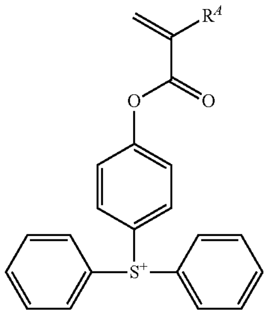
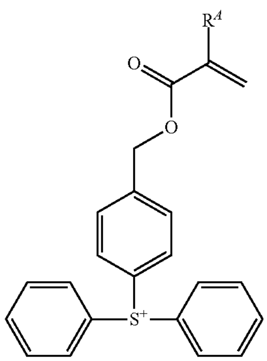
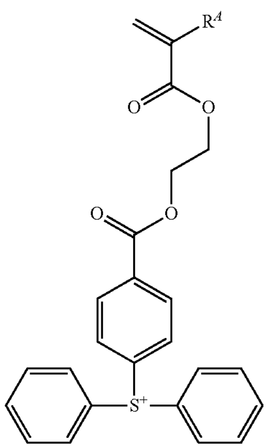
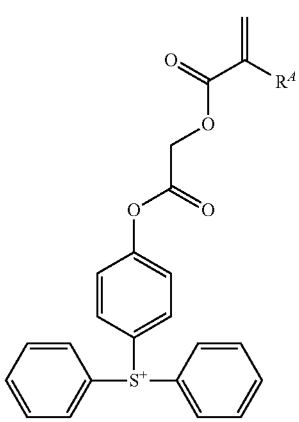
-continued
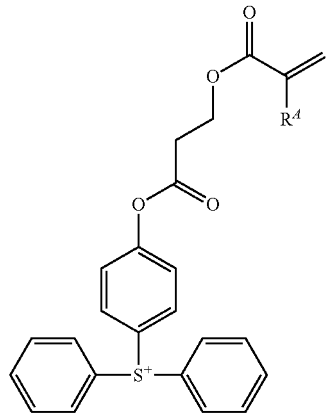
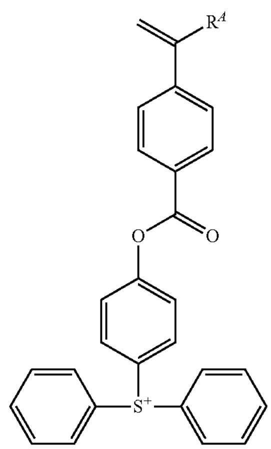
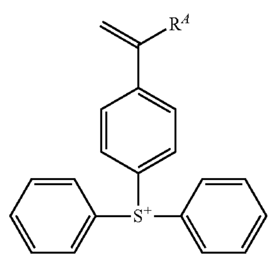
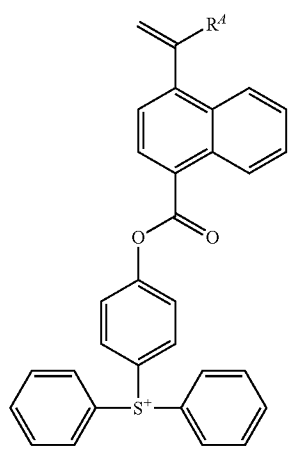

-continued
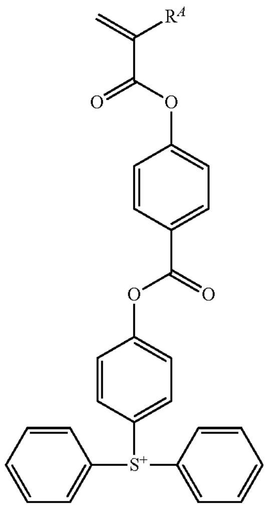
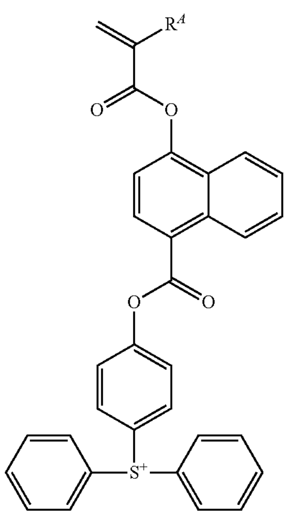
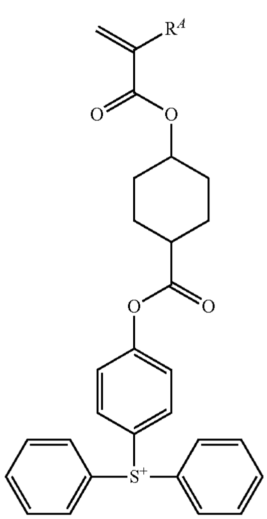
-continued
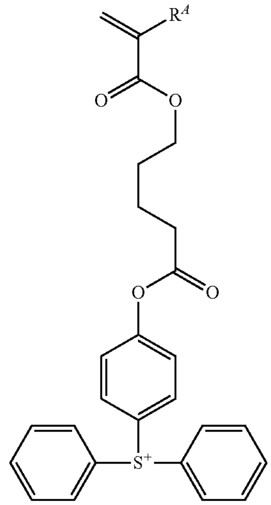
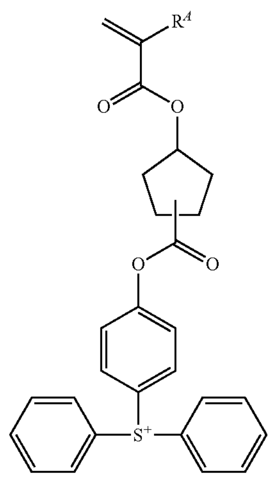
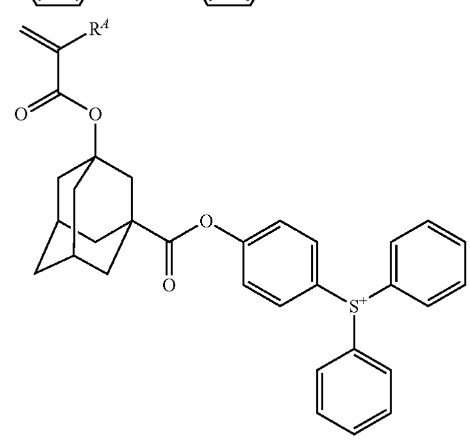
Examples of the cation in the monomer from which recurring unit (f2) or (f3) is derived are the same as exemplified above as the cation in the sulfonium salt having formula (A-1).
Examples of the anion in the monomer from which recurring unit (f2) is derived are shown below, but not limited thereto. $R^A$ is as defined above.

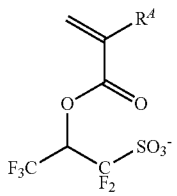
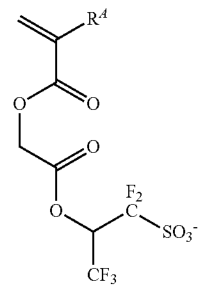
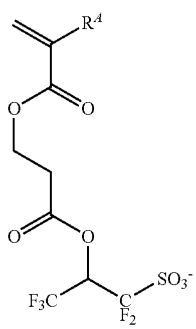
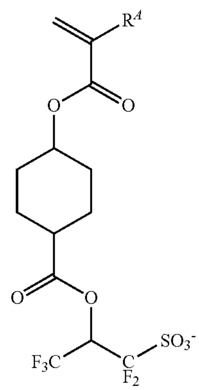
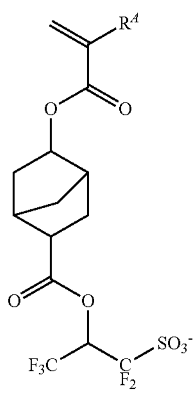
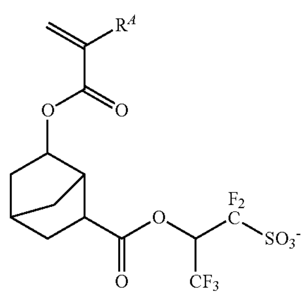
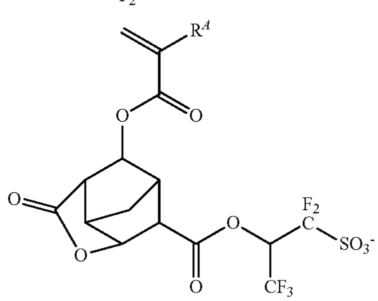
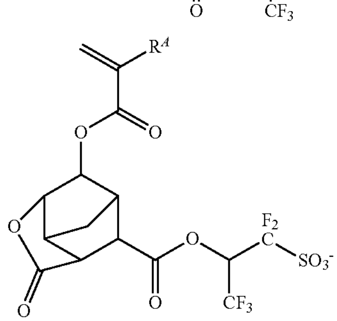
-continued
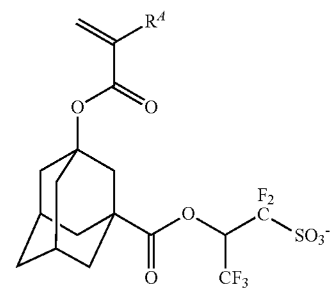
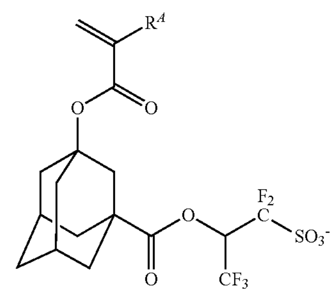
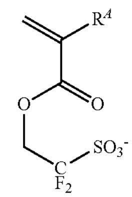
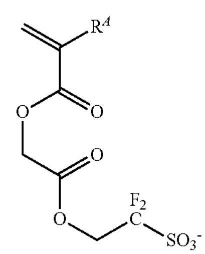
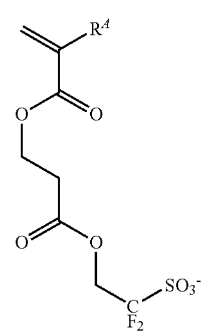
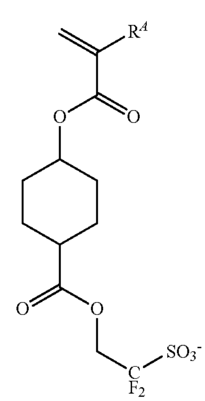
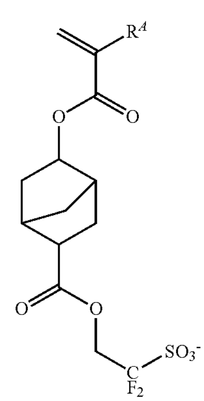
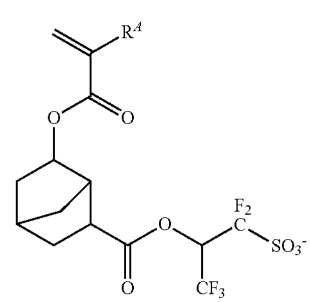

-continued
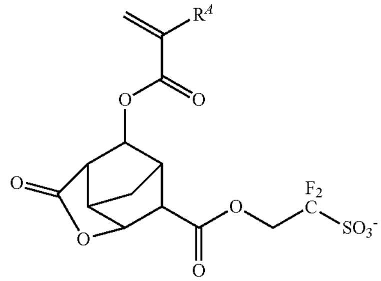
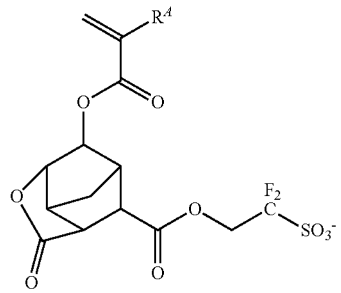
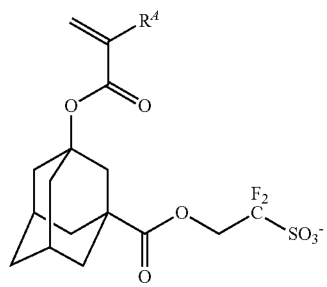
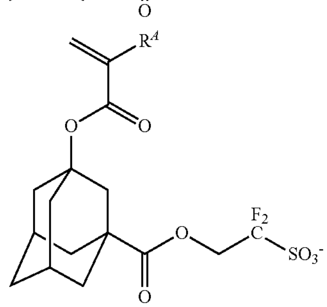
Examples of the anion in the monomer from which recurring unit (D) is derived are shown below, but not limited thereto. $R^A$ is as defined above.
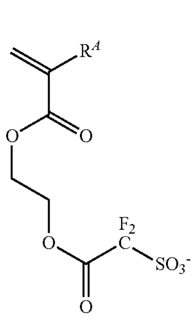
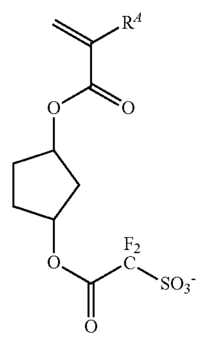
-continued
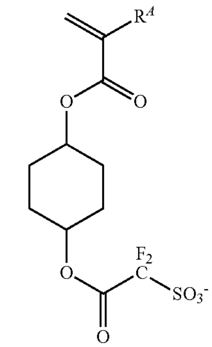
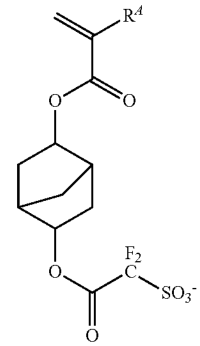
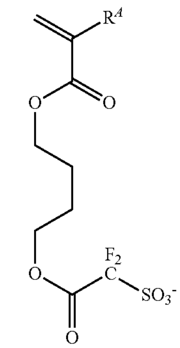
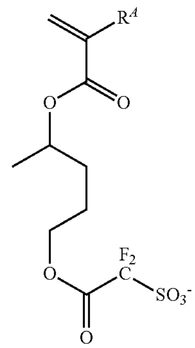
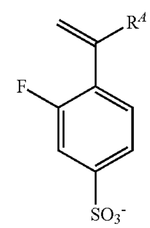
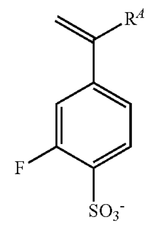
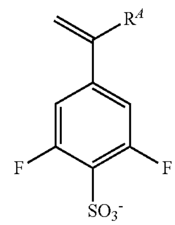
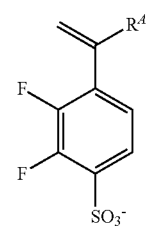
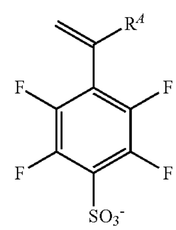
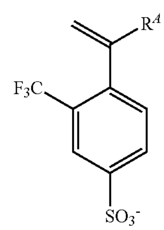
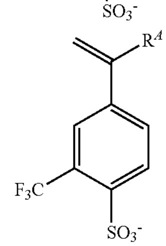
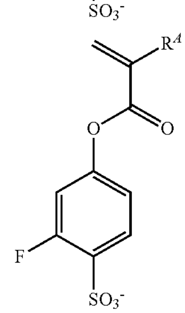
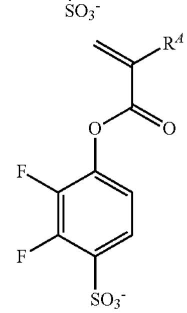
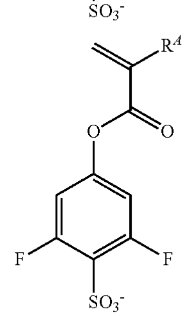
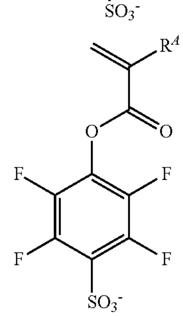

-continued

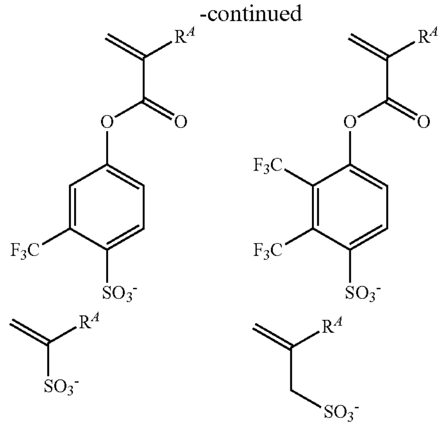

The attachment of an acid generator to the polymer main chain is effective in restraining acid diffusion, thereby preventing a reduction of resolution due to blur by acid diffusion. Also LWR is improved since the acid generator is uniformly distributed.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0 \leq a1 < 1.0$, $0 \leq a2 < 1.0$, $0 < a1+a2 < 1.0$, $0 \leq b \leq 0.9$, $0 \leq c \leq 0.9$, $0 \leq d \leq 0.8$, $0 \leq e \leq 0.8$, and $0 \leq f \leq 0.5$; more preferably $0 \leq a1 \leq 0.9$, $0 \leq a2 \leq 0.9$, $0.1 \leq a1+a2 \leq 0.9$, $0 \leq b \leq 0.8$, $0 \leq c \leq 0.8$, $0 \leq d \leq 0.7$, $0 \leq e \leq 0.7$, and $0 \leq f \leq 0.4$; and even more preferably $0 \leq a1 \leq 0.8$, $0 \leq a2 \leq 0.8$, $0.1 \leq a1+a2 \leq 0.8$, $0 \leq b \leq 0.75$, $0 \leq c \leq 0.75$, $0 \leq d \leq 0.6$, $0 \leq e \leq 0.6$, and $0 \leq f \leq 0.3$. Notably, $f=f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these units is: preferably $0 < b \leq 1.0$, $0 \leq c \leq 0.9$, $0 \leq d \leq 0.8$, $0 \leq e \leq 0.8$, and $0 \leq f \leq 0.5$; more preferably $0.2 \leq b \leq 1.0$, $0 \leq c \leq 0.8$, $0 \leq d \leq 0.7$, $0 \leq e \leq 0.7$, and $0 \leq f \leq 0.4$; and even more preferably $0.3 \leq b \leq 1.0$, $0 \leq c \leq 0.75$, $0 \leq d \leq 0.6$, $0 \leq e \leq 0.6$, and $0 \leq f \leq 0.3$. Notably, $f=f1+f2+f3$, meaning feat unit (f) is at least one of units (f1) to (13), and $b+c+d+e+f=1.0$.

The base polymer may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the polymerization temperature is 50 to 80° C. and the reaction time is 2 to 100 hours, more preferably 5 to 20 hours.

Where a monomer having a hydroxyl group is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxy styrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and alter polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Other Components

In the resist composition containing the foregoing components, other components such as a photoacid generator other than the sulfonium and iodonium salts having formulae (A-1) and (A-2), referred to as other photoacid generator, hereinafter, organic solvent, surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is folly use fill in commercial application and suited as a pattern-framing material for the fabrication of VLSIs. Particularly when a chemically amplified resist composition capable of utilizing add catalyzed reaction is formulated, the composition has a higher sensitivity and is further improved in the properties described above.

The other acid generator is typically a compound (PAG) capable of generating an acid upon exposure to actinic ray or radiation. Although the PAG used herein may be any compound capable of generating an acid upon exposure to high-energy radiation, those compounds capable of generating sulfonic add, imide acid (imidic acid) or methide acid are preferred. Suitable PAGs include sulfonium salts, iodonium salts, sulfonyldiazomethane, N-sulfouyloxyimide, and oxime-O-sulfonate acid generators. Exemplary PAGs are described in JP-A 2008-111103, paragraphs [0122]-[0142] (U.S. Pat. No. 7,537,880), JP-A 2018-005224, and JP-A 2018-025789. The other acid generator is preferably used in an amount of 0 to 200 parts, more preferably 0.1 to 100 parts by weight per 100 parts by weight of the base polymer.

Examples of the organic solvent used herein are described in JP-A 2008-111103, paragraphs [0144]-[0145] (U.S. Pat. No. 7,537,880). Exemplary solvents include ketones such as cyclohexanone (CyH), cycloheptanone and methyl-2-n-pentyl ketone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone (GBL), which may be used alone or in 3 admixture. The organic solvent is preferably added in an amount of 100 to 10,000 parts, and more preferably 200 to 8,000 parts by weight per 100 parts by weight of the base polymer.

Exemplary surfactants are described in JP-A 2008-111103, paragraphs [0165]-[0166], Inclusion of a surfactant may improve or control the coating characteristics of the resist composition. The surfactant is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms mi the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer.

In the case of negative resist compositions, a negative pattern may be formed by adding a crosslinker to reduce the dissolution rate of exposed area. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Suitable epoxy compounds include tris(2,3-epoxypropyl) isocyanurate, trimethylmethane triglycidyl ether, trimethylolpropane triglycidyl ether, and trimethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition, a quencher may be blended. The quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic adds which are not fluorinated at α-position as described in U.S. Pat. No. 8,795,942 (JP-A 2008-158339) and similar onium salts of carboxylic acid may also be used as the quencher. While an α-fluorinated sulfonic acid, imide acid, and methide acid are necessary to deprotect the acid labile group of carboxylic acid ester, an α-non-fluorinated sulfonic add or carboxylic add is released by salt exchange with an α-non-fluorinated onium salt. An α-non-fluorinated sulfonic acid and a carboxylic acid function as a quencher because they do not induce deprotection reaction.

Examples of the quencher include compounds having the formula (B), i.e., onium salts of α-non-fluorinated sulfonic acid and compounds having the formula (C), i.e., onium salts of carboxylic acid.

$$R^{101}—SO_3^-Mq^+ \quad (B)$$

$$R^{102}—CO_2^-Mq^+ \quad (C)$$

In formula (B), $R^{101}$ is hydrogen or a $C_1$-$C_{40}$ hydrocarbyl group which may contain a heteroatom, exclusive of the hydrocarbyl group in which the hydrogen bonded to the carbon atom at α-position of the sulfone group is substituted by fluorine or fluoroalkyl.

The hydrocarbyl group may be saturated or unsaturated and straight, branched or cyclic. Examples thereof include alkyl groups such as methyl, ethyl, propyl, isopropyl, n-butyl, sec-butyl, tert-butyl, tert-pentyl, n-pentyl n-hexyl, n-octyl, 2-ethylhexyl, n-nonyl, and n-decyl; cyclic saturated hydrocarbyl groups such as cyclopentyl, cyclohexyl, cyclopentylmethyl, cyclopentylediyl, cyclopentylbutyl, cyclohexylmethyl cyclohexylethyl, cyclohexylbutyl, norbornyl, tricyclo[5.2.1.$0^{2,6}$]decanyl, adamantyl, and adamantylmethyl; alkenyl groups such as vinyl, allyl, propenyl, butenyl, and hexenyl; unsaturated alicyclic hydrocarbyl groups such as cyclohexenyl; aryl groups such as phenyl, naphthyl, alkylphenyl groups, e.g., 2-methylphenyl, 3-methylphenyl, 1,4-methylphenyl, 4-ethylphenyl, 4-tert-butylphenyl, 4-n-butylphenyl, dialkylphenyl groups, e.g., 2,4-dimethylphenyl and 2,4,6-triisopropylphenyl, alkylnaphthyl groups, e.g., methylnaphthyl and ethylnaphthyl, dialkylnaphthyl groups, e.g., dimethylnaphthyl and diethylnaphthyl; heteroaryl groins such as thienyl; and aralkyl groups such as benzyl 1-phenylethyl and 2-phenylethyl.

In the foregoing groups, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl moiety, cyano moiety, carbonyl moiety, ether bond, ester bond, sulfonic acid ester bond, carbonate bond, lactone ring, sultone ring, carboxylic anhydride, or haloalkyl moiety. Examples of the heteroatom-containing hydrocarbyl group include alkoxyphenyl groups such as 4-hydroxyphenyl, 4-methoxyphenyl 3-methoxyphenyl, 2-methoxyphenyl 4-ethoxyphenyl, 4-tert-butoxyphenyl, and 3-tert-butoxyphenyl; alkoxynaphthyl groups such as methoxynaphthyl ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(1-naphthyl)-2-oxoethyl, and 2-(2-naphthyl)-2-oxoethyl.

In formula (C), $R^{102}$ is a $C_1$-$C_{20}$ hydrocarbyl group which may contain a heteroatom. Examples of the hydrocarbyl group $R^{102}$ are as exemplified above for the hydrocarbyl group $R^{101}$. Also included are fluorinated alkyl groups such as trifluoromethyl, trifluoroethyl. 2,2,2-trifluoro-1-methyl-1-hydroxyethyl, 2,2,2-trifluoro-1-trifluoromethyl-1-hydroxyethyl, and fluorinated aryl groups such as pentafluorophenyl and 4-trifluoromethylphenyl.

In formulae (B) and (C), $Mq^+$ is au onium cation. The preferred onium cations are sulfonium, iodonium and ammonium cations, with the sulfonium and iodonium cations being more preferred. Examples of the sulfonium and iodonium cations are as exemplified above for the cations in the sulfonium and iodonium salts having formulae (A-1) and (A-2), respectively.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective far preventing a film thickness loss of resist pattern or rounding of pattern top.

The quencher is preferably added in an amount of 0 to 5 parts, more preferably 0 to 4 parts by weight per 100 parts by weight of the base polymer.

To the resist composition, a water repellency improver may also be added for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in alkaline developers and organic solvent developers. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. An appropriate amount of the water repellency improver is 0 to parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182], An appropriate amount of the acetylene alcohol blended is 0 to 5 parts by weight per 100 parts by weight of the base polymer.

Process

The resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate at a temperature of 60 to 150° C. for 10 seconds to 30 minutes, preferably at 80 to 120° C. for 30 seconds to 20 minutes. The resulting resist film is generally 0.01 to 2 μm thick.

Then the resist film is exposed patternwise to high-energy radiation. Examples of die high-energy radiation include UV, deep-UV, EB, EUV of wavelength 3 to IS nm, x-ray, soft x-ray, excimer laser light, γ-ray or synchrotron radiation. On use of UV, deep UV, EUV, x-ray, soft x-ray, excimer laser, γ-ray or synchrotron radiation, the resist film is exposed through a mask having a desired pattern, preferably in a dose of about 1 to 200 mJ/$cm^2$, more preferably about 10 to 100 mJ/$cm^2$. On use of EB, a pattern may be written directly or through a mask having a desired pattern, preferably in a dose of about 0.1 to 1,000 μC/cm$^2$, more preferably about 0.5 to 200 μC/cm$^2$. The resist composition is suited for micropatterning using high-energy radiation such as i-line of wavelength 365 nm, KrF excimer laser, ArF excimer laser. EB, EUV, x-ray, soft x-ray, γ-ray or synchrotron radiation, especially EB or EUV.

After the exposure, the resist film may be baked (PEB) on a hotplate or in an oven at 50 to 150° C. for 10 seconds to 30 minutes, preferably at 60 to 120° C. for 30 seconds to 20 minutes.

After the exposure or PEB, the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxy isobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the bole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Acid generators PAG 1 to PAG 21 in the form of sulfonium or iodonium salts having the structure shown below were used in resist compositions. Each of PAG 1 to PAG 21 was synthesized by an ion exchange between an ammonium salt of iodized benzamide-containing Chlorinated sulfonic acid providing the anion shown below and a sulfonium or iodonium chloride providing the cation shown below.

PAG 1

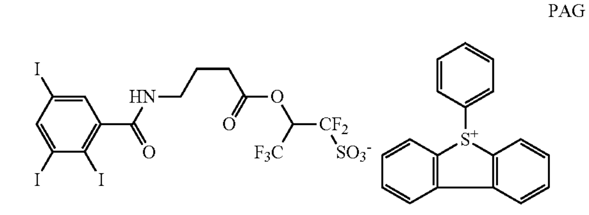

PAG 2

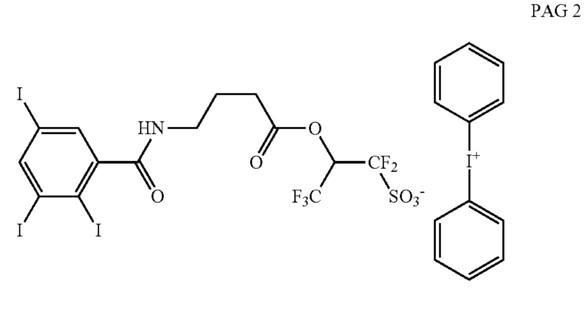

-continued
PAG 3
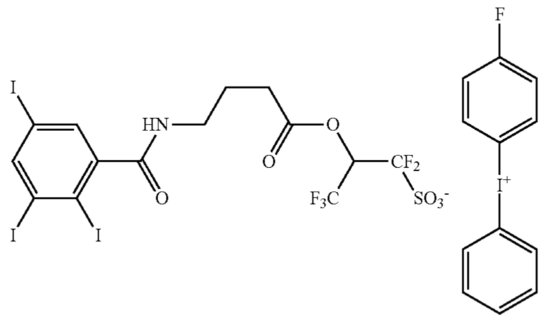
PAG 4
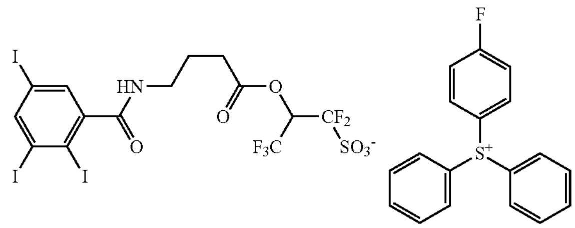
PAG 5
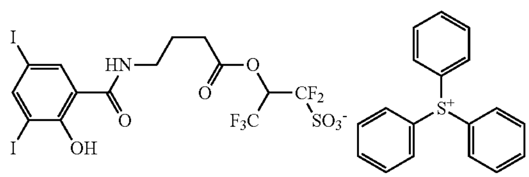
PAG 6
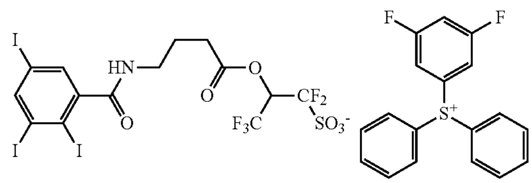
PAG 7
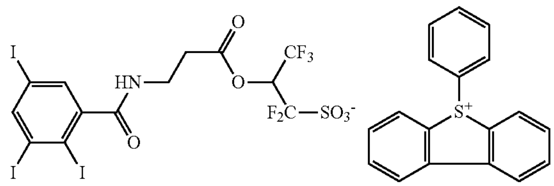
PAG 8
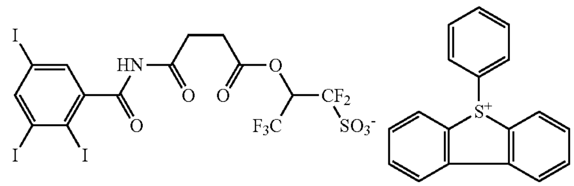
PAG 9
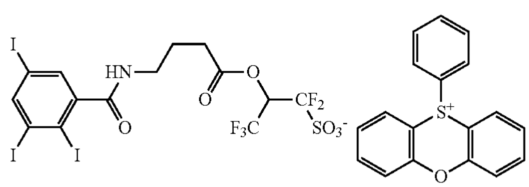
PAG 10
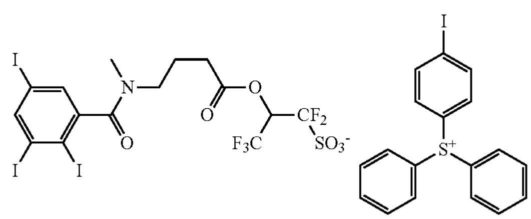
PAG 11
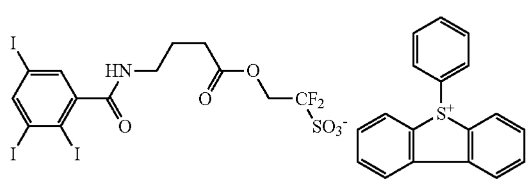
PAG 12
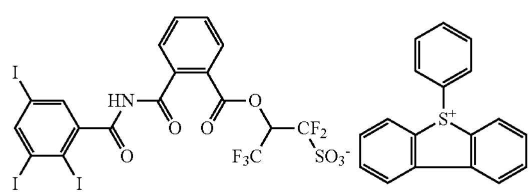
PAG 13
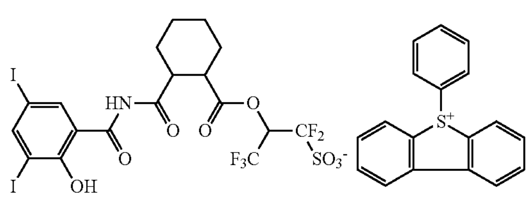
PAG 14
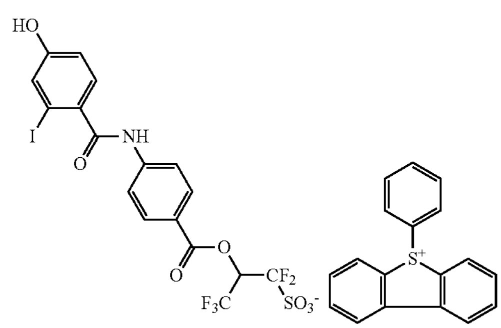

-continued
PAG 15
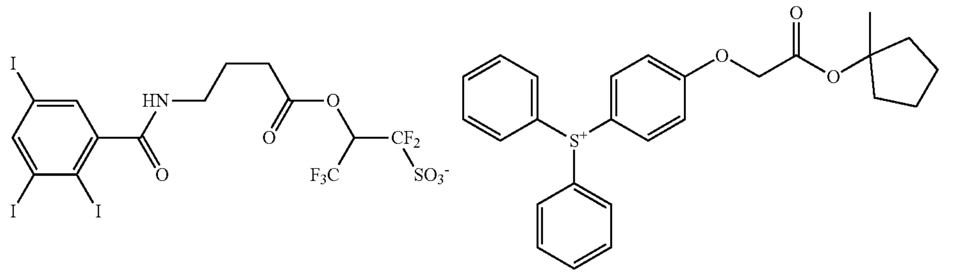
PAG 16
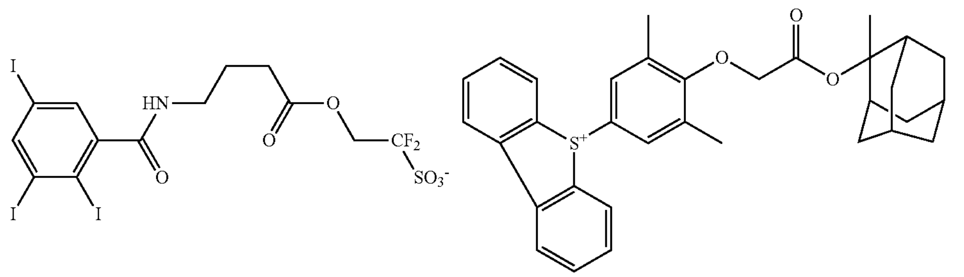
PAG 17
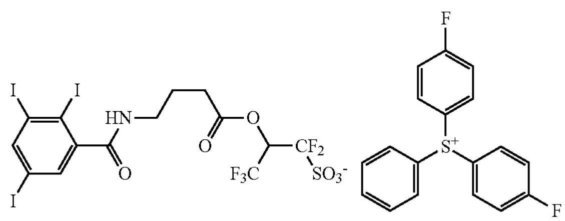
PAG 18
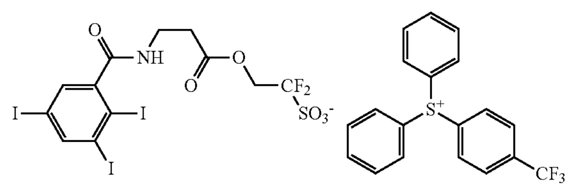
PAG 19
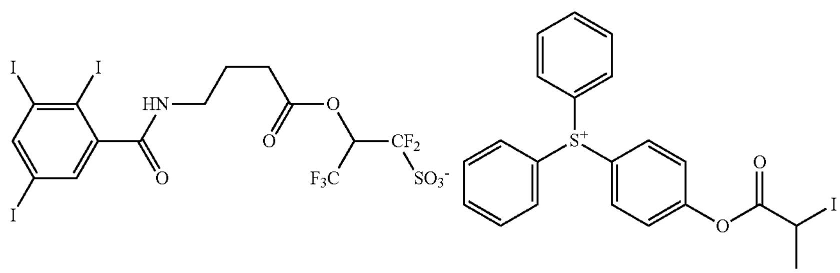
PAG 20
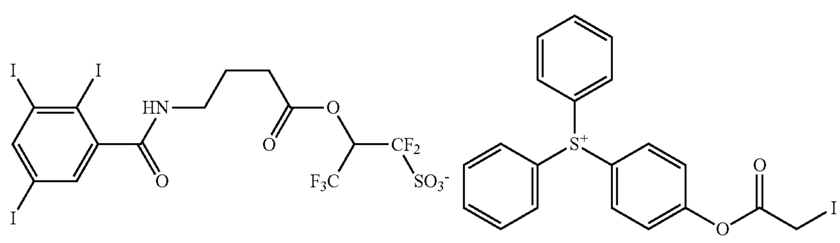
PAG 21
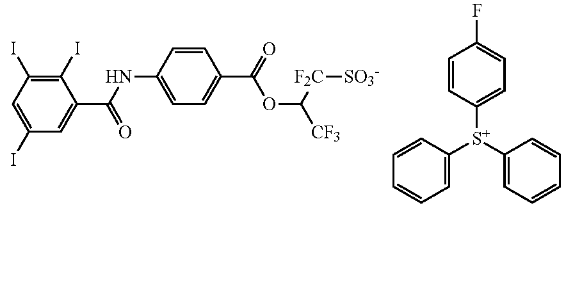

Synthesis Example

Synthesis of Base Polymers (Polymers 1 to 4)

Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 4, were analyzed for composition by $^{1}$H-NMR spectroscopy, and for Mw and Mw/Mn by GPC versus polystyrene standards using THF solvent.

Polymer 1

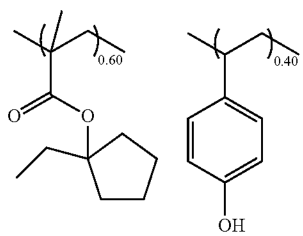

Mw = 8,200
Mw/Mn = 1.79

Polymer 2

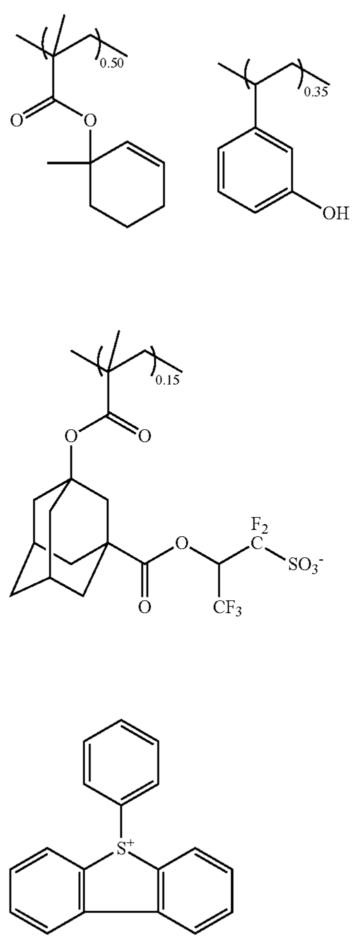

Mw = 8,800
Mw/Mn = 1.81

-continued

Polymer 3

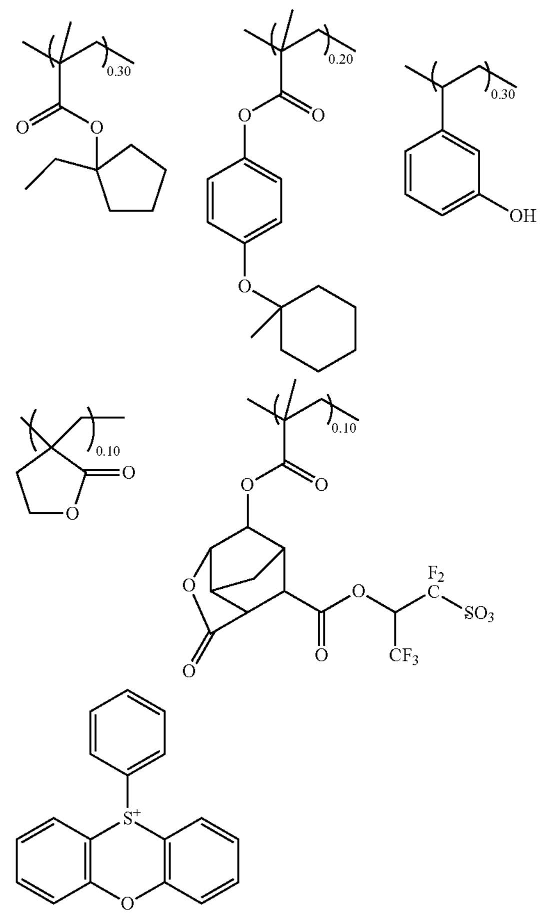

Mw = 8,100
Mw/Mn = 1.91

Polymer 4

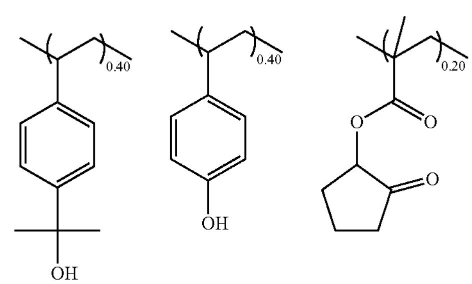

Mw = 6,900
Mw/Mn = 1.62

Examples 1 to 24 and Comparative Examples 1 to 4

(1) Preparation of Resist Composition

Resist compositions were prepared by dissolving components in a solvent in 3 accordance with the recipe shown in Tables 1 and 2, and filtering through a filter having a pore size of 0.2 μm. The solvent contained 100 ppm of surfactant PolyFox PF-636 (Onmova Solutions Inc.). The resist compositions of Examples 1 to 23 and Comparative Examples 1 and 2 are of positive tone, and the resist compositions of Example 24 and Comparative Examples 3 and 4 are of negative tone.

The components in Tables 1 and 2 are as identified below.

Organic Solvents:

PGMEA (propylene glycol monomethyl ether acetate)

CyH (cyclohexanone)

PGME (propylene glycol monomethyl ether)

DAA (diacetone alcohol)

Comparative Acid Generators: cPAG 1 and cPAG 2 of the Following Structural Formulae cPAG 1

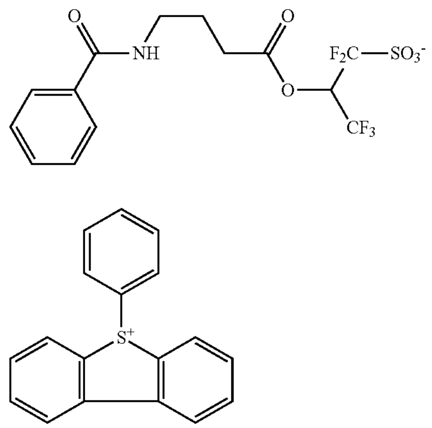

cPAG 2

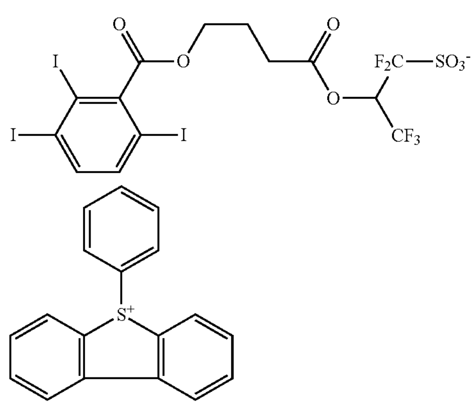

Quenchers 1 and 2 of the Following Structural Formulae

Quencher 1

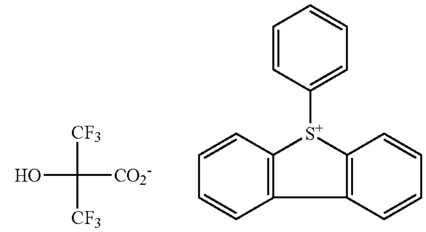

Quencher 2

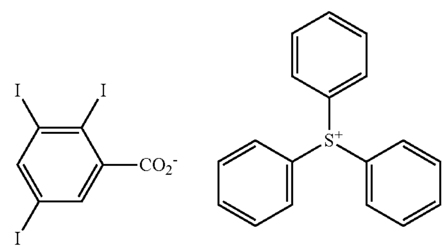

(2) EUV Lithography Test

Each of the resist compositions in Tables 1 and 2 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 50 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 and 2 for 60 seconds and developed in a 2.38 wt % TMAH aqueous solution for 30 seconds to form a pattern. In Examples 1 to 23 and Comparative Examples 1 and 2, a hole pattern having a size of 23 nm was framed. In Example 24 and Comparative Examples 3 and 4, a dot pattern having a size of 23 nm was formed.

The resist pattern was observed under CD-SEM (CG-5000, Hitachi High-Technologies Corp.). The exposure dose that provides a hole or dot pattern having a size of 23 nm is reported as sensitivity. The size of 50 holes or dots was measured, from which a size variation (3σ) was computed and reported as CDU.

The resist composition is shown in Tables 1 and 2 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|---|
| Example | 1 | Polymer 1 (100) | PAG 1 (31.7) | Quencher 1 (4.72) | PGMEA (400) CyH (2,000) PGME (100) | 100 | 23 | 2.9 |
| | 2 | Polymer 1 (100) | PAG 2 (32.3) | Quencher 1 (4.72) | PGMEA (400) CyH (2,000) PGME (100) | 100 | 23 | 2.9 |
| | 3 | Polymer 1 (100) | PAG 3 (32.9) | Quencher 1 (4.72) | PGMEA (2,000) DAA (500) | 100 | 22 | 2.8 |
| | 4 | Polymer 1 (100) | PAG 4 (32.3) | Quencher 1 (4.72) | PGMEA (2,000) DAA (500) | 100 | 25 | 2.7 |
| | 5 | Polymer 1 (100) | PAG 5 (28.5) | Quencher 1 (4.72) | PGMEA (2,000) DAA (500) | 100 | 26 | 2.9 |
| | 6 | Polymer 1 (100) | PAG 6 (32.9) | Quencher 1 (4.72) | PGMEA (2,000) DAA (500) | 100 | 24 | 2.5 |

TABLE 1-continued

| | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|
| 7 | Polymer 1 (100) | PAG 7 (31.3) | Quencher 1 (4.72) | PGMEA (2,000) DAA (500) | 100 | 25 | 2.3 |
| 8 | Polymer 1 (100) | PAG 8 (32.1) | Quencher 1 (4.72) | PGMEA (2,000) DAA (500) | 100 | 22 | 2.7 |
| 9 | Polymer 1 (100) | PAG 9 (32.1) | Quencher 1 (4.72) | PGMEA (2,000) DAA (500) | 100 | 26 | 2.4 |
| 10 | Polymer 1 (100) | PAG 10 (36.0) | Quencher 1 (4.72) | PGMEA (2,000) DAA (500) | 100 | 25 | 2.3 |
| 11 | Polymer 1 (100) | PAG 11 (29.7) | Quencher 1 (4.72) | PGMEA (2,000) DAA (500) | 100 | 25 | 2.3 |
| 12 | Polymer 1 (100) | PAG 12 (33.6) | Quencher 1 (4.72) | PGMEA (2,000) DAA (500) | 100 | 24 | 2.5 |
| 13 | Polymer 1 (100) | PAG 13 (30.4) | Quencher 1 (4.72) | PGMEA (2,000) DAA (500) | 100 | 25 | 2.4 |
| 14 | Polymer 1 (100) | PAG 14 (25.7) | Quencher 1 (4.72) | PGMEA (2,000) DAA (500) | 100 | 27 | 2.5 |
| 15 | Polymer 2 (100) | PAG 1 (10.5) | Quencher 2 (7.60) | PGMEA (2,000) DAA (500) | 90 | 22 | 2.6 |
| 16 | Polymer 3 (100) | PAG 2 (10.8) | Quencher 2 (7.60) | PGMEA (2,000) DAA (500) | 90 | 22 | 2.7 |
| 17 | Polymer 3 (100) | PAG 15 (10.8) | Quencher 2 (7.60) | PGMEA (2,000) DAA (500) | 90 | 24 | 2.7 |
| 18 | Polymer 3 (100) | PAG 16 (10.8) | Quencher 2 (7.60) | PGMEA (2,000) DAA (500) | 90 | 26 | 2.7 |
| 19 | Polymer 2 (100) | PAG 17 (10.5) | Quencher 2 (7.60) | PGMEA (2,000) DAA (500) | 90 | 22 | 2.6 |
| 20 | Polymer 3 (100) | PAG 18 (10.8) | Quencher 2 (7.60) | PGMEA (2,000) DAA (500) | 90 | 22 | 2.7 |
| 21 | Polymer 3 (100) | PAG 19 (10.8) | Quencher 2 (7.60) | PGMEA (2,000) DAA (500) | 90 | 21 | 2.7 |
| 22 | Polymer 3 (100) | PAG 20 (10.8) | Quencher 2 (7.60) | PGMEA (2,000) DAA (500) | 90 | 21 | 2.6 |
| 23 | Polymer 3 (100) | PAG 21 (11.1) | Quencher 2 (7.60) | PGMEA (2,000) DAA (500) | 90 | 22 | 2.5 |
| 24 | Polymer 4 (100) | PAG 1 (10.5) | Quencher 1 (4.72) | PGMEA (2,000) DAA (500) | 130 | 35 | 3.2 |

TABLE 2

| | | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|---|
| Comparative Example | 1 | Polymer 1 (100) | cPAG 1 (20.3) | Quencher 1 (4.72) | PGMEA (2,000) DAA (500) | 100 | 30 | 4.0 |
| | 2 | Polymer 1 (100) | cPAG 2 (31.7) | Quencher 1 (4.72) | PGMEA (2,000) DAA (500) | 100 | 20 | 3.2 |
| | 3 | Polymer 4 (100) | cPAG 1 (6.8) | Quencher 1 (4.72) | PGMEA (2,000) DAA (500) | 130 | 45 | 4.2 |
| | 4 | Polymer 4 (100) | cPAG 2 (10.6) | Quencher 1 (4.72) | PGMEA (2,000) DAA (500) | 130 | 31 | 3.8 |

It is demonstrated in Tables 1 and 2 that resist compositions comprising sulfonium or iodonium salts of iodized benzamide group-containing fluorinated sulfonic acid offer a high sensitivity and improved CDU.

Japanese Patent Application No. 2019-209458 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and an acid generator containing a sulfonium salt having the formula (A-1) or iodonium salt having the formula (A-2):

(A-1)

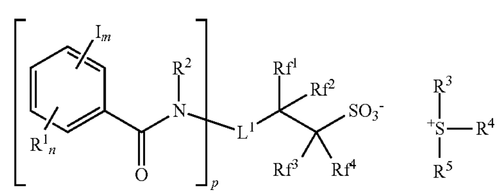

-continued (A-2)

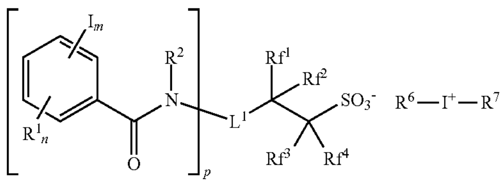

wherein m is an integer of 1 to 5, n is an integer of 0 to 3, m+n is 1 to 5, p is an integer of 1 to 3, $L^1$ is a single bond or $C_1$-$C_{20}$ divalent linking group when p=1, or a $C_1$-$C_{20}$ tri- or tetravalent linking group when p=2 or 3, the linking group optionally containing oxygen, sulfur or nitrogen, $Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$, taken together, may form a carbonyl group, $R^1$ is hydroxyl, carboxyl, nitro, cyano, fluorine, chlorine, bromine, amino, or a $C_1$-$C_{20}$ saturated hydrocarbyl, $C_1$-$C_{20}$ saturated hydrocarbyloxy, $C_2$-$C_{20}$ saturated hydrocarbyloxycarbonyl, $C_2$-$C_{20}$ saturated hydrocarbylcarbonyloxy or $C_1$-$C_4$ saturated hydrocarbylsulfonyloxy group, which may contain fluorine, chlorine, bromine, hydroxyl, amino or ether bond, or —$NR^{1A}$—C(═O)—$R^{1B}$ or —$NR^{1A}$—C(═O)—O—$R^{1B}$, $R^{1A}$ is hydrogen or a $C_1$-$C_6$ saturated hydrocarbyl group which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety, $R^{1B}$ is a $C_1$-$C_{16}$ aliphatic hydrocarbyl group or $C_6$-$C_{12}$ aryl group, which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety, $R^2$ is hydrogen or $C_1$-$C_4$ alkyl, $R^2$ and $L^1$ may bond together to form a ring with the nitrogen atom to which they are attached, $R^3$, $R^4$, $R^5$, $R^6$, and $R^7$ are each independently a $C_1$-$C_{20}$ hydrocarbyl group which may contain a heteroatom, $R^3$ and $R^4$ may bond together to form a ring with the sulfur atom to which they are attached.

2. The resist composition of claim 1, further comprising an organic solvent.

3. The resist composition of claim 1 wherein the base polymer comprises recurring units having the formula (a1) or recurring units having the formula (a2):

(a1)

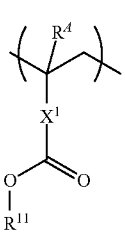

-continued (a2)

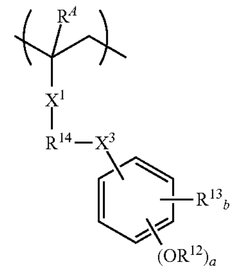

wherein $R^A$ is each independently hydrogen or methyl, $X^1$ is a single bond, phenylene group, naphthylene group, or $C_1$-$C_{12}$ linking group containing an ester bond, ether bond or lactone ring, $X^2$ is a single bond or ester bond, $X^3$ is a single bond, ether bond or ester bond, $R^{11}$ and $R^{12}$ each are an acid labile group, $R^{13}$ is fluorine, trifluoromethyl, cyano, $C_1$-$C_6$ saturated hydrocarbyl, $C_1$-$C_6$ saturated hydrocarbyloxy, $C_2$-$C_7$ saturated hydrocarbylcarbonyl, $C_2$-$C_7$ saturated hydrocarbylcarbonyloxy, or $C_2$-$C_7$ saturated hydrocarbyloxycarbonyl group, $R^{14}$ is a single bond or a $C_1$-$C_6$ alkanediyl group in which some carbon may be replaced by an ether bond or ester bond, a is 1 or 2, and b is an integer of 0 to 4.

4. The resist composition of claim 3, further comprising a dissolution inhibitor.

5. The resist composition of claim 3 which is a chemically amplified positive resist composition.

6. The resist composition of claim 1 wherein the base polymer is free of an acid labile group.

7. The resist composition of claim 6, further comprising a crosslinker.

8. The resist composition of claim 6 which is a chemically amplified negative resist composition.

9. The resist composition of claim 1, further comprising a surfactant.

10. The resist composition of claim 1 wherein the base polymer further comprises recurring units of at least one type selected from the formulae (f1) to (f3):

(f1)

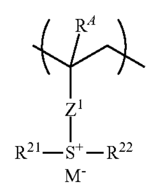

(f2)

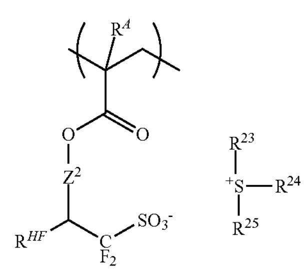

-continued (f3)

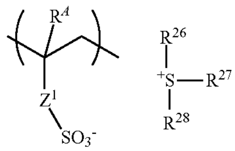

wherein $R^A$ is each independently hydrogen or methyl, $Z^1$ is a single bond, phenylene group, —O—$Z^{11}$—, —C(═O)—O—$Z^{11}$— or —C(═O)—NH—$Z^{11}$—, $Z^{11}$ is a $C_1$-$C_6$ aliphatic hydrocarbylene group, phenylene group, naphthylene group, or $C_7$-$C_{18}$ combination thereof, which may contain carbonyl, ester bond, ether bond or hydroxyl, $Z^2$ is a single bond, —$Z^{21}$—C(═O)—O—, —$Z^{21}$—O— or —$Z^{21}$—O—C(═O)—, $Z^{21}$ is a $C_1$-$C_{12}$ saturated hydrocarbylene group which may contain carbonyl, ester bond or ether bond, $Z^3$ is a single bond, methylene, ethylene, phenylene, fluorinated phenylene, —O—$Z^{31}$—, —C(═O)—O—$Z^{31}$— or —C(═O)—NH—$Z^{31}$—, $Z^{31}$ is a $C_1$-$C_6$ aliphatic hydrocarbylene group, phenylene group, fluorinated phenylene group, or trifluoromethyl-substituted phenylene group, which may contain carbonyl, ester bond, ether bond or hydroxyl, $R^{21}$ to $R^{28}$ are each independently a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, $R^{HF}$ is hydrogen or trifluoromethyl, and $M^-$ is a non-nucleophilic counter ion.

11. The resist composition of claim 1 wherein $R^{f1}$ is hydrogen or trifluoromethyl, $R^{f2}$ is hydrogen, and $R^{f3}$ and $R^{f4}$ are fluorine.

12. The resist composition of claim 1 wherein $R^{f1}$ and $R^{f2}$ are hydrogen, and $R^{f3}$ and $R^{f4}$ are fluorine.

13. The resist composition of claim 1 wherein $L^1$ is a $C_1$-$C_{20}$ divalent linking group when p=1, or a $C_1$-$C_{20}$ tri- or tetravalent linking group when p=2 or 3, the linking group containing oxygen, sulfur or nitrogen.

14. A process for forming a pattern comprising the steps of applying the resist composition of claim 1 onto a substrate to form a resist film thereon, exposing the resist film to high-energy radiation, and developing the exposed resist film in a developer.

15. The process of claim 14 wherein the high-energy radiation is ArF excimer laser radiation of wavelength 193 nm or KrF excimer laser radiation of wavelength 248 nm.

16. The process of claim 14 wherein the high-energy radiation is EB or EUV of wavelength 3 to 15 nm.

* * * * *